US009905610B2

(12) United States Patent
Tsai et al.

(10) Patent No.: US 9,905,610 B2
(45) Date of Patent: Feb. 27, 2018

(54) INTEGRATED STRUCTURES OF ACOUSTIC WAVE DEVICE AND VARACTOR, AND ACOUSTIC WAVE DEVICE, VARACTOR AND POWER AMPLIFIER, AND FABRICATION METHODS THEREOF

(71) Applicant: WIN Semiconductors Corp., Kuei Shan Hsiang, Tao Yuan Shien (TW)

(72) Inventors: Shu-Hsiao Tsai, Tao Yuan Shien (TW); Re Ching Lin, Tao Yuan Shien (TW); Pei-Chun Liao, Tao Yuan Shien (TW); Cheng-Kuo Lin, Tao Yuan Shien (TW); Yung-Chung Chin, Tao Yuan Shien (TW); Chih-Feng Chiang, Tao Yuan Shien (TW)

(73) Assignee: WIN SEMICONDUCTORS CORP., Guishan District (TW)

( * ) Notice: Subject to any disclaimer, the term of this patent is extended or adjusted under 35 U.S.C. 154(b) by 0 days.

(21) Appl. No.: 15/445,490

(22) Filed: Feb. 28, 2017

(65) Prior Publication Data

US 2017/0170233 A1    Jun. 15, 2017

Related U.S. Application Data

(63) Continuation-in-part of application No. 14/586,592, filed on Dec. 30, 2014, now Pat. No. 9,653,516.

(51) Int. Cl.
*H01L 29/49* (2006.01)
*H01L 27/20* (2006.01)
(Continued)

(52) U.S. Cl.
CPC .......... *H01L 27/20* (2013.01); *H01L 21/8252* (2013.01); *H01L 23/66* (2013.01);
(Continued)

(58) Field of Classification Search
CPC ..... H01L 27/20; H01L 21/8252; H01L 23/66; H01L 27/0605; H01L 29/20;
(Continued)

(56) References Cited

U.S. PATENT DOCUMENTS 4,814,845 A * 3/1989 Kurtz .................... G01L 9/0042
257/419
5,668,057 A * 9/1997 Eda ........................ H01L 27/20
257/E27.006

(Continued)

*Primary Examiner* — Michael Shingleton
(74) *Attorney, Agent, or Firm* — Muncy, Geissler, Olds & Lowe, P.C.

(57) ABSTRACT

An integrated structure of acoustic wave device and varactor comprises an acoustic wave device and a varactor formed on a first part and a second part of a semiconductor substrate respectively. The acoustic wave device comprises an acoustic wave device upper structure and a first part of a bottom epitaxial structure. The acoustic wave device upper structure is formed on the first part of the bottom epitaxial structure. The varactor comprises a varactor upper structure and a second part of the bottom epitaxial structure. The varactor upper structure is formed on the second part of the bottom epitaxial structure. The integrated structure of the acoustic wave device and the varactor formed on the same semiconductor substrate is capable of reducing the module size, optimizing the impedance matching, and reducing the signal loss between the varactor and the acoustic wave device.

78 Claims, 62 Drawing Sheets

(51) Int. Cl.
| | |
|---|---|
| H03H 9/17 | (2006.01) |
| H03H 9/13 | (2006.01) |
| H01L 29/93 | (2006.01) |
| H01L 23/66 | (2006.01) |
| H01L 29/20 | (2006.01) |
| H01L 27/06 | (2006.01) |
| H01L 29/66 | (2006.01) |
| H01L 21/8252 | (2006.01) |
| H03F 3/213 | (2006.01) |
| H01L 41/311 | (2013.01) |
| H03H 9/02 | (2006.01) |
| H03H 9/05 | (2006.01) |

(52) U.S. Cl.
CPC .......... *H01L 27/0605* (2013.01); *H01L 29/20* (2013.01); *H01L 29/66174* (2013.01); *H01L 29/93* (2013.01); *H01L 41/311* (2013.01); *H03F 3/213* (2013.01); *H03H 9/02007* (2013.01); *H03H 9/0542* (2013.01); *H03H 9/13* (2013.01); *H03H 9/171* (2013.01); *H03H 9/173* (2013.01); *H01L 2223/6655* (2013.01)

(58) Field of Classification Search
CPC . H01L 29/66174; H01L 29/93; H01L 41/332; H01L 2223/6655; H03F 3/213; H03H 9/13; H03H 9/9171
See application file for complete search history.

(56) References Cited

U.S. PATENT DOCUMENTS

| | | |
|---|---|---|
| 5,747,857 A * | 5/1998 | Eda .................. H01L 27/20 257/416 |
| 9,019,028 B2 | 4/2015 | Lin et al. |
| 2010/0295100 A1 | 11/2010 | Huang et al. |

* cited by examiner

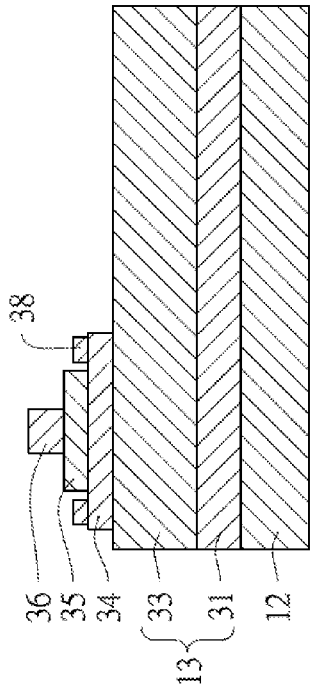
Fig. 2J
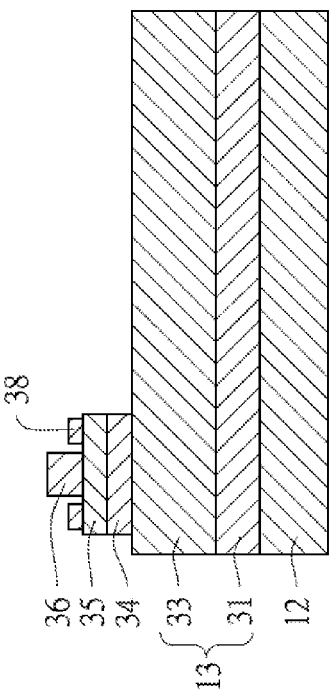
Fig. 2K
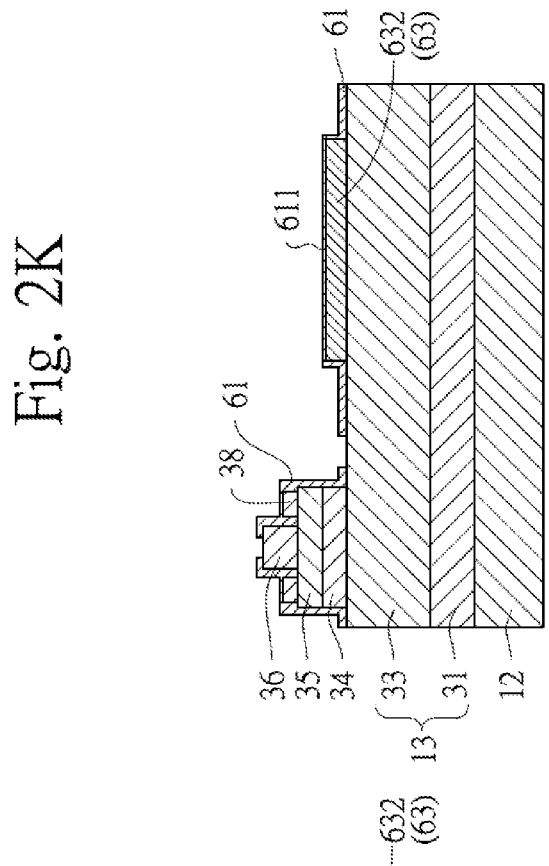
Fig. 2L
Fig. 2M

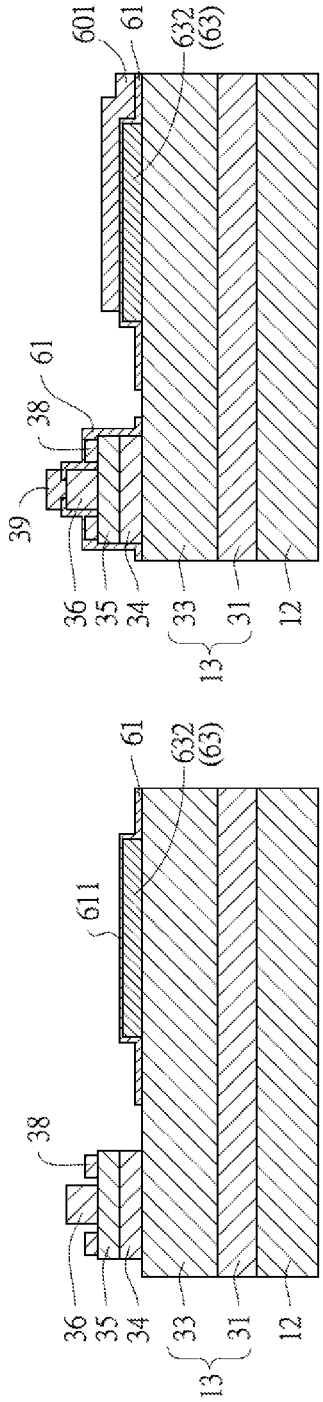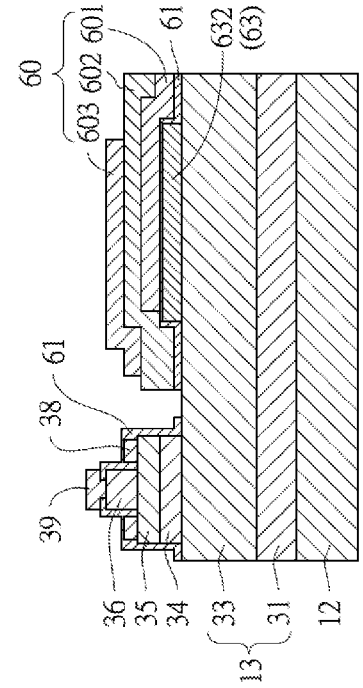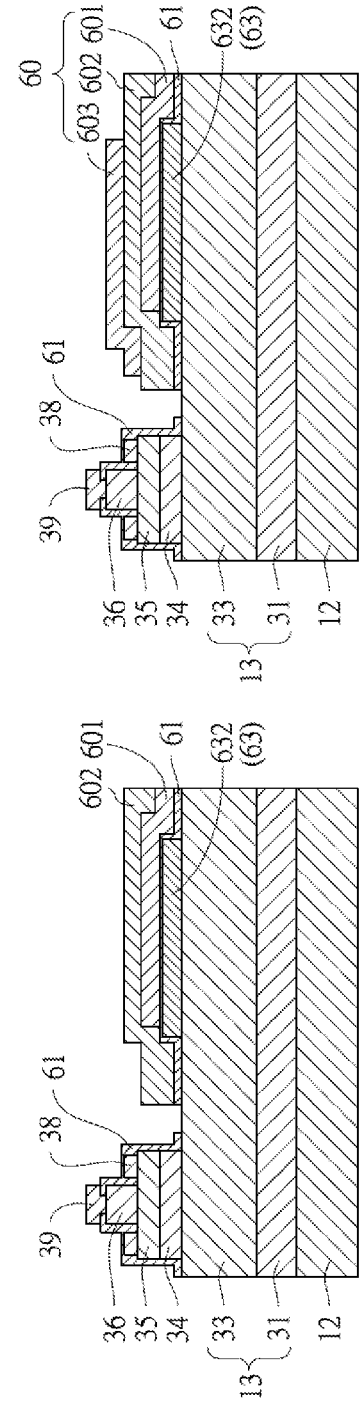

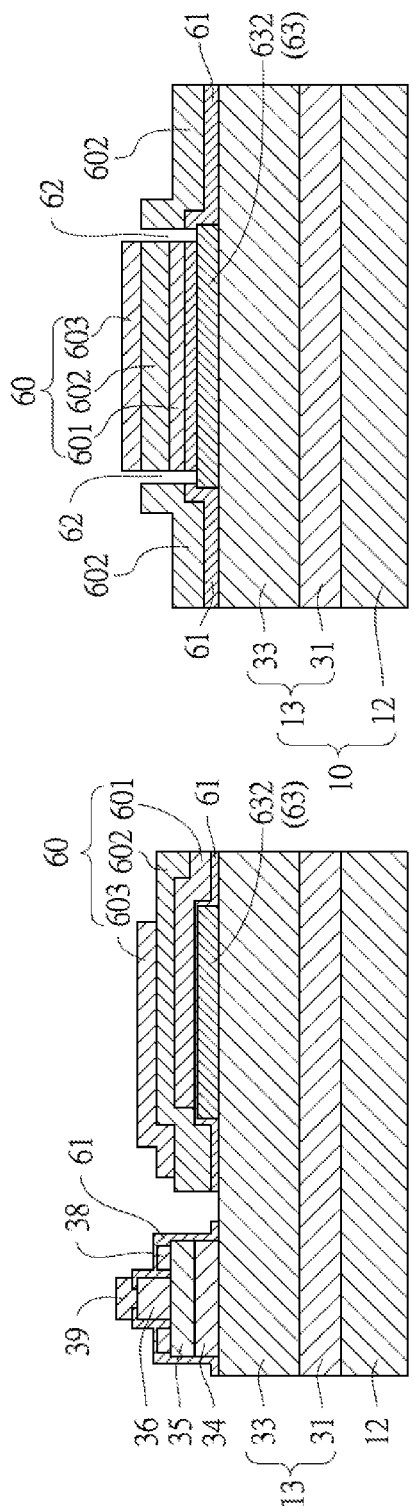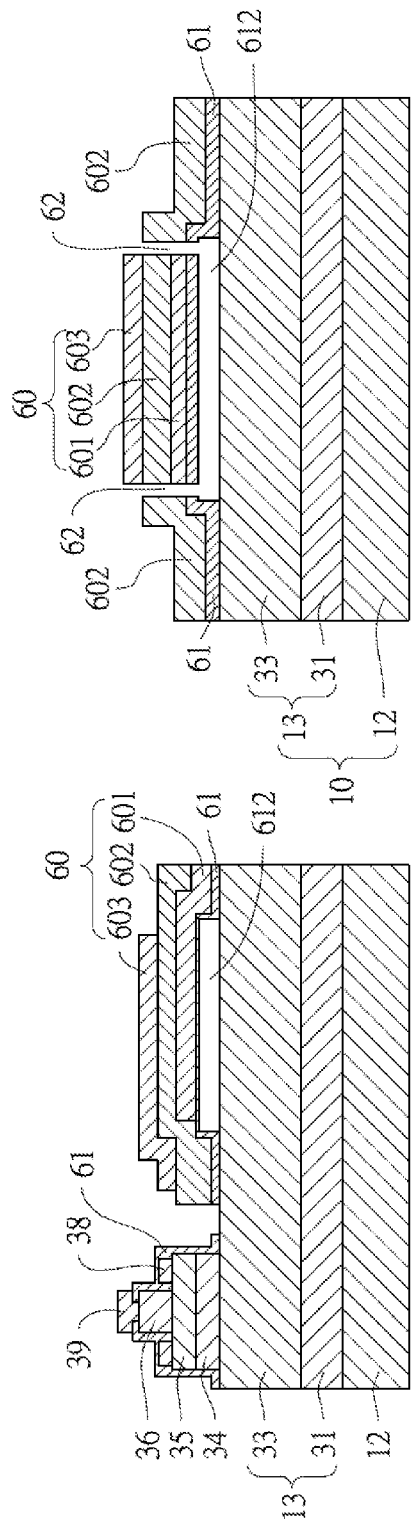

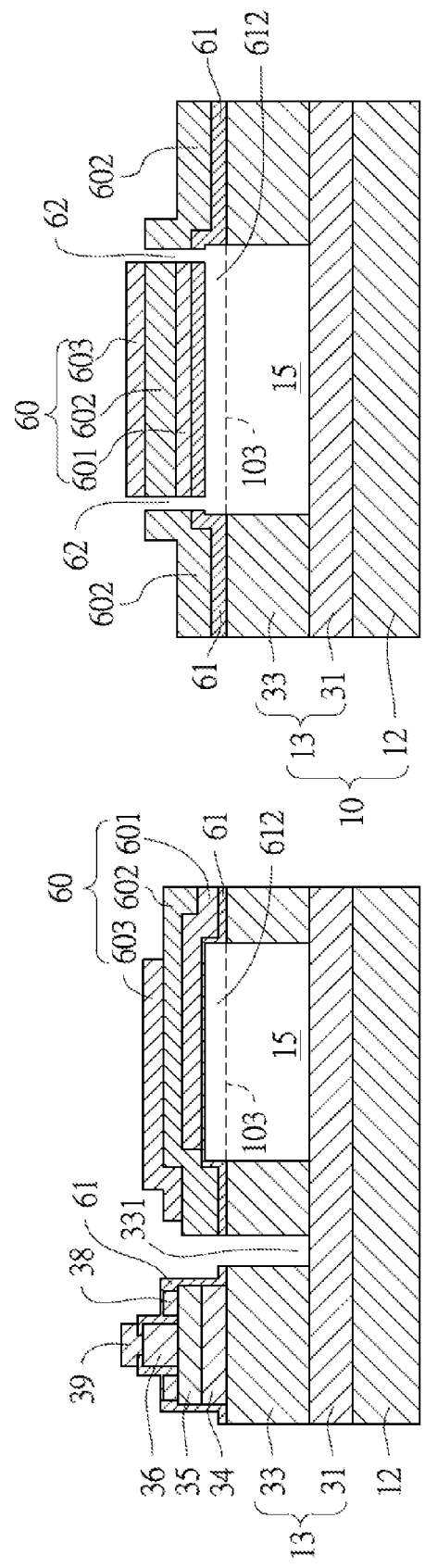

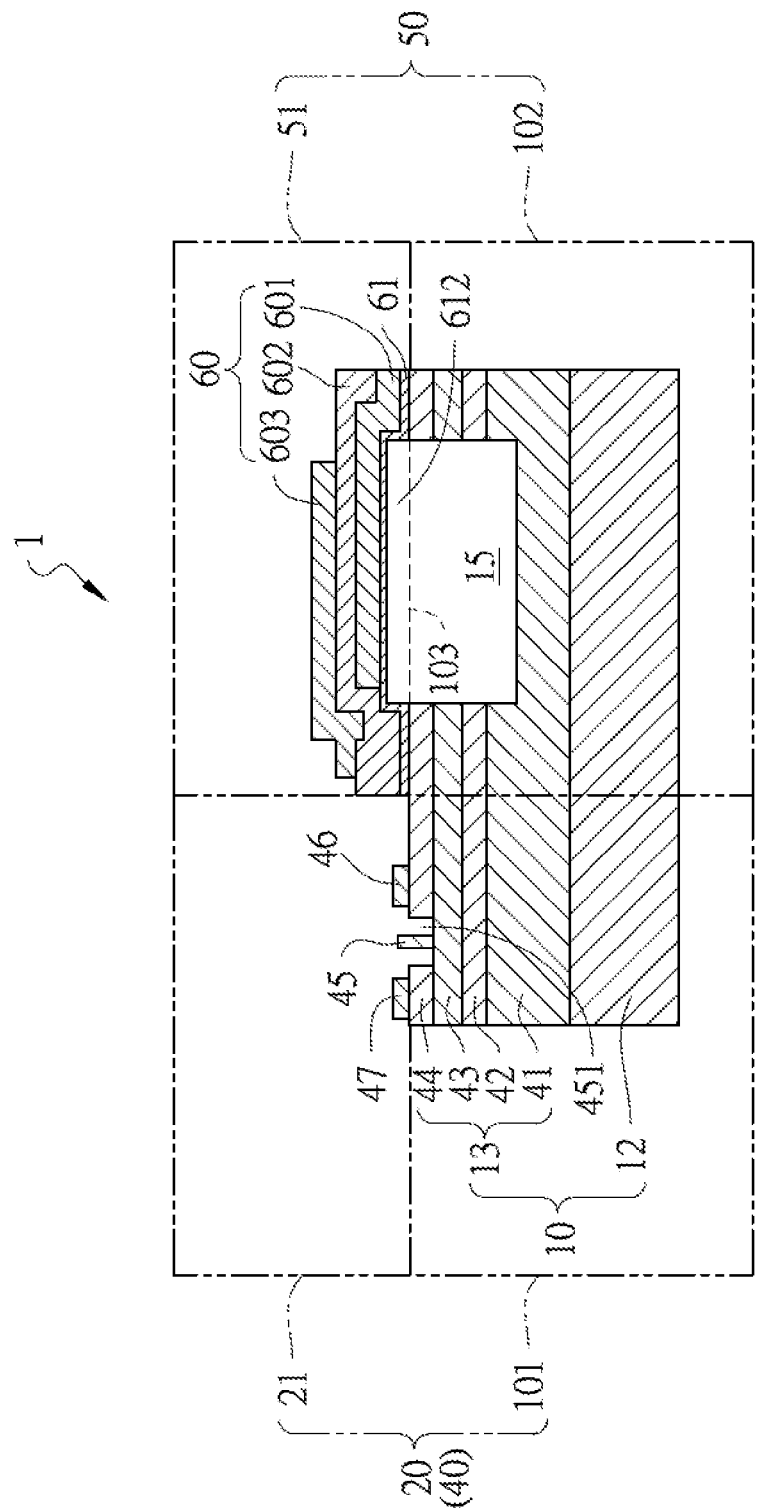

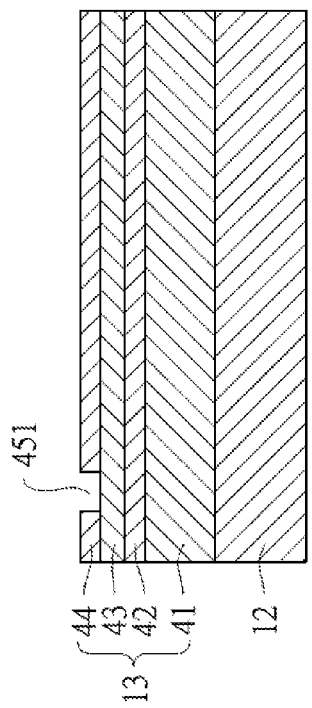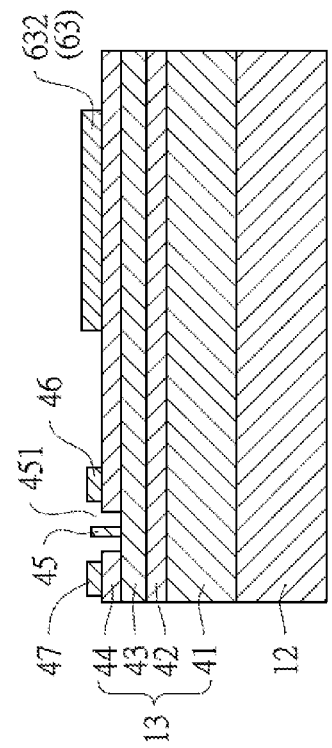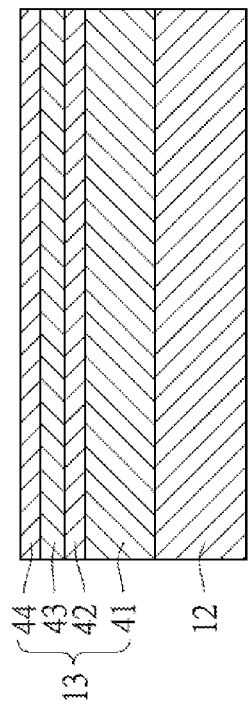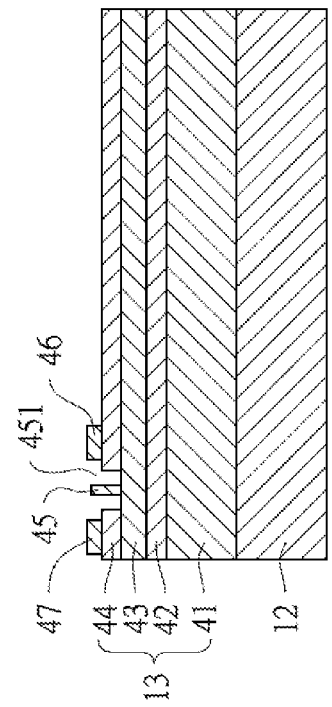

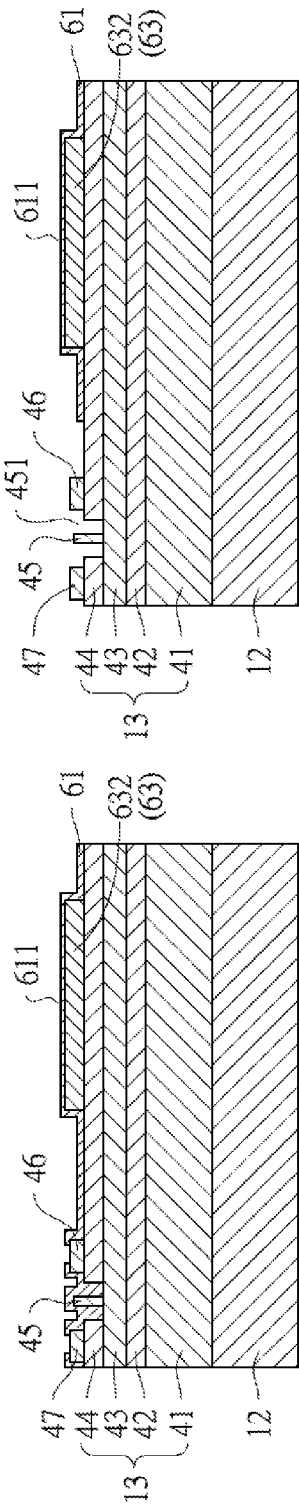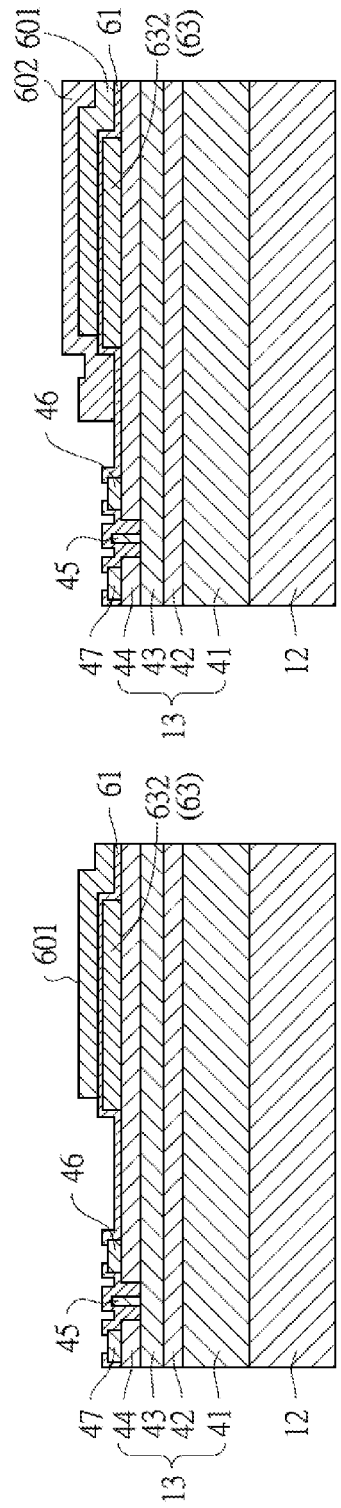

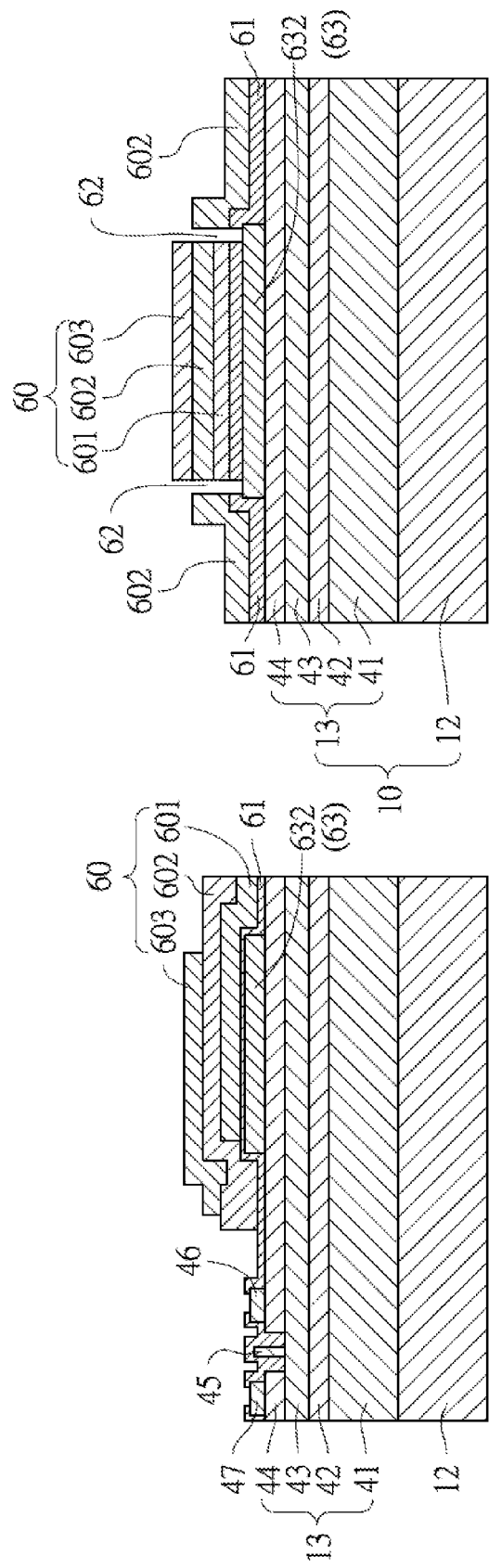

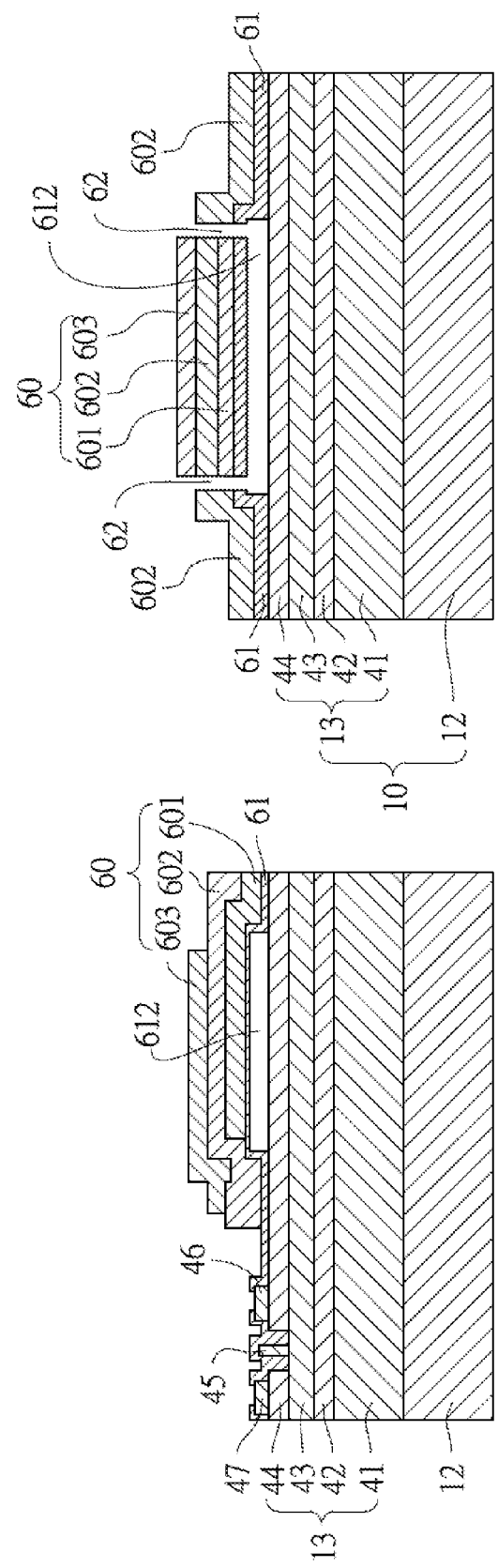

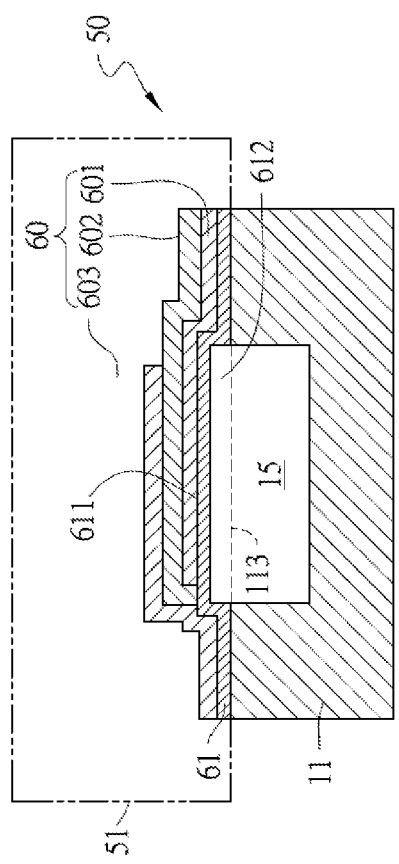
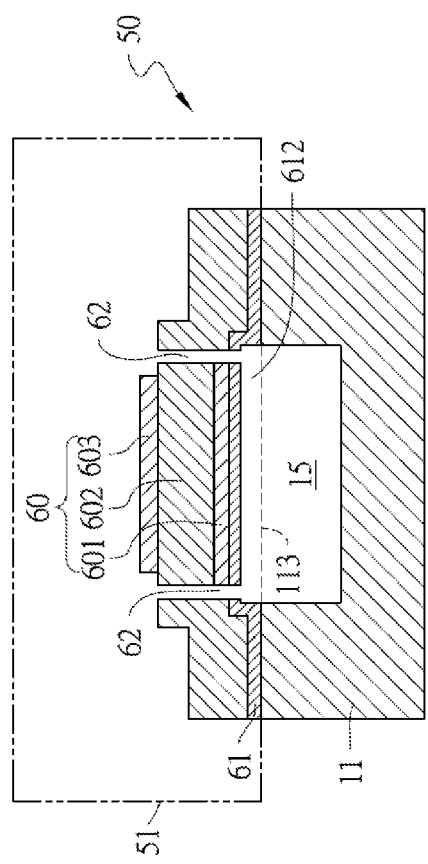

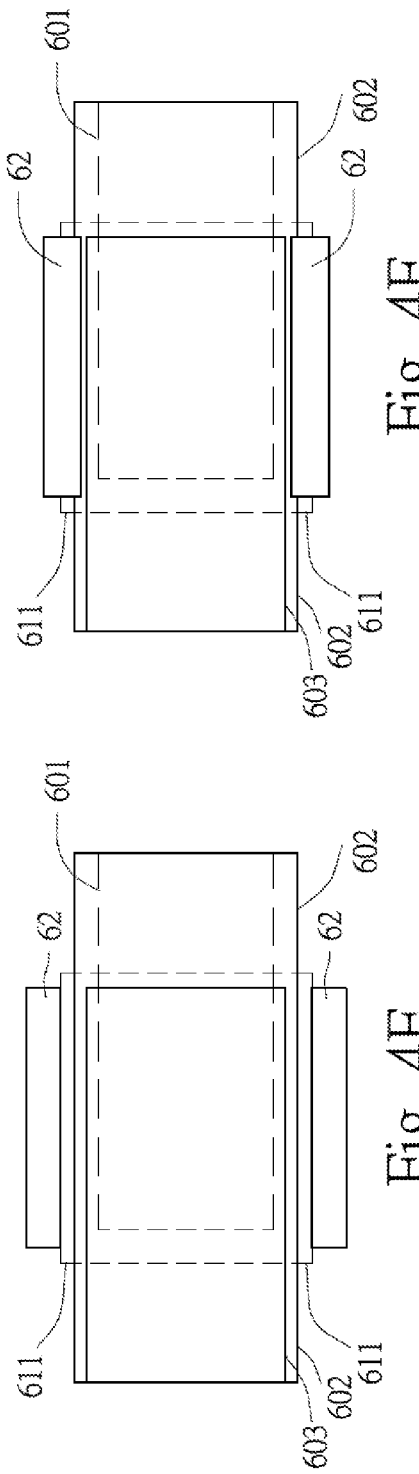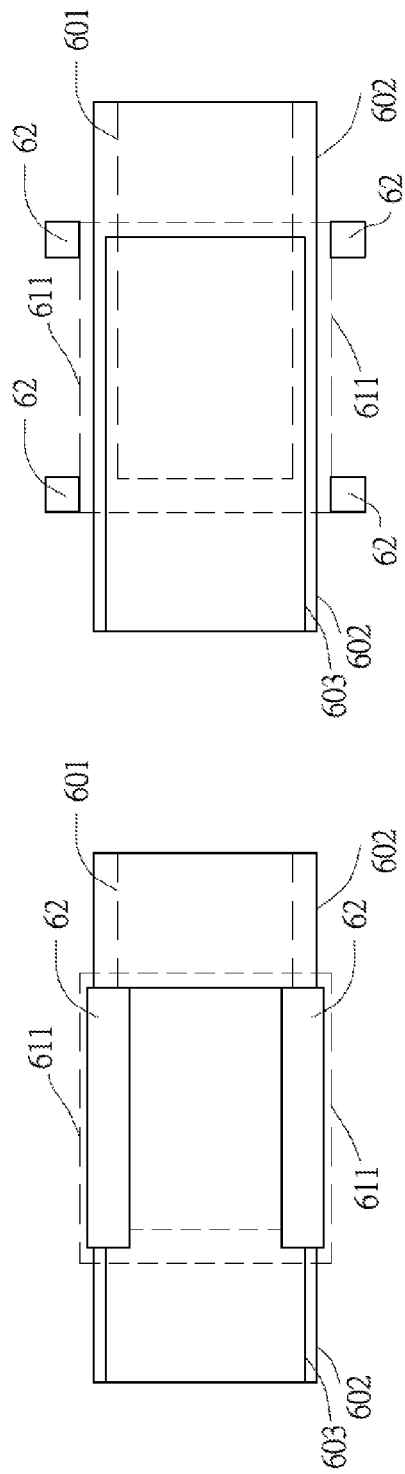
Fig. 4E    Fig. 4F    Fig. 4G    Fig. 4H

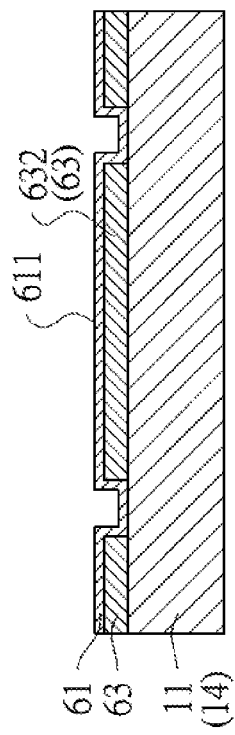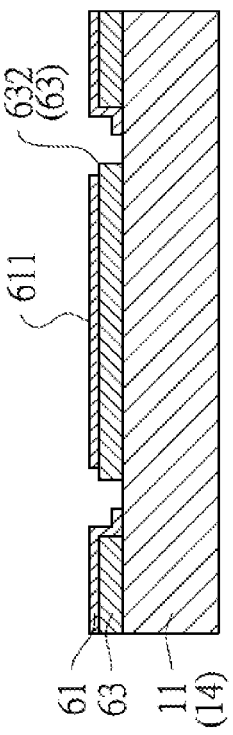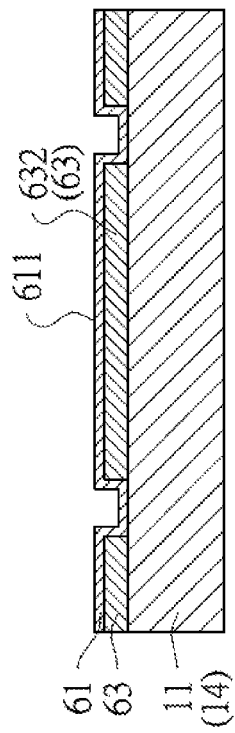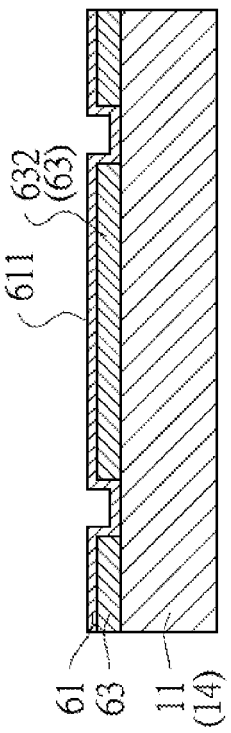

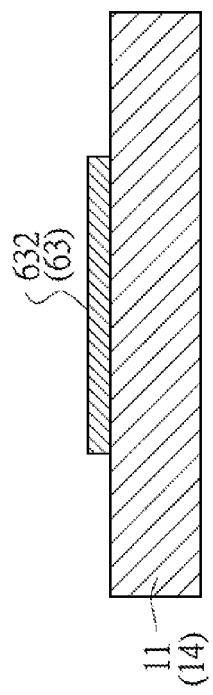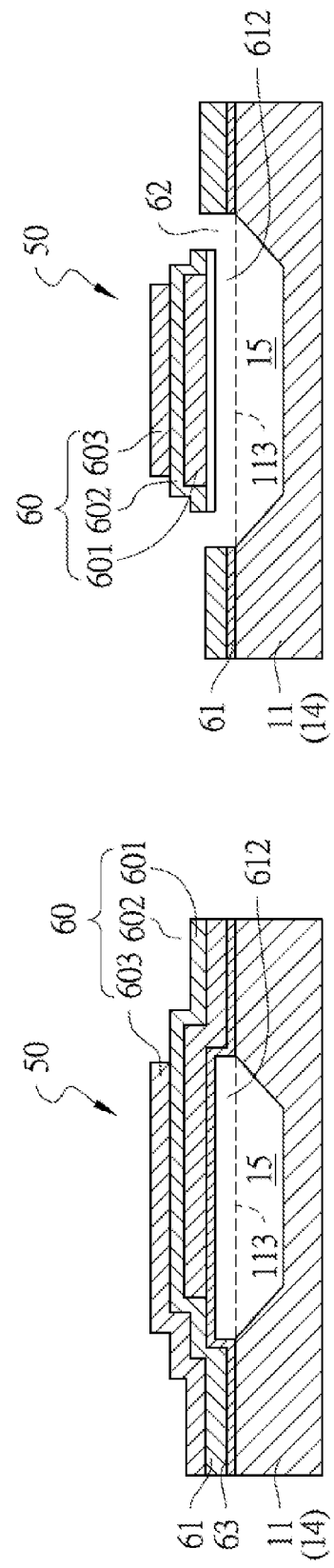

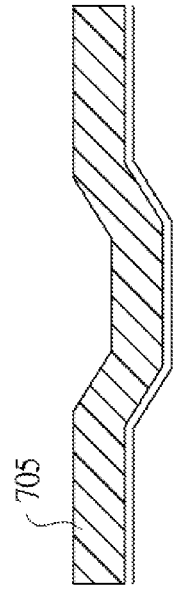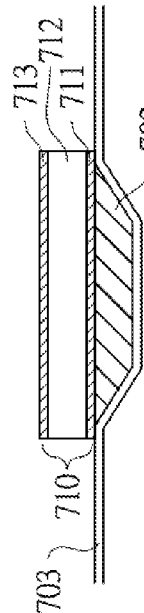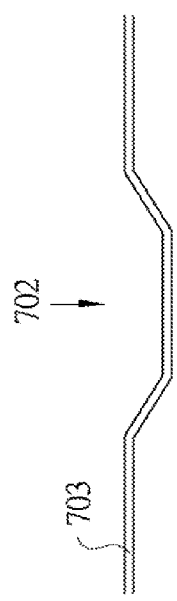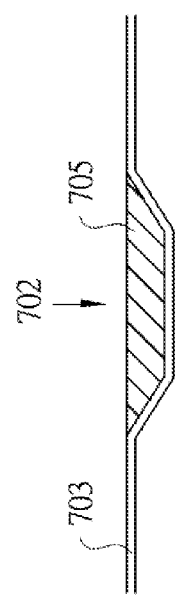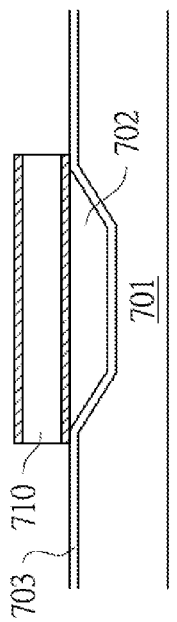

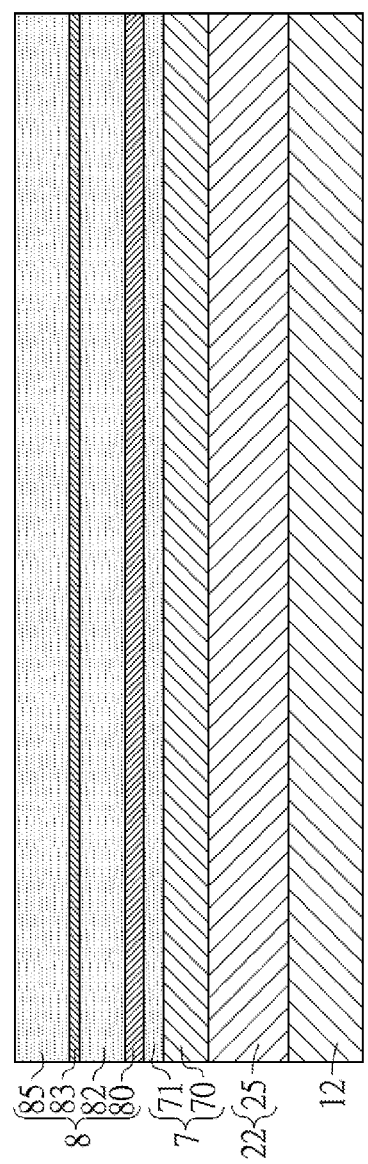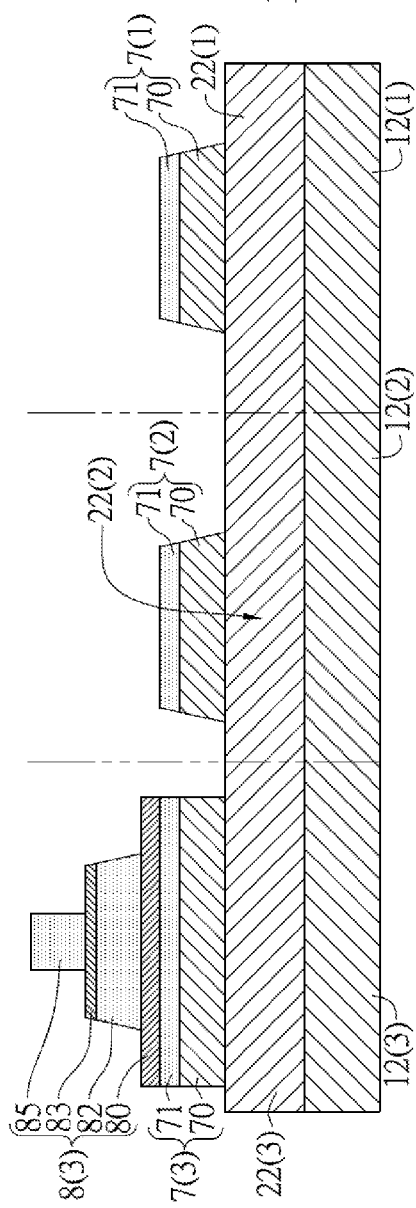

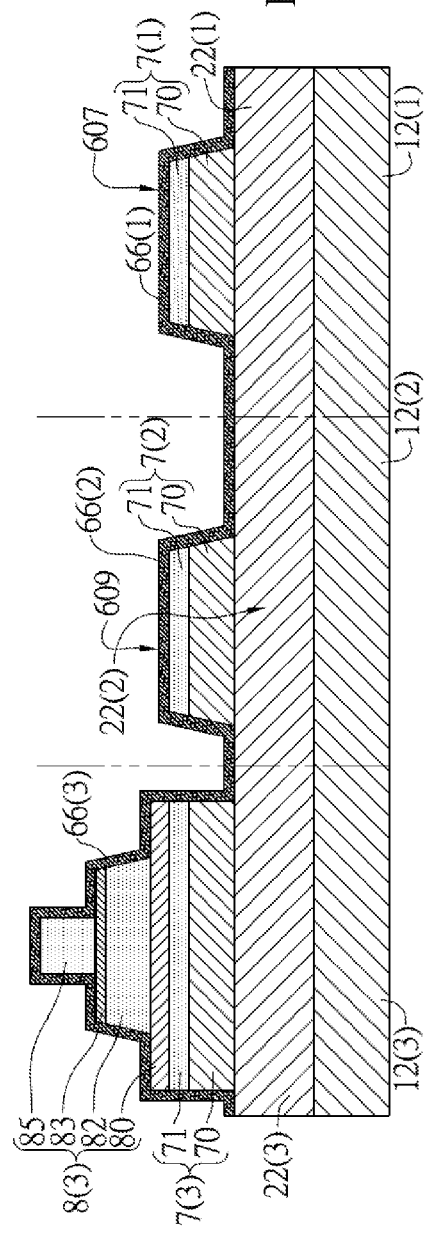
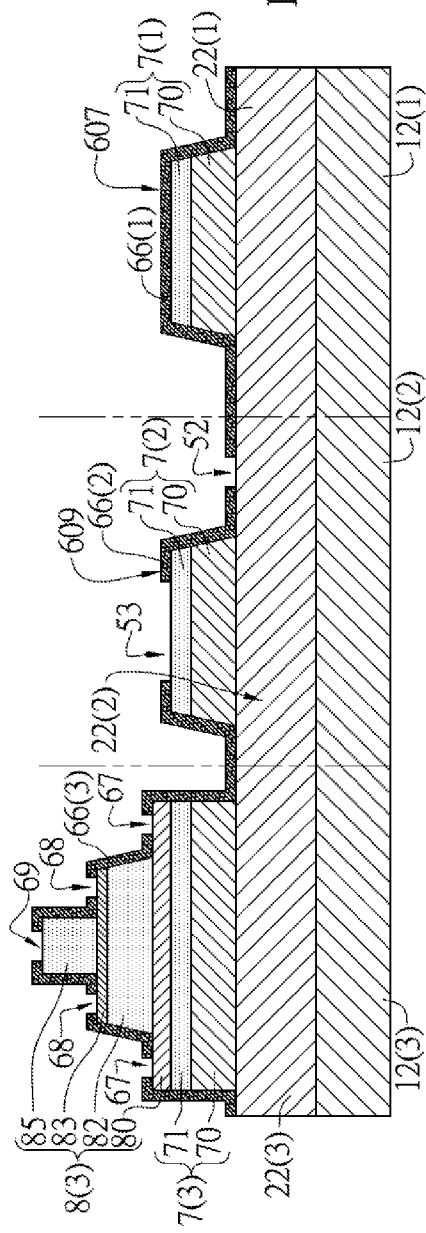

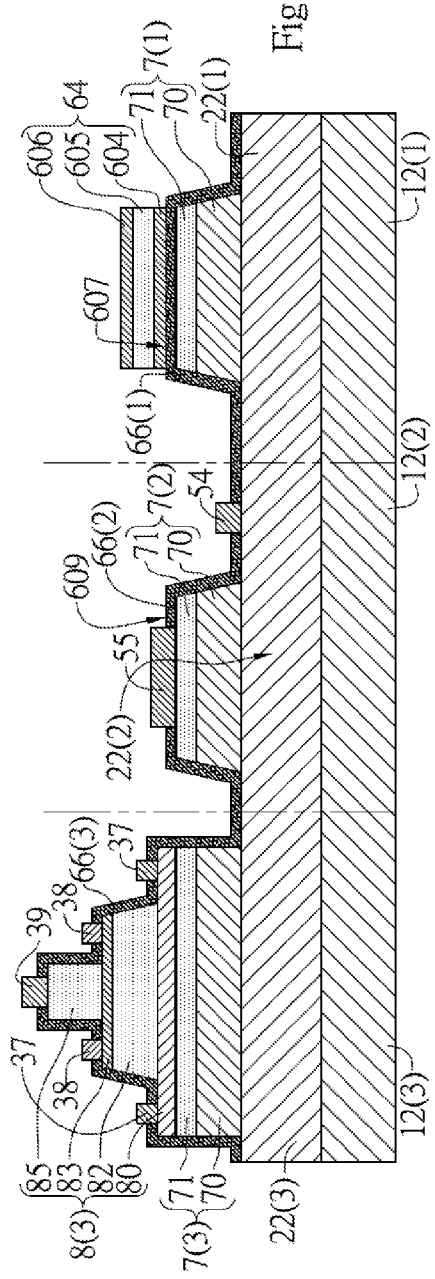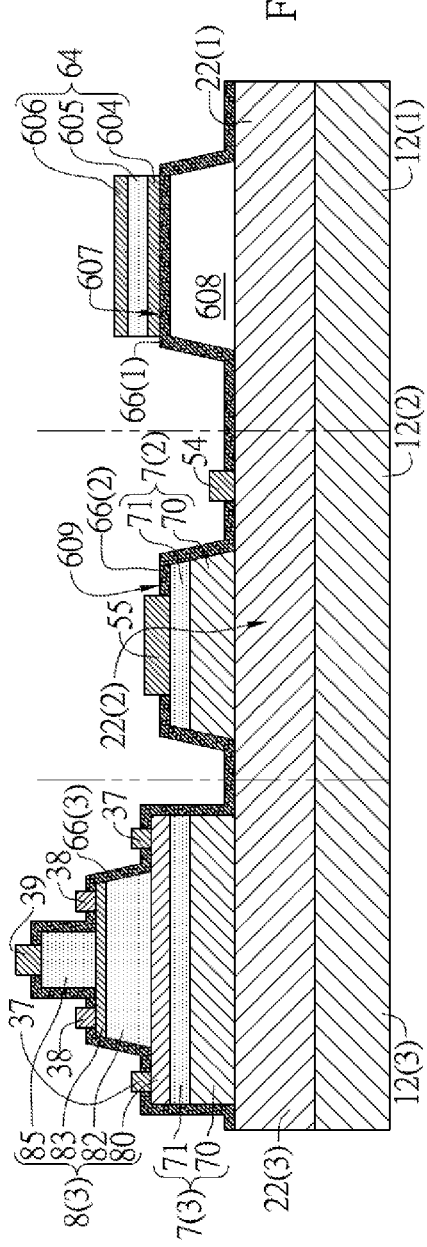

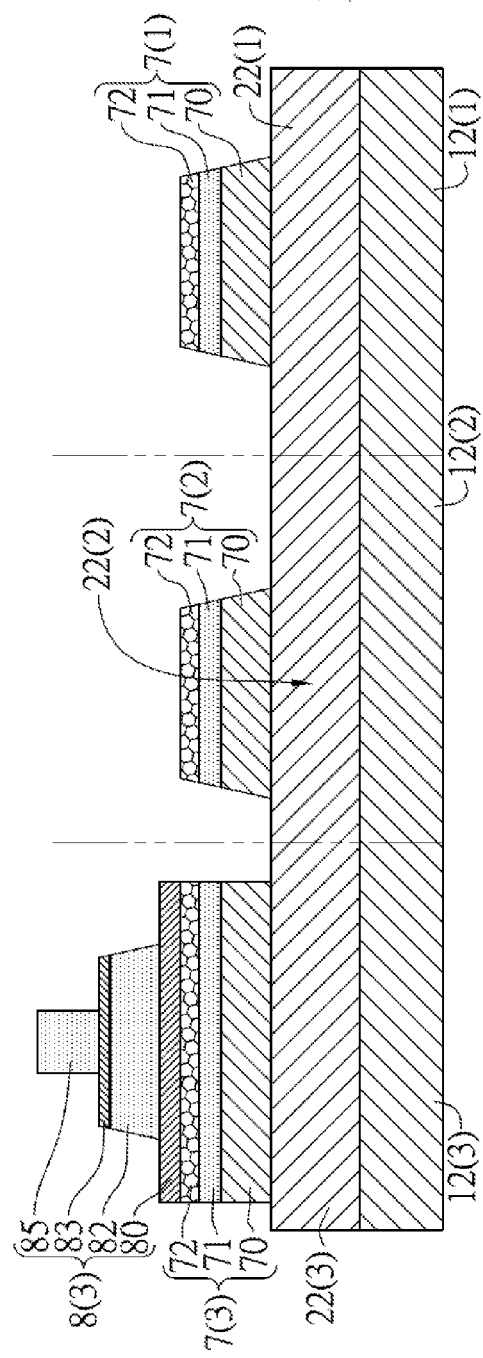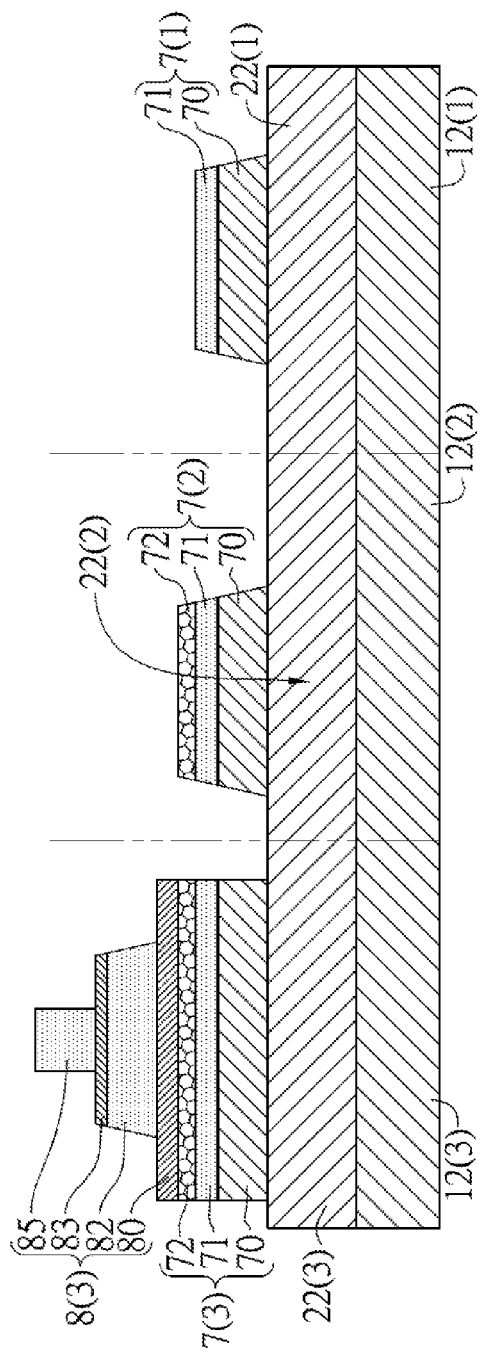

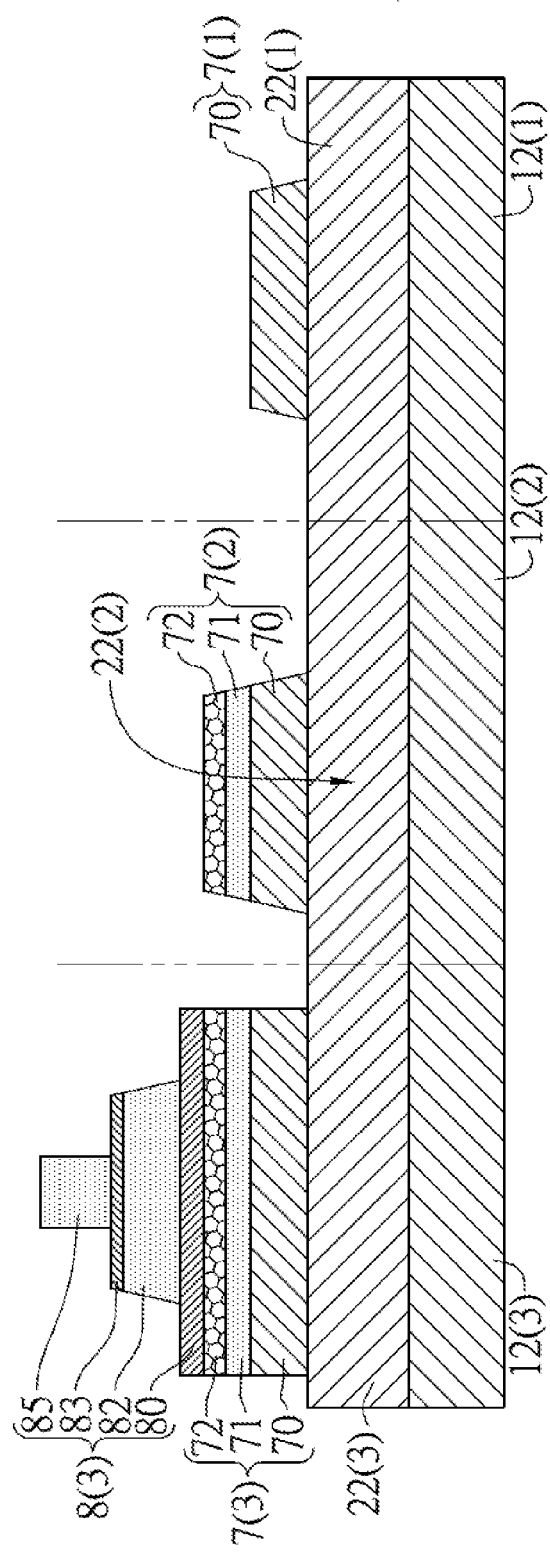

INTEGRATED STRUCTURES OF ACOUSTIC WAVE DEVICE AND VARACTOR, AND ACOUSTIC WAVE DEVICE, VARACTOR AND POWER AMPLIFIER, AND FABRICATION METHODS THEREOF

CROSS-REFERENCE TO RELATED DOCUMENTS

The present invention is a continuation in part (CIP) to a U.S. patent application Ser. No. 14/586,592 entitled "IMPROVED ACOUSTIC WAVE DEVICE STRUCTURE, INTEGRATED STRUCTURE OF POWER AMPLIFIER AND ACOUSTIC WAVE DEVICE, AND FABRICATION METHODS THEREOF" filed on Dec. 30, 2014.

FIELD OF THE INVENTION

The present invention relates to an integrated structure of power amplifier and acoustic wave device, wherein the integrated structure of the power amplifier and the acoustic wave device on the same compound semiconductor epitaxial substrate is capable of reducing the component size, optimizing the impedance matching, and reducing the signal loss between the power amplifier and the acoustic wave device.

BACKGROUND OF THE INVENTION

Please refer to FIG. 7~7D, which are the schematics of conventional production processes of acoustic wave device. First, forming a recess 702 on a silicon substrate 701; then forming a protection layer 703 on the silicon substrate 701 and the recess 702; and then forming a phosphosilicate glass (PSG) layer 705 on the protection layer 703 such that the phosphosilicate glass (PSG) layer 705 at least filled the recess 702; then polishing to remove the phosphosilicate glass (PSG) layer 705 outside the recess 702 by chemical mechanical polishing (CMP). Forming an acoustic wave device 710 with metal 711—insulator 712—metal 713 structure above the recess 702 such that the two ends of the acoustic wave device 710 with metal 711—insulator 712—metal 713 structure across outside of the recess 702; removing the rest of the phosphosilicate glass (PSG) layer 705 within the recess 702 such that the recess 702 forms a cavity.

Conventional technical producing the acoustic wave device needs to apply chemical mechanical polishing (CMP) technique for polishing to remove the phosphosilicate glass (PSG) layer 705 outside the recess 702. Furthermore the polishing requires fine polishing such that the roughness of polished surface is very smooth. Otherwise, the formation of the acoustic wave device 710 with metal 711—insulator 712—metal 713 structure will be influenced by the roughness of the polished surface. However the fine polished surface requirement for chemical mechanical polishing (CMP) process, not only the cost of the equipment is very expensive but also the time consuming and the materials cost are very high, such that the cost of production is too high.

Furthermore, the design of the single recess 702 has the problem that the gap between the bottom of the acoustic wave device 710 and the bottom of the recess 702 cannot efficiently widen. Hence, when the acoustic wave device 710 is affected by stress such that the acoustic wave device 710 is bended downwardly, the bottom of the acoustic wave device 710 may easily contact with the bottom of the recess 702 such that the characteristics of the acoustic wave device 710 been affected.

On the other hand, the application of the acoustic wave device 710 is often used as a radio frequency signal filter. When the application is with the power amplifier, the acoustic wave device plays a role to filter the signal firstly and then transmits the filtered signal to the power amplifier; or the power amplifier amplifies the signal firstly and then transmits the amplified signal to the acoustic wave device for filtering. However, the conventional acoustic wave device design is usually based on the silicon substrate. There is no one who ever tries to integrate the acoustic wave device with the compound semiconductor power amplifier on the same compound semiconductor epitaxial substrate. Integrating the acoustic wave device and the power amplifier on the same compound semiconductor epitaxial substrate may reduce the component size, and optimize the impedance matching, and reduce the signal loss between the power amplifier and the acoustic wave device.

Accordingly, the inventor has developed the design which may effectively widen the gap between the bottom of the acoustic wave device and the bottom of the recess, also may integrate the acoustic wave device and the power amplifier on the same compound semiconductor epitaxial substrate with the above mentioned benefits, the advantage of low cost, and with reduced component size, the optimized impedance matching, and the reduced signal loss between the power amplifier and the acoustic wave device.

SUMMARY OF THE INVENTION

There are two technical problems the present invention desires to solve: 1. How to provide a design which may effectively widen the gap between the bottom of the acoustic wave device and the bottom of the recess? 2. How to integrate the acoustic wave device and the power amplifier on the same compound semiconductor epitaxial substrate such that the component size is reduced, the impedance matching is optimized, and the signal loss between the power amplifier and the acoustic wave device is reduced?

To solve the above technical problems to achieve the expected effect, the present invention provides an integrated structure of acoustic wave device and varactor, which comprises a semiconductor substrate, an acoustic wave device and a varactor. The semiconductor substrate includes a first part and a second part of the semiconductor substrate. The acoustic wave device is formed on the first part of the semiconductor substrate, wherein the acoustic wave device comprises an acoustic wave device upper structure and a first part of a bottom epitaxial structure. The bottom epitaxial structure is formed on the semiconductor substrate, wherein the bottom epitaxial structure includes the first part and a second part of the bottom epitaxial structure formed on the first part and the second part of the semiconductor substrate respectively. The acoustic wave device upper structure is formed on the first part of the bottom epitaxial structure. The varactor is formed on the second part of the semiconductor substrate, wherein the varactor comprises a varactor upper structure and the second part of the bottom epitaxial structure. The varactor upper structure is formed on the second part of the bottom epitaxial structure. The integrated structure of the acoustic wave device and the varactor formed on the same the semiconductor substrate is capable of reducing the module size, optimizing the impedance matching, and reducing the signal loss between the varactor and the acoustic wave device.

In an embodiment, the first part of the bottom epitaxial structure comprises a bottom epitaxial structure recess on the top of the bottom epitaxial structure, wherein a bottom of the bottom epitaxial structure recess is the bottom epitaxial structure or the semiconductor substrate; and wherein the acoustic wave device upper structure comprises an acoustic wave device protection layer and an acoustic wave resonance structure. The acoustic wave device protection layer is formed on the first part of the bottom epitaxial structure, wherein the acoustic wave device protection layer comprises an acoustic wave device protection layer recess on a bottom of the acoustic wave device protection layer and an upwardly protruding acoustic wave device protection layer mesa right above the acoustic wave device protection layer recess, and wherein the acoustic wave device protection layer recess is located right above the bottom epitaxial structure recess, the acoustic wave device protection layer recess is communicated with the bottom epitaxial structure recess, and wherein the acoustic wave device protection layer recess and the bottom epitaxial structure recess have a boundary therebetween and the boundary is extended from a top surface of the bottom epitaxial structure. The acoustic wave resonance structure is formed on the acoustic wave device protection layer mesa. The acoustic wave resonance structure comprises an acoustic wave device bottom electrode, a dielectric layer and an acoustic wave device top electrode. The acoustic wave device bottom electrode is formed on the acoustic wave device protection layer mesa. The dielectric layer is formed on the acoustic wave device bottom electrode. The acoustic wave device top electrode is formed on the dielectric layer. A gap between the acoustic wave device protection layer and the bottom of the bottom epitaxial structure recess is increased by the communication of the acoustic wave device protection layer recess and the bottom epitaxial structure recess, so as to avoid the contact of the acoustic wave device protection layer and the bottom of the bottom epitaxial structure recess when the acoustic wave device is affected by stress such that the acoustic wave device protection layer is bended downwardly.

In an embodiment, the acoustic wave device protection layer recess has an opening smaller than or equal to that of the bottom epitaxial structure recess.

In an embodiment, the acoustic wave device comprises an auxiliary layer, a dielectric layer and an interdigital transducer electrode. The auxiliary layer is formed on the first part of the bottom epitaxial structure. The dielectric layer is formed on the auxiliary layer. The interdigital transducer electrode is formed on the dielectric layer.

In an embodiment, the bottom epitaxial structure comprises a bottom n-type doped layer. The varactor upper structure comprises a varactor middle epitaxial structure mesa, a varactor top electrode and a varactor bottom electrode, wherein the varactor top electrode is formed on the varactor middle epitaxial structure mesa, wherein the varactor bottom electrode is formed on the second part of the bottom epitaxial structure. The varactor middle epitaxial structure mesa comprises a middle n-type graded doped layer and a middle p-type doped layer. The middle n-type graded doped layer is formed on the bottom epitaxial structure. The middle p-type doped layer is formed on the middle n-type graded doped layer.

In an embodiment, a thickness of the bottom n-type doped layer is between 200 nm and 600 nm, wherein a thickness of the middle n-type graded doped layer is between 100 nm and 2000 nm, and wherein a thickness of the middle p-type doped layer is between 10 nm and 150 nm.

In an embodiment, the bottom n-type doped layer is made of InGaAs; the middle n-type graded doped layer is made of InGaAs; and the middle p-type doped layer is made of InGaAs.

In an embodiment, the varactor middle epitaxial structure mesa further comprises a varactor ledge layer formed on the middle p-type doped layer, wherein the varactor ledge layer is n-type doped and made of InGaAs, and wherein a thickness of the varactor ledge layer is between 1 nm and 60 nm.

In an embodiment, the bottom epitaxial structure further comprises an etching stop layer formed on the bottom n-type doped layer, wherein the etching stop layer is made of InP. The etching stop layer has a varactor bottom electrode recess, wherein a bottom of the varactor bottom electrode recess is the bottom n-type doped layer such that the varactor bottom electrode is formed on the bottom n-type doped layer within the varactor bottom electrode recess.

In an embodiment, the bottom n-type doped layer is made of GaAs; the middle n-type graded doped layer is made of GaAs; and the middle p-type doped layer is made of GaAs.

In an embodiment, the varactor middle epitaxial structure mesa further comprises a varactor ledge layer formed on the middle p-type doped layer, wherein the varactor ledge layer is n-type doped and made of InGaP, and wherein a thickness of the varactor ledge layer is between 1 nm and 60 nm.

In an embodiment, the bottom epitaxial structure further comprises an etching stop layer formed on the bottom n-type doped layer, wherein the etching stop layer is made of InGaP. The etching stop layer has a varactor bottom electrode recess, wherein a bottom of the varactor bottom electrode recess is the bottom n-type doped layer such that the varactor bottom electrode is formed on the bottom n-type doped layer within the varactor bottom electrode recess.

In an embodiment, the varactor upper structure further comprises a varactor protection layer, the varactor protection layer covers the exposed surfaces of the varactor middle epitaxial structure mesa and the second part of the bottom epitaxial structure.

In an embodiment, the semiconductor substrate is made of one material selected from the group consisting of: Si, GaAs, SiC, InP, GaN, AlN and Sapphire.

In addition, the present invention further provides a method for fabricating an integrated structure of acoustic wave device and varactor, which comprises a following step of: Step F1: forming an acoustic wave device and a varactor on a first part and a second part of a semiconductor substrate respectively, which comprises following steps of: Step F11: forming a bottom epitaxial structure on the semiconductor substrate, wherein the bottom epitaxial structure includes a first part and a second part of the bottom epitaxial structure formed on the first part and the second part of the semiconductor substrate respectively; and Step F12: forming an acoustic wave device upper structure and a varactor upper structure on the first part and the second part of the bottom epitaxial structure respectively; wherein the acoustic wave device comprises the acoustic wave device upper structure and the first part of the bottom epitaxial structure, wherein the varactor comprises the varactor upper structure and the second part of the bottom epitaxial structure; wherein the integrated structure of the acoustic wave device and the varactor formed on the same the semiconductor substrate is capable of reducing the module size, optimizing the impedance matching, and reducing the signal loss between the varactor and the acoustic wave device.

In an embodiment, wherein the Step F12 further comprises following steps of: Step F121: forming a middle epitaxial structure on the bottom epitaxial structure; and Step F122: defining a middle epitaxial structure etching area, and etching the middle epitaxial structure within the middle epitaxial structure etching area to form (a) an acoustic wave device middle epitaxial structure mesa and a varactor middle epitaxial structure mesa on the first part and the second part of the bottom epitaxial structure respectively or (b) a varactor middle epitaxial structure mesa on the second part of the bottom epitaxial structure.

In an embodiment, the Step F11 comprises a following step of: forming a bottom n-type doped layer on the semiconductor substrate, wherein the bottom epitaxial structure comprises the bottom n-type doped layer; wherein the Step F121 comprises following steps of: forming a middle n-type graded doped layer on the bottom epitaxial structure; and forming a middle p-type doped layer on the middle n-type graded doped layer, wherein the middle epitaxial structure comprises the middle n-type graded doped layer and the middle p-type doped layer; wherein the Step F122 comprises following steps of: defining a middle p-type doped layer etching area, and etching the middle p-type doped layer within the middle p-type doped layer etching area; and defining a middle n-type graded doped layer etching area, and etching the middle n-type graded doped layer within the middle n-type graded doped layer etching area, thereby the varactor middle epitaxial structure mesa is formed, wherein the varactor middle epitaxial structure mesa comprises the middle n-type graded doped layer and the middle p-type doped layer on the second part of the bottom epitaxial structure; and wherein the Step F12 further comprises following steps of: forming a varactor top electrode on the varactor middle epitaxial structure mesa; and forming a varactor bottom electrode on the second part of the bottom epitaxial structure, wherein the varactor upper structure comprises the varactor middle epitaxial structure mesa, the varactor top electrode and the varactor bottom electrode.

In an embodiment, a thickness of the bottom n-type doped layer is between 200 nm and 600 nm, wherein a thickness of the middle n-type graded doped layer is between 100 nm and 2000 nm, and wherein a thickness of the middle p-type doped layer is between 10 nm and 150 nm.

In an embodiment, the bottom n-type doped layer is made of InGaAs; the middle n-type graded doped layer is made of InGaAs; and the middle p-type doped layer is made of InGaAs.

In an embodiment, the Step F121 further comprises a following step of: forming a varactor ledge layer on the middle p-type doped layer, wherein the varactor ledge layer is n-type doped and made of InGaAs, wherein a thickness of the varactor ledge layer is between 1 nm and 60 nm; and wherein the Step F122 further comprises a following step of: defining a varactor ledge layer etching area, and etching the varactor ledge layer within the varactor ledge layer etching area; wherein the varactor middle epitaxial structure mesa comprises the middle n-type graded doped layer, the middle p-type doped layer and the varactor ledge layer on the second part of the bottom epitaxial structure.

In an embodiment, the Step F11 further comprises following steps of: forming an etching stop layer on the bottom n-type doped layer, wherein the bottom epitaxial structure comprises the bottom n-type doped layer and the etching stop layer, wherein the etching stop layer is made of InP; and etching the etching stop layer to form a varactor bottom electrode recess, wherein a bottom of the varactor bottom electrode recess is the bottom n-type doped layer such that the varactor bottom electrode is formed on the bottom n-type doped layer within the varactor bottom electrode recess.

In an embodiment, the bottom n-type doped layer is made of GaAs; the middle n-type graded doped layer is made of GaAs; and the middle p-type doped layer is made of GaAs.

In an embodiment, the Step F121 further comprises a following step of: forming a varactor ledge layer on the middle p-type doped layer, wherein the varactor ledge layer is n-type doped and made of InGaP, wherein a thickness of the varactor ledge layer is between 1 nm and 60 nm; and wherein the Step F122 further comprises a following step of: defining a varactor ledge layer etching area, and etching the varactor ledge layer within the varactor ledge layer etching area; wherein the varactor middle epitaxial structure mesa comprises the middle n-type graded doped layer, the middle p-type doped layer and the varactor ledge layer on the second part of the bottom epitaxial structure.

In an embodiment, the Step F11 further comprises following steps of: forming an etching stop layer on the bottom n-type doped layer, wherein the bottom epitaxial structure comprises the bottom n-type doped layer and the etching stop layer, wherein the etching stop layer is made of InGaP; and etching the etching stop layer to form a varactor bottom electrode recess, wherein a bottom of the varactor bottom electrode recess is the bottom n-type doped layer such that the varactor bottom electrode is formed on the bottom n-type doped layer within the varactor bottom electrode recess.

In an embodiment, the Step F12 further comprises a following step of: forming a varactor protection layer, wherein the varactor protection layer covers the exposed surfaces of the second part of the bottom epitaxial structure and the varactor middle epitaxial structure mesa, wherein the varactor upper structure comprises the varactor middle epitaxial structure mesa, the varactor top electrode, the varactor bottom electrode and the varactor protection layer.

In an embodiment, in the Step F122 the middle epitaxial structure on the first part of the bottom epitaxial structure is etched and removed; and wherein the Step F12 further comprises following steps of: forming an auxiliary layer on the first part of the bottom epitaxial structure; forming a dielectric layer on the auxiliary layer; and forming an interdigital transducer electrode on the dielectric layer, wherein the acoustic wave device upper structure comprises the auxiliary layer, the dielectric layer and the interdigital transducer electrode.

In an embodiment, in the Step F122 the acoustic wave device middle epitaxial structure mesa and the varactor middle epitaxial structure mesa are formed on the first part and the second part of the bottom epitaxial structure respectively; and wherein the Step F12 further comprises following steps of: forming an acoustic wave device protection layer, wherein the acoustic wave device protection layer covers the exposed surfaces of the first part of the bottom epitaxial structure and the acoustic wave device middle epitaxial structure mesa, and wherein the acoustic wave device protection layer covers the acoustic wave device middle epitaxial structure mesa to form an acoustic wave device protection layer mesa; forming an acoustic wave resonance structure on the acoustic wave device protection layer mesa, which comprises following steps of: forming an acoustic wave device bottom electrode on the acoustic wave device protection layer mesa; forming a dielectric layer on the acoustic wave device bottom electrode; and forming an acoustic wave device top electrode on the dielectric layer, wherein the acoustic wave resonance structure comprises the acoustic wave device bottom electrode, the dielectric layer and the acoustic wave device top electrode; and etching the acoustic wave device middle epitaxial structure mesa to form an acoustic wave device protection layer recess, wherein at least one middle epitaxial structure etching solution contacts with the acoustic wave device middle epitaxial structure mesa and etches and removes the acoustic wave device middle epitaxial structure mesa, thereby a top and a bottom of the acoustic wave device protection layer recess are the acoustic wave device protection layer and the bottom epitaxial structure respectively, wherein the acoustic wave device upper structure comprises the acoustic wave device protection layer and the acoustic wave resonance structure; wherein the Step F1 further comprises a following step of: etching the bottom epitaxial structure below the acoustic wave device protection layer recess to form a bottom epitaxial structure recess, wherein a bottom of the bottom epitaxial structure recess is the bottom epitaxial structure or the semiconductor substrate, wherein at least one bottom epitaxial structure etching solution contacts with a top surface of the bottom epitaxial structure and the acoustic wave device protection layer recess, the at least one bottom epitaxial structure etching solution is uniformly distributed on the top surface of the bottom epitaxial structure through the acoustic wave device protection layer recess so as to uniformly etch part of the bottom epitaxial structure below the acoustic wave device protection layer recess to form the bottom epitaxial structure recess, and thereby prevents the side etching phenomenon during the etching, wherein the acoustic wave device protection layer recess is communicated with the bottom epitaxial structure recess, and the acoustic wave device protection layer recess and the bottom epitaxial structure recess have a boundary therebetween and the boundary is extended from the top surface of the bottom epitaxial structure, wherein a gap between the acoustic wave device protection layer and the bottom of the bottom epitaxial structure recess is increased by the communication of the acoustic wave device protection layer recess and the bottom epitaxial structure recess, so as to avoid the contact of the acoustic wave device protection layer and the bottom of the bottom epitaxial structure recess when the acoustic wave device is affected by stress such that the acoustic wave device protection layer is bended downwardly.

In an embodiment, the acoustic wave device protection layer recess has an opening smaller than or equal to that of the bottom epitaxial structure recess.

In an embodiment, the Step F121 further comprises following steps of: forming a middle n-type graded doped layer on the bottom epitaxial structure; and forming a middle p-type doped layer on the middle n-type graded doped layer, wherein the middle epitaxial structure comprises the middle n-type graded doped layer and the middle p-type doped layer; and wherein the Step F122 comprises following steps of: defining a middle p-type doped layer etching area, and etching the middle p-type doped layer within the middle p-type doped layer etching area; and defining a middle n-type graded doped layer etching area, and etching the middle n-type graded doped layer within the middle n-type graded doped layer etching area; wherein the varactor middle epitaxial structure mesa comprises the middle n-type graded doped layer and the middle p-type doped layer on the second part of the bottom epitaxial structure; and wherein the acoustic wave device middle epitaxial structure mesa comprises (a) the middle n-type graded doped layer on the first part of the bottom epitaxial structure, or (b) the middle n-type graded doped layer and the middle p-type doped layer on the first part of the bottom epitaxial structure.

In an embodiment, the Step F121 further comprises a following step of: forming a varactor ledge layer on the middle p-type doped layer; and wherein the Step F122 further comprises a following step of: defining a varactor ledge layer etching area, and etching the varactor ledge layer within the varactor ledge layer etching area; wherein the varactor middle epitaxial structure mesa comprises the middle n-type graded doped layer, the middle p-type doped layer and the varactor ledge layer on the second part of the bottom epitaxial structure, and wherein the acoustic wave device middle epitaxial structure mesa comprises (a) the middle n-type graded doped layer on the first part of the bottom epitaxial structure, (b) the middle n-type graded doped layer and the middle p-type doped layer on the first part of the bottom epitaxial structure, or (c) the middle n-type graded doped layer, the middle p-type doped layer and the varactor ledge layer on the first part of the bottom epitaxial structure.

In an embodiment, the semiconductor substrate is made of one material selected from the group consisting of: Si, GaAs, SiC, InP, GaN, AlN and Sapphire.

In addition, the present invention further provides an integrated structure of acoustic wave device, varactor and heterojunction bipolar transistor, which comprises a semiconductor substrate, a bottom epitaxial structure, an acoustic wave device, a middle epitaxial structure, a varactor and an heterojunction bipolar transistor. The semiconductor substrate includes a first part, a second part and a third part of the semiconductor substrate. The acoustic wave device is formed on the first part of the semiconductor substrate, wherein the acoustic wave device comprises an acoustic wave device upper structure and a first part of a bottom epitaxial structure, wherein the bottom epitaxial structure is formed on the semiconductor substrate, wherein the bottom epitaxial structure includes the first part, a second part and a third part of the bottom epitaxial structure formed on the first part, the second part and the third part of the semiconductor substrate respectively, wherein the acoustic wave device upper structure is formed on the first part of the bottom epitaxial structure. The varactor is formed on the second part of the semiconductor substrate, wherein the varactor comprises a varactor upper structure and the second part of the bottom epitaxial structure, wherein the varactor upper structure is formed on the second part of the bottom epitaxial structure. The heterojunction bipolar transistor is formed on an heterojunction bipolar transistor middle epitaxial structure mesa, wherein heterojunction bipolar transistor middle epitaxial structure mesa is formed on the third part of the bottom epitaxial structure. The integrated structure of the acoustic wave device, the varactor and the heterojunction bipolar transistor formed on the same the semiconductor substrate is capable of reducing the module size, optimizing the impedance matching, and reducing the signal loss between the heterojunction bipolar transistor, the varactor and the acoustic wave device.

In an embodiment, the first part of the bottom epitaxial structure comprises a bottom epitaxial structure recess on the top of the bottom epitaxial structure, wherein a bottom of the bottom epitaxial structure recess is the bottom epitaxial structure or the semiconductor substrate; and wherein the acoustic wave device upper structure comprises an acoustic wave device protection layer and an acoustic wave resonance structure. The acoustic wave device protection layer is formed on the first part of the bottom epitaxial structure, wherein the acoustic wave device protection layer comprises an acoustic wave device protection layer recess on a bottom of the acoustic wave device protection layer and an upwardly protruding acoustic wave device protection layer mesa right above the acoustic wave device protection layer recess, and wherein the acoustic wave device protection layer recess is located right above the bottom epitaxial structure recess, the acoustic wave device protection layer recess is communicated with the bottom epitaxial structure recess, and wherein the acoustic wave device protection layer recess and the bottom epitaxial structure recess have a boundary therebetween and the boundary is extended from a top surface of the bottom epitaxial structure. The acoustic wave resonance structure is formed on the acoustic wave device protection layer mesa. The acoustic wave resonance structure comprises an acoustic wave device bottom electrode, a dielectric layer and an acoustic wave device top electrode. The acoustic wave device bottom electrode is formed on the acoustic wave device protection layer mesa. The dielectric layer is formed on the acoustic wave device bottom electrode. The acoustic wave device top electrode is formed on the dielectric layer. A gap between the acoustic wave device protection layer and the bottom of the bottom epitaxial structure recess is increased by the communication of the acoustic wave device protection layer recess and the bottom epitaxial structure recess, so as to avoid the contact of the acoustic wave device protection layer and the bottom of the bottom epitaxial structure recess when the acoustic wave device is affected by stress such that the acoustic wave device protection layer is bended downwardly.

In an embodiment, the acoustic wave device protection layer recess has an opening smaller than or equal to that of the bottom epitaxial structure recess.

In an embodiment, the acoustic wave device comprises an auxiliary layer, a dielectric layer and an interdigital transducer electrode. The auxiliary layer is formed on the first part of the bottom epitaxial structure. The dielectric layer is formed on the auxiliary layer. The interdigital transducer electrode is formed on the dielectric layer.

In an embodiment, the heterojunction bipolar transistor comprises a top epitaxial structure mesa, a collector electrode, a base electrode and an emitter electrode. The top epitaxial structure mesa comprises a subcollector layer, a collector layer, a base layer and an emitter layer. The subcollector layer is formed on the heterojunction bipolar transistor middle epitaxial structure mesa. The collector layer is formed on the subcollector layer. The base layer is formed on the collector layer. The emitter layer is formed on the base layer. The collector electrode is formed on the subcollector layer. The base electrode is formed on the base layer. The emitter electrode is formed on the emitter layer.

In an embodiment, the subcollector layer is n-type doped and made of InGaAs; the collector layer is n-type doped and made of InGaAs; the base layer is p-type doped and made of InGaAs; and the emitter layer is n-type doped and made of InP; and wherein the heterojunction bipolar transistor is an InP heterojunction bipolar transistor.

In an embodiment, the top epitaxial structure mesa further comprises an emitter ledge layer formed on the base layer, the emitter layer is formed on the emitter ledge layer, wherein the emitter ledge layer is n-type doped and made of InGaAs, and wherein the emitter ledge layer has a base electrode recess, and wherein a bottom of the base electrode recess is the base layer such that the base electrode is formed on the base layer within the base electrode recess.

In an embodiment, the top epitaxial structure mesa further comprises a second etching stop layer, wherein the second etching stop layer is formed on the subcollector layer, the collector layer is formed on the second etching stop layer, wherein the second etching stop layer is made of InP. The second etching stop layer has a collector electrode recess, a bottom of the collector electrode recess is the subcollector layer such that the collector electrode is formed on the subcollector layer within the collector electrode recess.

In an embodiment, the subcollector layer is n-type doped and made of GaAs; the collector layer is n-type doped and made of GaAs; the base layer is p-type doped and made of GaAs; and the emitter layer is n-type doped and made of GaAs; wherein the heterojunction bipolar transistor is an GaAs heterojunction bipolar transistor.

In an embodiment, the top epitaxial structure mesa further comprises an emitter ledge layer formed on the base layer, the emitter layer is formed on the emitter ledge layer, wherein the emitter ledge layer is n-type doped and made of InGaP, and wherein the emitter ledge layer has a base electrode recess, and wherein a bottom of the base electrode recess is the base layer such that the base electrode is formed on the base layer within the base electrode recess.

In an embodiment, the top epitaxial structure mesa further comprises a second etching stop layer, wherein the second etching stop layer is formed on the subcollector layer, the collector layer is formed on the second etching stop layer, wherein the second etching stop layer is made of InGaP. The second etching stop layer has a collector electrode recess, a bottom of the collector electrode recess is the subcollector layer such that the collector electrode is formed on the subcollector layer within the collector electrode recess.

In an embodiment, the heterojunction bipolar transistor further comprises an heterojunction bipolar transistor protection layer, the heterojunction bipolar transistor protection layer covers the exposed surfaces of the top epitaxial structure mesa, the heterojunction bipolar transistor middle epitaxial structure mesa and the third part of the bottom epitaxial structure.

In an embodiment, the bottom epitaxial structure comprises a bottom n-type doped layer. The varactor upper structure comprises a varactor middle epitaxial structure mesa, a varactor top electrode and a varactor bottom electrode, wherein the varactor top electrode is formed on the varactor middle epitaxial structure mesa, wherein the varactor bottom electrode is formed on the second part of the bottom epitaxial structure. The varactor middle epitaxial structure mesa comprises a middle n-type graded doped layer and a middle p-type doped layer. The middle n-type graded doped layer is formed on the bottom epitaxial structure. The middle p-type doped layer is formed on the middle n-type graded doped layer.

In an embodiment, a thickness of the bottom n-type doped layer is between 200 nm and 600 nm, wherein a thickness of the middle n-type graded doped layer is between 100 nm and 2000 nm, and wherein a thickness of the middle p-type doped layer is between 10 nm and 150 nm.

In an embodiment, the bottom n-type doped layer is made of InGaAs; the middle n-type graded doped layer is made of InGaAs; and the middle p-type doped layer is made of InGaAs.

In an embodiment, the varactor middle epitaxial structure mesa further comprises a varactor ledge layer formed on the middle p-type doped layer, wherein the varactor ledge layer is n-type doped and made of InGaAs, and wherein a thickness of the varactor ledge layer is between 1 nm and 60 nm.

In an embodiment, the bottom epitaxial structure further comprises an etching stop layer formed on the bottom n-type doped layer, wherein the etching stop layer is made of InP. The etching stop layer has a varactor bottom electrode recess, wherein a bottom of the varactor bottom electrode recess is the bottom n-type doped layer such that the varactor bottom electrode is formed on the bottom n-type doped layer within the varactor bottom electrode recess.

In an embodiment, the bottom n-type doped layer is made of GaAs; the middle n-type graded doped layer is made of GaAs; and the middle p-type doped layer is made of GaAs.

In an embodiment, the varactor middle epitaxial structure mesa further comprises a varactor ledge layer formed on the middle p-type doped layer, wherein the varactor ledge layer is n-type doped and made of InGaP, and wherein a thickness of the varactor ledge layer is between 1 nm and 60 nm.

In an embodiment, the bottom epitaxial structure further comprises an etching stop layer formed on the bottom n-type doped layer, wherein the etching stop layer is made of InGaP. The etching stop layer has a varactor bottom electrode recess, wherein a bottom of the varactor bottom electrode recess is the bottom n-type doped layer such that the varactor bottom electrode is formed on the bottom n-type doped layer within the varactor bottom electrode recess.

In an embodiment, the varactor upper structure further comprises a varactor protection layer, the varactor protection layer covers the exposed surfaces of the varactor middle epitaxial structure mesa and the second part of the bottom epitaxial structure.

In an embodiment, the semiconductor substrate is made of one material selected from the group consisting of: Si, GaAs, SiC, InP, GaN, AlN and Sapphire.

In addition, the present invention further provides a method for fabricating an integrated structure of acoustic wave device, varactor and heterojunction bipolar transistor, which comprises following steps of: Step G1: forming an acoustic wave device, a varactor and an heterojunction bipolar transistor on a first part, a second part and a third part of a semiconductor substrate respectively, which comprises following steps of: Step G11: forming a bottom epitaxial structure on the semiconductor substrate, wherein the bottom epitaxial structure includes a first part, a second part and a third part of the bottom epitaxial structure formed on the first part, the second part and the third part of the semiconductor substrate respectively; Step G12: forming a middle epitaxial structure on the bottom epitaxial structure, wherein the middle epitaxial structure includes a first part, a second part and a third part of the middle epitaxial structure formed on the first part, the second part and the third part of the bottom epitaxial structure; Step G13: etching the middle epitaxial structure and forming an acoustic wave device upper structure, a varactor upper structure and an heterojunction bipolar transistor middle epitaxial structure mesa on the first part, the second part and the third part of the bottom epitaxial structure respectively, wherein the acoustic wave device comprises the acoustic wave device upper structure and the first part of the bottom epitaxial structure, wherein the varactor comprises the varactor upper structure and the second part of the bottom epitaxial structure, wherein the heterojunction bipolar transistor middle epitaxial structure mesa is formed by etching the third part of the middle epitaxial structure; and Step G14: forming an heterojunction bipolar transistor on the heterojunction bipolar transistor middle epitaxial structure mesa; wherein the integrated structure of the acoustic wave device, the varactor and the heterojunction bipolar transistor formed on the same the semiconductor substrate is capable of reducing the module size, optimizing the impedance matching, and reducing the signal loss between the heterojunction bipolar transistor, the varactor and the acoustic wave device.

In an embodiment, the Step G14 comprises following steps of: forming a top epitaxial structure mesa on the heterojunction bipolar transistor middle epitaxial structure mesa, which comprises following steps of: forming a subcollector layer on the heterojunction bipolar transistor middle epitaxial structure mesa; forming a collector layer on the subcollector layer; forming a base layer on the collector layer; forming an emitter layer on the base layer; defining an emitter layer etching area, and etching the emitter layer within the emitter layer etching area; defining a base layer etching area, and etching the base layer within the base layer etching area; defining a collector layer etching area, and etching the collector layer within the collector layer etching area; and defining a subcollector layer etching area, and etching the subcollector layer within the subcollector layer etching area, wherein the top epitaxial structure mesa comprises the subcollector layer, the collector layer, the base layer and the emitter layer; forming an emitter electrode on the emitter layer; forming a base electrode on the base layer; and forming a collector electrode on the subcollector layer, wherein the heterojunction bipolar transistor comprises the top epitaxial structure mesa, the emitter electrode, the base electrode and the collector electrode.

In an embodiment, the subcollector layer is n-type doped and made of InGaAs; the collector layer is n-type doped and made of InGaAs; the base layer is p-type doped and made of InGaAs; and the emitter layer is n-type doped and made of InP; and wherein the heterojunction bipolar transistor is an InP heterojunction bipolar transistor.

In an embodiment, the Step G14 further comprises following steps of: forming an emitter ledge layer on the base layer, wherein the emitter layer is formed on the emitter ledge layer, wherein the emitter ledge layer is n-type doped and made of InGaAs, and defining an emitter ledge layer etching area, and etching the emitter ledge layer within the emitter ledge layer etching area to form a base electrode recess, wherein a bottom of the base electrode recess is the base layer such that the base electrode is formed on the base layer within the base electrode recess, wherein the top epitaxial structure mesa comprises the subcollector layer, the collector layer, the base layer, the emitter ledge layer and the emitter layer.

In an embodiment, the Step G14 further comprises following steps of: forming a second etching stop layer on the subcollector layer, wherein the collector layer is formed on the second etching stop layer, wherein the second etching stop layer is made of InP; and defining a second etching stop layer etching area, and etching the second etching stop layer within the second etching stop layer etching area to form a collector electrode recess of the second etching stop layer, wherein a bottom of the collector electrode recess is the subcollector layer such that the collector electrode is formed on the subcollector layer within the collector electrode recess, wherein the top epitaxial structure mesa comprises the subcollector layer, the second etching stop layer, the collector layer, the base layer and the emitter layer.

In an embodiment, the subcollector layer is n-type doped and made of GaAs; the collector layer is n-type doped and made of GaAs; the base layer is p-type doped and made of GaAs; and the emitter layer is n-type doped and made of GaAs; wherein the heterojunction bipolar transistor is an GaAs heterojunction bipolar transistor.

In an embodiment, the Step G14 further comprises following steps of: forming an emitter ledge layer on the base layer, wherein the emitter layer is formed on the emitter ledge layer, wherein the emitter ledge layer is n-type doped and made of InGaP, and defining an emitter ledge layer etching area, and etching the emitter ledge layer within the emitter ledge layer etching area and to form a base electrode recess, wherein a bottom of the base electrode recess is the base layer such that the base electrode is formed on the base layer within the base electrode recess, wherein the top epitaxial structure mesa comprises the subcollector layer, the collector layer, the base layer, the emitter ledge layer and the emitter layer.

In an embodiment, the Step G14 further comprises following steps of: forming a second etching stop layer on the subcollector layer, wherein the collector layer is formed on the second etching stop layer, wherein the second etching stop layer is made of InGaP; and defining a second etching stop layer etching area, and etching the second etching stop layer within the second etching stop layer etching area to form a collector electrode recess of the second etching stop layer, wherein a bottom of the collector electrode recess is the subcollector layer such that the collector electrode is formed on the subcollector layer within the collector electrode recess, wherein the top epitaxial structure mesa comprises the subcollector layer, the second etching stop layer, the collector layer, the base layer and the emitter layer.

In an embodiment, the Step G14 further comprises a following step of: forming an heterojunction bipolar transistor protection layer, wherein the heterojunction bipolar transistor protection layer covers the exposed surfaces of the third part of the bottom epitaxial structure, the heterojunction bipolar transistor middle epitaxial structure mesa and the top epitaxial structure mesa, wherein the heterojunction bipolar transistor comprises the top epitaxial structure mesa, the emitter electrode, the base electrode, the collector electrode and the heterojunction bipolar transistor protection layer.

In an embodiment, in the Step G13, the first part and the second part of the middle epitaxial structure are etched such that (a) an acoustic wave device middle epitaxial structure mesa and a varactor middle epitaxial structure mesa are formed on the first part and the second part of the bottom epitaxial structure respectively or (b) the middle epitaxial structure on the first part of the bottom epitaxial structure is etched and removed and a varactor middle epitaxial structure mesa is formed on the second part of the bottom epitaxial structure.

In an embodiment, the Step G11 comprises a following step of: forming a bottom n-type doped layer on the semiconductor substrate, wherein the bottom epitaxial structure comprises the bottom n-type doped layer; wherein the Step G12 comprises following steps of: forming a middle n-type graded doped layer on the bottom epitaxial structure; and forming a middle p-type doped layer on the middle n-type graded doped layer, wherein the middle epitaxial structure comprises the middle n-type graded doped layer and the middle p-type doped layer; wherein the Step G13 comprises following steps of: defining a middle p-type doped layer etching area, and etching the middle p-type doped layer within the middle p-type doped layer etching area; defining a middle n-type graded doped layer etching area, and etching the middle n-type graded doped layer within the middle n-type graded doped layer etching area, thereby the varactor middle epitaxial structure mesa is formed, wherein the varactor middle epitaxial structure mesa comprises the middle n-type graded doped layer and the middle p-type doped layer on the second part of the bottom epitaxial structure; forming a varactor top electrode on the varactor middle epitaxial structure mesa; and forming a varactor bottom electrode on the second part of the bottom epitaxial structure, wherein the varactor upper structure comprises the varactor middle epitaxial structure mesa, the varactor top electrode and the varactor bottom electrode.

In an embodiment, a thickness of the bottom n-type doped layer is between 200 nm and 600 nm, wherein a thickness of the middle n-type graded doped layer is between 100 nm and 2000 nm, and wherein a thickness of the middle p-type doped layer is between 10 nm and 150 nm.

In an embodiment, the bottom n-type doped layer is made of InGaAs; the middle n-type graded doped layer is made of InGaAs; and the middle p-type doped layer is made of InGaAs.

In an embodiment, the Step G12 further comprises a following step of: forming a varactor ledge layer on the middle p-type doped layer, wherein the varactor ledge layer is n-type doped and made of InGaAs, wherein a thickness of the varactor ledge layer is between 1 nm and 60 nm; and wherein the Step G13 further comprises a following step of: defining a varactor ledge layer etching area, and etching the varactor ledge layer within the varactor ledge layer etching area; wherein the varactor middle epitaxial structure mesa comprises the middle n-type graded doped layer, the middle p-type doped layer and the varactor ledge layer on the second part of the bottom epitaxial structure.

In an embodiment, the Step G11 further comprises following steps of: forming an etching stop layer on the bottom n-type doped layer, wherein the bottom epitaxial structure comprises the bottom n-type doped layer and the etching stop layer, wherein the etching stop layer is made of InP; and etching the etching stop layer to form a varactor bottom electrode recess, wherein a bottom of the varactor bottom electrode recess is the bottom n-type doped layer such that the varactor bottom electrode is formed on the bottom n-type doped layer within the varactor bottom electrode recess.

In an embodiment, the bottom n-type doped layer is made of GaAs; the middle n-type graded doped layer is made of GaAs; and the middle p-type doped layer is made of GaAs.

In an embodiment, the Step G12 further comprises a following step of: forming a varactor ledge layer on the middle p-type doped layer, wherein the varactor ledge layer is n-type doped and made of InGaP, wherein a thickness of the varactor ledge layer is between 1 nm and 60 nm; and wherein the Step G13 further comprises a following step of: defining a varactor ledge layer etching area, and etching the varactor ledge layer within the varactor ledge layer etching area; wherein the varactor middle epitaxial structure mesa comprises the middle n-type graded doped layer, the middle p-type doped layer and the varactor ledge layer on the second part of the bottom epitaxial structure.

In an embodiment, the Step G11 further comprises following steps of: forming an etching stop layer on the bottom n-type doped layer, wherein the bottom epitaxial structure comprises the bottom n-type doped layer and the etching stop layer, wherein the etching stop layer is made of InGaP; and etching the etching stop layer to form a varactor bottom electrode recess, wherein a bottom of the varactor bottom electrode recess is the bottom n-type doped layer such that the varactor bottom electrode is formed on the bottom n-type doped layer within the varactor bottom electrode recess.

In an embodiment, the Step G13 further comprises a following step of: forming a varactor protection layer, wherein the varactor protection layer covers the exposed surfaces of the second part of the bottom epitaxial structure and the varactor middle epitaxial structure mesa, wherein the varactor upper structure comprises the varactor middle epitaxial structure mesa, the varactor top electrode, the varactor bottom electrode and the varactor protection layer.

In an embodiment, in the Step G13 the varactor middle epitaxial structure mesa on the first part of the bottom epitaxial structure is etched and removed; and wherein the Step G13 further comprises following steps of: forming an auxiliary layer on the first part of the bottom epitaxial structure; forming a dielectric layer on the auxiliary layer;

and forming an interdigital transducer electrode on the dielectric layer, wherein the acoustic wave device upper structure comprises the auxiliary layer, the dielectric layer and the interdigital transducer electrode.

In an embodiment, in the Step G13 the acoustic wave device middle epitaxial structure mesa and the varactor middle epitaxial structure mesa are formed on the first part and the second part of the bottom epitaxial structure respectively; wherein the Step G13 comprises following steps of: forming an acoustic wave device protection layer, wherein the acoustic wave device protection layer covers the exposed surfaces of the first part of the bottom epitaxial structure and the acoustic wave device middle epitaxial structure mesa, and wherein the acoustic wave device protection layer covers the acoustic wave device middle epitaxial structure mesa to form an acoustic wave device protection layer mesa; forming an acoustic wave resonance structure on the acoustic wave device protection layer mesa, which comprises following steps of: forming an acoustic wave device bottom electrode on the acoustic wave device protection layer mesa; forming a dielectric layer on the acoustic wave device bottom electrode; and forming an acoustic wave device top electrode on the dielectric layer, wherein the acoustic wave resonance structure comprises the acoustic wave device bottom electrode, the dielectric layer and the acoustic wave device top electrode; and etching the acoustic wave device middle epitaxial structure mesa to form an acoustic wave device protection layer recess, wherein at least one middle epitaxial structure etching solution contacts with the acoustic wave device middle epitaxial structure mesa and etches and removes the acoustic wave device middle epitaxial structure mesa, thereby a top and a bottom of the acoustic wave device protection layer recess are the acoustic wave device protection layer and the bottom epitaxial structure respectively, wherein the acoustic wave device upper structure comprises the acoustic wave device protection layer and the acoustic wave resonance structure; wherein the Step G1 further comprises a following step of: etching the bottom epitaxial structure below the acoustic wave device protection layer recess to form a bottom epitaxial structure recess, wherein a bottom of the bottom epitaxial structure recess is the bottom epitaxial structure or the semiconductor substrate, wherein at least one bottom epitaxial structure etching solution contacts with a top surface of the bottom epitaxial structure and the acoustic wave device protection layer recess, the at least one bottom epitaxial structure etching solution is uniformly distributed on the top surface of the bottom epitaxial structure through the acoustic wave device protection layer recess so as to uniformly etch part of the bottom epitaxial structure below the acoustic wave device protection layer recess to form the bottom epitaxial structure recess, and thereby prevents the side etching phenomenon during the etching, wherein the acoustic wave device protection layer recess is communicated with the bottom epitaxial structure recess, and the acoustic wave device protection layer recess and the bottom epitaxial structure recess have a boundary therebetween and the boundary is extended from the top surface of the bottom epitaxial structure, wherein a gap between the acoustic wave device protection layer and the bottom of the bottom epitaxial structure recess is increased by the communication of the acoustic wave device protection layer recess and the bottom epitaxial structure recess, so as to avoid the contact of the acoustic wave device protection layer and the bottom of the bottom epitaxial structure recess when the acoustic wave device is affected by stress such that the acoustic wave device protection layer is bended downwardly.

In an embodiment, the acoustic wave device protection layer recess has an opening smaller than or equal to that of the bottom epitaxial structure recess.

In an embodiment, the Step G12 comprises following steps of: forming a middle n-type graded doped layer on the bottom epitaxial structure; and forming a middle p-type doped layer on the middle n-type graded doped layer, wherein the middle epitaxial structure comprises the middle n-type graded doped layer and the middle p-type doped layer; and wherein the Step G13 comprises following steps of: defining a middle p-type doped layer etching area, and etching the middle p-type doped layer within the middle p-type doped layer etching area; and defining a middle n-type graded doped layer etching area, and etching the middle n-type graded doped layer within the middle n-type graded doped layer etching area; wherein the varactor middle epitaxial structure mesa comprises the middle n-type graded doped layer and the middle p-type doped layer on the second part of the bottom epitaxial structure; and wherein the acoustic wave device middle epitaxial structure mesa comprises (a) the middle n-type graded doped layer on the first part of the bottom epitaxial structure; or (b) the middle n-type graded doped layer and the middle p-type doped layer on the first part of the bottom epitaxial structure.

In an embodiment, the Step G12 further comprises a following step of: forming a varactor ledge layer on the middle p-type doped layer; wherein the Step G13 further comprises a following step of: defining a varactor ledge layer etching area, and etching the varactor ledge layer within the varactor ledge layer etching area; wherein the varactor middle epitaxial structure mesa comprises the middle n-type graded doped layer, the middle p-type doped layer and the varactor ledge layer on the second part of the bottom epitaxial structure; and wherein the acoustic wave device middle epitaxial structure mesa comprises (a) the middle n-type graded doped layer on the first part of the bottom epitaxial structure; (b) the middle n-type graded doped layer and the middle p-type doped layer on the first part of the bottom epitaxial structure; or (c) the middle n-type graded doped layer, the middle p-type doped layer and the varactor ledge layer on the first part of the bottom epitaxial structure.

In an embodiment, the semiconductor substrate is made of one material selected from the group consisting of: Si, GaAs, SiC, InP, GaN, AN and Sapphire.

For further understanding the characteristics and effects of the present invention, some preferred embodiments referred to drawings are in detail described as follows

BRIEF DESCRIPTION OF DRAWINGS

FIGS. 3 and 3A~3C are the cross-sectional views of embodiments of the integrated structure of power amplifier and acoustic wave device of the present invention.

FIG. 3D~3O are the cross-sectional schematics showing steps of a fabrication method for the embodiments of the integrated structure of power amplifier and acoustic wave device of the present invention.

FIGS. 4, 4A, and 4B are the cross-sectional views of embodiments of the improved acoustic wave device structure of the present invention.

FIG. 4E~4H are the top views showing the relative position of the etching recess and the supporting layer mesa in the embodiments of the improved acoustic wave device structure of the present invention.

FIG. 6B~6L are the cross-sectional schematics showing steps of a fabrication method for the embodiments of the improved acoustic wave device structure of the present invention.

FIGS. 6M and 6N are the cross-sectional views of an embodiment of the improved acoustic wave device structure of the present invention.

FIGS. 7 and 7A~7D are the schematics of conventional production processes of acoustic wave device.

FIGS. 9A~9F are the cross-sectional schematics showing steps of an embodiment of a method for fabricating an integrated structure of acoustic wave device, varactor and heterojunction bipolar transistor of the present invention.

FIG. 9O is the cross-sectional schematic showing an embodiment of an integrated structure of acoustic wave device, varactor and heterojunction bipolar transistor of the present invention.

FIG. 9P is the cross-sectional schematic showing a step of another embodiment of a method for fabricating an integrated structure of acoustic wave device, varactor and heterojunction bipolar transistor of the present invention.

FIG. 9Q is the cross-sectional schematic showing a step of another embodiment of a method for fabricating an integrated structure of acoustic wave device, varactor and heterojunction bipolar transistor of the present invention.

FIG. 9R is the cross-sectional schematic showing a step of another embodiment of a method for fabricating an integrated structure of acoustic wave device, varactor and heterojunction bipolar transistor of the present invention.

DETAILED DESCRIPTIONS OF PREFERRED EMBODIMENTS

Figure 1:
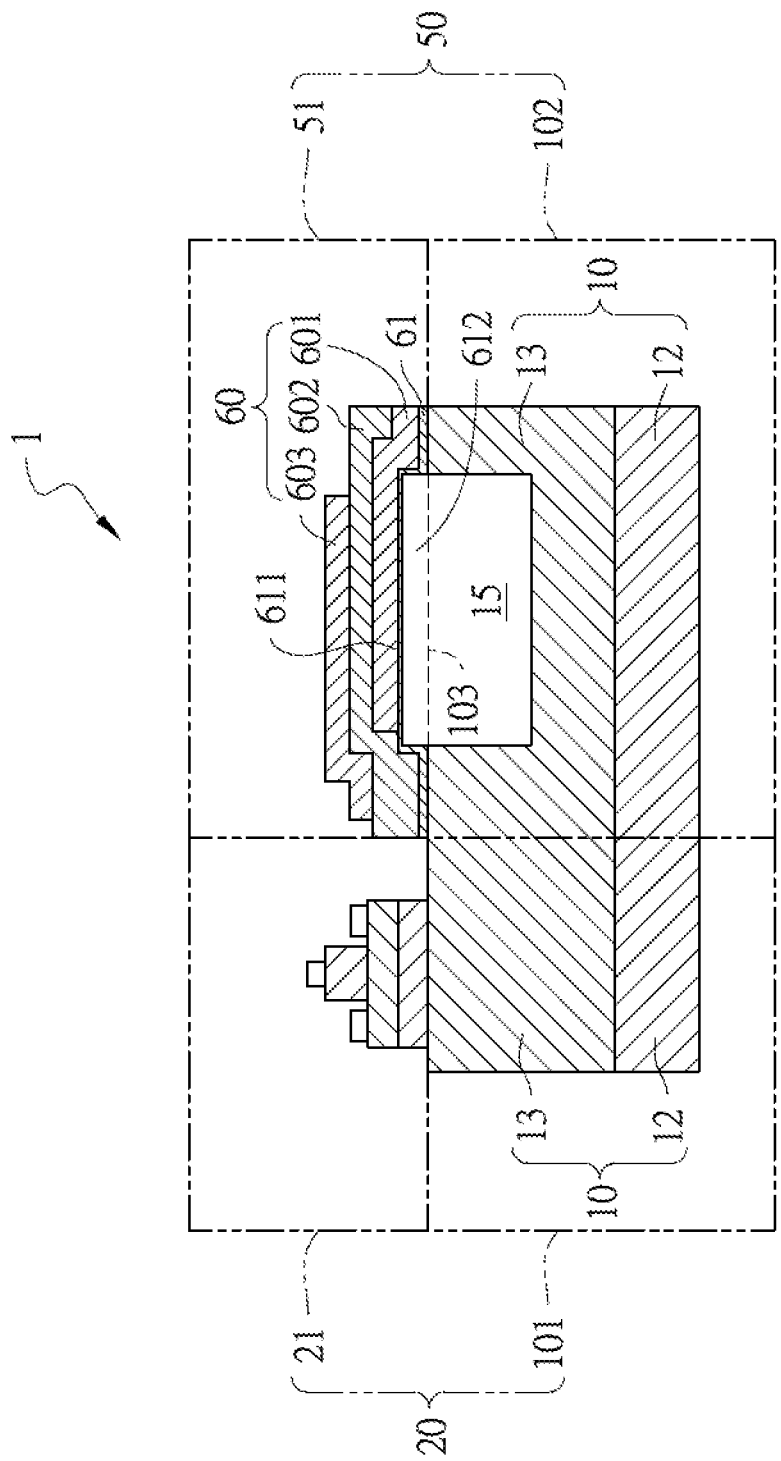
FIGS. 1, 1A, and 1B are the cross-sectional views of embodiments of the integrated structure of power amplifier and acoustic wave device of the present invention.

Please refer to FIG. 1, the cross-sectional view of an embodiment of the integrated structure of power amplifier and acoustic wave device of the present invention, the integrated structure comprises: a compound semiconductor epitaxial substrate 10, a power amplifier upper structure 21 and a film bulk acoustic resonator 51. The compound semiconductor epitaxial substrate 10 includes a compound semiconductor substrate 12 and an epitaxial structure 13 formed on the compound semiconductor substrate 12. The power amplifier upper structure 21 is formed on a first side 101 of the compound semiconductor epitaxial substrate 10, wherein the first side 101 of the compound semiconductor epitaxial substrate 10 and the power amplifier upper structure 21 form a power amplifier 20. The film bulk acoustic resonator 51 is formed on a second side 102 of the compound semiconductor epitaxial substrate 10, wherein the second side 102 of the compound semiconductor epitaxial substrate 10 and the film bulk acoustic resonator 51 form an acoustic wave device 50. The integrated structure 1 of the power amplifier 20 and the acoustic wave device 50 on the same the compound semiconductor epitaxial substrate 10 is capable of reducing the component size, optimizing the impedance matching, and reducing the signal loss between the power amplifier 20 and the acoustic wave device 50.

Figure 1A:
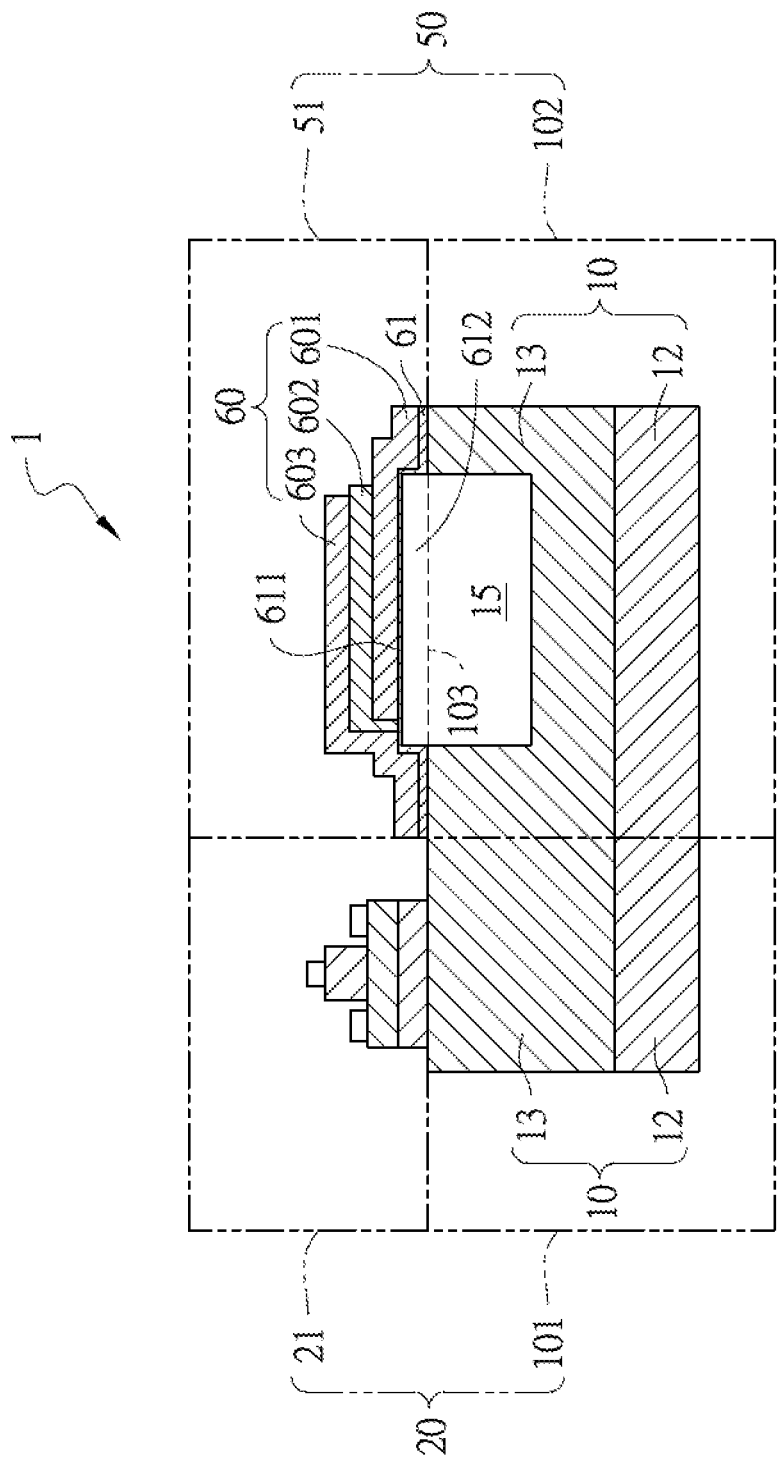

The film bulk acoustic resonator 51 comprises: a supporting layer 61 and a bulk acoustic resonator structure 60. The supporting layer 61 is formed on the compound semiconductor epitaxial substrate 10, wherein the supporting layer 61 has a supporting layer recess 612 on the bottom of the supporting layer 61, and the supporting layer 61 has an upwardly protruding supporting layer mesa 611 right above the supporting layer recess 612. The compound semiconductor epitaxial substrate 10 has a substrate recess 15 on the top of the compound semiconductor epitaxial substrate 10, and the substrate recess 15 is located right below the supporting layer recess 612. The supporting layer recess 612 is communicated with the substrate recess 15, and the supporting layer recess 612 and the substrate recess 15 have a boundary 103 therebetween and the boundary 103 is the extended from the top surface of the compound semiconductor epitaxial substrate 10. The bulk acoustic resonator structure 60 is formed on the supporting layer 61, wherein the bulk acoustic resonator structure 60 includes: a bottom electrode 601, a dielectric layer 602 and a top electrode 603. The bottom electrode 601 is formed on one end of the supporting layer 61, where the bottom electrode 601 is formed on and at least extended along the supporting layer mesa 611. The dielectric layer 602 is formed at least on the bottom electrode 601 above the supporting layer mesa 611. In the embodiment of FIG. 1, the dielectric layer 602 is formed on both the bottom electrode 601 and the supporting layer 61, and the dielectric layer 602 is also formed on the bottom electrode 601 above the supporting layer mesa 611. Please also refer to FIG. 1A, which shows the cross-sectional view of another embodiment of the integrated structure of power amplifier and acoustic wave device of the present invention. The main structure in FIG. 1A is basically the same as the structure shown in FIG. 1, except that the dielectric layer 602 is formed on the bottom electrode 601 above the supporting layer mesa 611 and also formed on a small part of the supporting layer 61 above the supporting layer mesa 611. The top electrode 603 is formed on the other end with respect to the bottom electrode 601, where the top electrode 603 is formed on the dielectric layer 602 or formed on both the dielectric layer 602 and the supporting layer 61, and the top electrode 603 is formed on and at least extended along the dielectric layer 602 above the supporting layer mesa 611. In the embodiment of FIG. 1, the top electrode 603 is formed on the dielectric layer 602, while in embodiment of FIG. 1A, the top electrode 603 is formed on both the dielectric layer 602 and the supporting layer 61. The top electrode 603 and the bottom electrode 601 are not electrically connected. The gap between the supporting layer mesa 611 and the bottom of the substrate recess 15 is increased by the communication of the supporting layer recess 612 and the substrate recess 15, so as to avoid the contact of the supporting layer mesa 611 and the bottom of the substrate recess 15 when the film bulk acoustic resonator 51 is affected by stress such that the supporting layer mesa 611 is bended downwardly.

In an embodiment, the integrated structure 1 of power amplifier 20 and acoustic wave device 50 is not limited to integrating one single power amplifier 20 and one single acoustic wave device 50. In another embodiment, the integrated structure 1 of power amplifier 20 and acoustic wave device 50 may integrates one single power amplifier 20 and plural acoustic wave devices 50, plural power amplifiers 20 and one single acoustic wave device 50 or plural power amplifiers 20 and plural acoustic wave devices 50.

In an embodiment, the integrated structure 1 of power amplifier 20 and acoustic wave device 50 may also integrate other components, such as metal-insulator-metal capacitor, resistor, inductor or diode, on the same the compound semiconductor epitaxial substrate 10, wherein the components may be directly or indirectly electrically connected. In another embodiment, the power amplifier 20 and the acoustic wave device 50 may be directly electrically connected. In other embodiment, the power amplifier 20 may be indirectly electrically connected with the acoustic wave device 50 through other component(s) on the integrated structure.

In an embodiment, the application of the acoustic wave device 50 may be a filter. Usually plural acoustic wave devices 50 are in series and/or in parallel in the combination of circuit to form a filter which may filter the signal. In another embodiment, the signal may flow into the filter formed by the acoustic wave devices 50 to be filtered, and then the filtered signal flows into the power amplifier 20 to be amplified. In other embodiment, the signal may flow into the power amplifier 20 to be amplified, and then the amplified signal flows into the filter formed by the acoustic wave devices 50 to be filtered. In one another embodiment, the integrated structure may integrate one power amplifier 20 and two filters formed by acoustic wave devices 50. The signal may firstly flow into the first filter formed by acoustic wave devices 50 to be filtered, and then flow into the power amplifier 20 to be amplified, and finally flow into the second filter formed by acoustic wave devices 50 to be filtered.

In one embodiment, the application of the acoustic wave device 50 may be a mass sensing device, a biomedical sensing device, an UV sensing device, a pressure sensing device or a temperature sensing device.

In an embodiment, the compound semiconductor substrate 12 may be made of GaAs, SiC, InP, GaN, AlN or Sapphire.

In an embodiment, the function of the supporting layer 61 may be the supporting for the film bulk acoustic resonator 51 for preventing the film bulk acoustic resonator 51 from collapsing. The supporting layer 61 also may be the seed layer for the bottom electrode 601 and the dielectric layer 602 for improving the crystalline quality. In an embodiment, the supporting layer 61 is made of $SiN_x$ or AlN. The supporting layer 61 is formed on the epitaxial structure 13 by molecular beam epitaxy (MBE), sputtering or chemical vapor deposition (CVD).

In an embodiment, the bottom electrode 601 is needed to have a lower roughness and resistivity for benefit the preferable crystal growth axis. In an embodiment, the bottom electrode 601 is made of Mo, Pt, Al, Au, W or Ru. The bottom electrode 601 is formed on the supporting layer 61 by evaporation or sputtering.

In an embodiment, the dielectric layer 602 is made of AlN, monocrystalline $SiO_2$, ZnO, $HfO_2$, barium strontium titanate (BST) or lead zirconate titanate (PZT), and is formed on the bottom electrode 601 or formed on both the electrode 601 and the supporting layer 61 by epitaxial growth or sputtering. The selection of the materials of the dielectric layer 602 is associated with the application. AlN is a high acoustic wave velocity material (12000 m/s) and is suitable for high frequency application, and after the formation of the micro structure of the material, it has good physical and chemical stability and its properties are not easily to be influenced by the circumstance. ZnO may be formed under lower temperature and it has an acoustic wave velocity 6000 m/s. Its electromechanical coupling coefficient is higher (8.5%) and it is suitable for the application of broadband filter. However when forming ZnO, the concentration of oxygen vacancies in ZnO is not easily controlled, yet it is easily influenced by the humidity and oxygen of the circumstance. Both barium strontium titanate (BST) and lead zirconate titanate (PZT) are ferroelectric materials. Their dielectric constant may vary under external electric field. Hence, they are suitable for the application of acoustic wave device with tunable frequency within dozen MHz range of frequencies. Both barium strontium titanate (BST) and lead zirconate titanate (PZT) need to be polarized under high voltage electric field in order to obtain their piezoelectric characteristics. Lead zirconate titanate (PZT) has higher electromechanical coupling coefficient, however it contains lead.

In an embodiment, the top electrode 603 is needed to have a lower resistivity for reducing power loss so as to reduce the insertion loss. In an embodiment, the top electrode 603 may be made of Mo, Pt, Al, Au, W or Ru. The top electrode 603 is formed on the dielectric layer 602 or is formed on both the dielectric layer 602 and the supporting layer 61 by evaporation or sputtering.

In an embodiment, the bottom electrode 601 is made of Mo or Pt, while the dielectric layer 602 is made of AlN. The Mo of the bottom electrode 601 may be etched by Lithography and Lift-off process. And the AlN of the dielectric layer 602 may be etched by inductively coupled plasma (ICP) process with $CF_4$ plasma.

In an embodiment, the depth of the substrate recess 15 is between 50 nm and 10000 nm.

In an embodiment, the depth of the supporting layer recess 612 is between 10 nm and 3500 nm. In another embodiment, the optimized depth of the supporting layer recess 612 is between 10 nm and 1500 nm.

Figure 1B:
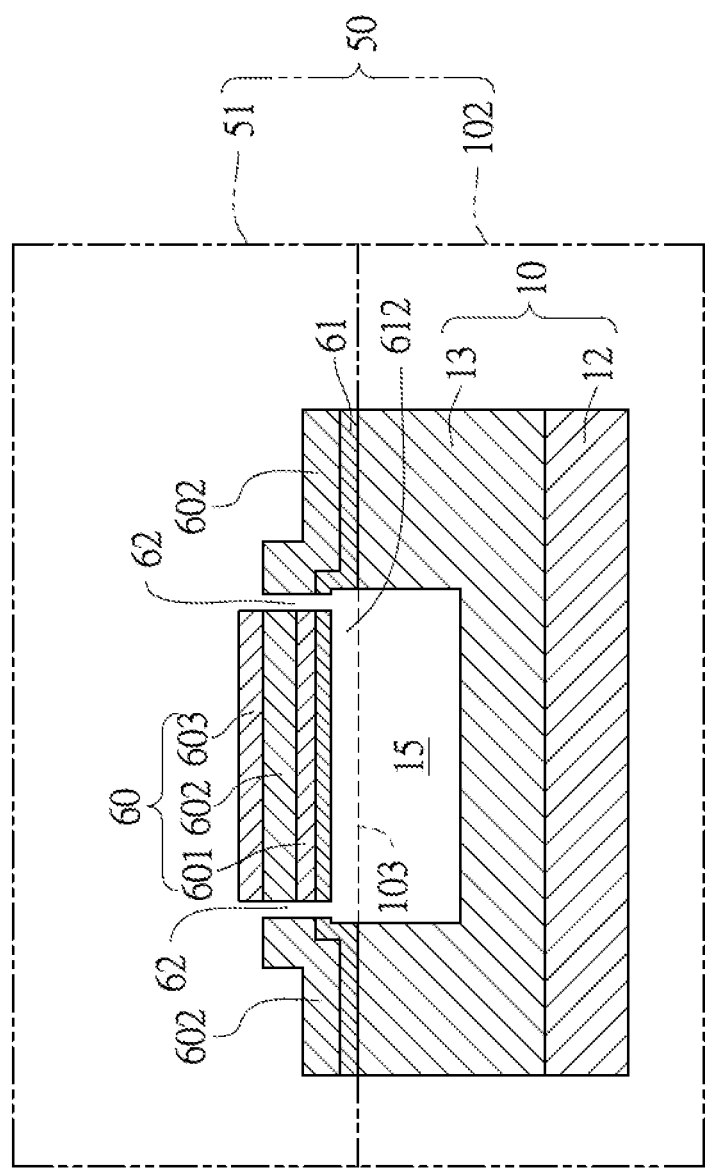

Please refer to FIG. 1B, which shows the cross-sectional view of another embodiment of the integrated structure of power amplifier and acoustic wave device of the present invention. The main structure in FIG. 1B is basically the same as the structure shown in FIG. 1, except that the film bulk acoustic resonator 51 further comprises at least one etching recess 62. The cross-sectional direction of FIG. 1B is orthogonal to that of FIG. 1. And there is only the acoustic wave device 50 at the position of the cross-sectional direction of FIG. 1B, hence there is no power amplifier 20 shown in FIG. 1B. One end of the at least one etching recess 62 is communicated with the supporting layer recess 612, the other end of the at least one etching recess 62 penetrates the supporting layer 61 or penetrates both the supporting layer 61 and the bulk acoustic resonator structure 60 such that the at least one etching recess 62 is communicated with the outside, and thereby the supporting layer recess 612 is communicated with the outside.

Figure 1C:
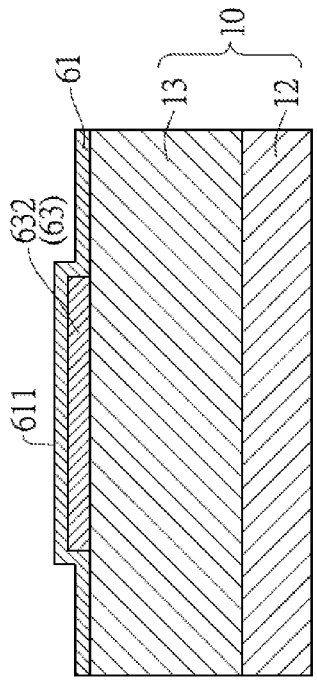
FIG. 1C~1H are the cross-sectional schematics showing steps of a fabrication method for the embodiments of the integrated structure of power amplifier and acoustic wave device of the present invention.
Figure 1D:
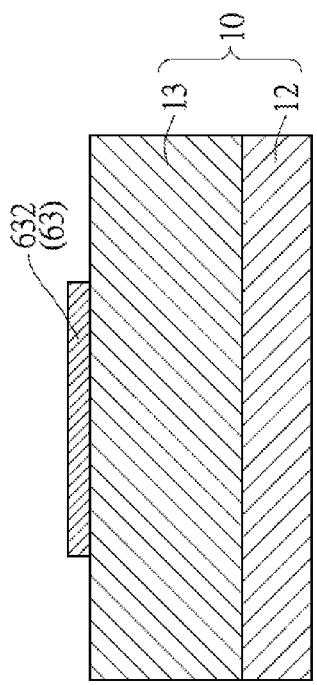
Figure 1E:
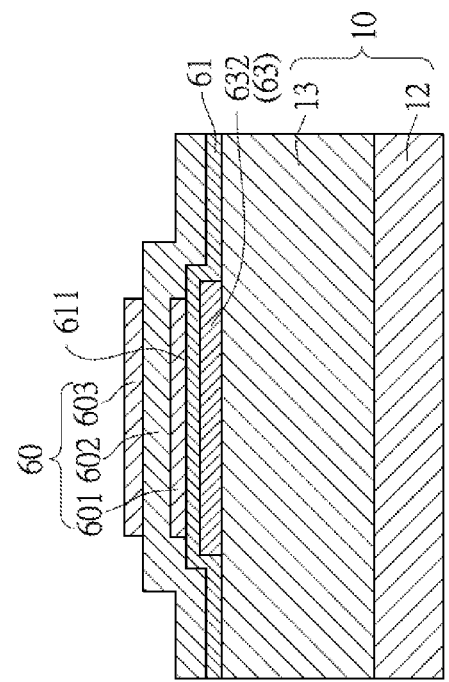
Figure 1F:
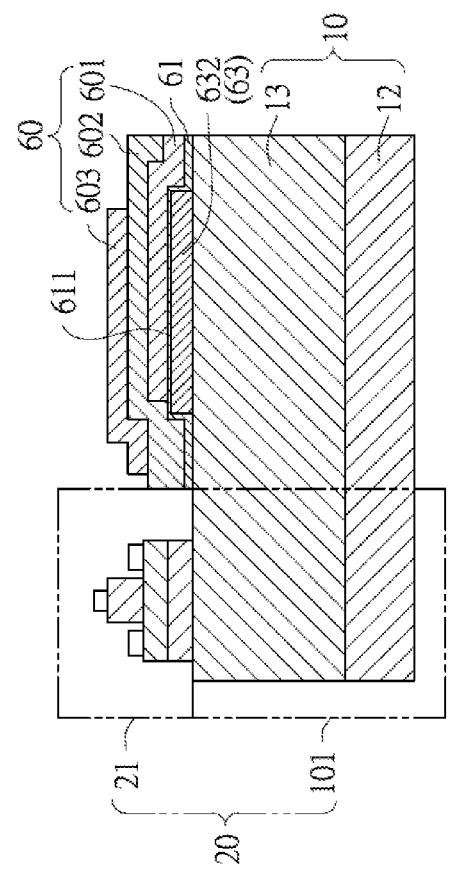
Figure 1G:
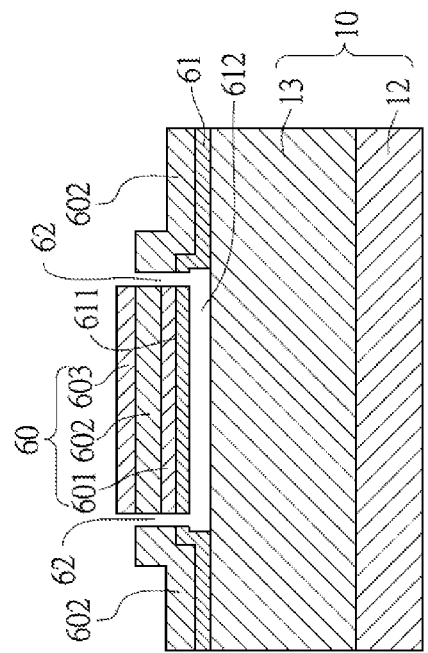
Figure 1H:
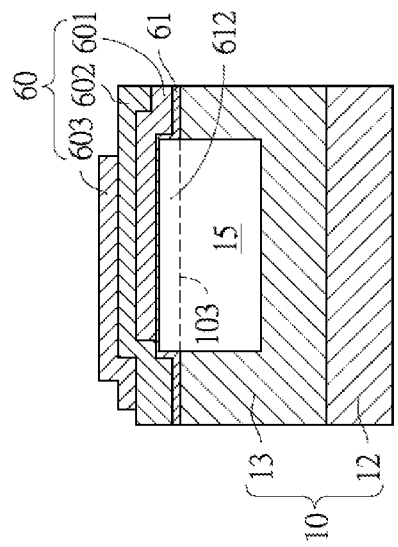

Please refer to the embodiment of FIGS. 1 and 1B, the present invention provides a fabrication method for integrated structure of power amplifier and acoustic wave device. The fabrication method for the embodiment of FIGS. 1 and 1B comprises following steps of: Step A1: forming an epitaxial structure 13 on a compound semiconductor substrate 12 to form a compound semiconductor epitaxial substrate 10; Step A2: forming a power amplifier upper structure 21 on a first side 101 of the compound semiconductor epitaxial substrate 10 to form a power amplifier 20; and Step A3: forming a film bulk acoustic resonator 51 on a second side 102 of the compound semiconductor epitaxial substrate 10 to form an acoustic wave device 50. The integrated structure 1 of the power amplifier 20 and the acoustic wave device 50 on the same compound semiconductor epitaxial substrate 10 is capable of reducing the component size, optimizing the impedance matching, and reducing the signal loss between the power amplifier 20 and the acoustic wave device 50. Step A3 includes following steps of: Step A31: (Please referring to FIG. 1C) forming a top sacrificial layer 63 on the compound semiconductor epitaxial substrate 10; Step A32: defining a top sacrificial layer etching area, and etching to remove the top sacrificial layer 63 within the top sacrificial layer etching area to form a top sacrificial layer mesa 632, such that the compound semiconductor epitaxial substrate 10 within the top sacrificial layer etching area is exposed; Step A33: (Please referring to FIG. 1D) forming a supporting layer 61 on the top sacrificial layer 63 and the compound semiconductor epitaxial substrate 10, wherein the supporting layer 61 has a supporting layer mesa 611 right above the top sacrificial layer mesa 632; Step A34: forming a bulk acoustic resonator structure 60 on the supporting layer 61 (Please referring to FIGS. 1E and 1F, wherein the cross-sectional direction of FIG. 1F is orthogonal to that of FIG. 1E, and there is only the acoustic wave device 50 at the position of the cross-sectional direction of FIG. 1F, hence there is no power amplifier 20 shown in FIG. 1F), which includes following steps of: Step A341: forming a bottom electrode 601 on one end of the supporting layer 61, where the bottom electrode 601 is formed on and at least extended along the supporting layer mesa 611; Step A342: forming a dielectric layer 602, wherein the dielectric layer 602 is formed at least on the bottom electrode 601 above the supporting layer mesa 611; and Step A343: forming a top electrode 603, wherein the top electrode 603 is formed on the other end with respect to the bottom electrode 601, where the top electrode 603 is formed on the dielectric layer 602 or formed on both the dielectric layer 602 and the supporting layer 61, and the top electrode 603 is formed on and at least extended along the dielectric layer 602 above the supporting layer mesa 611; Step A35: (Please referring to FIG. 1G) defining at least one recess etching area, and etching to remove the supporting layer 61 within the at least one recess etching area or etching to remove the supporting layer 61 and the bulk acoustic resonator structure 60 within the at least one recess etching area such that the etching stops at the top sacrificial layer mesa 632 and/or the compound semiconductor epitaxial substrate 10 to form at least one etching recess 62, thereby part of the top sacrificial layer mesa 632 is exposed; Step A36: (Please referring to FIG. 1H) etching to remove the top sacrificial layer mesa 632 to form a supporting layer recess 612, wherein at least one top sacrificial layer etching solution contacts with the top sacrificial layer mesa 632 via the at least one etching recess 62 and etches to remove the top sacrificial layer mesa 632, thereby the top and the bottom of the supporting layer recess 612 are the supporting layer 61 and the compound semiconductor epitaxial substrate 10 respectively; and Step A37: etching to remove part of the compound semiconductor epitaxial substrate 10 below the supporting layer recess 612 to form a substrate recess 15 (Please referring to FIGS. 1 and 1B, wherein the cross-sectional direction of FIG. 1B is orthogonal to that of FIG. 1, and there is only the acoustic wave device 50 at the position of the cross-sectional direction of FIG. 1B, hence there is no power amplifier 20 shown in FIG. 1B), wherein the bottom of the substrate recess 15 is the compound semiconductor epitaxial substrate 10, wherein at least one substrate recess etching solution contacts with the top surface of the compound semiconductor epitaxial substrate 10 via the at least one etching recess 62 and the supporting layer recess 612, the at least one substrate recess etching solution is uniformly distributed on the top surface of the compound semiconductor epitaxial substrate 10 through the supporting layer recess 612 so as to uniformly etch part of the compound semiconductor epitaxial substrate 10 below the supporting layer recess 612 to form the substrate recess 15, and thereby prevents the side etching phenomenon during the etching, wherein the supporting layer recess 612 is communicated with the substrate recess 15, and the supporting layer recess 612 and the substrate recess 15 have a boundary 103 therebetween and the boundary 103 is the extended from the top surface of the compound semiconductor epitaxial substrate 10, wherein the gap between the supporting layer mesa 611 and the bottom of the substrate recess 15 is increased by the communication of the supporting layer recess 612 and the substrate recess 15, so as to avoid the contact of the supporting layer mesa 611 and the bottom of the substrate recess 15 when the film bulk acoustic resonator 51 is affected by stress such that the supporting layer mesa 611 is bended downwardly.

Figure 1I:
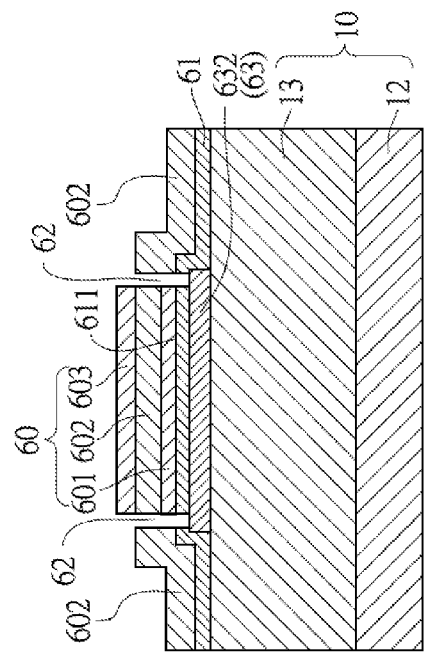
FIGS. 1I and 1J are the partial enlarged cross-sectional views of embodiments of the integrated structure of power amplifier and acoustic wave device of the present invention.
Figure 1J:
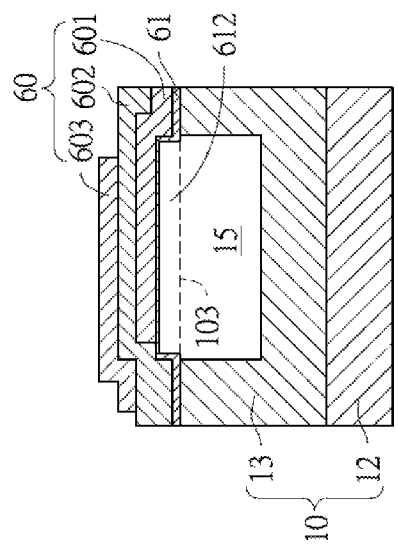

Please refer to FIG. 1I, which shows the partial enlarged cross-sectional view of an embodiment of the integrated structure of power amplifier and acoustic wave device of the present invention. In the embodiment of FIG. 1I, the supporting layer recess 612 has an opening smaller than that of the substrate recess 15. Please refer to FIG. 1J, which shows the partial enlarged cross-sectional view of another embodiment of the integrated structure of power amplifier and acoustic wave device of the present invention. In the embodiment of FIG. 1J, the supporting layer recess 612 has an opening almost equal to that of the substrate recess 15.

Figure 1K:
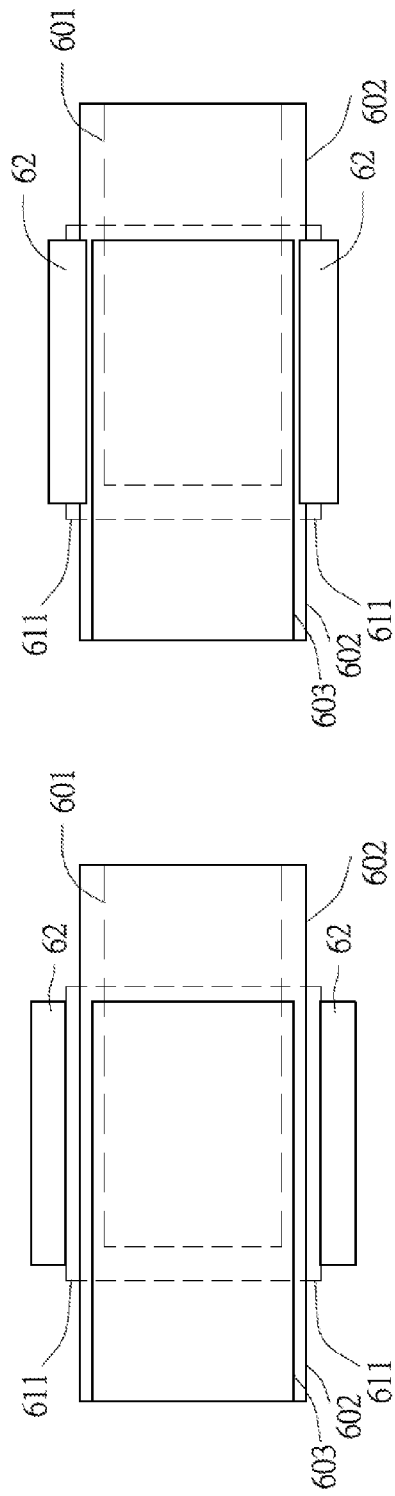
FIG. 1K~1N are the top views showing the relative position of the etching recess and the supporting layer mesa in the embodiments of the integrated structure of power amplifier and acoustic wave device of the present invention.
Figure 1L:
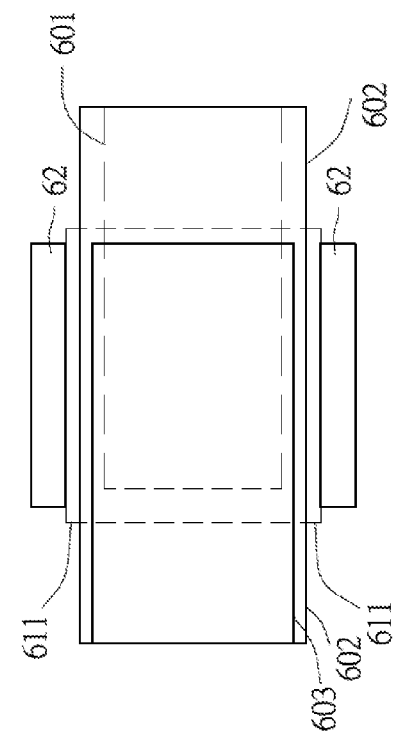
Figure 1M:
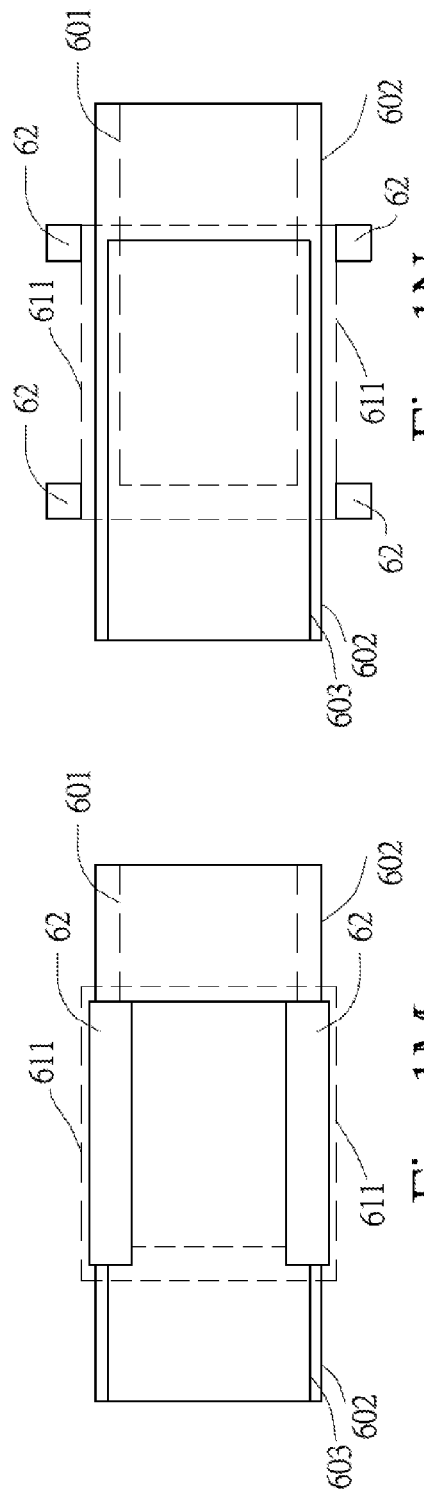
Figure 1N:
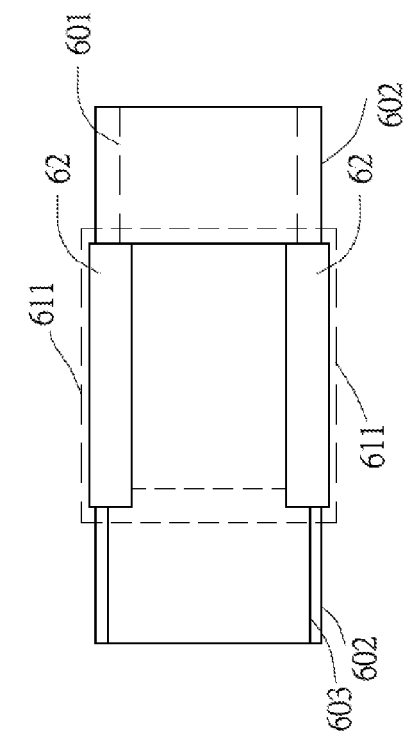

Please refer to FIGS. 1K, 1L, 1M and 1N, which show the top views of the relative position of the etching recess and the supporting layer mesa in the embodiments of the integrated structure of power amplifier and acoustic wave device of the present invention. In the embodiment of FIG. 1K, the integrated structure 1 of power amplifier 20 and acoustic wave device 50 has two etching recess 62 with long strip opening. The two etching recesses 62 are located on two opposite sides of the supporting layer mesa 611 respectively. And the etching recesses 62 penetrate the supporting layer 61 (not shown in FIG. 1K), and thereby the supporting layer recess 612 (not shown in FIG. 1K) is communicated with the outside. In the embodiment of FIG. 1L, the integrated structure 1 of power amplifier 20 and acoustic wave device 50 has two etching recess 62 with long strip opening. The two etching recesses 62 are located on two opposite sides of the supporting layer mesa 611 respectively. (part of the etching recesses 62 are within the supporting layer mesa 611, the rest part of the etching recesses 62 are outside the supporting layer mesa 611) And the etching recesses 62 penetrate the supporting layer 61 (not shown in FIG. 1L) and the dielectric layer 602. In the embodiment of FIG. 1M, the integrated structure 1 of power amplifier 20 and acoustic wave device 50 has two etching recess 62 with long strip opening. The two etching recesses 62 are located respectively on two opposite sides of the supporting layer mesa 611 within the supporting layer mesa 611. And the etching recesses 62 penetrate the supporting layer 61 (not shown in FIG. 1M), the bottom electrode 601, the dielectric layer 602 and the top electrode 603. In the embodiment of FIG. 1N, the integrated structure 1 of power amplifier 20 and acoustic wave device 50 has four etching recess 62 with square opening. The four etching recesses 62 are located on four corners of the supporting layer mesa 611 respectively. And the etching recesses 62 penetrate the supporting layer 61 (not shown in FIG. 1N). The amount of the etching recesses 62 is not limited to one, two, three, four or more. The etching recesses 62 may locate on other position and should not be limited by FIG. 1K, 1L, 1M or 1N.

In one embodiment, the power amplifier 20 may be a heterojunction bipolar transistor (HBT). In another embodiment, the power amplifier 20 may be a field effect transistor (FET), a high electron mobility transistor (HEMT) or a pseudomorphic high electron mobility transistor (pHEMT). In an embodiment, the power amplifier 20 may be any other type of amplifier which may be formed on the compound semiconductor substrate 12.

Figure 2:
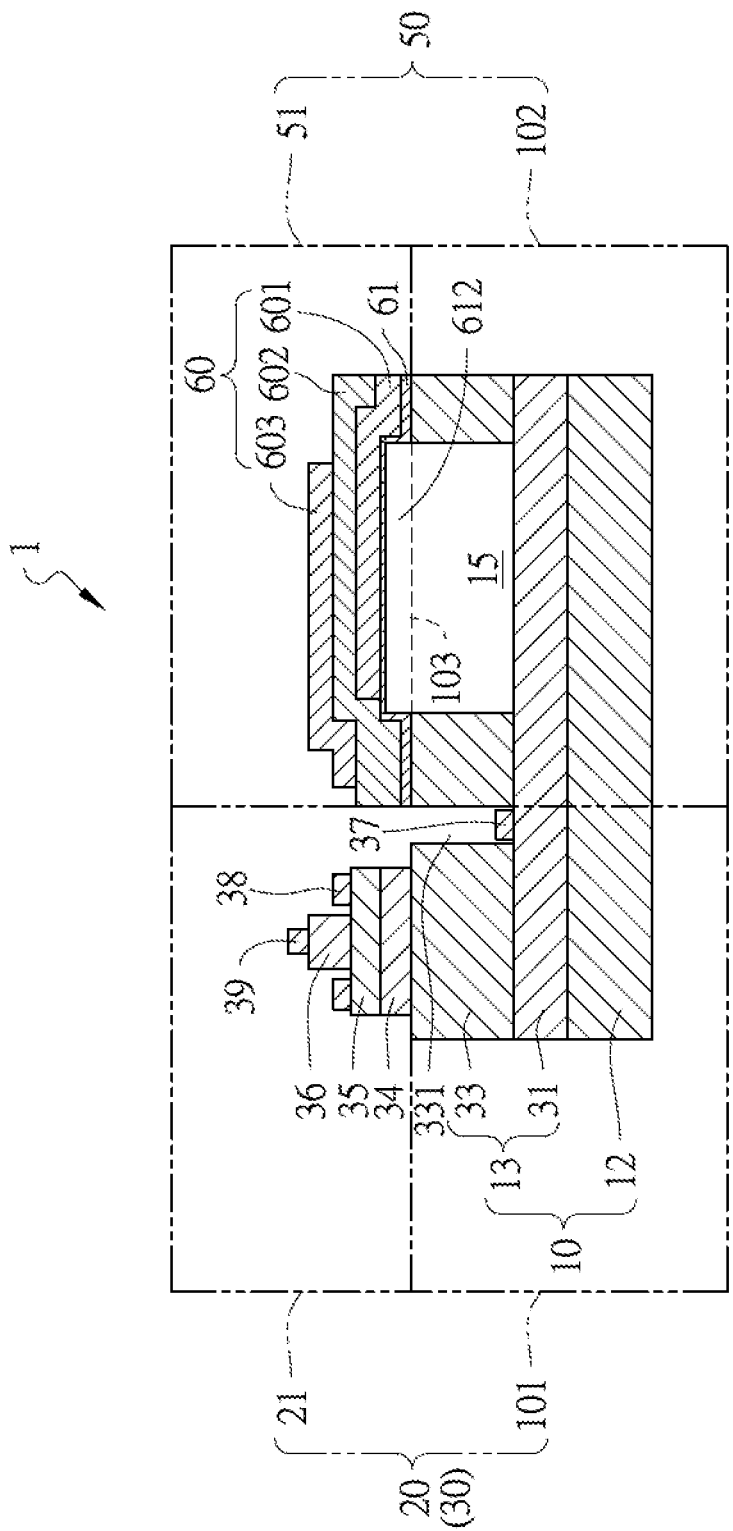
FIGS. 2 and 2A~2E are the cross-sectional views of embodiments of the integrated structure of power amplifier and acoustic wave device of the present invention.

Please refer to FIG. 2, which shows the cross-sectional view of another embodiment of the integrated structure of power amplifier and acoustic wave device of the present invention. The main structure in FIG. 2 is basically the same as the structure shown in FIG. 1, except that the power amplifier 20 is a heterojunction bipolar transistor 30 (HBT). The epitaxial structure 13 includes: a subcollector layer 31 and a collector layer 33. The subcollector layer 31 formed on the compound semiconductor substrate 12; the collector layer 33 formed on the subcollector layer 31. The first side 101 of the compound semiconductor epitaxial substrate 10 further comprises a collector recess 331, and the bottom of the collector recess 331 is the subcollector layer 31. The power amplifier upper structure 21 includes: a base layer 34, an emitter ledge layer 35, an emitter layer 36, a base electrode 38, an emitter electrode 39 and a collector electrode 37. The base layer 34 is formed on the collector layer 33; the emitter ledge layer 35 is formed on the base layer 34; the emitter layer 36 is formed on the emitter ledge layer 35; the base electrode 38 is formed on the emitter ledge layer 35; the emitter electrode 39 is formed on the emitter layer 36; the collector electrode 37 is formed on the subcollector layer 31 within the collector recess 331. The first side 101 of the compound semiconductor epitaxial substrate 10 includes: the compound semiconductor substrate 12, the subcollector layer 31, the collector layer 33 and the collector recess 331. The first side 101 of the compound semiconductor epitaxial substrate 10 and the power amplifier upper structure 21 form the heterojunction bipolar transistor 30. The acoustic wave device 50 in FIG. 2 is basically the same as the acoustic wave device 50 in FIG. 1. The substrate recess 15 of the second side 102 of the compound semiconductor epitaxial substrate 10 is peripherally surrounded by the collector layer 33, and the bottom of the substrate recess 15 is the subcollector layer 31. The second side 102 of the compound semiconductor epitaxial substrate 10 and the film bulk acoustic resonator 51 form the acoustic wave device 50.

In one embodiment, the collector layer 33 is made of GaAs. The thickness of the collector layer 33 is between 500 nm and 3000 nm.

In another embodiment, the base layer 34 is made of GaAs. The thickness of the base layer 34 is between 60 nm and 100 nm.

In one embodiment, the subcollector layer 31 is made of GaAs and is formed on the compound semiconductor substrate 12 by epitaxial growth.

Figure 2A:
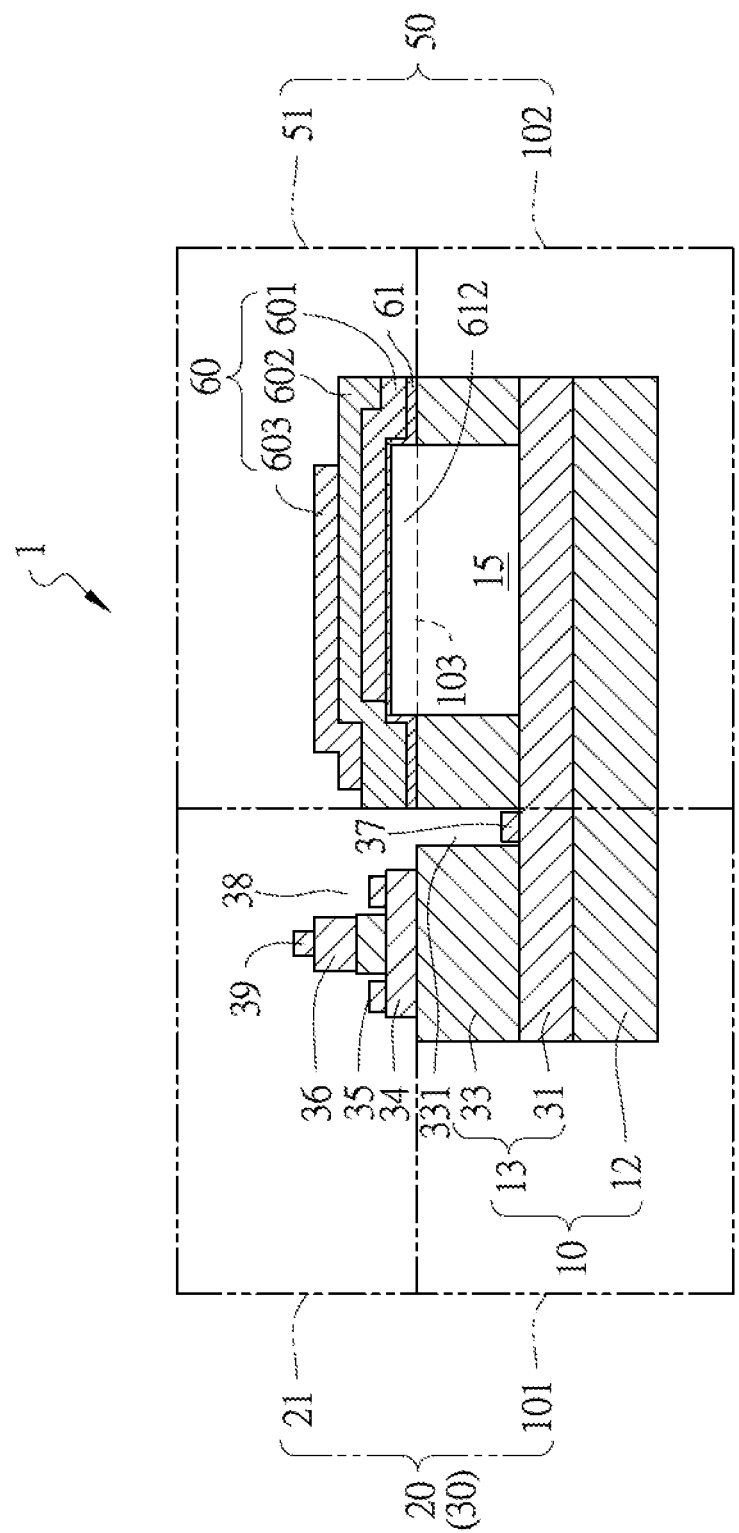

Please refer to FIG. 2A, which shows the cross-sectional view of another embodiment of the integrated structure of power amplifier and acoustic wave device of the present invention. The main structure in FIG. 2A is basically the same as the structure shown in FIG. 2, except that the base electrode 38 is formed on the base layer 34. In one other embodiment, the base electrode 38 may be formed on both the base layer 34 and the emitter ledge layer 35. In other embodiments having basically the same structure as the embodiment in FIG. 2, the base electrode 38 may be formed on the base layer 34 and/or the emitter ledge layer 35.

Figure 2B:
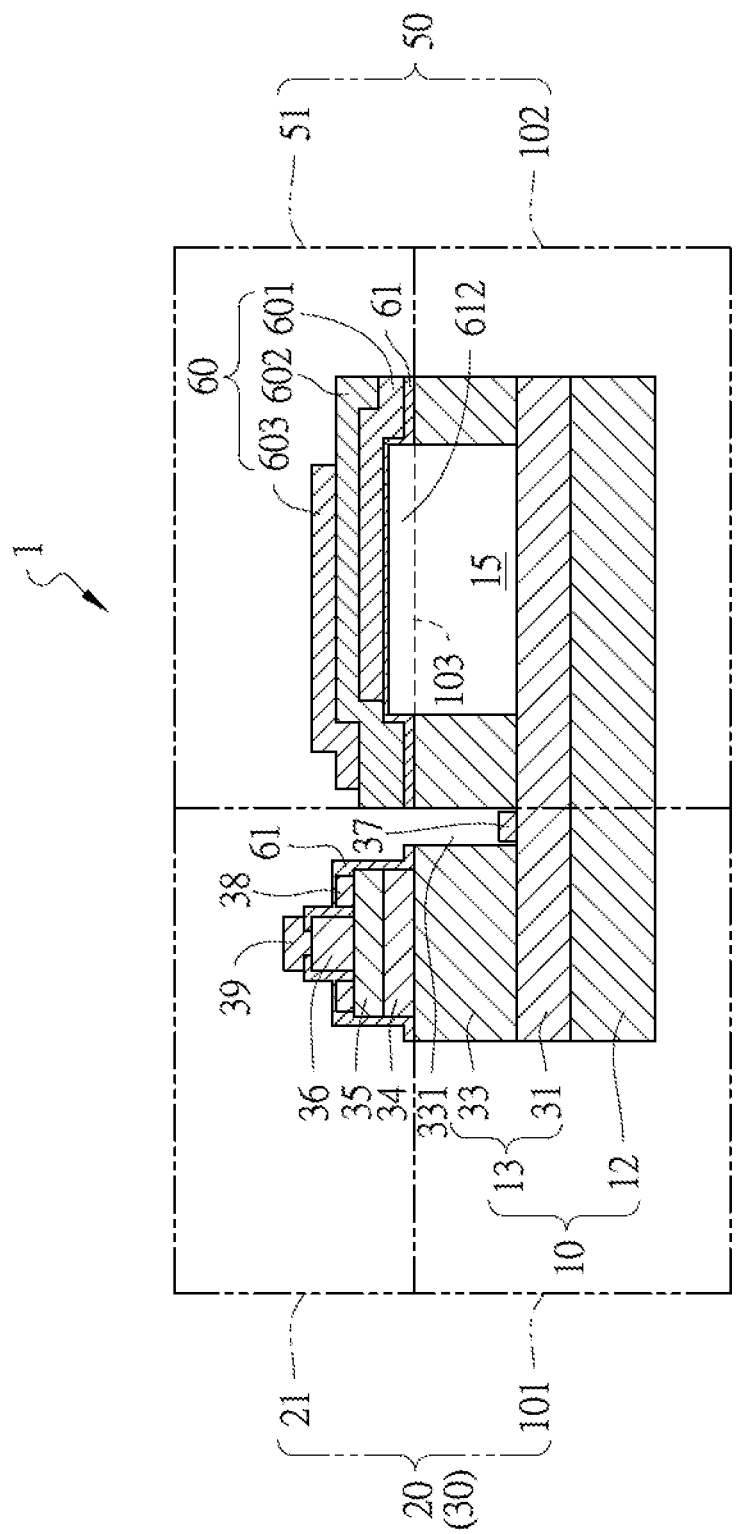

Please refer to FIG. 2B, which shows the cross-sectional view of another embodiment of the integrated structure of power amplifier and acoustic wave device of the present invention. The main structure in FIG. 2B is basically the same as the structure shown in FIG. 2, except that the heterojunction bipolar transistor 30 further comprises the supporting layer 61. The supporting layer 61 plays a role of protection, and may prevent the heterojunction bipolar transistor 30 from oxidation or corrosion. In other embodiments having basically the same structure as the embodiment in FIG. 2, the power amplifier 20 may also include the supporting layer 61.

Figure 2C:
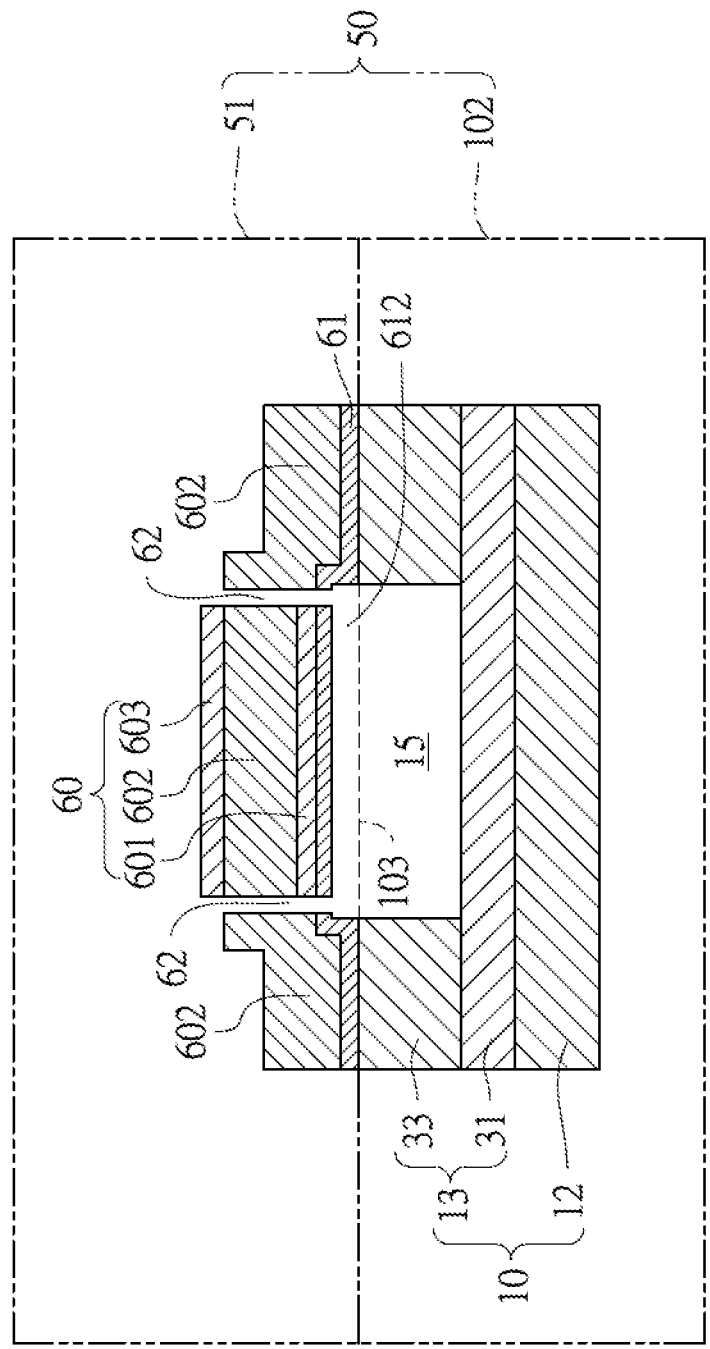

Please refer to FIG. 2C, which shows the cross-sectional view of another embodiment of the integrated structure of power amplifier and acoustic wave device of the present invention. The main structure in FIG. 2C is basically the same as the structure shown in FIG. 2, except that the film bulk acoustic resonator 51 further comprises at least one etching recess 62. The cross-sectional direction of FIG. 2C is orthogonal to that of FIG. 2. And there is only the acoustic wave device 50 at the position of the cross-sectional direction of FIG. 2C, hence there is no power amplifier 20 shown in FIG. 2C. One end of the at least one etching recess 62 is communicated with the supporting layer recess 612, the other end of the at least one etching recess 62 penetrates the supporting layer 61 or penetrates both the supporting layer 61 and the bulk acoustic resonator structure 60 such that the at least one etching recess 62 is communicated with the outside, and thereby the supporting layer recess 612 is communicated with the outside. The feature of the at least one etching recess 62 of the embodiment in FIG. 2C is basically the same as that of the embodiment in FIG. 1B. The power amplifier 20 may also include the supporting layer 61, or may choose not to include the supporting layer 61.

Figure 2D:
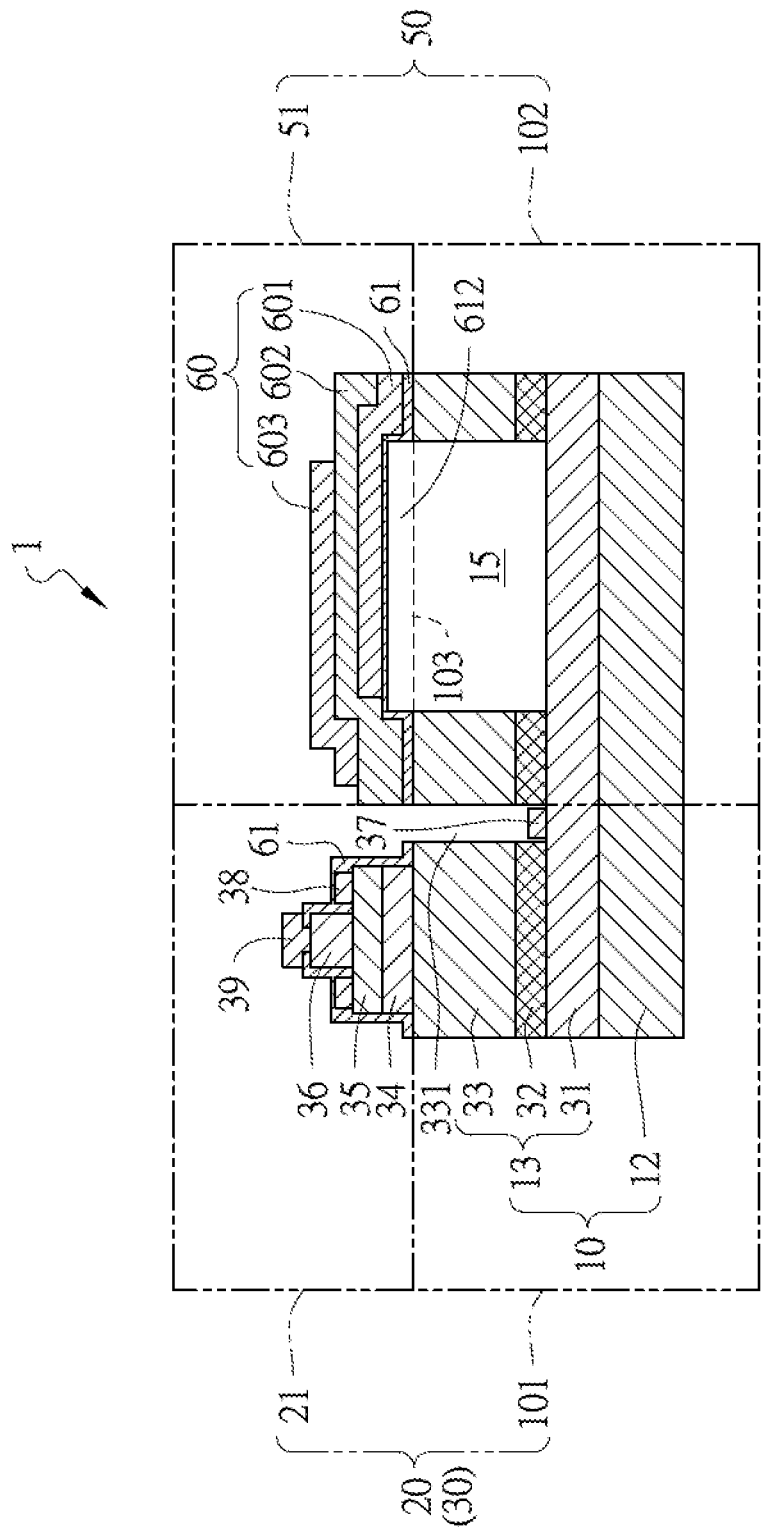

Please refer to FIG. 2D, which shows the cross-sectional view of another embodiment of the integrated structure of power amplifier and acoustic wave device of the present invention. The main structure in FIG. 2D is basically the same as the structure shown in FIG. 2B, except that the epitaxial structure 13 further comprises an etching stop layer 32; wherein the etching stop layer 32 is formed on the subcollector layer 31; and the collector layer 33 is formed on the etching stop layer 32. The bottom of the collector recess 331 is the subcollector layer 31, the collector electrode 37 is formed on the subcollector layer 31 within the collector recess 331. The substrate recess 15 is peripherally surrounded by the collector layer 33 and the etching stop layer 32, and the bottom of the substrate recess 15 is the subcollector layer 31. The power amplifier 20 may also include the supporting layer 61, or may choose not to include the supporting layer 61.

In an embodiment, the etching stop layer 32 is made of InGaP. In one embodiment, the thickness of the etching stop layer 32 is between 5 nm and 1000 nm. In another embodiment, the optimized thickness of the etching stop layer 32 is 20 nm.

Figure 2E:
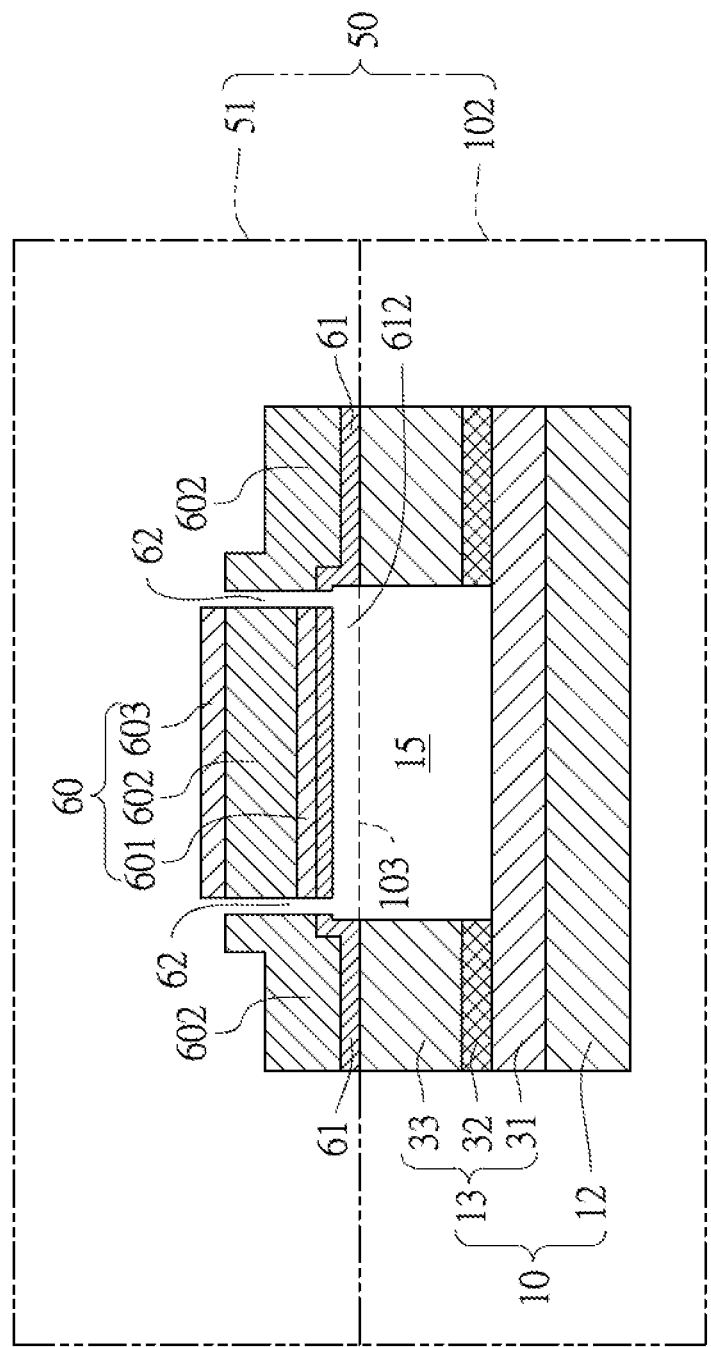

Please refer to FIG. 2E, which shows the cross-sectional view of another embodiment of the integrated structure of power amplifier and acoustic wave device of the present invention. The main structure in FIG. 2E is basically the same as the structure shown in FIG. 2D, except that the film bulk acoustic resonator 51 further comprises at least one etching recess 62. The cross-sectional direction of FIG. 2E is orthogonal to that of FIG. 2D. And there is only the acoustic wave device 50 at the position of the cross-sectional direction of FIG. 2E, hence there is no power amplifier 20 shown in FIG. 2E. One end of the at least one etching recess 62 is communicated with the supporting layer recess 612, the other end of the at least one etching recess 62 penetrates the supporting layer 61 or penetrates both the supporting layer 61 and the bulk acoustic resonator structure 60 such that the at least one etching recess 62 is communicated with the outside, and thereby the supporting layer recess 612 is communicated with the outside. The feature of the at least one etching recess 62 of the embodiment in FIG. 2E is basically the same as that of the embodiment in FIG. 1B. The power amplifier 20 may also include the supporting layer 61, or may choose not to include the supporting layer 61.

Figure 2F:
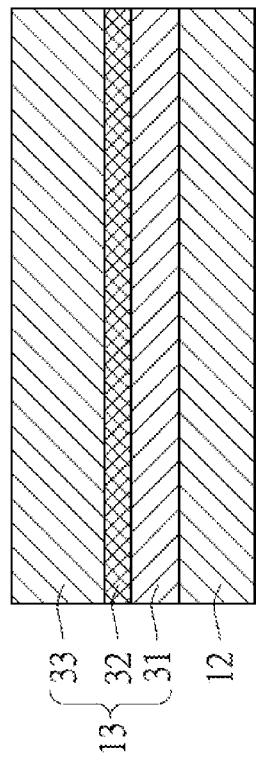
FIG. 2F~2W are the cross-sectional schematics showing steps of a fabrication method for the embodiments of the integrated structure of power amplifier and acoustic wave device of the present invention.

Please refer to FIGS. 2B and 2C. The cross-sectional direction of FIG. 2C is orthogonal to that of FIG. 2B. And there is only the acoustic wave device 50 at the position of the cross-sectional direction of FIG. 2C, hence there is no power amplifier 20 shown in FIG. 2C. The present invention provides a fabrication method for integrated structure of power amplifier and acoustic wave device. The fabrication method for the embodiment of FIGS. 2B and 2C comprises following steps of: Step B1: forming an epitaxial structure 13 on a compound semiconductor substrate 12 to form a compound semiconductor epitaxial substrate 10; Step B2: forming a power amplifier upper structure 21 on a first side 101 of the compound semiconductor epitaxial substrate 10 to form a power amplifier 20, wherein the power amplifier 20 is a heterojunction bipolar transistor 30 (HBT); and Step B3: forming a film bulk acoustic resonator 51 on a second side 102 of the compound semiconductor epitaxial substrate 10 to form an acoustic wave device 50; wherein, the integrated structure 1 of the power amplifier 20 and the acoustic wave device 50 on the same the compound semiconductor epitaxial substrate 10 is capable of reducing the component size, optimizing the impedance matching, and reducing the signal loss between the power amplifier 20 and the acoustic wave device 50. In this embodiment, Step B1 further includes following steps of: Step B11: (Please referring to FIG. 2F) forming a subcollector layer 31 on the compound semiconductor substrate 12; and Step B12: forming a collector layer 33 on the subcollector layer 31. Step B2 and Step B3 include following steps of: Step B41: (Please referring to FIG. 2H) forming a base layer 34 on the collector layer 33; Step B42: forming an emitter ledge layer 35 on the base layer 34; Step B43: forming an emitter layer 36 on the emitter ledge layer 35; Step B44: (Please referring to FIG. 2I) defining an emitter layer etching area, and etching to remove the emitter layer 36 within the emitter layer etching area; Step B45: forming a base electrode 38 on the emitter ledge layer 35; Step B46: (Please referring to FIG. 2J) defining an emitter ledge layer etching area, and etching to remove the emitter ledge layer 35 within the emitter ledge layer etching area; Step B47: defining a base layer etching area, and etching to remove the base layer 34 within the base layer etching area; Step B48: (Please referring to FIG. 2L) forming a top sacrificial layer 63 on the compound semiconductor epitaxial substrate 10 (the collector layer 33); Step B49: defining a top sacrificial layer etching area, and etching to remove the top sacrificial layer 63 within the top sacrificial layer etching area to form a top sacrificial layer mesa 632, such that the compound semiconductor epitaxial substrate 10 (the collector layer 33) within the top sacrificial layer etching area is exposed; Step B50: (Please referring to FIGS. 2M and 2N) forming a supporting layer 61 on the top sacrificial layer 63 and the compound semiconductor epitaxial substrate 10 (the collector layer 33), wherein the supporting layer 61 has a supporting layer mesa 611 right above the top sacrificial layer mesa 632; wherein the supporting layer 61 may also be formed on the base layer 34, the emitter ledge layer 35, the emitter layer 36 and the base electrode 38, and the supporting layer 61 may play a role of protection; Step B51: forming a bulk acoustic resonator structure 60 on the supporting layer 61, which includes following steps of: Step B511: (Please referring to FIG. 20) forming a bottom electrode 601 on one end of the supporting layer 61, where the bottom electrode 601 is formed on and at least extended along the supporting layer mesa 611; and forming an emitter electrode 39 on the emitter layer 36 (the emitter electrode 39 may choose to be formed on the emitter layer 36 through other step); Step B512: (Please referring to FIG. 2P) forming a dielectric layer 602, wherein the dielectric layer 602 is formed at least on the bottom electrode 601 above the supporting layer mesa 611; and Step B513: (Please referring to FIG. 2Q) forming a top electrode 603, wherein the top electrode 603 is formed on the other end with respect to the bottom electrode 601, where the top electrode 603 is formed on the dielectric layer 602 or formed on both the dielectric layer 602 and the supporting layer 61, and the top electrode 603 is formed on and at least extended along the dielectric layer 602 above the supporting layer mesa 611; Step B52: defining at least one recess etching area, and etching to remove the supporting layer 61 within the at least one recess etching area or etching to remove the supporting layer 61 and the bulk acoustic resonator structure 60 within the at least one recess etching area such that the etching stops at the top sacrificial layer mesa 632 and/or the compound semiconductor epitaxial substrate 10 (the collector layer 33) to form at least one etching recess 62, thereby part of the top sacrificial layer mesa 632 is exposed (Please referring to FIGS. 2R and 2S, wherein the cross-sectional direction of FIG. 2S is orthogonal to that of FIG. 2R, and there is only the acoustic wave device 50 at the position of the cross-sectional direction of FIG. 2S, hence there is no power amplifier 20 shown in FIG. 2S); Step B53: etching to remove the top sacrificial layer mesa 632 to form a supporting layer recess 612, wherein at least one top sacrificial layer etching solution contacts with the top sacrificial layer mesa 632 via the at least one etching recess 62 and etches to remove the top sacrificial layer mesa 632, thereby the top and the bottom of the supporting layer recess 612 are the supporting layer 61 and the compound semiconductor epitaxial substrate 10 (the collector layer 33) respectively (Please referring to FIGS. 2T and 2U, wherein the cross-sectional direction of FIG. 2U is orthogonal to that of FIG. 2T, and there is only the acoustic wave device 50 at the position of the cross-sectional direction of FIG. 2U, hence there is no power amplifier 20 shown in FIG. 2U); Step B54: defining a collector electrode etching area, and etching to remove the collector layer 33 within the collector electrode etching area such that the etching stops at the subcollector layer 31 to form a collector recess 331 (Please referring to FIGS. 2V and 2W, wherein the cross-sectional direction of FIG. 2W is orthogonal to that of FIG. 2V, and there is only the acoustic wave device 50 at the position of the cross-sectional direction of FIG. 2W, hence there is no power amplifier 20 shown in FIG. 2W), thereby the subcollector layer 31 within the collector recess 331 is exposed; and etching to remove part of the compound semiconductor epitaxial substrate 10 below the supporting layer recess 612 to form a substrate recess 15, wherein the bottom of the substrate recess 15 is the compound semiconductor epitaxial substrate 10 (the subcollector layer 31), wherein at least one substrate recess etching solution contacts with the top surface of the compound semiconductor epitaxial substrate 10 (the collector layer 33) via the at least one etching recess 62 and the supporting layer recess 612, the at least one substrate recess etching solution is uniformly distributed on the top surface of the compound semiconductor epitaxial substrate 10 (the collector layer 33) through the supporting layer recess 612 so as to uniformly etch part of the compound semiconductor epitaxial substrate 10 below the supporting layer recess 612 to form the substrate recess 15, and thereby prevents the side etching phenomenon during the etching, wherein the supporting layer recess 612 is communicated with the substrate recess 15, and the supporting layer recess 612 and the substrate recess 15 have a boundary 103 therebetween and the boundary 103 is the extended from the top surface of the compound semiconductor epitaxial substrate 10, wherein the gap between the supporting layer mesa 611 and the bottom of the substrate recess 15 is increased by the communication of the supporting layer recess 612 and the substrate recess 15, so as to avoid the contact of the supporting layer mesa 611 and the bottom of the substrate recess 15 when the film bulk acoustic resonator 51 is affected by stress such that the supporting layer mesa 611 is bended downwardly; and Step B55: forming a collector electrode 37 on the subcollector layer 31 within the collector recess 331 (Please referring to FIGS. 2B and 2C, wherein the cross-sectional direction of FIG. 2C is orthogonal to that of FIG. 2B, and there is only the acoustic wave device 50 at the position of the cross-sectional direction of FIG. 2C, hence there is no power amplifier 20 shown in FIG. 2C); thereby the first side 101 of the compound semiconductor epitaxial substrate 10 includes: the compound semiconductor substrate 12, the subcollector layer 31, the collector layer 33 and the collector recess 331; the power amplifier upper structure 21 includes: the base layer 34, the emitter ledge layer 35, the emitter layer 36, the base electrode 38, the emitter electrode 39 and the collector electrode 37; wherein the first side 101 of the compound semiconductor epitaxial substrate 10 and the power amplifier upper structure 21 form the heterojunction bipolar transistor 30; wherein the substrate recess 15 is peripherally surrounded by the collector layer 33, and the bottom of the substrate recess 15 is the subcollector layer 31.

Step B44, Step B45 and Step B46 may be substituted by Step B441, Step B451, Step B461 and Step B462. These steps are as follows: Step B441: (Please referring to FIG. 2K) defining an emitter layer etching area, and etching to remove the emitter layer 36 within the emitter layer etching area; Step B451: defining an emitter ledge layer etching area, and etching to remove the emitter ledge layer 35 within the emitter ledge layer etching area; Step B461: forming a base electrode 38 on the base layer 34; Step B462: defining a base layer etching area, and etching to remove the base layer 34 within the base layer etching area.

Figure 2G:
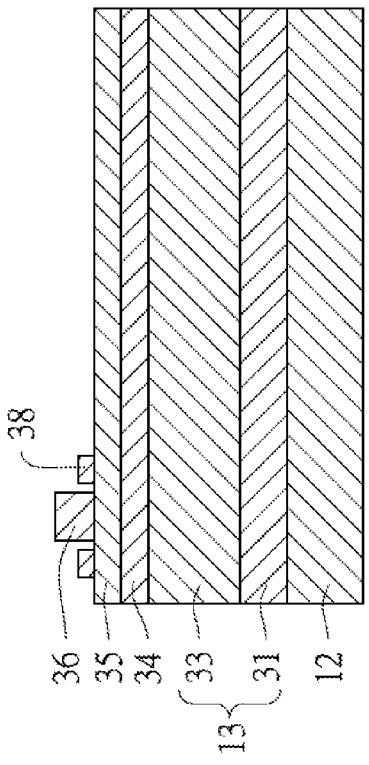
Figure 2H:
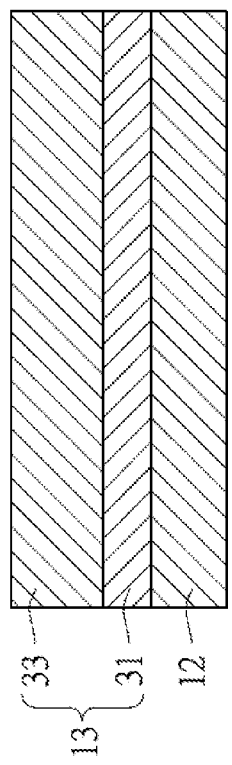
Figure 2I:
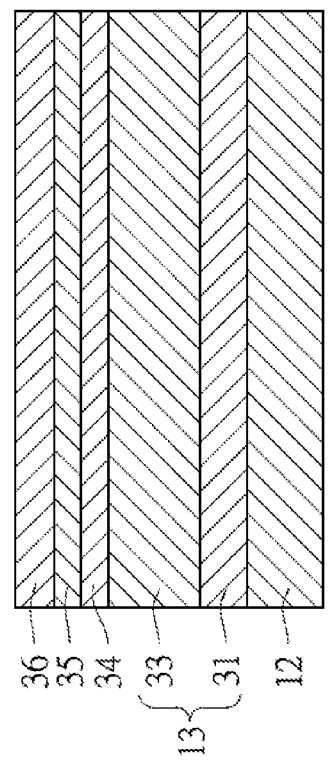

Please refer to FIGS. 2G, 2D and 2E, in which FIG. 2G shows the cross-sectional schematic of the steps of the fabrication method for the embodiment of FIGS. 2D and 2E of the integrated structure of power amplifier and acoustic wave device of the present invention. The steps of the fabrication method for the embodiment of FIGS. 2D and 2E are basically the same as the fabrication method steps for the embodiment of FIGS. 2B and 2C, except that Step B1 further comprises Step B115: forming an etching stop layer 32 on the subcollector layer 31; and Step B545: etching to remove the etching stop layer 32 within the collector electrode etching area such that the etching stops at the subcollector layer 31 to form the collector recess 331, and thereby the subcollector layer 31 within the collector recess 331 is exposed. Step B115 is between Step B11 and Step B12, i.e. first, forming the subcollector layer 31 on the compound semiconductor substrate 12, then forming the etching stop layer 32 on the subcollector layer 31, and then forming the collector layer 33 on the etching stop layer 32, such that the epitaxial structure 13 includes: the subcollector layer 31, the etching stop layer 32 and the collector layer 33. Step B545 is between Step B54 and Step B55. Step B545 may also includes a step of etching to remove the etching stop layer 32 below the bottom of the substrate recess 15, such that the substrate recess 15 is peripherally surrounded by the collector layer 33 and the etching stop layer 32, and the bottom of the substrate recess 15 is the subcollector layer 31. The collector electrode 37 is formed on the subcollector layer 31 within the collector recess 331. Thereby the first side 101 of the compound semiconductor epitaxial substrate 10 includes: the compound semiconductor substrate 12, the subcollector layer 31, the etching stop layer 32, the collector layer 33 and the collector recess 331. The power amplifier upper structure 21 includes: the base layer 34, the emitter ledge layer 35, the emitter layer 36, the base electrode 38, the emitter electrode 39 and the collector electrode 37. The first side 101 of the compound semiconductor epitaxial substrate 10 and the power amplifier upper structure 21 form the heterojunction bipolar transistor 30.

In an embodiment, the top sacrificial layer 63 is made of AlAs or TiW.

In an embodiment, the TiW of the top sacrificial layer 63 may be formed by sputtering on the epitaxial structure 13 (the collector layer 33). TiW may be etched by $H_2O_2$.

In an embodiment, the AlAs of the top sacrificial layer 63 may be formed by molecular beam epitaxy (MBE) or metal organic chemical vapor deposition (MOCVD) on the epitaxial structure 13 (the collector layer 33).

In an embodiment, the thickness of the top sacrificial layer 63 is between 10 nm and 3500 nm. In another embodiment, the optimized thickness of the top sacrificial layer 63 is between 10 nm and 1500 nm.

Please refer to FIG. 3, which shows the cross-sectional view of another embodiment of the integrated structure of power amplifier and acoustic wave device of the present invention. The main structure in FIG. 3 is basically the same as the structure shown in FIG. 1, except that the power amplifier 20 is a pseudomorphic high electron mobility transistor 40 (pHEMT). The epitaxial structure 13 includes: a buffer layer 41, a channel layer 42, a Schottky layer 43 and a cap layer 44; wherein the buffer layer 41 is formed on the compound semiconductor substrate 12; the channel layer 42 is formed on the buffer layer 41; the Schottky layer 43 is formed on the channel layer 42; the cap layer 44 is formed on the Schottky layer 43. The first side 101 of the compound semiconductor epitaxial substrate 10 further comprises a gate recess 451; the bottom of the gate recess 451 is the Schottky layer 43; wherein the power amplifier upper structure 21 includes: a drain electrode 47, a source electrode 46 and a gate electrode 45; wherein the drain electrode 47 is formed on one end of the cap layer 44; the source electrode 46 is formed on the other end of the cap layer 44, wherein the gate recess 451 is located between the drain electrode 47 and the source electrode 46; the gate electrode 45 is formed on the Schottky layer 43 within the gate recess 451; thereby the first side 101 of the compound semiconductor epitaxial substrate 10 includes: the compound semiconductor substrate 12, the buffer layer 41, the channel layer 42, the Schottky layer 43, the cap layer 44 and the gate recess 451; wherein the first side 101 of the compound semiconductor epitaxial substrate 10 and the power amplifier upper structure 21 form the pseudomorphic high electron mobility transistor 40. The acoustic wave device 50 in FIG. 3 is basically the same as the acoustic wave device 50 in FIG. 1. The substrate recess 15 of the second side 102 of the compound semiconductor epitaxial substrate 10 is peripherally surrounded by the buffer layer 41, the channel layer 42, the Schottky layer 43 and the cap layer 44; and the bottom of the substrate recess 15 is the buffer layer 41. The second side 102 of the compound semiconductor epitaxial substrate 10 and the film bulk acoustic resonator 51 form the acoustic wave device 50.

In an embodiment, the buffer layer 41 is made of GaAs, $SiO_2$ or GaN and is formed on the compound semiconductor substrate 12 by epitaxial growth.

In an embodiment, the compound semiconductor substrate 12 is made of GaAs, while the buffer layer 41 is preferable to be made of GaAs. In another embodiment, the compound semiconductor substrate 12 is made of Sapphire, while the buffer layer 41 is preferable to be made of GaN.

Figure 3A:
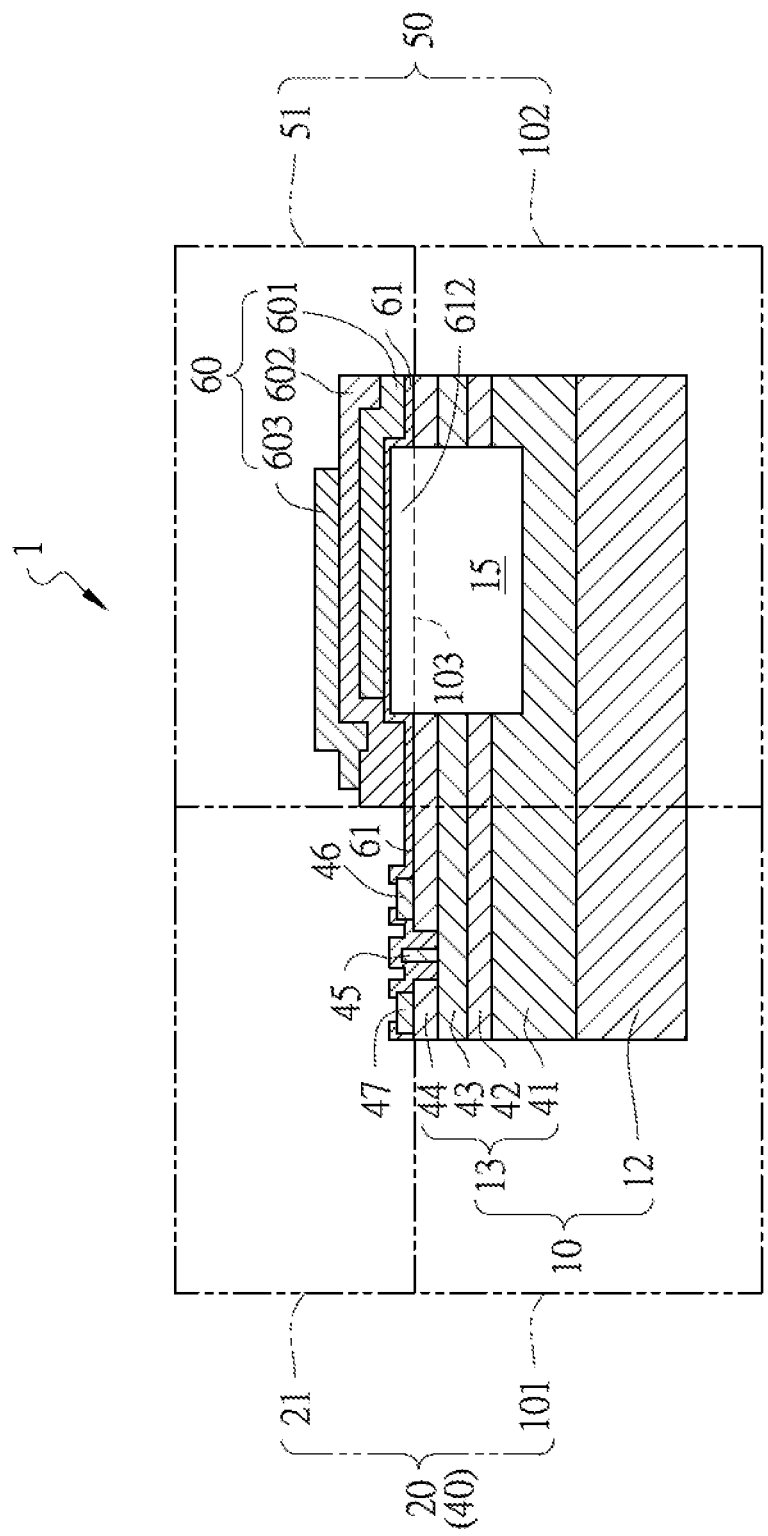

Please refer to FIG. 3A, which shows the cross-sectional view of another embodiment of the integrated structure of power amplifier and acoustic wave device of the present invention. The main structure in FIG. 3A is basically the same as the structure shown in FIG. 3, except that the pseudomorphic high electron mobility transistor 40 further comprises the supporting layer 61. The supporting layer 61 plays a role of protection, and may prevent the pseudomorphic high electron mobility transistor 40 from oxidation or corrosion. In other embodiments having basically the same structure as the embodiment in FIG. 3, the power amplifier 20 may also include the supporting layer 61.

Figure 3B:
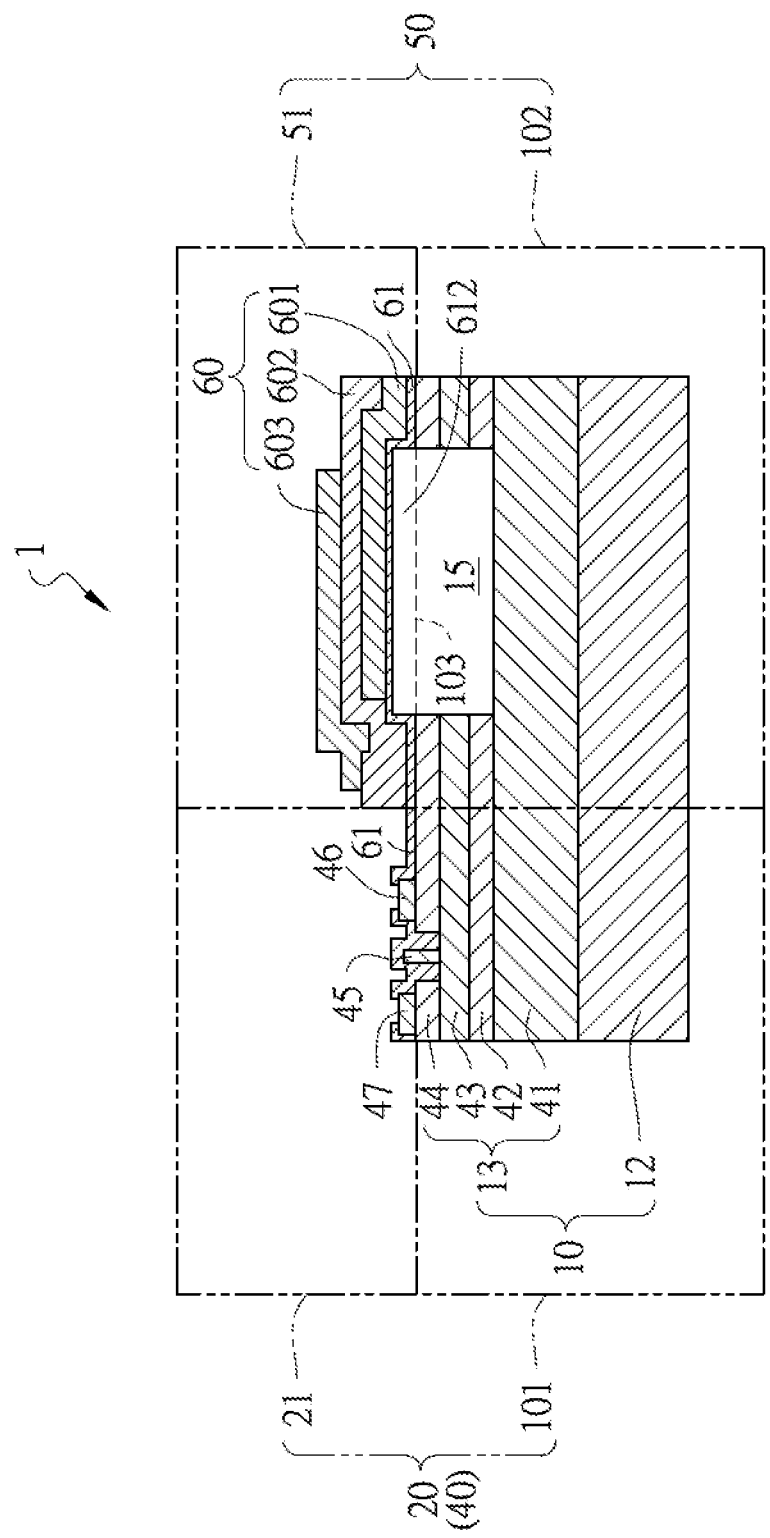

Please refer to FIG. 3B, which shows the cross-sectional view of another embodiment of the integrated structure of power amplifier and acoustic wave device of the present invention. The main structure in FIG. 3B is basically the same as the structure shown in FIG. 3, except that the substrate recess 15 of the second side 102 of the compound semiconductor epitaxial substrate 10 is peripherally surrounded by the channel layer 42, the Schottky layer 43 and the cap layer 44, and the bottom of the substrate recess 15 is the buffer layer 41. The power amplifier 20 may also include the supporting layer 61, or may choose not to include the supporting layer 61.

Figure 3C:
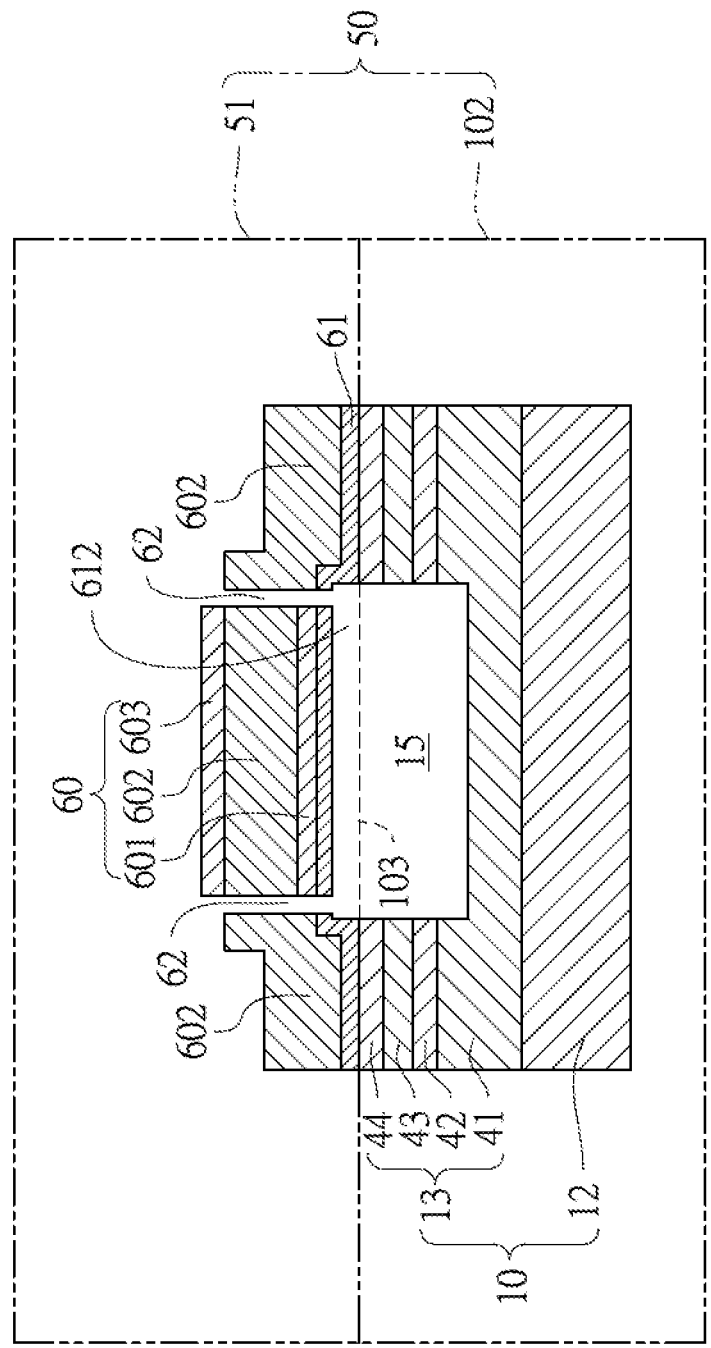

Please refer to FIG. 3C, which shows the cross-sectional view of another embodiment of the integrated structure of power amplifier and acoustic wave device of the present invention. The main structure in FIG. 3C is basically the same as the structure shown in FIG. 3, except that the film bulk acoustic resonator 51 further comprises at least one etching recess 62. The cross-sectional direction of FIG. 3C is orthogonal to that of FIG. 3. And there is only the acoustic wave device 50 at the position of the cross-sectional direction of FIG. 3C, hence there is no power amplifier 20 shown in FIG. 3C. One end of the at least one etching recess 62 is communicated with the supporting layer recess 612, the other end of the at least one etching recess 62 penetrates the supporting layer 61 or penetrates both the supporting layer 61 and the bulk acoustic resonator structure 60 such that the at least one etching recess 62 is communicated with the outside, and thereby the supporting layer recess 612 is communicated with the outside. The feature of the at least one etching recess 62 of the embodiment in FIG. 3C is basically the same as that of the embodiment in FIG. 1B. The power amplifier 20 may also include the supporting layer 61, or may choose not to include the supporting layer 61.

Please refer to FIGS. 3A and 3C. The cross-sectional direction of FIG. 3C is orthogonal to that of FIG. 3A. And there is only the acoustic wave device 50 at the position of the cross-sectional direction of FIG. 3C, hence there is no power amplifier 20 shown in FIG. 3C. The present invention provides a fabrication method for integrated structure of power amplifier and acoustic wave device. The fabrication method for the embodiment of FIGS. 3A and 3C comprises following steps of: Step C1: forming an epitaxial structure 13 on a compound semiconductor substrate 12 to form a compound semiconductor epitaxial substrate 10; Step C2: forming a power amplifier upper structure 21 on a first side 101 of the compound semiconductor epitaxial substrate 10 to form a power amplifier 20, wherein the power amplifier 20 is a pseudomorphic high electron mobility transistor 40; and Step C3: forming a film bulk acoustic resonator 51 on a second side 102 of the compound semiconductor epitaxial substrate 10 to form an acoustic wave device 50; wherein, the integrated structure 1 of the power amplifier 20 and the acoustic wave device 50 on the same the compound semiconductor epitaxial substrate 10 is capable of reducing the component size, optimizing the impedance matching, and reducing the signal loss between the power amplifier 20 and the acoustic wave device 50. Step C1 includes following steps of: Step C11: (Please referring to FIG. 3D) forming a buffer layer 41 on the compound semiconductor substrate 12; Step C12: forming a channel layer 42 on the buffer layer 41; Step C13: forming a Schottky layer 43 on the channel layer 42; and Step C14: forming a cap layer 44 on the Schottky layer 43. Step C2 includes following steps of: Step C21: (Please referring to FIG. 3E) defining a gate electrode etching area, and etching to remove the cap layer 44 within the gate electrode etching area such that the etching stops at the Schottky layer 43 to form a gate recess 451, thereby the Schottky layer 43 within the gate recess 451 is exposed; Step C22: (Please referring to FIG. 3F) forming a drain electrode 47 on one end of the cap layer 44; Step C23: forming a source electrode 46 on the other end of the cap layer 44, wherein the gate recess 451 is located between the drain electrode 47 and the source electrode 46; and Step C24: forming a gate electrode 45 on the Schottky layer 43 within the gate recess 451. Step C3 includes following steps of: Step C31: (Please referring to FIG. 3G) forming a top sacrificial layer 63 on the compound semiconductor epitaxial substrate 10 (the cap layer 44); Step C32: defining a top sacrificial layer etching area, and etching to remove the top sacrificial layer 63 within the top sacrificial layer etching area to form a top sacrificial layer mesa 632, such that the compound semiconductor epitaxial substrate 10 (the cap layer 44) within the top sacrificial layer etching area is exposed; Step C33: (Please referring to FIGS. 3H and 3I) forming a supporting layer 61 on the top sacrificial layer 63 and the compound semiconductor epitaxial substrate 10 (the cap layer 44), wherein the supporting layer 61 has a supporting layer mesa 611 right above the top sacrificial layer mesa 632; wherein the supporting layer 61 may also be formed on the gate electrode 45, the source electrode 46, the drain electrode 47 and the gate recess 451, where the supporting layer 61 plays a role of protection; Step C34: forming a bulk acoustic resonator structure 60 on the supporting layer 61, which includes following steps of: Step C341: (Please referring to FIG. 3J) forming a bottom electrode 601 on one end of the supporting layer 61, where the bottom electrode 601 is formed on and at least extended along the supporting layer mesa 611; Step C342: (Please referring to FIG. 3K) forming a dielectric layer 602, wherein the dielectric layer 602 is formed at least on the bottom electrode 601 above the supporting layer mesa 611; and Step C343: (Please referring to FIG. 3L) forming a top electrode 603, wherein the top electrode 603 is formed on the other end with respect to the bottom electrode 601, where the top electrode 603 is formed on the dielectric layer 602 or formed on both the dielectric layer 602 and the supporting layer 61, and the top electrode 603 is formed on and at least extended along the dielectric layer 602 above the supporting layer mesa 611; Step C35: defining at least one recess etching area, and etching to remove the supporting layer 61 within the at least one recess etching area or etching to remove the supporting layer 61 and the bulk acoustic resonator structure 60 within the at least one recess etching area such that the etching stops at the top sacrificial layer mesa 632 and/or the compound semiconductor epitaxial substrate 10 (the cap layer 44) to form at least one etching recess 62, thereby part of the top sacrificial layer mesa 632 is exposed (Please referring to FIGS. 3L and 3M, wherein the cross-sectional direction of FIG. 3M is orthogonal to that of FIG. 3L, and there is only the acoustic wave device 50 at the position of the cross-sectional direction of FIG. 3M, hence there is no power amplifier 20 shown in FIG. 3M); Step C36: etching to remove the top sacrificial layer mesa 632 to form a supporting layer recess 612, wherein at least one top sacrificial layer etching solution contacts with the top sacrificial layer mesa 632 via the at least one etching recess 62 and etches to remove the top sacrificial layer mesa 632, thereby the top and the bottom of the supporting layer recess 612 are the supporting layer 61 and the compound semiconductor epitaxial substrate 10 (the cap layer 44) respectively (Please referring to FIGS. 3N and 3O, wherein the cross-sectional direction of FIG. 3O is orthogonal to that of FIG. 3N, and there is only the acoustic wave device 50 at the position of the cross-sectional direction of FIG. 3O, hence there is no power amplifier 20 shown in FIG. 3O); and Step C37: etching to remove part of the compound semiconductor epitaxial substrate 10 below the supporting layer recess 612 to form a substrate recess 15 (Please referring to FIGS. 3A and 3C, wherein the cross-sectional direction of FIG. 3C is orthogonal to that of FIG. 3A, and there is only the acoustic wave device 50 at the position of the cross-sectional direction of FIG. 3C, hence there is no power amplifier 20 shown in FIG. 3C), wherein at least one substrate recess etching solution contacts with the top surface of the compound semiconductor epitaxial substrate 10 (the cap layer 44) via the at least one etching recess 62 and the supporting layer recess 612, the at least one substrate recess etching solution is uniformly distributed on the top surface of the compound semiconductor epitaxial substrate 10 (the cap layer 44) through the supporting layer recess 612 so as to uniformly etch part of the compound semiconductor epitaxial substrate 10 below the supporting layer recess 612 to form the substrate recess 15, and thereby prevents the side etching phenomenon during the etching, wherein the supporting layer recess 612 is communicated with the substrate recess 15, and the supporting layer recess 612 and the substrate recess 15 have a boundary 103 therebetween and the boundary 103 is the extended from the top surface of the compound semiconductor epitaxial substrate 10, wherein the gap between the supporting layer mesa 611 and the bottom of the substrate recess 15 is increased by the communication of the supporting layer recess 612 and the substrate recess 15, so as to avoid the contact of the supporting layer mesa 611 and the bottom of the substrate recess 15 when the film bulk acoustic resonator 51 is affected by stress such that the supporting layer mesa 611 is bended downwardly; thereby the first side 101 of the compound semiconductor epitaxial substrate 10 includes: the compound semiconductor substrate 12, the buffer layer 41, the channel layer 42, the Schottky layer 43, the cap layer 44 and the gate recess 451; the power amplifier upper structure 21 includes: the drain electrode 47, the source electrode 46 and the gate electrode 45; wherein the first side 101 of the compound semiconductor epitaxial substrate 10 and the power amplifier upper structure 21 form the pseudomorphic high electron mobility transistor 40; wherein the bottom of the substrate recess 15 is the compound semiconductor epitaxial substrate 10 (the buffer layer 41), and the substrate recess 15 is peripherally surrounded by the channel layer 42, the Schottky layer 43 and the cap layer 44 or by the buffer layer 41, the channel layer 42, the Schottky layer 43 and the cap layer 44 (Please referring to FIG. 3B).

Figure 4:
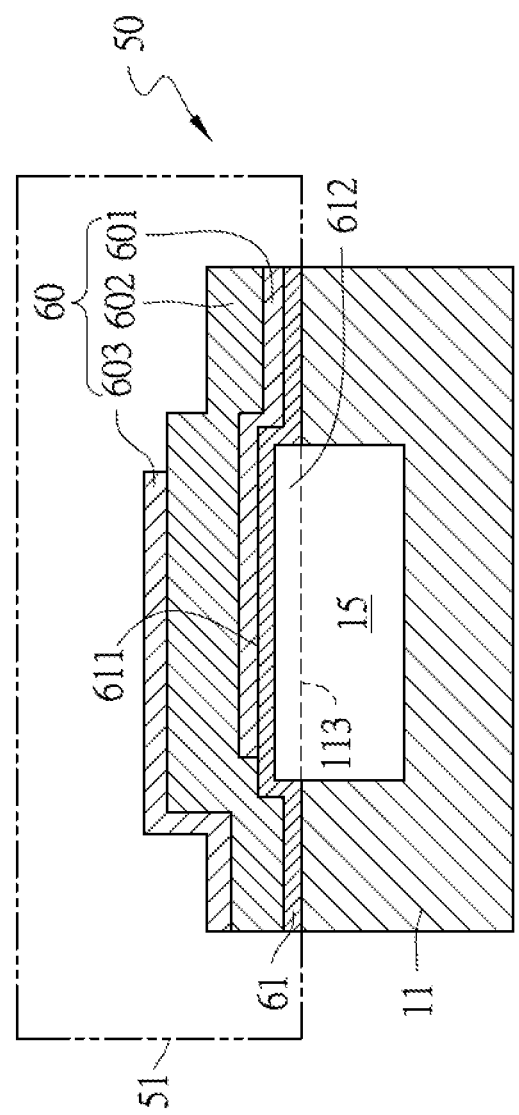

Please refer to FIG. 4, the cross-sectional view of an embodiment of the improved acoustic wave device structure of the present invention, the improved acoustic wave device structure comprises: a substrate 11 and a film bulk acoustic resonator 51; wherein the substrate 11 has a substrate recess 15 on the top of the substrate 11; the film bulk acoustic resonator 51 is formed on the substrate 11; wherein the film bulk acoustic resonator 51 includes: a supporting layer 61 and a bulk acoustic resonator structure 60; wherein supporting layer 61 is formed on the substrate 11, wherein the supporting layer 61 has a supporting layer recess 612 on the bottom of the supporting layer 61, the supporting layer 61 has an upwardly protruding supporting layer mesa 611 right above the supporting layer recess 612, and the supporting layer recess 612 is located right above the substrate recess 15, the supporting layer recess 612 is communicated with the substrate recess 15, and the supporting layer recess 612 and the substrate recess 15 have a boundary 113 therebetween and the boundary 113 is the extended from the top surface of the substrate 11; the bulk acoustic resonator structure 60 is formed on the supporting layer 61, wherein the bulk acoustic resonator structure 60 includes: a bottom electrode 601, a dielectric layer 602 and a top electrode 603. The bottom electrode 601 is formed on one end of the supporting layer 61, where the bottom electrode 601 is formed on and at least extended along the supporting layer mesa 611. The dielectric layer 602 is formed at least on the bottom electrode 601 above the supporting layer mesa 611. In the embodiment of FIG. 4, the dielectric layer 602 is formed on both the bottom electrode 601 and the supporting layer 61, and the dielectric layer 602 is also formed on the bottom electrode 601 above the supporting layer mesa 611. Please also refer to FIG. 4A, which shows the cross-sectional view of another embodiment of the improved acoustic wave device structure of the present invention. The main structure in FIG. 4A is basically the same as the structure shown in FIG. 4, except that the dielectric layer 602 is formed on the bottom electrode 601 above the supporting layer mesa 611 and on a small part of the supporting layer 61 above the supporting layer mesa 611. The top electrode 603 is formed on the other end with respect to the bottom electrode 601, where the top electrode 603 is formed on the dielectric layer 602 or formed on both the dielectric layer 602 and the supporting layer 61, and the top electrode 603 is formed on and at least extended along the dielectric layer 602 above the supporting layer mesa 611. In the embodiment of FIG. 4, the top electrode 603 is formed on the dielectric layer 602, while in embodiment of FIG. 4A, the top electrode 603 is formed on both the dielectric layer 602 and the supporting layer 61. The top electrode 603 and the bottom electrode 601 are not electrically connected. The gap between the supporting layer mesa 611 and the bottom of the substrate recess 15 is increased by the communication of the supporting layer recess 612 and the substrate recess 15, so as to avoid the contact of the supporting layer mesa 611 and the bottom of the substrate recess 15 when the film bulk acoustic resonator 51 is affected by stress such that the supporting layer mesa 611 is bended downwardly.

In an embodiment, the application of the acoustic wave device 50 may be a filter. Usually plural acoustic wave devices 50 are in series and/or in parallel in the combination of circuit to form a filter which may filter the signal.

In one embodiment, the application of the acoustic wave device 50 may be a mass sensing device, a biomedical sensing device, an UV sensing device, a pressure sensing device or a temperature sensing device.

In an embodiment, the function of the supporting layer 61 may be the supporting for the film bulk acoustic resonator 51 for preventing the film bulk acoustic resonator 51 from collapsing. The supporting layer 61 also may be the seed layer for the bottom electrode 601 and the dielectric layer 602 for improving the crystalline quality. In an embodiment, the supporting layer 61 is made of $SiN_x$ or AlN. The supporting layer 61 is formed on the substrate 11 by molecular beam epitaxy (MBE), sputtering or chemical vapor deposition (CVD).

In an embodiment, the bottom electrode 601 is needed to have a lower roughness and resistivity for benefit the preferable crystal growth axis. In an embodiment, the bottom electrode 601 is made of Mo, Pt, Al, Au, W or Ru. The bottom electrode 601 is formed on the supporting layer 61 by evaporation or sputtering.

In an embodiment, the dielectric layer 602 is made of AlN, monocrystalline $SiO_2$, ZnO, $HfO_2$, barium strontium titanate (BST) or lead zirconate titanate (PZT), and is formed on the bottom electrode 601 or formed on both the electrode 601 and the supporting layer 61 by epitaxial growth or sputtering. The selection of the materials of the dielectric layer 602 is associated with the application. AlN is a high acoustic wave velocity material (12000 m/s) and is suitable for high frequency application, and after the formation of the micro structure of the material, it has good physical and chemical stability and its properties are not easily to be influenced by the circumstance. ZnO may be formed under lower temperature and it has an acoustic wave velocity 6000 m/s. Its electromechanical coupling coefficient is higher (8.5%) and it is suitable for the application of broadband filter. However when forming ZnO, the concentration of oxygen vacancies in ZnO is not easily controlled, yet it is easily influenced by the humidity and oxygen of the circumstance. Both barium strontium titanate (BST) and lead zirconate titanate (PZT) are ferroelectric materials. Their dielectric constant may vary under external electric field. Hence, they are suitable for the application of acoustic wave device with tunable frequency within dozen MHz range of frequencies. Both barium strontium titanate (BST) and lead zirconate titanate (PZT) need to be polarized under high voltage electric field in order to obtain their piezoelectric characteristics. Lead zirconate titanate (PZT) has higher electromechanical coupling coefficient, however it contains lead.

In an embodiment, the top electrode 603 is needed to have a lower resistivity for reducing power loss so as to reduce the insertion loss. In an embodiment, the top electrode 603 may be made of Mo, Pt, Al, Au, W or Ru. The top electrode 603 is formed on the dielectric layer 602 or is formed on both the dielectric layer 602 and the supporting layer 61 by evaporation or sputtering.

In an embodiment, the bottom electrode 601 is made of Mo or Pt, while the dielectric layer 602 is made of AlN. The Mo of the bottom electrode 601 may be etched by Lithography and Lift-off process. And the AlN of the dielectric layer 602 may be etched by inductively coupled plasma (ICP) process with $CF_4$ plasma.

In an embodiment, the depth of the substrate recess 15 is between 50 nm and 10000 nm.

In an embodiment, the depth of the supporting layer recess 612 is between 10 nm and 3500 nm. In another embodiment, the optimized depth of the supporting layer recess 612 is between 10 nm and 1500 nm.

Please refer to FIG. 4B, which shows the cross-sectional view of another embodiment of the improved acoustic wave device structure of the present invention. The main structure in FIG. 4B is basically the same as the structure shown in FIG. 4, except that the film bulk acoustic resonator 51 further comprises at least one etching recess 62. The cross-sectional direction of FIG. 4B is orthogonal to that of FIG. 4. One end of the at least one etching recess 62 is communicated with the supporting layer recess 612, the other end of the at least one etching recess 62 penetrates the supporting layer 61 or penetrates both the supporting layer 61 and the bulk acoustic resonator structure 60 such that the at least one etching recess 62 is communicated with the outside, and thereby the supporting layer recess 612 is communicated with the outside.

Figure 4C:
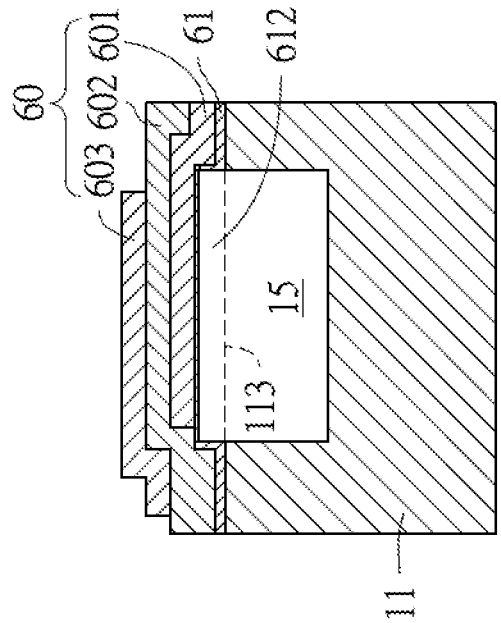
FIGS. 4C and 4D are the partial enlarged cross-sectional views of embodiments of the improved acoustic wave device structure of the present invention.
Figure 4D:
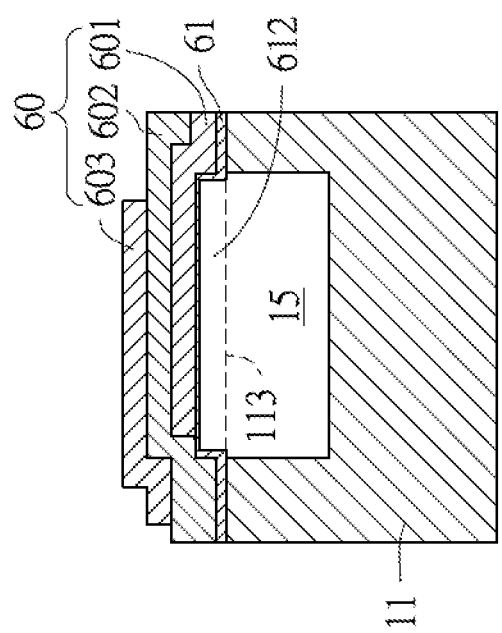

Please refer to FIG. 4C, which shows the partial enlarged cross-sectional view of an embodiment of the improved acoustic wave device structure of the present invention. In the embodiment of FIG. 4C, the supporting layer recess 612 has an opening smaller than that of the substrate recess 15. Please refer to FIG. 4D, which shows the partial enlarged cross-sectional view of another embodiment of the improved acoustic wave device structure of the present invention. In the embodiment of FIG. 4D, the supporting layer recess 612 has an opening almost equal to that of the substrate recess 15.

Please refer to FIGS. 4E, 4F, 4G and 4H, which show the top views of the relative position of the etching recess and the supporting layer mesa in the embodiments of the improved acoustic wave device structure of the present invention. In the embodiment of FIG. 4E, the improved acoustic wave device structure 50 has two etching recess 62 with long strip opening. The two etching recesses 62 are located on two opposite sides of the supporting layer mesa 611 respectively. And the etching recesses 62 penetrate the supporting layer 61 (not shown in FIG. 4E), and thereby the supporting layer recess 612 (not shown in FIG. 4E) is communicated with the outside. In the embodiment of FIG. 4F, the improved acoustic wave device structure 50 has two etching recess 62 with long strip opening. The two etching recesses 62 are located on two opposite sides of the supporting layer mesa 611 respectively. (part of the etching recesses 62 are within the supporting layer mesa 611, the rest part of the etching recesses 62 are outside the supporting layer mesa 611) And the etching recesses 62 penetrate the supporting layer 61 (not shown in FIG. 4F) and the dielectric layer 602. In the embodiment of FIG. 4G, the improved acoustic wave device structure 50 has two etching recess 62 with long strip opening. The two etching recesses 62 are located respectively on two opposite sides of the supporting layer mesa 611 within the supporting layer mesa 611. And the etching recesses 62 penetrate the supporting layer 61 (not shown in FIG. 4G), the bottom electrode 601, the dielectric layer 602 and the top electrode 603. In the embodiment of FIG. 4H, the improved acoustic wave device structure 50 has four etching recess 62 with square opening. The four etching recesses 62 are located on four corners of the supporting layer mesa 611 respectively. And the etching recesses 62 penetrate the supporting layer 61 (not shown in FIG. 4H). The amount of the etching recesses 62 is not limited to one, two, three, four or more. The etching recesses 62 may locate on other position and should not be limited by FIG. 4E, 4F, 4G or 4H.

Figure 5:
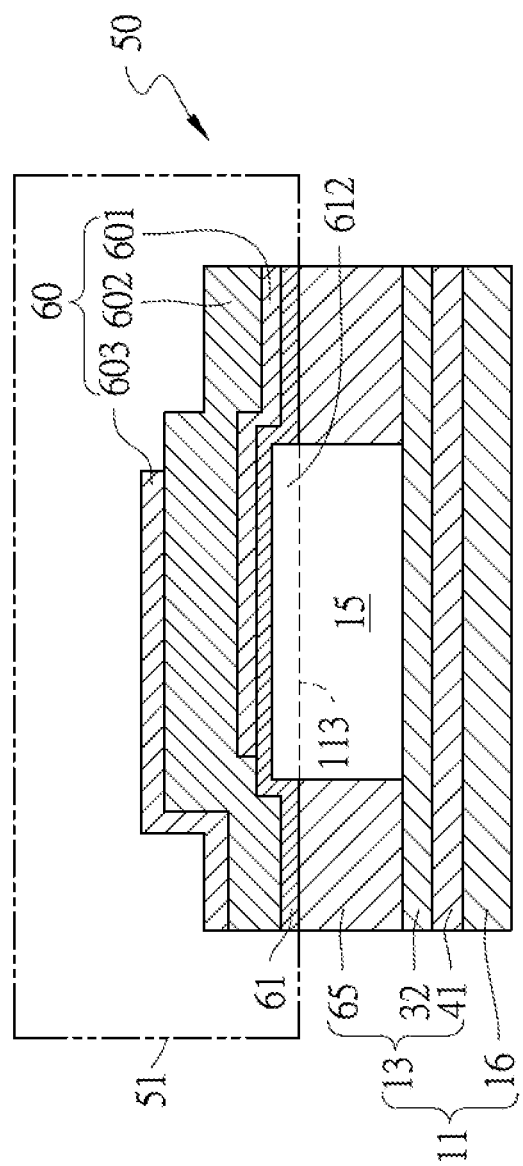
FIGS. 5 and 5A~5C are the cross-sectional views of embodiments of the improved acoustic wave device structure of the present invention.

Please refer to FIG. 5, which shows the cross-sectional view of another embodiment of the improved acoustic wave device structure of the present invention. The main structure in FIG. 5 is basically the same as the structure shown in FIG. 4, except that the substrate 11 includes a base substrate 16 and an epitaxial structure 13 formed on the base substrate 16. The epitaxial structure 13 includes: a buffer layer 41, an etching stop layer 32 and a bottom sacrificial layer 65; wherein the buffer layer 41 is formed on the base substrate 16; the etching stop layer 32 is formed on the buffer layer 41; the bottom sacrificial layer 65 is formed on the etching stop layer 32; wherein the substrate recess 15 is peripherally surrounded by the bottom sacrificial layer 65, and the bottom of the substrate recess 15 is the etching stop layer 32.

In an embodiment, the base substrate 16 may be made of GaAs, SiC, InP, GaN, AlN, Sapphire, Si or glass.

In an embodiment, the buffer layer 41 is made of GaAs, $SiO_2$ or GaN and is formed on the base substrate 16 by epitaxial growth.

In an embodiment, the base substrate 16 is made of GaAs, while the buffer layer 41 is preferable to be made of GaAs. In another embodiment, the base substrate 16 is made of Sapphire, while the buffer layer 41 is preferable to be made of GaN. In one embodiment, the base substrate 16 is made of Si, while the buffer layer 41 is preferable to be made of $SiO_2$.

In an embodiment, the etching stop layer 32 is made of InGaP. In one embodiment, the thickness of the etching stop layer 32 is between 5 nm and 1000 nm. In another embodiment, the optimized thickness of the etching stop layer 32 is 20 nm.

In an embodiment, the bottom sacrificial layer 65 is made of GaAs and is formed on the etching stop layer 32 by molecular beam epitaxy (MBE) or metal organic chemical vapor deposition (MOCVD). In another embodiment, the thickness of the bottom sacrificial layer 65 is between 500 nm and 3000 nm.

In an embodiment, the buffer layer 41 is made of GaAs, $SiO_2$ or GaN. The bottom sacrificial layer 65 is made of GaAs, Phosphosilicate glass (PSG) or Borophosphosilicate glass (BPSG). The etching stop layer 32 is made of InGaP, $SiN_x$, Pt, Al or Au.

In an embodiment, the bottom sacrificial layer 65 is made of GaAs; the etching stop layer 32 is made of InGaP; GaAs of the bottom sacrificial layer 65 may be etched by citric acid; and the etching may stop at InGaP of the etching stop layer 32. In another embodiment, the bottom sacrificial layer 65 is made of Phosphosilicate glass (PSG) or Borophosphosilicate glass (BPSG); the etching stop layer 32 is made of $SiN_x$, Pt, Al or Au.

Figure 5A:
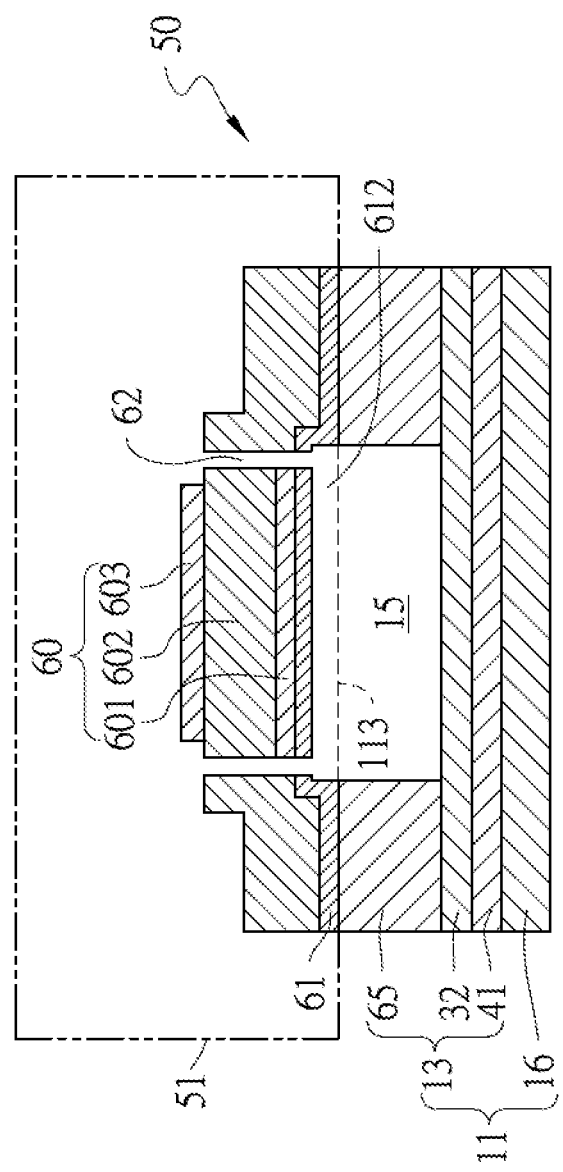

Please refer to FIG. 5A, which shows the cross-sectional view of another embodiment of the improved acoustic wave device structure of the present invention. The main structure in FIG. 5A is basically the same as the structure shown in FIG. 5, except that the film bulk acoustic resonator 51 further comprises at least one etching recess 62. The cross-sectional direction of FIG. 5A is orthogonal to that of FIG. 5. One end of the at least one etching recess 62 is communicated with the supporting layer recess 612, the other end of the at least one etching recess 62 penetrates the supporting layer 61 or penetrates both the supporting layer 61 and the bulk acoustic resonator structure 60 such that the at least one etching recess 62 is communicated with the outside, and thereby the supporting layer recess 612 is communicated with the outside. The feature of the at least one etching recess 62 of the embodiment in FIG. 5A is basically the same as that of the embodiment in FIG. 4B.

Figure 5C:
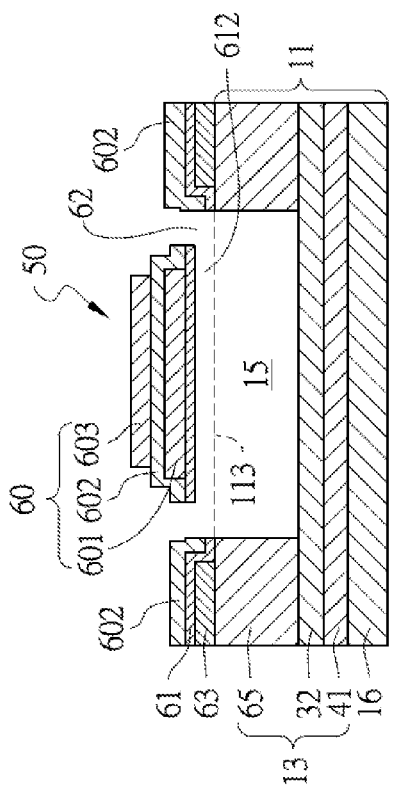
Figure 5B:
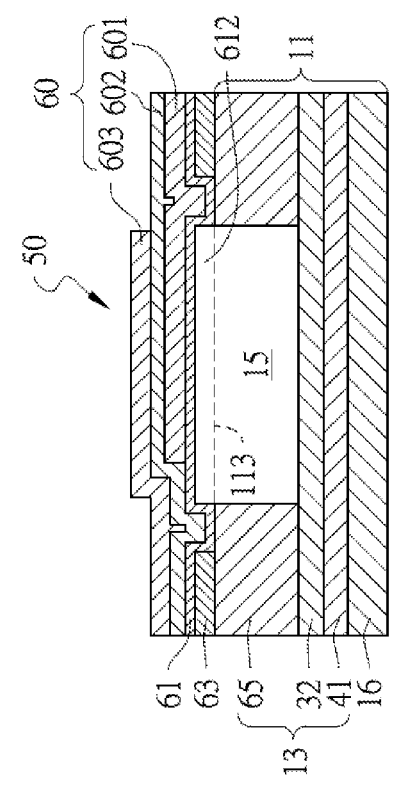
Figure 5E:
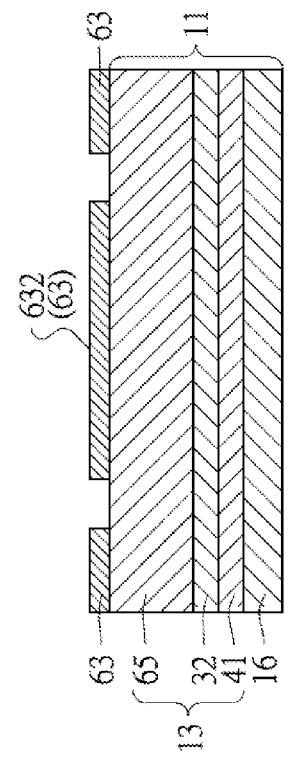
FIG. 5D~5M are the cross-sectional schematics showing steps of a fabrication method for the embodiments of the improved acoustic wave device structure of the present invention.
Figure 5D:
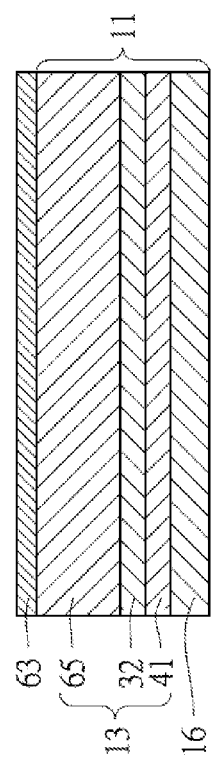
Figure 5F:
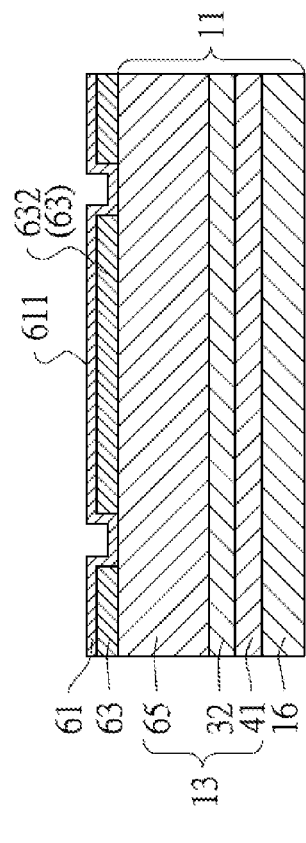
Figure 5G:
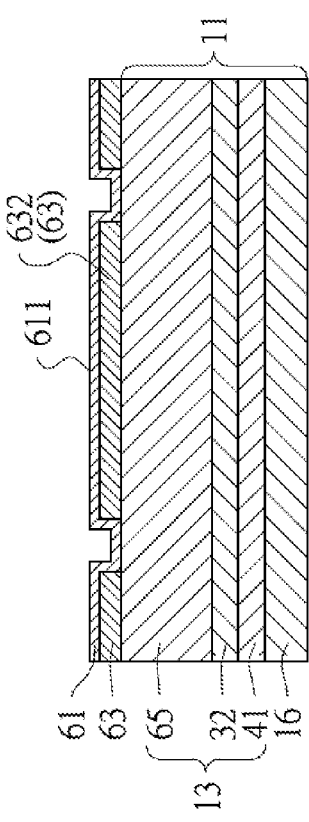
Figure 5H:
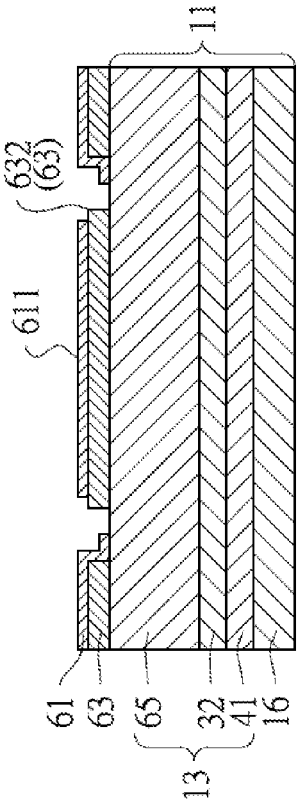
Figure 5I:
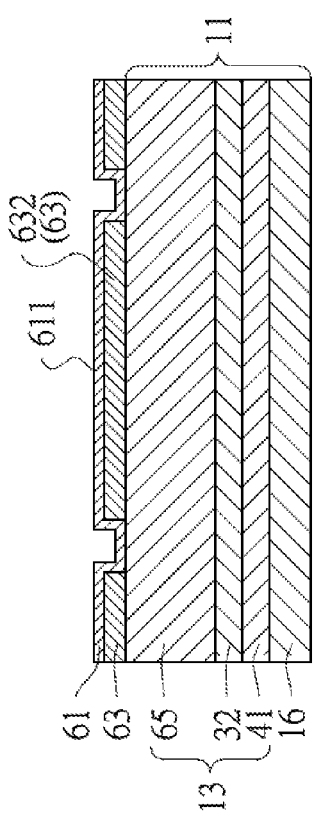
Figure 5J:
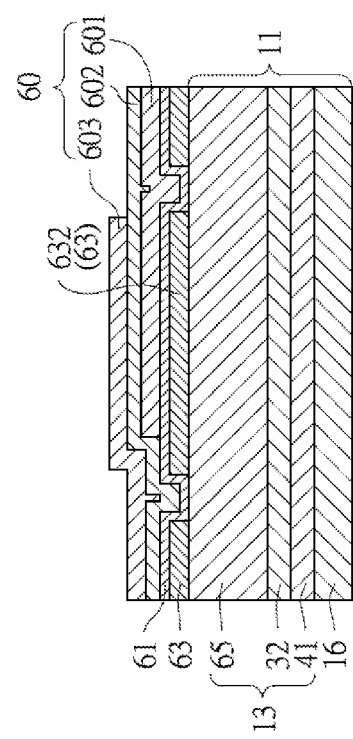
Figure 5K:
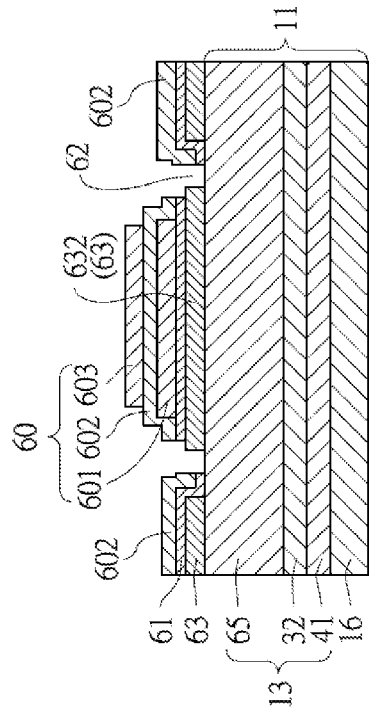
Figure 5L:
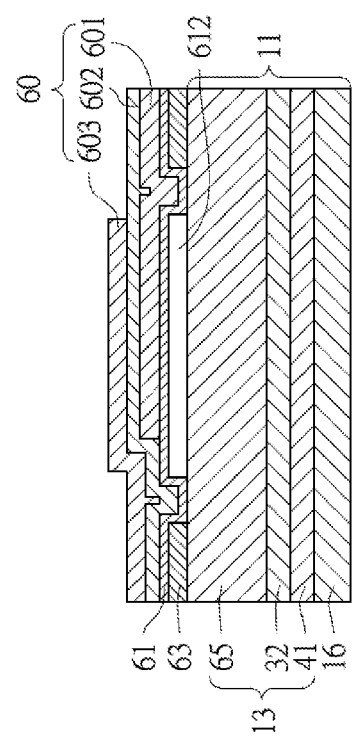
Figure 5M:
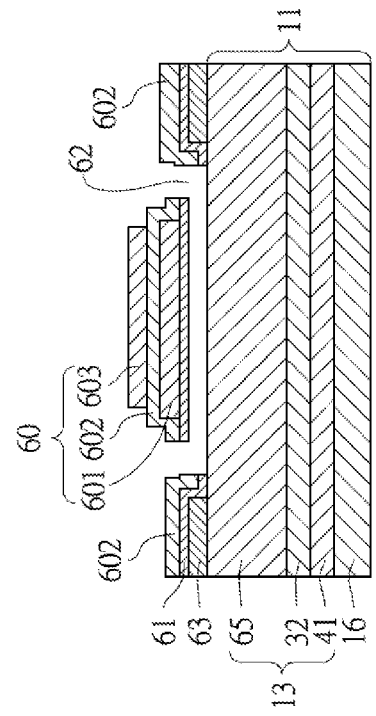

Please refer to FIGS. 5B and 5C. The cross-sectional direction of FIG. 5C is orthogonal to that of FIG. 5B. The present invention provides a fabrication method for improved acoustic wave device structure. The fabrication method for the embodiment of FIGS. 5B and 5C comprises following steps of: Step D1: forming an epitaxial structure 13 on a base substrate 16 to form a substrate 11; and Step D2: forming a film bulk acoustic resonator 51 on the substrate 11 (the epitaxial structure 13). Step D1 includes following steps of: Step D11: (Please referring to FIG. 5D) forming a buffer layer 41 on the base substrate 16; Step D12: forming an etching stop layer 32 on the buffer layer 41; and Step D13: forming a bottom sacrificial layer 65 on the etching stop layer 32; wherein the epitaxial structure 13 includes: the buffer layer 41, the etching stop layer 32 and the bottom sacrificial layer 65. Step D2 includes following steps of: Step D21: (Please referring to FIG. 5D) forming a top sacrificial layer 63 on the substrate 11 (the bottom sacrificial layer 65); Step D22: (Please referring to FIG. 5E) defining a top sacrificial layer etching area, and etching to remove the top sacrificial layer 63 within the top sacrificial layer etching area to form a top sacrificial layer mesa 632, such that the substrate 11 (the bottom sacrificial layer 65) within the top sacrificial layer etching area is exposed; Step D23: forming a supporting layer 61 on the top sacrificial layer 63 and the substrate 11 (the bottom sacrificial layer 65), wherein the supporting layer 61 has a supporting layer mesa 611 right above the top sacrificial layer mesa 632 (Please referring to FIGS. 5F and 5G, wherein the cross-sectional direction of FIG. 5G is orthogonal to that of FIG. 5F); wherein after Step D23, it may also choose to execute the step: defining a supporting layer etching area, and etching to remove the supporting layer 61 within the supporting layer etching area, such that the top sacrificial layer mesa 632 and/or the substrate 11 (the bottom sacrificial layer 65) within the supporting layer etching area are/is exposed (please also referring to FIGS. 5H and 5I, wherein the cross-sectional direction of FIG. 5I is orthogonal to that of FIG. 5H); Step D24: forming a bulk acoustic resonator structure 60 on the supporting layer 61 (Please referring to FIGS. 5J and 5K, wherein the cross-sectional direction of FIG. 5K is orthogonal to that of FIG. 5J), which includes following steps of: Step D241: forming a bottom electrode 601 on one end of the supporting layer 61, where the bottom electrode 601 is formed on and at least extended along the supporting layer mesa 611; Step D242: forming a dielectric layer 602, wherein the dielectric layer 602 is formed at least on the bottom electrode 601 above the supporting layer mesa 611; and Step D243: forming a top electrode 603, wherein the top electrode 603 is formed on the other end with respect to the bottom electrode 601, where the top electrode 603 is formed on the dielectric layer 602 or formed on both the dielectric layer 602 and the supporting layer 61, and the top electrode 603 is formed on and at least extended along the dielectric layer 602 above the supporting layer mesa 611; Step D25: defining at least one recess etching area, and etching to remove the supporting layer 61 within the at least one recess etching area or etching to remove the supporting layer 61 and the bulk acoustic resonator structure 60 within the at least one recess etching area such that the etching stops at the top sacrificial layer mesa 632 and/or the substrate 11 (the bottom sacrificial layer 65) to form at least one etching recess 62, thereby part of the top sacrificial layer mesa 632 is exposed; Step D26: etching to remove the top sacrificial layer mesa 632 to form a supporting layer recess 612, wherein at least one top sacrificial layer etching solution contacts with the top sacrificial layer mesa 632 via the at least one etching recess 62 and etches to remove the top sacrificial layer mesa 632, thereby the top and the bottom of the supporting layer recess 612 are the supporting layer 61 and the substrate 11 (the bottom sacrificial layer 65) respectively (Please referring to FIGS. 5L and 5M, wherein the cross-sectional direction of FIG. 5M is orthogonal to that of FIG. 5L); and Step D27: etching to remove part of the substrate 11 below the supporting layer recess 612 to form a substrate recess 15 (Please referring to FIGS. 5B and 5C, wherein the cross-sectional direction of FIG. 5C is orthogonal to that of FIG. 5B), wherein the substrate recess 15 is peripherally surrounded by the bottom sacrificial layer 65, and the bottom of the substrate recess 15 is the etching stop layer 32, wherein at least one substrate recess etching solution contacts with the top surface of the substrate 11 via the at least one etching recess 62 and the supporting layer recess 612, the at least one substrate recess etching solution is uniformly distributed on the top surface of the substrate 11 through the supporting layer recess 612 so as to uniformly etch part of the substrate 11 below the supporting layer recess 612 to form the substrate recess 15, and thereby prevents the side etching phenomenon during the etching, wherein the supporting layer recess 612 is communicated with the substrate recess 15, and the supporting layer recess 612 and the substrate recess 15 have a boundary 113 therebetween and the boundary 113 is the extended from the top surface of the substrate 11, wherein the gap between the supporting layer mesa 611 and the bottom of the substrate recess 15 is increased by the communication of the supporting layer recess 612 and the substrate recess 15, so as to avoid the contact of the supporting layer mesa 611 and the bottom of the substrate recess 15 when the film bulk acoustic resonator 51 is affected by stress such that the supporting layer mesa 611 is bended downwardly.

In an embodiment, the top sacrificial layer 63 is made of AlAs or TiW.

In an embodiment, the TiW of the top sacrificial layer 63 may be formed by sputtering on the epitaxial structure 13. TiW may be etched by $H_2O_2$.

In an embodiment, the AlAs of the top sacrificial layer 63 may be formed by molecular beam epitaxy (MBE) or metal organic chemical vapor deposition (MOCVD) on the epitaxial structure 13.

In an embodiment, the thickness of the top sacrificial layer 63 is between 10 nm and 3500 nm. In another embodiment, the optimized thickness of the top sacrificial layer 63 is between 10 nm and 1500 nm.

Figure 6A:
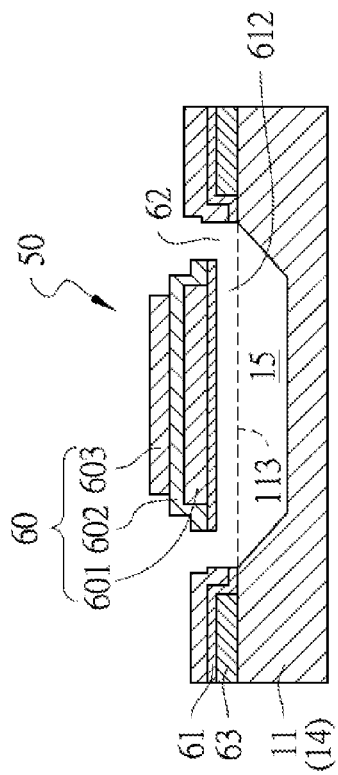
FIGS. 6 and 6A are the cross-sectional views of an embodiment of the improved acoustic wave device structure of the present invention.
Figure 6C:
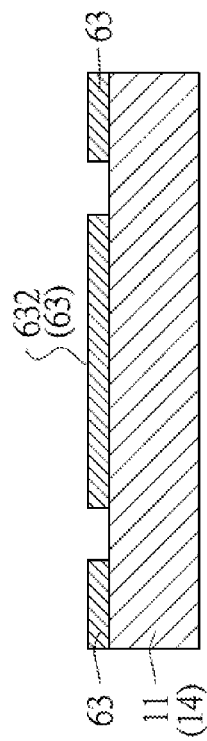
Figure 6:
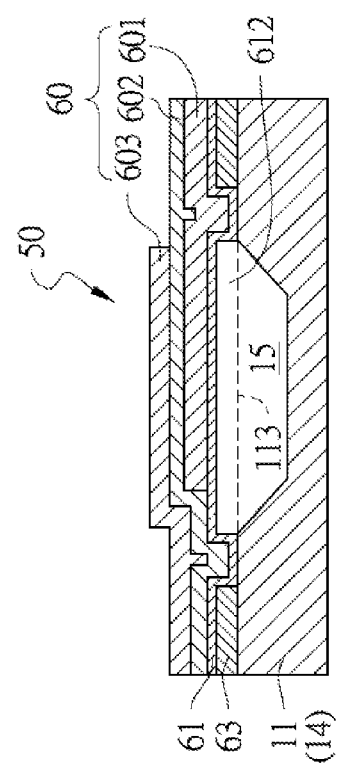

Please refer to FIG. 6, which shows the cross-sectional view of another embodiment of the improved acoustic wave device structure of the present invention. The main structure in FIG. 6 is basically the same as the structure shown in FIG. 4, except that the substrate 11 is a silicon substrate 14.

In another embodiment, the substrate 11 is a glass substrate.

Please refer to FIG. 6A, which shows the cross-sectional view of another embodiment of the improved acoustic wave device structure of the present invention. The main structure in FIG. 6A is basically the same as the structure shown in FIG. 6, except that the film bulk acoustic resonator 51 further comprises at least one etching recess 62. The cross-sectional direction of FIG. 6A is orthogonal to that of FIG. 6. One end of the at least one etching recess 62 is communicated with the supporting layer recess 612, the other end of the at least one etching recess 62 penetrates the supporting layer 61 or penetrates both the supporting layer 61 and the bulk acoustic resonator structure 60 such that the at least one etching recess 62 is communicated with the outside, and thereby the supporting layer recess 612 is communicated with the outside. The feature of the at least one etching recess 62 of the embodiment in FIG. 6A is basically the same as that of the embodiment in FIG. 4B.

Figure 6B:
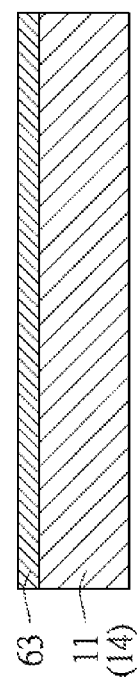
Figure 6H:
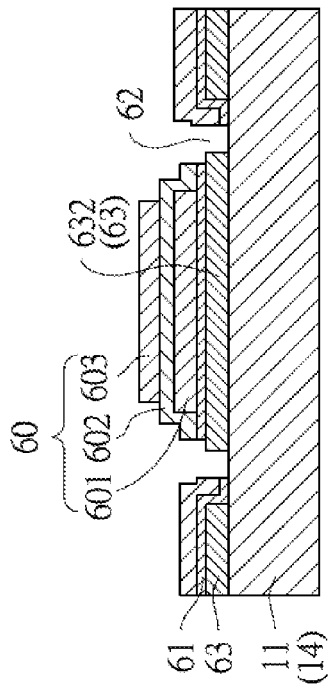
Figure 6I:
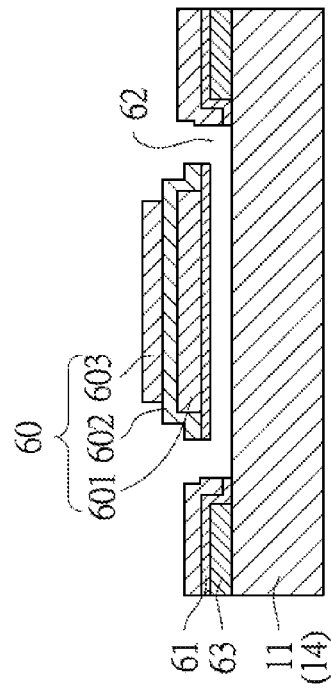
Figure 6J:
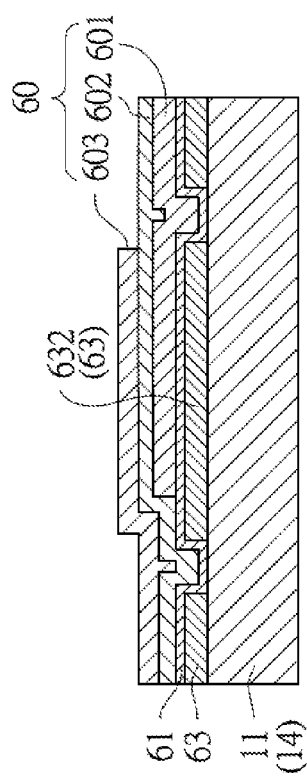
Figure 6K:
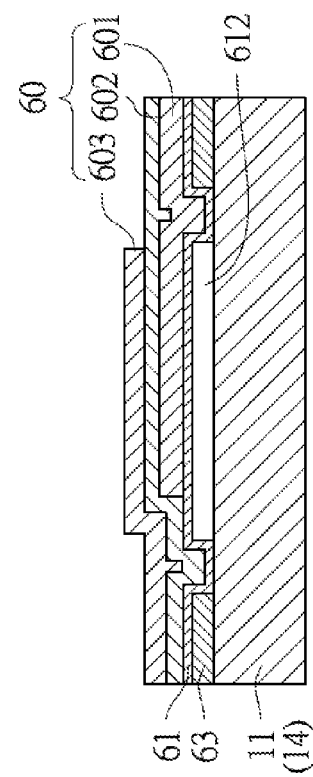

Please refer to FIGS. 6 and 6A. The cross-sectional direction of FIG. 6A is orthogonal to that of FIG. 6. The present invention provides a fabrication method for improved acoustic wave device structure. The fabrication method for the embodiment of FIGS. 6 and 6A comprises following steps of: Step E1: forming a film bulk acoustic resonator 51 on a substrate 11, which includes following steps of: Step E11: (Please referring to FIG. 6B) forming a top sacrificial layer 63 on the substrate 11, wherein the substrate 11 is a silicon substrate 14; Step E12: (Please referring to FIG. 6C) defining a top sacrificial layer etching area, and etching to remove the top sacrificial layer 63 within the top sacrificial layer etching area to form a top sacrificial layer mesa 632, such that the substrate 11 within the top sacrificial layer etching area is exposed; Step E13: forming a supporting layer 61 on the top sacrificial layer 63 and the substrate 11, wherein the supporting layer 61 has a supporting layer mesa 611 right above the top sacrificial layer mesa 632 (Please referring to FIGS. 6D and 6E, wherein the cross-sectional direction of FIG. 6E is orthogonal to that of FIG. 6D); wherein after Step E13, it may also choose to execute the step: defining a supporting layer etching area, and etching to remove the supporting layer 61 within the supporting layer etching area, such that the top sacrificial layer mesa 632 and/or the substrate 11 within the supporting layer etching area are/is exposed (please also referring to FIGS. 6F and 6G, wherein the cross-sectional direction of FIG. 6G is orthogonal to that of FIG. 6F); Step E14: forming a bulk acoustic resonator structure 60 on the supporting layer 61 (Please referring to FIGS. 6H and 6I, wherein the cross-sectional direction of FIG. 6I is orthogonal to that of FIG. 6H), which includes following steps of: Step E141: forming a bottom electrode 601 on one end of the supporting layer 61, where the bottom electrode 601 is formed on and at least extended along the supporting layer mesa 611; Step E142: forming a dielectric layer 602, wherein the dielectric layer 602 is formed at least on the bottom electrode 601 above the supporting layer mesa 611; and Step E143: forming a top electrode 603, wherein the top electrode 603 is formed on the other end with respect to the bottom electrode 601, where the top electrode 603 is formed on the dielectric layer 602 or formed on both the dielectric layer 602 and the supporting layer 61, and the top electrode 603 is formed on and at least extended along the dielectric layer 602 above the supporting layer mesa 611; Step E15: defining at least one recess etching area, and etching to remove the supporting layer 61 within the at least one recess etching area or etching to remove the supporting layer 61 and the bulk acoustic resonator structure 60 within the at least one recess etching area such that the etching stops at the top sacrificial layer mesa 632 and/or the substrate 11 to form at least one etching recess 62, thereby part of the top sacrificial layer mesa 632 is exposed; Step E16: etching to remove the top sacrificial layer mesa 632 to form a supporting layer recess 612, wherein at least one top sacrificial layer etching solution contacts with the top sacrificial layer mesa 632 via the at least one etching recess 62 and etches to remove the top sacrificial layer mesa 632, thereby the top and the bottom of the supporting layer recess 612 are the supporting layer 61 and the substrate 11 respectively (Please referring to FIGS. 6J and 6K, wherein the cross-sectional direction of FIG. 6K is orthogonal to that of FIG. 6J); and Step E17: etching to remove part of the substrate 11 below the supporting layer recess 612 to form a substrate recess 15 (Please referring to FIGS. 6 and 6A, wherein the cross-sectional direction of FIG. 6A is orthogonal to that of FIG. 6), wherein the bottom of the substrate recess 15 is the substrate 11, wherein at least one substrate recess etching solution contacts with the top surface of the substrate 11 via the at least one etching recess 62 and the supporting layer recess 612, the at least one substrate recess etching solution is uniformly distributed on the top surface of the substrate 11 through the supporting layer recess 612 so as to uniformly etch part of the substrate 11 below the supporting layer recess 612 to form the substrate recess 15, and thereby prevents the side etching phenomenon during the etching, wherein the supporting layer recess 612 is communicated with the substrate recess 15, and the supporting layer recess 612 and the substrate recess 15 have a boundary 113 therebetween and the boundary 113 is the extended from the top surface of the substrate 11, wherein the gap between the supporting layer mesa 611 and the bottom of the substrate recess 15 is increased by the communication of the supporting layer recess 612 and the substrate recess 15, so as to avoid the contact of the supporting layer mesa 611 and the bottom of the substrate recess 15 when the film bulk acoustic resonator 51 is affected by stress such that the supporting layer mesa 611 is bended downwardly.

In another embodiment, the substrate 11 is a silicon substrate 14, the top sacrificial layer 63 is made of TiW.

In an embodiment, the TiW of the top sacrificial layer 63 may be formed by sputtering on the substrate 11. TiW may be etched by $H_2O_2$.

In an embodiment, the thickness of the top sacrificial layer 63 is between 10 nm and 3500 nm. In another embodiment, the optimized thickness of the top sacrificial layer 63 is between 10 nm and 1500 nm.

Please refer to FIGS. 6M and 6N, which show the cross-sectional views of another embodiment of the improved acoustic wave device structure of the present invention, wherein the cross-sectional direction of FIG. 6N is orthogonal to that of FIG. 6M.

The main structure in FIGS. 6M and 6N is basically the same as the structure shown in FIGS. 6 and 6A, except that in Step E12 (Please compare FIGS. 6C and 6L), the top sacrificial layer 63 is etched and removed, except the top sacrificial layer mesa 632.

Figure 8A:
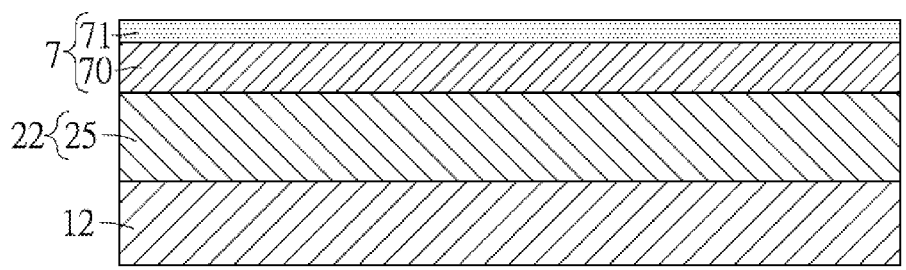
FIGS. 8A~8F are the cross-sectional schematics showing steps of an embodiment of a method for fabricating an integrated structure of acoustic wave device and varactor of the present invention.
Figure 8B:
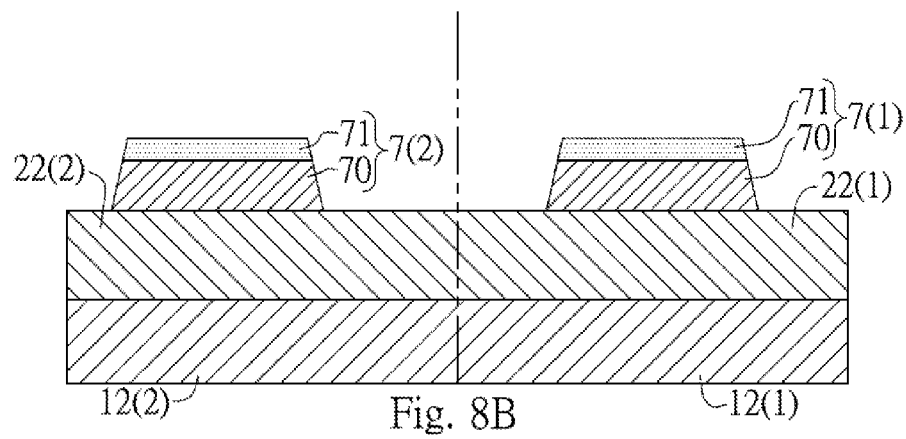
Figure 8C:
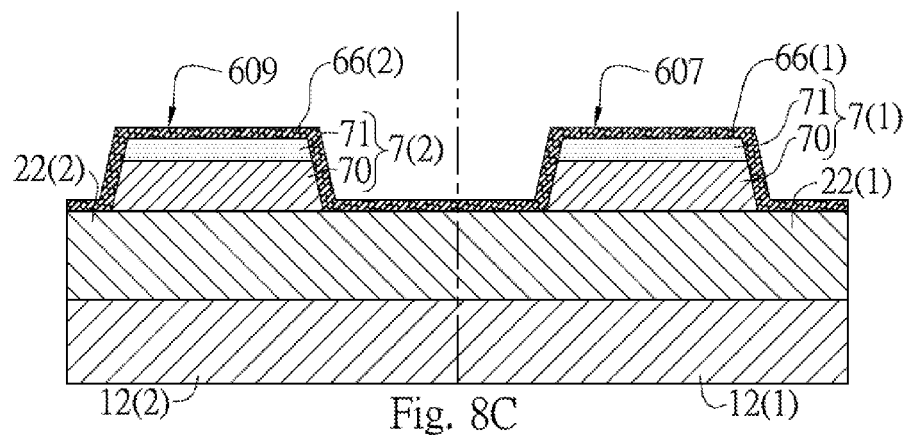
Figure 8D:
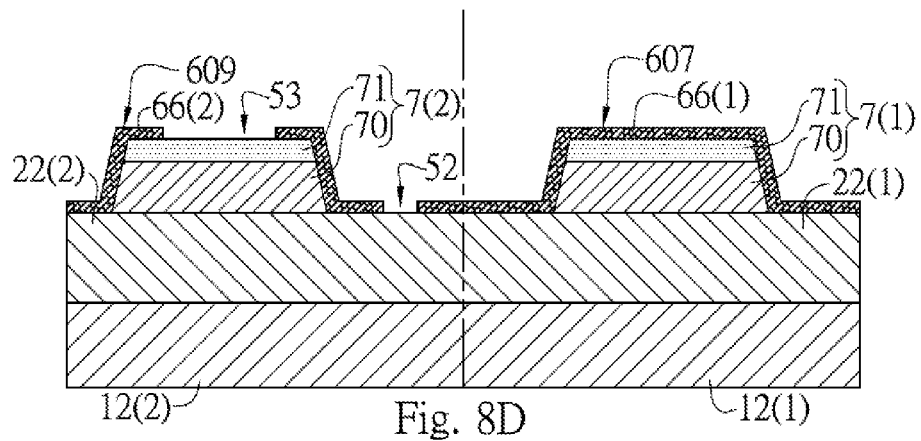
Figure 8E:
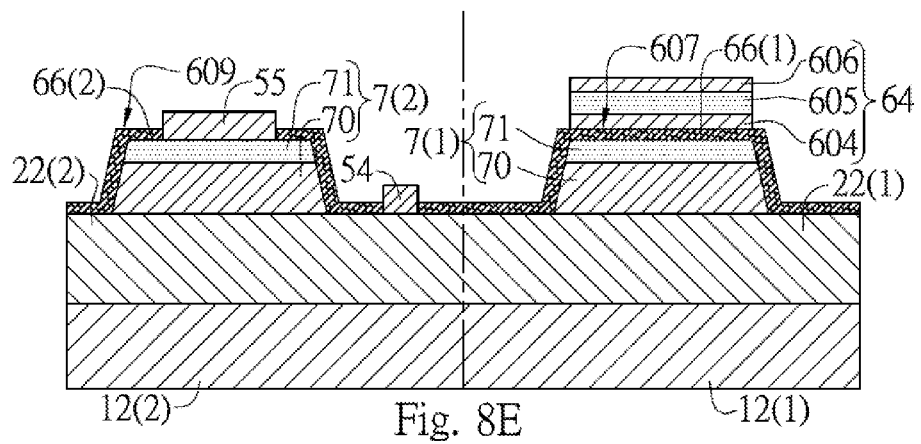
Figure 8F:
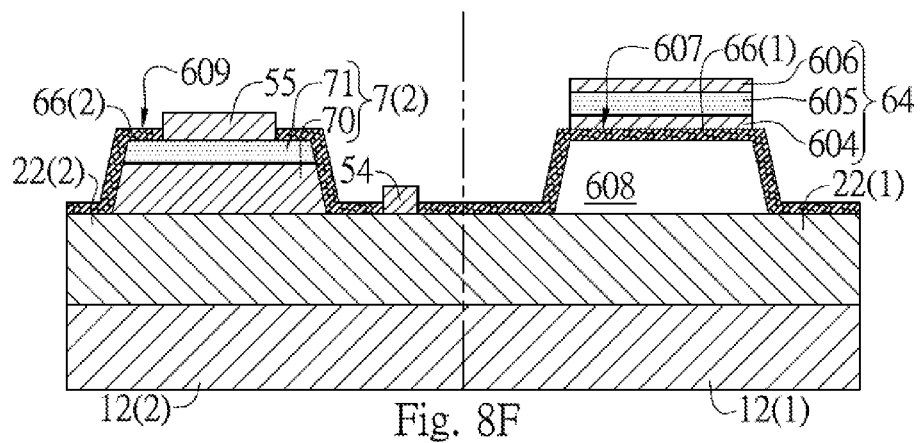
Figure 8G:
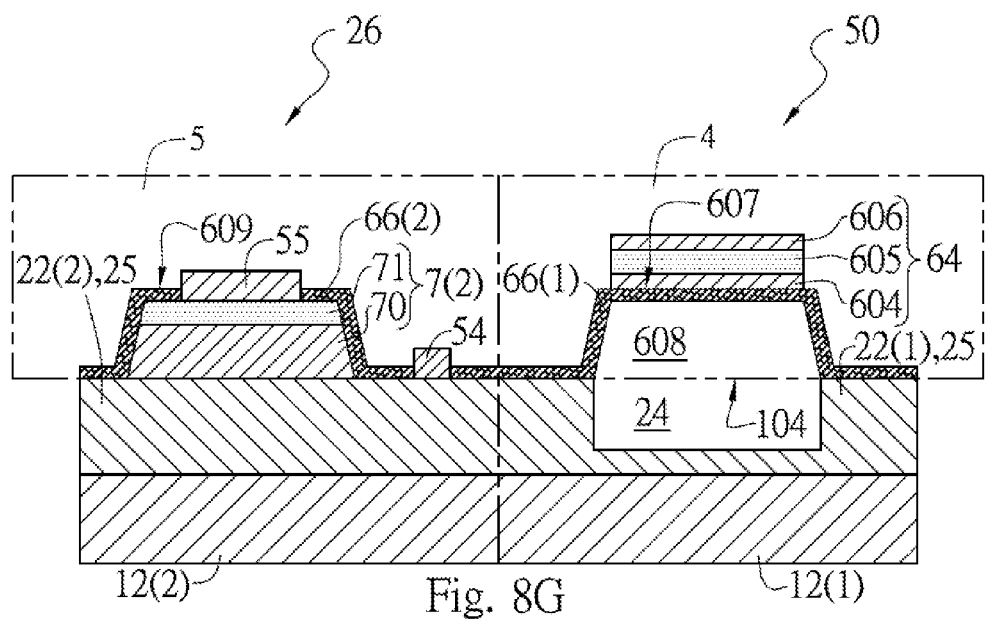
FIGS. 8G~8L are the cross-sectional schematics showing the embodiments of an integrated structure of acoustic wave device and varactor of the present invention.

Please refer to FIG. 8G, which is the cross-sectional schematic showing an embodiment of an integrated structure of acoustic wave device and varactor of the present invention. The present invention further provides an integrated structure of acoustic wave device and varactor. The integrated structure comprises a semiconductor substrate 12, an acoustic wave device 50 and a varactor 26. The semiconductor substrate 12 includes a first part 12(1) and a second part 12(2) of the semiconductor substrate 12. The acoustic wave device 50 and the varactor 26 are formed on the first part 12(1) and the second part 12(2) of the semiconductor substrate 12 respectively. The acoustic wave device 50 comprises an acoustic wave device upper structure 4 and a first part 22(1) of a bottom epitaxial structure 22, wherein the bottom epitaxial structure 22 is formed on the semiconductor substrate 12, wherein the bottom epitaxial structure 22 includes the first part 22(1) and a second part 22(2) of the bottom epitaxial structure 22, wherein the first part 22(1) and the second part 22(2) of the bottom epitaxial structure 22 are formed on the first part 12(1) and the second part 12(2) of the semiconductor substrate 12 respectively, and wherein the acoustic wave device upper structure 4 is formed on the first part 22(1) of the bottom epitaxial structure 22. The varactor 26 comprises a varactor upper structure 5 and the second part 22(2) of the bottom epitaxial structure 22, wherein the varactor upper structure 5 is formed on the second part 22(2) of the bottom epitaxial structure 22. In current embodiment, the acoustic wave device 50 may be a bulk acoustic wave device. The integrated structure of the acoustic wave device 50 and the varactor 26 formed on the same the semiconductor substrate 12 is capable of reducing the module size, optimizing the impedance matching, and reducing the signal loss between the varactor 26 and the acoustic wave device 50. The first part 22(1) of the bottom epitaxial structure 22 comprises a bottom epitaxial structure recess 24 on the top of the bottom epitaxial structure 22. A bottom of the bottom epitaxial structure recess 24 is the bottom epitaxial structure 22. The acoustic wave device upper structure 4 comprises an acoustic wave device protection layer 66(1) and an acoustic wave resonance structure 64. The acoustic wave device protection layer 66(1) is formed on the first part 22(1) of the bottom epitaxial structure 22. The acoustic wave device protection layer 66(1) comprises an acoustic wave device protection layer recess 608 on the bottom of the acoustic wave device protection layer 66(1) and an upwardly protruding acoustic wave device protection layer mesa 607 right above the acoustic wave device protection layer recess 608. The acoustic wave device protection layer recess 608 is located right above the bottom epitaxial structure recess 24, and the acoustic wave device protection layer recess 608 is communicated with the bottom epitaxial structure recess 24, and wherein the acoustic wave device protection layer recess 608 and the bottom epitaxial structure recess 24 have a boundary 104 therebetween and the boundary 104 is extended from a top surface of the bottom epitaxial structure 22. The acoustic wave resonance structure 64 is formed on the acoustic wave device protection layer mesa 607. The acoustic wave resonance structure 64 comprises an acoustic wave device bottom electrode 604, a dielectric layer 605 and an acoustic wave device top electrode 606. The acoustic wave device bottom electrode 604 is formed on the acoustic wave device protection layer mesa 607. The dielectric layer 605 is formed on the acoustic wave device bottom electrode 604. The acoustic wave device top electrode 606 is formed on the dielectric layer 605. A gap between the acoustic wave device protection layer 66(1) and the bottom of the bottom epitaxial structure recess 24 is increased by the communication of the acoustic wave device protection layer recess 608 and the bottom epitaxial structure recess 24, so as to avoid the contact of the acoustic wave device protection layer 66(1) and the bottom of the bottom epitaxial structure recess 24 when the acoustic wave device 50 is affected by stress such that the acoustic wave device protection layer 66(1) is bended downwardly. In some embodiments, the acoustic wave device protection layer recess 608 has an opening smaller than or equal to that of the bottom epitaxial structure recess 24. In another embodiment, the acoustic wave device protection layer recess 608 may have an opening greater than that of the bottom epitaxial structure recess 24. The varactor upper structure 5 comprises a varactor middle epitaxial structure mesa 7(2), a varactor protection layer 66(2), a varactor top electrode 55 and a varactor bottom electrode 54. The middle epitaxial structure 7 comprises a middle n-type graded doped layer 70 and a middle p-type doped layer 71. The middle n-type graded doped layer 70 is formed on the bottom epitaxial structure 22. The middle p-type doped layer 71 is formed on the middle n-type graded doped layer 70. The varactor middle epitaxial structure mesa 7(2) comprises the middle n-type graded doped layer 70 and the middle p-type doped layer 71 on the second part 22(2) of the bottom epitaxial structure 22. The varactor protection layer 66(2) covers the exposed surfaces of the varactor middle epitaxial structure mesa 7(2) and the second part 22(2) of the bottom epitaxial structure 22. Please also refer to FIG. 8D, the varactor protection layer 66(2) comprises a varactor bottom electrode recess 52 and a varactor top electrode recess 53. A bottom of the varactor bottom electrode recess 52 is defined by the second part 22(2) of the bottom epitaxial structure 22. A bottom of the varactor top electrode recess 53 is defined by the varactor middle epitaxial structure mesa 7(2). The varactor bottom electrode 54 is formed within the varactor bottom electrode recess 52 on the second part 22(2) of the bottom epitaxial structure 22. The varactor top electrode 55 is formed within the varactor top electrode recess 53 on the varactor middle epitaxial structure mesa 7(2). In current embodiment, the bottom of the varactor top electrode recess 53 is defined by the middle p-type doped layer 71, and the varactor top electrode 55 is formed within the varactor top electrode recess 53 on the middle p-type doped layer 71. The bottom epitaxial structure 22 comprises a bottom n-type doped layer 25. The bottom of the varactor bottom electrode recess 52 is defined by the bottom n-type doped layer 25, and the varactor bottom electrode 54 is formed within the varactor bottom electrode recess 52 on the bottom n-type doped layer 25. The bottom n-type doped layer 25 on the second part 12(2) of the semiconductor substrate 12, the middle n-type graded doped layer 70 and the middle p-type doped layer 71 on the second part 22(2) of the bottom epitaxial structure 22, the varactor protection layer 66(2), the varactor top electrode 55 and the varactor bottom electrode 54 form the varactor 26.

The semiconductor substrate 12 is made of one material selected from the group consisting of: Si, GaAs, SiC, InP, GaN, AlN and Sapphire.

In the present invention, there are two types of applications of embodiments, a first type and a second type. In the first type of applications of embodiments, the bottom n-type doped layer 25 is made of $In_xGa_{1-x}As$, wherein x is greater than 0 and less than 1; in a preferable embodiment, x is about 0.53; the doping concentration of the bottom n-type doped layer 25 is greater than or equal to $2\times10^{18}$ and less than or equal to $5\times10^{19}$; and a thickness of the bottom n-type doped layer 25 is between 200 nm and 600 nm. The middle n-type graded doped layer 70 is made of $In_xGa_{1-x}As$, wherein x is greater than 0 and less than 1; in a preferable embodiment, x is about 0.53; the doping concentration of the middle n-type graded doped layer 70 is greater than or equal to $1\times10^{15}$ and less than or equal to $5\times10^{17}$; and a thickness of the middle n-type graded doped layer 70 is between 100 nm and 2000 nm. The middle p-type doped layer 71 is made of $In_xGa_{1-x}As$, wherein x is greater than 0 and less than 1; in a preferable embodiment, x is about 0.53; the doping concentration of the middle p-type doped layer 71 is greater than or equal to $1\times10^{19}$ and less than or equal to $1\times10^{20}$; and a thickness of the middle p-type doped layer 71 is between 10 nm and 150 nm. In the second type of applications of embodiments, the bottom n-type doped layer 25 is made of GaAs; the doping concentration of the bottom n-type doped layer 25 is greater than or equal to $2\times10^{18}$ and less than or equal to $5\times10^{19}$; and a thickness of the bottom n-type doped layer 25 is between 200 nm and 600 nm. The middle n-type graded doped layer 70 is made of GaAs; the doping concentration of the middle n-type graded doped layer 70 is greater than or equal to $1 \times 10^{15}$ and less than or equal to $5 \times 10^{17}$; and a thickness of the middle n-type graded doped layer 70 is between 100 nm and 2000 nm. The middle p-type doped layer 71 is made of GaAs; the doping concentration of the middle p-type doped layer 71 is greater than or equal to $1 \times 10^{19}$ and less than or equal to $1 \times 10^{20}$; and a thickness of the middle p-type doped layer 71 is between 10 nm and 150 nm.

The present invention further provides a method for fabricating an integrated structure of acoustic wave device and varactor. Please refer to FIGS. 8A-8F, which are the cross-sectional schematics showing steps of an embodiment of a method for fabricating an integrated structure of acoustic wave device and varactor of the present invention. The method fabricates the embodiment as shown in FIG. 8G. The method comprises a following step of: (please referring to FIG. 8A and FIG. 8G) Step F1: forming an acoustic wave device 50 and a varactor 26 on a first part 12(1) and a second part 12(2) of a semiconductor substrate 12 respectively. The Step F1 comprises following steps of: Step F11: forming a bottom epitaxial structure 22 on the semiconductor substrate 12, wherein the bottom epitaxial structure includes a first part 22(1) and a second part 22(2) of the bottom epitaxial structure 22 formed on the first part 12(1) and the second part 12(2) of the semiconductor substrate 12 respectively; and Step F12: forming an acoustic wave device upper structure 4 and a varactor upper structure 5 on the first part 22(1) and the second part 22(2) of the bottom epitaxial structure 22 respectively. The acoustic wave device 50 comprises the acoustic wave device upper structure 4 and the first part 22(1) of the bottom epitaxial structure 22. The varactor 26 comprises the varactor upper structure 5 and the second part 22(2) of the bottom epitaxial structure 22. The Step F12 comprises a following step: Step F121: forming a middle epitaxial structure 7 on the bottom epitaxial structure 22. In FIG. 8A, the middle epitaxial structure 7 comprises a middle n-type graded doped layer 70 and a middle p-type doped layer 71. The Step F121 comprises following steps of: forming the middle n-type graded doped layer 70 on the bottom epitaxial structure 22; and forming the middle p-type doped layer 71 on the middle n-type graded doped layer 70. In current embodiment, the bottom epitaxial structure 22 comprises a bottom n-type doped layer 25. The Step F11 comprises a following step of: forming a bottom n-type doped layer 25 on the semiconductor substrate 12. Please refer to FIG. 8B, the Step F12 further comprises a following step of: Step F122 (case a): defining a middle epitaxial structure etching area, and etching the middle epitaxial structure 7 within the middle epitaxial structure etching area to form an acoustic wave device middle epitaxial structure mesa 7(1) on the first part 22(1) of the bottom epitaxial structure 22 and a varactor middle epitaxial structure mesa 7(2) on the second part 22(2) of the bottom epitaxial structure 22 respectively. The Step F122 comprises following steps of: defining a middle p-type doped layer etching area, and etching the middle p-type doped layer 71 within the middle p-type doped layer etching area; and defining a middle n-type graded doped layer etching area, and etching the middle n-type graded doped layer 70 within the middle n-type graded doped layer etching area, thereby the acoustic wave device middle epitaxial structure mesa 7(1) and the varactor middle epitaxial structure mesa 7(2) are formed on the first part 22(1) and the second part 22(2) of the bottom epitaxial structure 22 respectively; wherein the acoustic wave device middle epitaxial structure mesa 7(1) comprises the middle n-type graded doped layer 70 and the middle p-type doped layer 71 on the first part 22(1) of the bottom epitaxial structure 22; and wherein the varactor middle epitaxial structure mesa 7(2) comprises the middle n-type graded doped layer 70 and the middle p-type doped layer 71 on the second part 22(2) of the bottom epitaxial structure 22. Please refer to FIG. 8C, the Step F12 further comprises a following step of: forming an acoustic wave device protection layer 66(1) and a varactor protection layer 66(2); wherein the acoustic wave device protection layer 66(1) covers the exposed surfaces of the first part 22(1) of the bottom epitaxial structure 22 and the acoustic wave device middle epitaxial structure mesa 7(1), wherein the acoustic wave device protection layer 66(1) covers the acoustic wave device middle epitaxial structure mesa 7(1) to form an acoustic wave device protection layer mesa 607; and wherein the varactor protection layer 66(2) covers the exposed surfaces of the second part 22(2) of the bottom epitaxial structure 22 and the varactor middle epitaxial structure mesa 7(2), wherein the varactor protection layer 66(2) covers the varactor middle epitaxial structure mesa 7(2) to form a varactor protection layer mesa 609. Please refer to FIG. 8D, the Step F12 further comprises a following step of: etching the varactor protection layer 66(2) to form a varactor bottom electrode recess 52 and a varactor top electrode recess 53 respectively. A bottom of the varactor bottom electrode recess 52 is defined by the second part 22(2) of the bottom epitaxial structure 22 such that part of the second part 22(2) of the bottom epitaxial structure 22 is exposed through the varactor bottom electrode recess 52. A bottom of the varactor top electrode recess 53 is defined by the varactor middle epitaxial structure mesa 7(2) such that part of the varactor middle epitaxial structure mesa 7(2) is exposed through the varactor top electrode recess 53. Please refer to FIG. 8E, the Step F12 further comprises following steps of: forming a varactor top electrode 55 on the varactor middle epitaxial structure mesa 7(2) within the varactor top electrode recess 53; forming a varactor bottom electrode 54 on the second part 22(2) of the bottom epitaxial structure 22 within the varactor bottom electrode recess 52; and forming an acoustic wave resonance structure 64 on the acoustic wave device protection layer mesa 607, which comprises following steps of: forming an acoustic wave device bottom electrode 604 on the acoustic wave device protection layer mesa 607; forming a dielectric layer 605 on the acoustic wave device bottom electrode 604; and forming an acoustic wave device top electrode 606 on the dielectric layer 605. The varactor upper structure 5 comprises the varactor middle epitaxial structure mesa 7(2), the varactor protection layer 66(2), the varactor top electrode 55 and the varactor bottom electrode 54. In current embodiment, the bottom n-type doped layer 25 on the second part 12(2) of the semiconductor substrate 12, the middle n-type graded doped layer 70 and the middle p-type doped layer 71 on the second part 22(2) of the bottom epitaxial structure 22, the varactor protection layer 66(2), the varactor top electrode 55 and the varactor bottom electrode 54 form the varactor 26. The acoustic wave resonance structure 64 comprises the acoustic wave device bottom electrode 604, the dielectric layer 605 and the acoustic wave device top electrode 606. The Step F12 further comprises a following step of: defining at least one recess etching area, and etching the acoustic wave device protection layer 66(1) within the at least one recess etching area or etching the acoustic wave device protection layer 66(1) and the acoustic wave resonance structure 64 within the at least one recess etching area such that the etching stops at the acoustic wave device middle epitaxial structure mesa 7(1) and/or the first part 22(1) of the bottom epitaxial structure 22 to form at least one etching recess, thereby part of the acoustic wave device middle epitaxial structure mesa 7(1) is exposed. Although in current embodiment, the at least one etching recess is not shown in FIG. 8E or FIG. 8F, the structure of the at least one etching recess may be similar to the structure of the at least one etching recess 62 in FIG. 1G or FIG. 1H. Please refer to FIG. 8F, the Step F12 further comprises a following step of: etching the acoustic wave device middle epitaxial structure mesa 7(1) to form an acoustic wave device protection layer recess 608, wherein at least one middle epitaxial structure etching solution contacts with the acoustic wave device middle epitaxial structure mesa 7(1) via the at least one etching recess and etches and removes the acoustic wave device middle epitaxial structure mesa 7(1), thereby a top and a bottom of the acoustic wave device protection layer recess 608 are the acoustic wave device protection layer 66(1) and the first part 22(1) of the bottom epitaxial structure 22 respectively. Please refer to FIG. 8G, the Step F1 further comprises a following step of: etching the first part 22(1) of the bottom epitaxial structure 22 below the acoustic wave device protection layer recess 608 to form a bottom epitaxial structure recess 24, wherein a bottom of the bottom epitaxial structure recess 24 is the first part 22(1) of the bottom epitaxial structure 22, wherein at least one bottom epitaxial structure etching solution contacts with a top surface of the first part 22(1) of the bottom epitaxial structure 22 via the at least one etching recess and the acoustic wave device protection layer recess 608, the at least one bottom epitaxial structure etching solution is uniformly distributed on the top surface of the first part 22(1) of the bottom epitaxial structure 22 through the acoustic wave device protection layer recess 608 so as to uniformly etch part of the first part 22(1) of the bottom epitaxial structure 22 below the acoustic wave device protection layer recess 608 to form the bottom epitaxial structure recess 24, and thereby prevents the side etching phenomenon during the etching, wherein the acoustic wave device protection layer recess 608 is communicated with the bottom epitaxial structure recess 24, and the acoustic wave device protection layer recess 608 and the bottom epitaxial structure recess 24 have a boundary 104 therebetween and the boundary 104 is extended from the top surface of the first part 22(1) of the bottom epitaxial structure 22, wherein a gap between the acoustic wave device protection layer 66(1) and the bottom of the bottom epitaxial structure recess 24 is increased by the communication of the acoustic wave device protection layer recess 608 and the bottom epitaxial structure recess 24, so as to avoid the contact of the acoustic wave device protection layer 66(1) and the bottom of the bottom epitaxial structure recess when the acoustic wave device 50 is affected by stress such that the acoustic wave device protection layer 66(1) is bended downwardly. The integrated structure of the acoustic wave device 50 and the varactor 26 formed on the same the semiconductor substrate 12 is capable of reducing the module size, optimizing the impedance matching, and reducing the signal loss between the varactor 26 and the acoustic wave device 50. In some embodiments, the acoustic wave device protection layer recess 608 has an opening smaller than or equal to that of the bottom epitaxial structure recess 24. In another embodiment, the acoustic wave device protection layer recess 608 may have an opening greater than that of the bottom epitaxial structure recess 24.

Figure 8H:
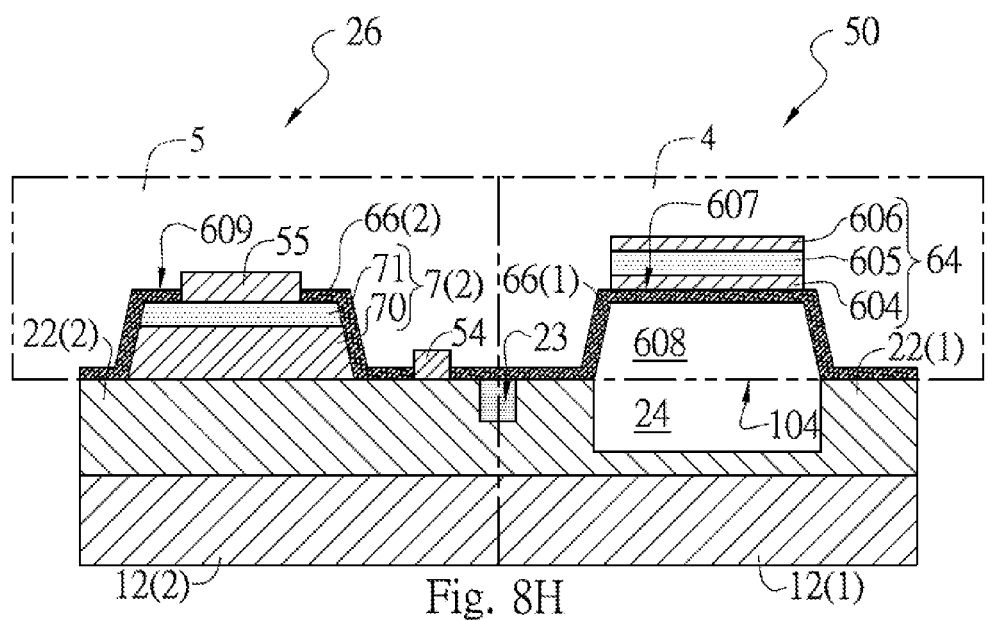

Please refer to FIG. 8H, which is the cross-sectional schematic showing another embodiment of an integrated structure of acoustic wave device and varactor of the present invention. The Step F1 further comprises a following step of: forming an isolation structure 23 between the varactor 26 and the acoustic wave device 50. The main structure in FIG. 8H is basically the same as the structure shown in FIG. 8G, except that the isolation structure 23 is formed between the varactor 26 and the acoustic wave device 50. The varactor 26 and the acoustic wave device 50 are electrically isolated by the isolation structure 23.

Figure 8I:
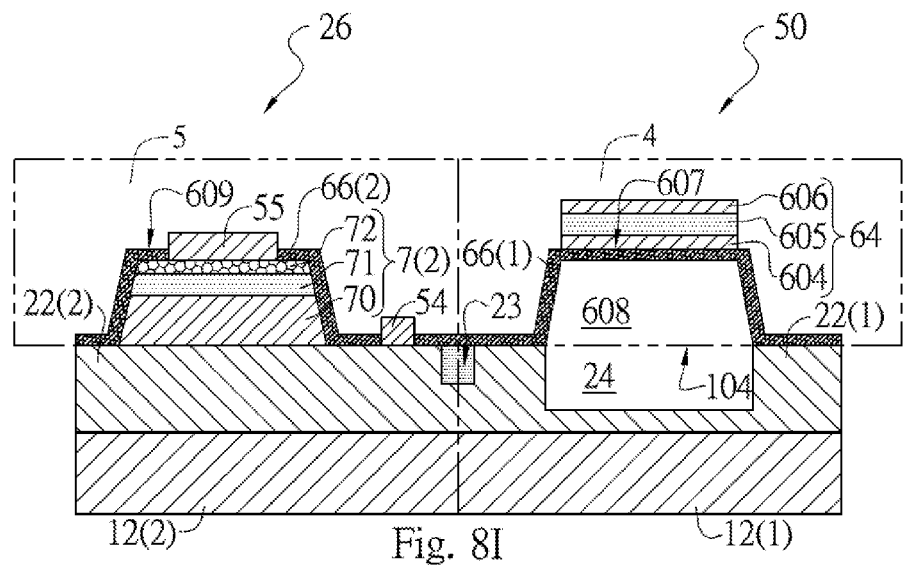

Please refer to FIG. 8I, which is the cross-sectional schematic showing another embodiment of an integrated structure of acoustic wave device and varactor of the present invention. The main structure in FIG. 8I is basically the same as the structure shown in FIG. 8H, except that the varactor middle epitaxial structure mesa 7(2) further comprises a varactor ledge layer 72 formed on the middle p-type doped layer 71. The Step F121 further comprises a following step of: forming a varactor ledge layer 72 on the middle p-type doped layer 71. The Step F122 further comprises a following step of: defining a varactor ledge layer etching area, and etching the varactor ledge layer 72 within the varactor ledge layer etching area; wherein the varactor middle epitaxial structure mesa 7(2) comprises the middle n-type graded doped layer 70, the middle p-type doped layer 71 and the varactor ledge layer 72 on the second part 22(2) of the bottom epitaxial structure 22. In the first type of applications of embodiments, the varactor ledge layer 72 is made of $In_xGa_{1-x}As$, wherein x is greater than 0 and less than 1; in a preferable embodiment, x is about 0.53; the varactor ledge layer 72 is n-type doped and the doping concentration of the varactor ledge layer 72 is greater than or equal to $5\times10^{16}$ and less than or equal to $5\times10^{17}$; and a thickness of the varactor ledge layer 72 is between 1 nm and 60 nm. In the second type of applications of embodiments, the varactor ledge layer 72 is made of $In_xGa_{1-x}P$, wherein x is greater than 0 and less than 1; in a preferable embodiment, x is about 0.48; the varactor ledge layer 72 is n-type doped and the doping concentration of the varactor ledge layer 72 is greater than or equal to $5\times10^{16}$ and less than or equal to $5\times10^{17}$; and a thickness of the varactor ledge layer 72 is between 1 nm and 60 nm.

Figure 8J:
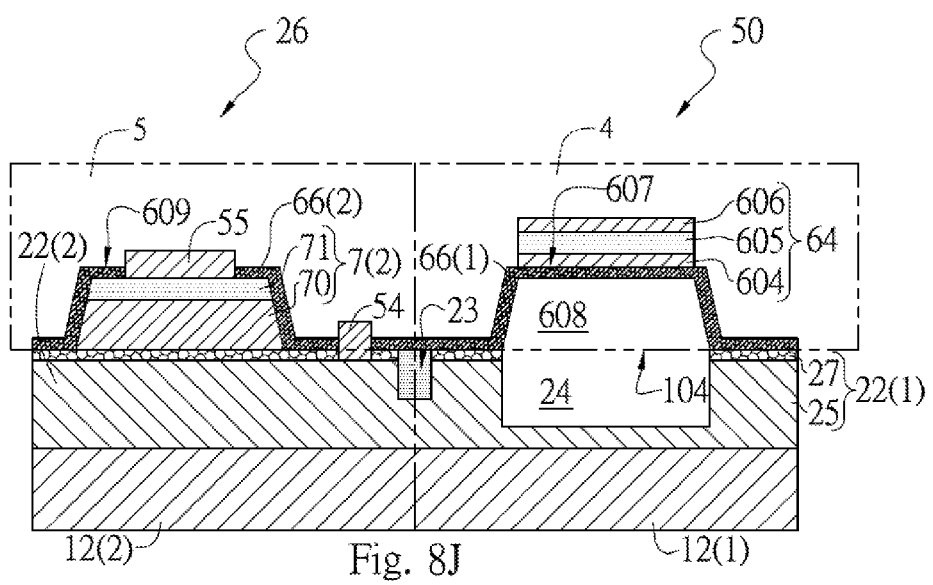

Please refer to FIG. 8J, which is the cross-sectional schematic showing another embodiment of an integrated structure of acoustic wave device and varactor of the present invention. The main structure in FIG. 8J is basically the same as the structure shown in FIG. 8H, except that the bottom epitaxial structure 22 further comprises an etching stop layer 27. The etching stop layer 27 is formed on the bottom n-type doped layer 25, wherein the bottom epitaxial structure 22 comprises the bottom n-type doped layer 25 and the etching stop layer 27. The Step F11 further comprises following steps of: forming an etching stop layer 27 on the bottom n-type doped layer 25; and etching the etching stop layer 27 to form the varactor bottom electrode recess 52 on the second part 22(2) of the bottom epitaxial structure 22 such that the bottom of the varactor bottom electrode recess 52 is the second part 22(2) of the bottom epitaxial structure 22; wherein the varactor bottom electrode 54 is formed on the bottom n-type doped layer 25 within the varactor bottom electrode recess 52. In the first type of applications of embodiments, the etching stop layer 27 is made of InP; the etching stop layer 27 is n-type doped and the doping concentration of etching stop layer 27 is greater than or equal to $2\times10^{18}$ and less than or equal to $5\times10^{19}$; and a thickness of the varactor ledge layer 72 is between 1 nm and 40 nm. In the second type of applications of embodiments, the etching stop layer 27 is made of $In_xGa_{1-x}P$, wherein x is greater than 0 and less than 1; in a preferable embodiment, x is about 0.48; the etching stop layer 27 is n-type doped and the doping concentration of etching stop layer 27 is greater than or equal to $2 \times 10^{18}$ and less than or equal to $5 \times 10^{19}$; and a thickness of the varactor ledge layer 72 is between 1 nm and 40 nm.

Figure 8K:
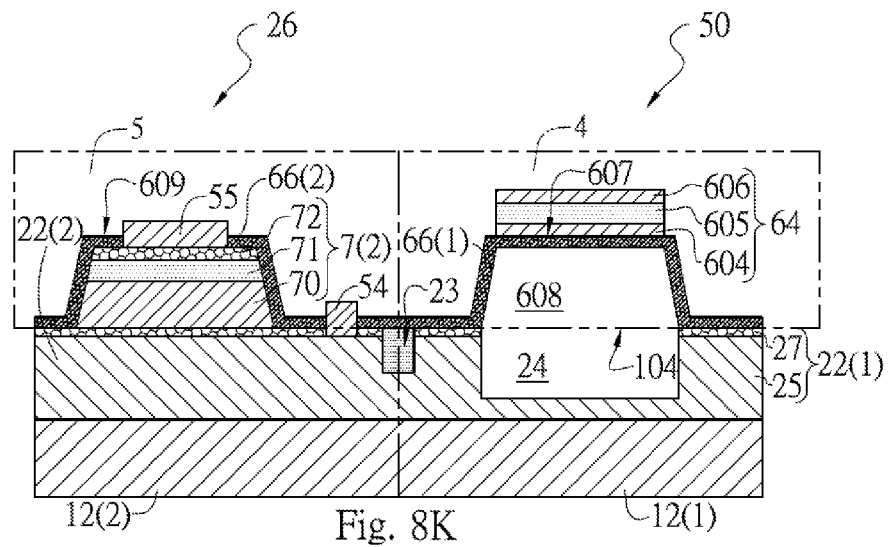

Please refer to FIG. 8K, which is the cross-sectional schematic showing another embodiment of an integrated structure of acoustic wave device and varactor of the present invention. The main structure in FIG. 8K is basically the same as the structure shown in FIG. 8J, except that the varactor middle epitaxial structure mesa 7(2) further comprises a varactor ledge layer 72 formed on the middle p-type doped layer 71. The Step F121 further comprises a following step of: forming a varactor ledge layer 72 on the middle p-type doped layer 71. The Step F122 further comprises a following step of: defining a varactor ledge layer etching area, and etching the varactor ledge layer 72 within the varactor ledge layer etching area; wherein the varactor middle epitaxial structure mesa 7(2) comprises the middle n-type graded doped layer 70, the middle p-type doped layer 71 and the varactor ledge layer 72 on the second part 22(2) of the bottom epitaxial structure 22. In the first type of applications of embodiments, the varactor ledge layer 72 is made of $In_xGa_{1-x}As$, wherein x is greater than 0 and less than 1; in a preferable embodiment, x is about 0.53; the varactor ledge layer 72 is n-type doped and the doping concentration of the varactor ledge layer 72 is greater than or equal to $5 \times 10^{16}$ and less than or equal to $5 \times 10^{17}$; and a thickness of the varactor ledge layer 72 is between 1 nm and 60 nm. In the second type of applications of embodiments, the varactor ledge layer 72 is made of $In_xGa_{1-x}P$, wherein x is greater than 0 and less than 1; in a preferable embodiment, x is about 0.48; the varactor ledge layer 72 is n-type doped and the doping concentration of the varactor ledge layer 72 is greater than or equal to $5 \times 10^{16}$ and less than or equal to $5 \times 10^{17}$; and a thickness of the varactor ledge layer 72 is between 1 nm and 60 nm.

Figure 8L:
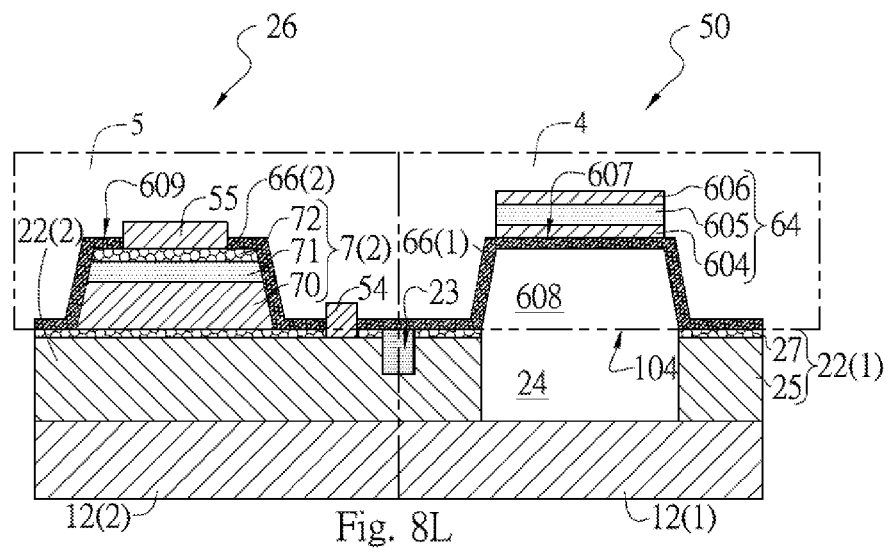

Please refer to FIG. 8L, which is the cross-sectional schematic showing another embodiment of an integrated structure of acoustic wave device and varactor of the present invention. The main structure in FIG. 8L is basically the same as the structure shown in FIG. 8K, except that the bottom of the bottom epitaxial structure recess 24 is defined by the semiconductor substrate 12, thereby the gap between the acoustic wave device protection layer 66(1) and the bottom of the bottom epitaxial structure recess 24 is further increased.

Figure 8M:
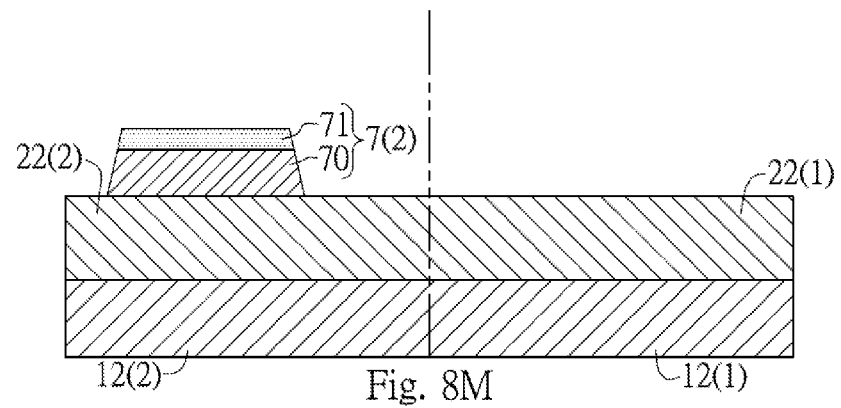
FIG. 8M is the cross-sectional schematic showing a step of another embodiment of a method for fabricating an integrated structure of acoustic wave device and varactor of the present invention.
Figure 8N:
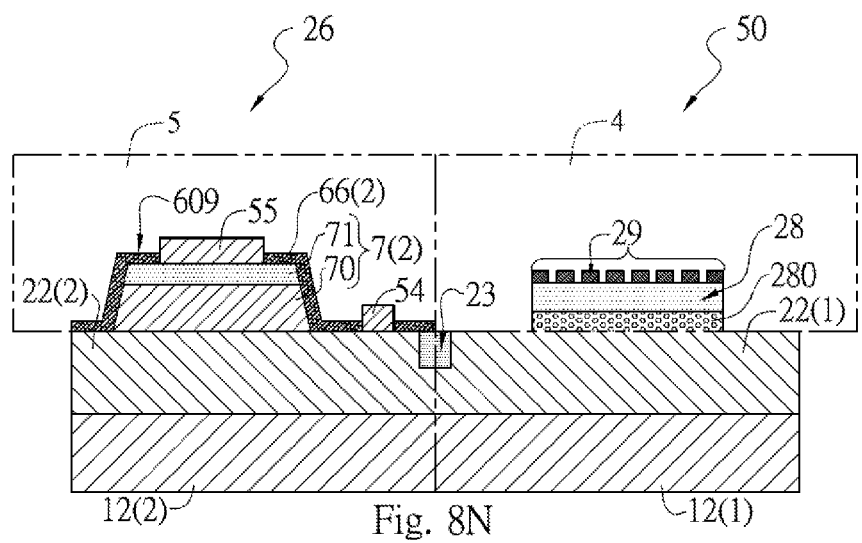
FIG. 8N is the cross-sectional schematic showing another embodiment of an integrated structure of acoustic wave device and varactor of the present invention.

Please refer to FIG. 8N is the cross-sectional schematic showing another embodiment of an integrated structure of acoustic wave device and varactor of the present invention. The main structure in FIG. 8N is basically the same as the structure shown in FIG. 8H, except that the acoustic wave device upper structure 4 comprises an auxiliary layer 280, a dielectric layer 28 and an interdigital transducer electrode 29, wherein the auxiliary layer 280 is formed on the first part 22(1) of the bottom epitaxial structure 22, the dielectric layer 28 is formed on the auxiliary layer 280, wherein the interdigital transducer electrode 29 is formed on the dielectric layer 28, and wherein the first part 22(1) of the bottom epitaxial structure 22 has no bottom epitaxial structure recess 24. In current embodiment, the acoustic wave device 50 may be a surface acoustic wave device. The integrated structure of the acoustic wave device 50 and the varactor 26 formed on the same the semiconductor substrate 12 is capable of reducing the module size, optimizing the impedance matching, and reducing the signal loss between the varactor 26 and the acoustic wave device 50.

Please refer to FIGS. 8A, 8M and 8N, which are the cross-sectional schematics showing steps of an embodiment of a method for fabricating an integrated structure of acoustic wave device and varactor of the present invention. The method fabricates the embodiment as shown in FIG. 8N. The method for fabricating the embodiment of FIG. 8N is basically the same as the method for fabricating the embodiment of FIG. 8H (that is the method for fabricating the varactor 26 on the second part 12(2) of the semiconductor substrate 12 of the embodiment of FIG. 8N is basically the same as the method for fabricating the varactor 26 on the second part 12(2) of the semiconductor substrate 12 of the embodiment of FIG. 8H, while the method for fabricating the acoustic wave device 50 on the first part 12(1) of the semiconductor substrate 12 of the embodiment of FIG. 8N is different from the method for fabricating the acoustic wave device 50 on the first part 12(1) of the semiconductor substrate 12 of the embodiment of FIG. 8H), except that the Step F122 (case b) is modified as following: defining a middle epitaxial structure etching area, and etching the middle epitaxial structure 7 within the middle epitaxial structure etching area to form a varactor middle epitaxial structure mesa 7 (2) on the second part 22(2) of the bottom epitaxial structure 22 (therefore, there is no such an acoustic wave device middle epitaxial structure mesa 7(1) formed on the first part 22(1) of the bottom epitaxial structure 22 as shown in FIG. 8B, the first part of the middle epitaxial structure 7 on the first part 22(1) of the bottom epitaxial structure 22 is etched and removed); in the Step F12, forming the acoustic wave device upper structure 4 on the first part 22(1) of the bottom epitaxial structure 22 comprises following steps of: forming an auxiliary layer 280 on the first part 22(1) of the bottom epitaxial structure 22; forming a dielectric layer 28 on the auxiliary layer 280; and forming an interdigital transducer electrode 29 on the dielectric layer 28; and in the Step F1, there is no such a step to etch the first part 22(1) of the bottom epitaxial structure 22 to form the bottom epitaxial structure recess 24. In the embodiment of FIG. 8N, the acoustic wave device upper structure 4 comprises the auxiliary layer 280, the dielectric layer 28 and the interdigital transducer electrode 29. The acoustic wave device 50 may be a surface acoustic wave device. In the embodiment of FIG. 8N, the structure of the varactor 26 is basically the same structure as the structure of the varactor 26 in the embodiment of FIG. 8H.

Figure 8O:
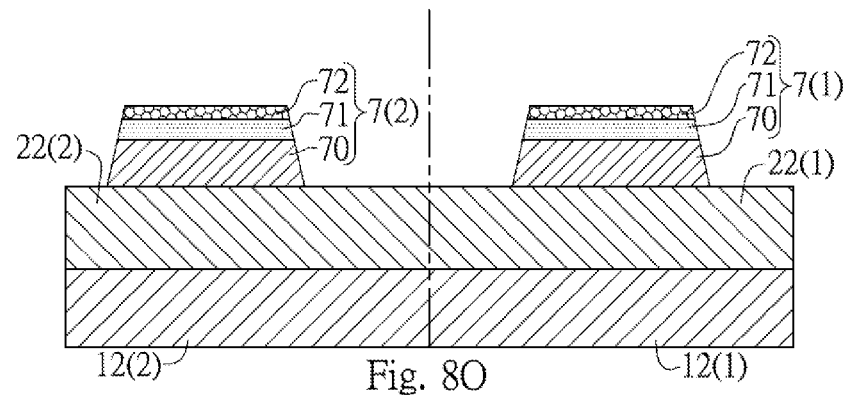
FIG. 8O is the cross-sectional schematic showing a step of another embodiment of a method for fabricating an integrated structure of acoustic wave device and varactor of the present invention.

Please refer to FIGS. 8B, 8I and 8O, which are the cross-sectional schematics showing steps of an embodiment of a method for fabricating an integrated structure of acoustic wave device and varactor of the present invention. The method fabricates the embodiment as shown in FIG. 8I. In FIG. 8B, the varactor middle epitaxial structure mesa 7(2) comprises the middle n-type graded doped layer 70 and the middle p-type doped layer 71 on the second part 22(2) of the bottom epitaxial structure 22. The acoustic wave device middle epitaxial structure mesa 7(1) comprises the middle n-type graded doped layer 70 and the middle p-type doped layer 71 on the first part 22(1) of the bottom epitaxial structure 22. To form the structure of FIG. 8O, the Step F121 may further comprise a following step of: forming a varactor ledge layer 72 on the middle p-type doped layer 71. And the Step F122 may further comprise a following step of: defining a varactor ledge layer etching area, and etching the varactor ledge layer 72 within the varactor ledge layer etching area. Then the structure of FIG. 8O may be fabricated. In FIG. 8O, the varactor middle epitaxial structure mesa 7(2) comprises the middle n-type graded doped layer 70, the middle p-type doped layer 71 and the varactor ledge layer 72 on the second part 22(2) of the bottom epitaxial structure 22. The acoustic wave device middle epitaxial structure mesa 7(1) comprises the middle n-type graded doped layer 70, the middle p-type doped layer 71 and the varactor ledge layer 72 on the first part 22(1) of the bottom epitaxial structure 22. Therefore, after forming the acoustic wave device protection layer 66(1) and the varactor protection layer 66(2), the acoustic wave device protection layer mesa 607 and the varactor protection layer mesa 609 may have the same height (as shown in FIG. 8I).

Figure 8P:
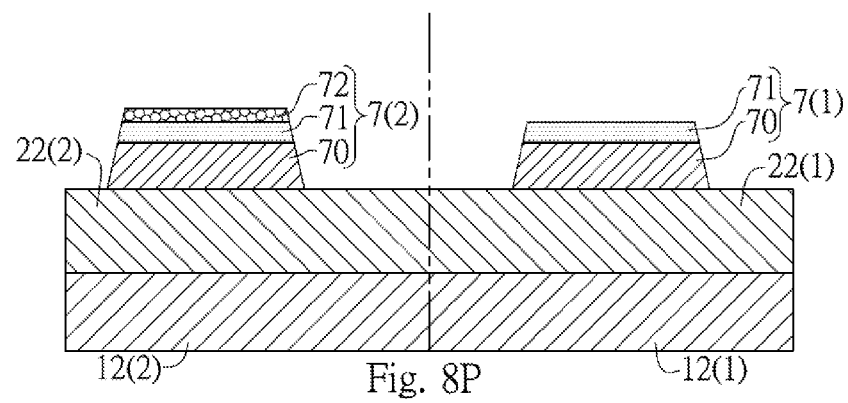
FIG. 8P is the cross-sectional schematic showing a step of another embodiment of a method for fabricating an integrated structure of acoustic wave device and varactor of the present invention.
Figure 8Q:
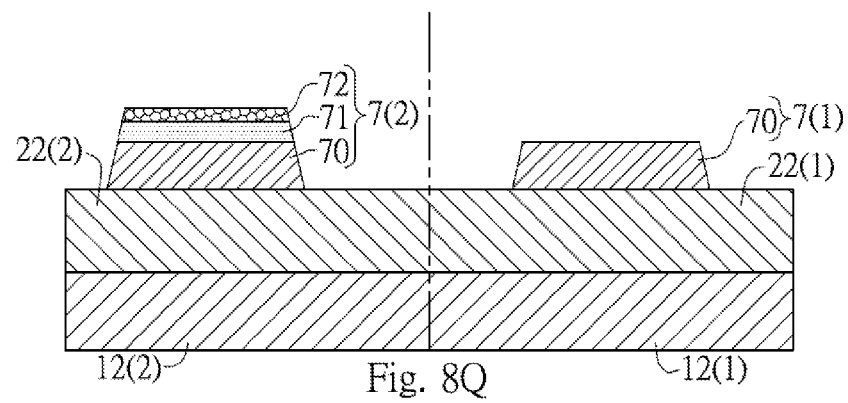
FIG. 8Q is the cross-sectional schematic showing a step of another embodiment of a method for fabricating an integrated structure of acoustic wave device and varactor of the present invention.
Figure 8R:
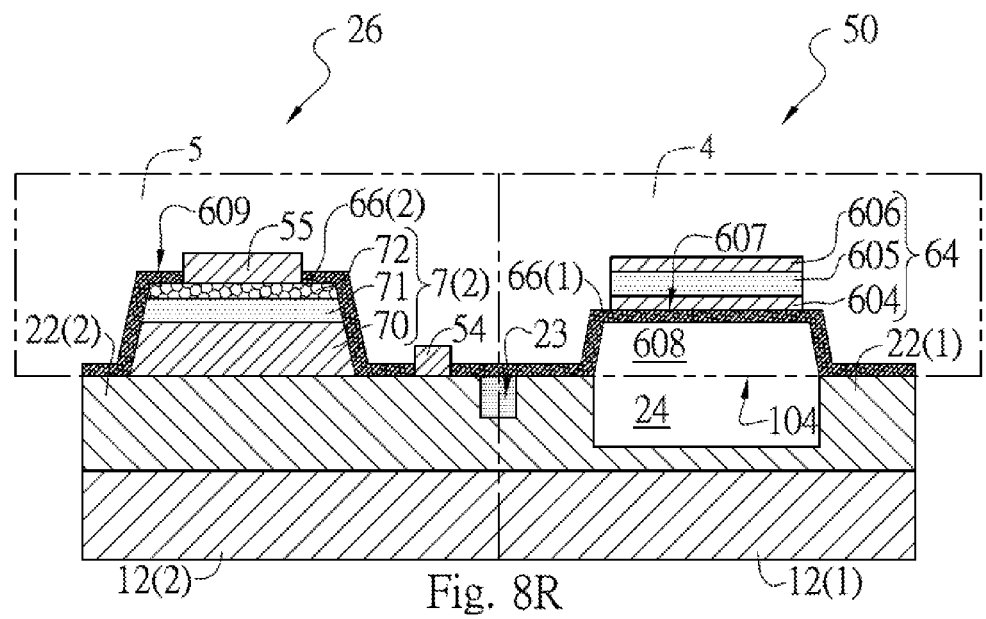
FIGS. 8R and 8S are the cross-sectional schematics showing the embodiments of an integrated structure of acoustic wave device and varactor of the present invention.

Please refer to FIGS. 8P, 8Q and 8R, which are the cross-sectional schematics showing steps of an embodiment of a method for fabricating an integrated structure of acoustic wave device and varactor of the present invention. The method fabricates the embodiment as shown in FIG. 8R. The main structure in FIG. 8R is basically the same as the structure shown in FIG. 8I, except that a height of the varactor protection layer mesa 609 is greater than a height of the acoustic wave device protection layer mesa 607. To form the structure of FIG. 8P from the structure of FIG. 8O, the Step F12 may further comprise a following step of: etching the varactor ledge layer 72 of the acoustic wave device middle epitaxial structure mesa 7(1) such that the acoustic wave device middle epitaxial structure mesa 7(1) comprises the middle n-type graded doped layer 70 and the middle p-type doped layer 71 on the first part 22(1) of the bottom epitaxial structure 22, while the varactor middle epitaxial structure mesa 7(2) comprises the middle n-type graded doped layer 70, the middle p-type doped layer 71 and the varactor ledge layer 72 on the second part 22(2) of the bottom epitaxial structure 22. To form the structure of FIG. 8Q from the structure of FIG. 8P, the Step F12 may further comprise a following step of: etching the middle p-type doped layer 71 of the acoustic wave device middle epitaxial structure mesa 7(1) such that the acoustic wave device middle epitaxial structure mesa 7(1) comprises the middle n-type graded doped layer 70 on the first part 22(1) of the bottom epitaxial structure 22, while the varactor middle epitaxial structure mesa 7(2) comprises the middle n-type graded doped layer 70, the middle p-type doped layer 71 and the varactor ledge layer 72 on the second part 22(2) of the bottom epitaxial structure 22. The structure of FIG. 8R may be formed from the structure of FIG. 8P or FIG. 8Q. And therefore, after forming the acoustic wave device protection layer 66(1) and the varactor protection layer 66(2), the height of the varactor protection layer mesa 609 is greater than the height of the acoustic wave device protection layer mesa 607 (as shown in FIG. 8R).

Figure 8S:
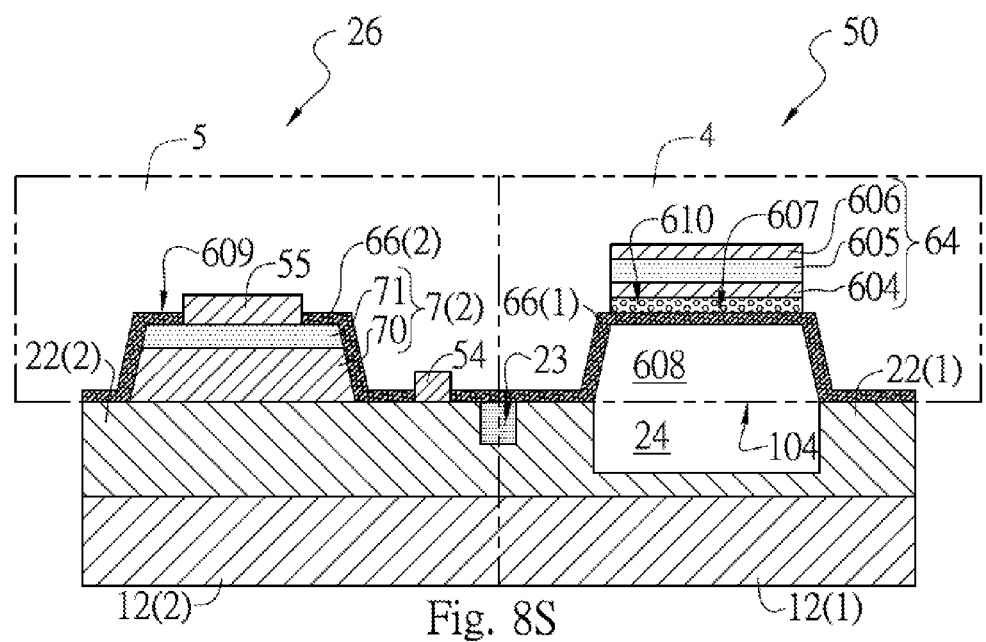

Please refer to FIG. 8S, which is the cross-sectional schematic showing an embodiment of an integrated structure of acoustic wave device and varactor of the present invention. The main structure in FIG. 8S is basically the same as the structure shown in FIG. 8H, except that an auxiliary layer 610 is inserted between the acoustic wave device protection layer mesa 607 and the acoustic wave device bottom electrode 604, wherein the auxiliary layer 610 is formed on the acoustic wave device protection layer mesa 607 and the acoustic wave device bottom electrode 604 is formed on the auxiliary layer 610. Similarly the auxiliary layer 610 may be introduced and inserted between the acoustic wave device protection layer mesa 607 and the acoustic wave device bottom electrode 604 in the embodiments of FIGS. 8G, 8I, 8J, 8K, 8L and 8R.

Figure 9G:
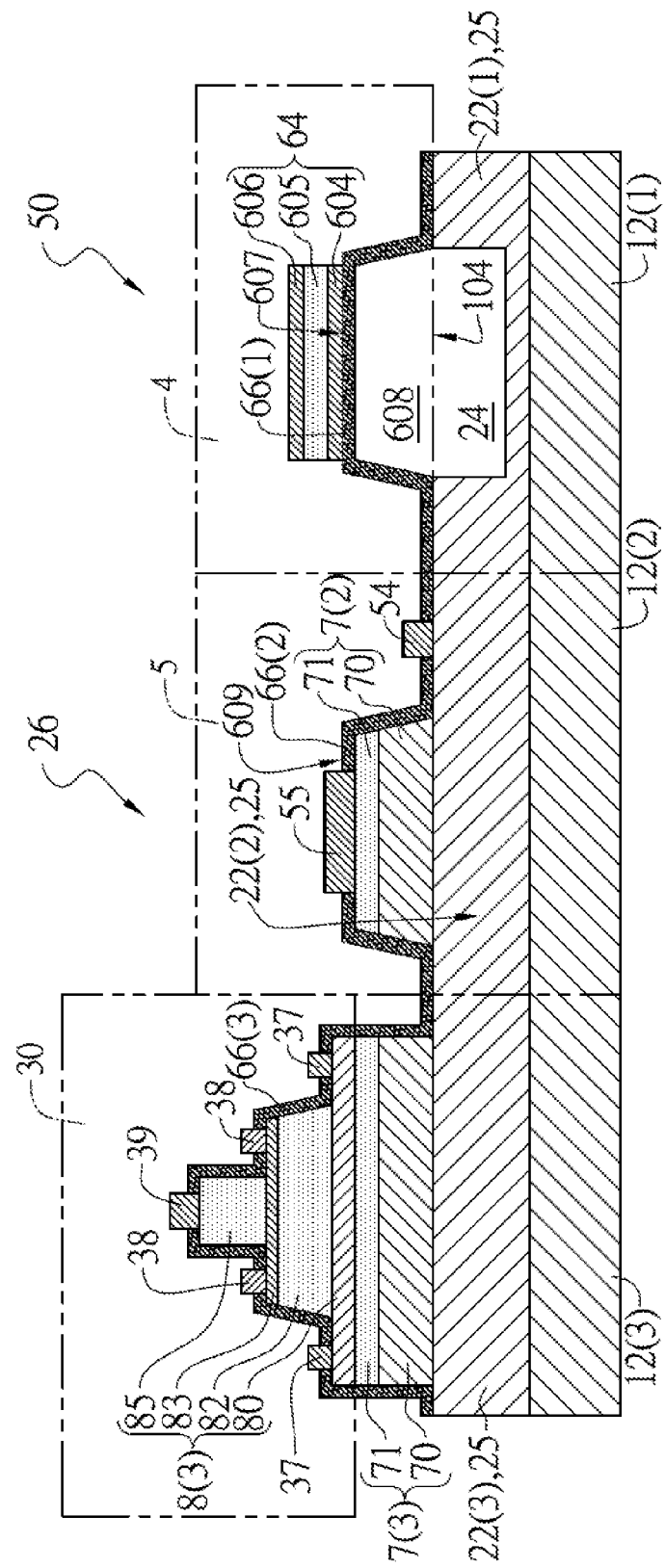
FIGS. 9G~9M are the cross-sectional schematics showing the embodiments of an integrated structure of acoustic wave device, varactor and heterojunction bipolar transistor of the present invention.

Please refer to FIG. 9G, which is the cross-sectional schematic showing an embodiment of an integrated structure of acoustic wave device, varactor and heterojunction bipolar transistor of the present invention. The present invention further provides an integrated structure of acoustic wave device, varactor and heterojunction bipolar transistor. The integrated structure comprises a semiconductor substrate 12, an acoustic wave device 50, a varactor 26, an heterojunction bipolar transistor middle epitaxial structure mesa 7(3) and an heterojunction bipolar transistor 30. The semiconductor substrate 12 includes a first part 12(1), a second part 12(2) and a third part 12(3) of the semiconductor substrate 12. The acoustic wave device 50 and the varactor 26 are formed on the first part 12(1) and the second part 12(2) of the semiconductor substrate 12 respectively. The acoustic wave device 50 comprises an acoustic wave device upper structure 4 and a first part 22(1) of a bottom epitaxial structure 22, wherein the bottom epitaxial structure 22 is formed on the semiconductor substrate 12, wherein the bottom epitaxial structure 22 includes the first part 22(1), a second part 22(2) and a third part 22(3) of the bottom epitaxial structure 22, wherein the first part 22(1), the second part 22(2) and the third part 22(3) of the bottom epitaxial structure 22 are formed on the first part 12(1), the second part 12(2) and the third part 12(3) of the semiconductor substrate 12 respectively, and wherein the acoustic wave device upper structure 4 is formed on the first part 22(1) of the bottom epitaxial structure 22. The varactor 26 comprises a varactor upper structure 5 and the second part 22(2) of the bottom epitaxial structure 22, wherein the varactor upper structure 5 is formed on the second part 22(2) of the bottom epitaxial structure 22. The heterojunction bipolar transistor middle epitaxial structure mesa 7(3) is formed on the third part 22(3) of the bottom epitaxial structure 22. The heterojunction bipolar transistor 30 is formed on the heterojunction bipolar transistor middle epitaxial structure mesa 7(3). In current embodiment, the acoustic wave device 50 may be a bulk acoustic wave device. The integrated structure of the acoustic wave device 50, the varactor 26 and the heterojunction bipolar transistor 30 formed on the same the semiconductor substrate 12 is capable of reducing the module size, optimizing the impedance matching, and reducing the signal loss between the varactor 26, the acoustic wave device 50 and the heterojunction bipolar transistor 30. The first part 22(1) of the bottom epitaxial structure 22 comprises a bottom epitaxial structure recess 24 on the top of the bottom epitaxial structure 22. A bottom of the bottom epitaxial structure recess 24 is the bottom epitaxial structure 22 (In another embodiment, the bottom of the bottom epitaxial structure recess 24 may be the semiconductor substrate 12, which is similar to the embodiment of FIG. 8L). The acoustic wave device upper structure 4 comprises an acoustic wave device protection layer 66(1) and an acoustic wave resonance structure 64. The acoustic wave device protection layer 66(1) is formed on the first part 22(1) of the bottom epitaxial structure 22. The acoustic wave device protection layer 66(1) comprises an acoustic wave device protection layer recess 608 on the bottom of the acoustic wave device protection layer 66(1) and an upwardly protruding acoustic wave device protection layer mesa 607 right above the acoustic wave device protection layer recess 608. The acoustic wave device protection layer recess 608 is located right above the bottom epitaxial structure recess 24, and the acoustic wave device protection layer recess 608 is communicated with the bottom epitaxial structure recess 24, and wherein the acoustic wave device protection layer recess 608 and the bottom epitaxial structure recess 24 have a boundary 104 therebetween and the boundary 104 is extended from a top surface of the bottom epitaxial structure 22. The acoustic wave resonance structure 64 is formed on the acoustic wave device protection layer mesa 607. The acoustic wave resonance structure 64 comprises an acoustic wave device bottom electrode 604, a dielectric layer 605 and an acoustic wave device top electrode 606. The acoustic wave device bottom electrode 604 is formed on the acoustic wave device protection layer mesa 607. The dielectric layer 605 is formed on the acoustic wave device bottom electrode 604. The acoustic wave device top electrode 606 is formed on the dielectric layer 605. A gap between the acoustic wave device protection layer 66(1) and the bottom of the bottom epitaxial structure recess 24 is increased by the communication of the acoustic wave device protection layer recess 608 and the bottom epitaxial structure recess 24, so as to avoid the contact of the acoustic wave device protection layer 66(1) and the bottom of the bottom epitaxial structure recess 24 when the acoustic wave device 50 is affected by stress such that the acoustic wave device protection layer 66(1) is bended downwardly. In some embodiments, the acoustic wave device protection layer recess 608 has an opening smaller than or equal to that of the bottom epitaxial structure recess 24. In another embodiment, the acoustic wave device protection layer recess 608 may have an opening greater than that of the bottom epitaxial structure recess 24. The varactor upper structure 5 comprises a varactor middle epitaxial structure mesa 7(2), a varactor protection layer 66(2), a varactor top electrode 55 and a varactor bottom electrode 54. The middle epitaxial structure 7 comprises a middle n-type graded doped layer 70 and a middle p-type doped layer 71. The middle n-type graded doped layer 70 is formed on the bottom epitaxial structure 22. The middle p-type doped layer 71 is formed on the middle n-type graded doped layer 70. The varactor middle epitaxial structure mesa 7(2) comprises the middle n-type graded doped layer 70 and the middle p-type doped layer 71 on the second part 22(2) of the bottom epitaxial structure 22. The varactor protection layer 66(2) covers the exposed surfaces of the varactor middle epitaxial structure mesa 7(2) and the second part 22(2) of the bottom epitaxial structure 22. Please also refer to FIG. 9D, the varactor protection layer 66(2) comprises a varactor bottom electrode recess 52 and a varactor top electrode recess 53. A bottom of the varactor bottom electrode recess 52 is defined by the second part 22(2) of the bottom epitaxial structure 22. A bottom of the varactor top electrode recess 53 is defined by the varactor middle epitaxial structure mesa 7(2). The varactor bottom electrode 54 is formed within the varactor bottom electrode recess 52 on the second part 22(2) of the bottom epitaxial structure 22. The varactor top electrode 55 is formed within the varactor top electrode recess 53 on the varactor middle epitaxial structure mesa 7(2). In current embodiment, the bottom of the varactor top electrode recess 53 is defined by the middle p-type doped layer 71, and the varactor top electrode 55 is formed within the varactor top electrode recess 53 on the middle p-type doped layer 71. The bottom epitaxial structure 22 comprises a bottom n-type doped layer 25. The bottom of the varactor bottom electrode recess 52 is defined by the bottom n-type doped layer 25, and the varactor bottom electrode 54 is formed within the varactor bottom electrode recess 52 on the bottom n-type doped layer 25. The bottom n-type doped layer 25 on the second part 12(2) of the semiconductor substrate 12, the middle n-type graded doped layer 70 and the middle p-type doped layer 71 on the second part 22(2) of the bottom epitaxial structure 22, the varactor protection layer 66(2), the varactor top electrode 55 and the varactor bottom electrode 54 form the varactor 26. The heterojunction bipolar transistor middle epitaxial structure mesa 7(3) comprises the middle n-type graded doped layer 70 and the middle p-type doped layer 71 on the third part 22(3) of the bottom epitaxial structure 22. The heterojunction bipolar transistor 30 comprises a top epitaxial structure mesa 8(3), an heterojunction bipolar transistor protection layer 66(3), a collector electrode 37, a base electrode 38 and an emitter electrode 39. The top epitaxial structure mesa 8(3) comprises a subcollector layer 80, a collector layer 82, a base layer 83 and an emitter layer 85. The subcollector layer 80 is formed on the heterojunction bipolar transistor middle epitaxial structure mesa 7(3). The collector layer 82 is formed on the subcollector layer 80. The base layer 83 is formed on the collector layer 82. The emitter layer 85 is formed on the base layer 83. The heterojunction bipolar transistor protection layer 66(3) covers the exposed surfaces of the top epitaxial structure mesa 8(3), the heterojunction bipolar transistor middle epitaxial structure mesa 7(3) and the third part 22(3) of the bottom epitaxial structure 22. Please also refer to FIG. 9D, the heterojunction bipolar transistor protection layer 66(3) comprises a collector electrode recess 67, a base electrode recess 68 and an emitter electrode recess 69. A bottom of the collector electrode recess 67 is defined by the subcollector layer 80. A bottom of the base electrode recess 68 is defined by the base layer 83. A bottom of the emitter electrode recess 69 is defined by the emitter layer 85. The collector electrode 37 is formed within the collector electrode recess 67 on the subcollector layer 80. The base electrode 38 is formed within the base electrode recess 68 on the base layer 83. The emitter electrode 39 is formed within the emitter electrode recess 69 on the emitter layer 85.

The semiconductor substrate 12 is made of one material selected from the group consisting of: Si, GaAs, SiC, InP, GaN, AlN and Sapphire. There are two types of applications of embodiments, a first type and a second type. In the first type of applications of embodiments, the bottom n-type doped layer 25 is made of $In_xGa_{1-x}As$, wherein x is greater than 0 and less than 1; in a preferable embodiment, x is about 0.53; the doping concentration of the bottom n-type doped layer 25 is greater than or equal to $2\times10^{18}$ and less than or equal to $5\times10^{19}$; and a thickness of the bottom n-type doped layer 25 is between 200 nm and 600 nm. The middle n-type graded doped layer 70 is made of $In_xGa_{1-x}As$, wherein x is greater than 0 and less than 1; in a preferable embodiment, x is about 0.53; the doping concentration of the middle n-type graded doped layer 70 is greater than or equal to $1\times10^{15}$ and less than or equal to $5\times10^{17}$; and a thickness of the middle n-type graded doped layer 70 is between 100 nm and 2000 nm. The middle p-type doped layer 71 is made of $In_xGa_{1-x}As$, wherein x is greater than 0 and less than 1; in a preferable embodiment, x is about 0.53; the doping concentration of the middle p-type doped layer 71 is greater than or equal to $1\times10^{19}$ and less than or equal to $1\times10^{20}$; and a thickness of the middle p-type doped layer 71 is between 10 nm and 150 nm. The subcollector layer 80 is made of $In_xGa_{1-x}As$, wherein x is greater than 0 and less than 1; in a preferable embodiment, x is about 0.53; the subcollector layer 80 is n-type doped and the doping concentration of the subcollector layer 80 is greater than or equal to $2\times10^{18}$ and less than or equal to $5\times10^{19}$; and a thickness of the subcollector layer 80 is between 200 nm and 600 nm. The collector layer 82 is made of $In_xGa_{1-x}As$, wherein x is greater than 0 and less than 1; in a preferable embodiment, x is about 0.53; the collector layer 82 is n-type doped and the doping concentration of the collector layer 82 is greater than or equal to $1\times10^{15}$ and less than or equal to $5\times10^{17}$; and a thickness of the collector layer 82 is between 100 nm and 2000 nm. The base layer 83 is made of $In_xGa_{1-x}As$, wherein x is greater than 0 and less than 1; in a preferable embodiment, x is about 0.53; the base layer 83 is p-type doped and the doping concentration of the base layer 83 is greater than or equal to $1\times10^{19}$ and less than or equal to $1\times10^{20}$; and a thickness of the base layer 83 is between 10 nm and 150 nm. The emitter layer 85 is made of InP; the emitter layer 85 is n-type doped and the doping concentration of emitter layer 85 is greater than or equal to $2\times10^{18}$ and less than or equal to $5\times10^{19}$; and a thickness of the emitter layer 85 is between 100 nm and 500 nm. In the second type of applications of embodiments, the bottom n-type doped layer 25 is made of GaAs; the doping concentration of the bottom n-type doped layer 25 is greater than or equal to $2\times10^{18}$ and less than or equal to $5\times10^{19}$; and a thickness of the bottom n-type doped layer 25 is between 200 nm and 600 nm. The middle n-type graded doped layer 70 is made of GaAs; the doping concentration of the middle n-type graded doped layer 70 is greater than or equal to $1\times10^{15}$ and less than or equal to $5\times10^{17}$; and a thickness of the middle n-type graded doped layer 70 is between 100 nm and 2000 nm. The middle p-type doped layer 71 is made of GaAs; the doping concentration of the middle p-type doped layer 71 is greater than or equal to $1\times10^{19}$ and less than or equal to $1\times10^{20}$; and a thickness of the middle p-type doped layer 71 is between 10 nm and 150 nm. The subcollector layer 80 is made of GaAs; the subcollector layer 80 is n-type doped and the doping concentration of the subcollector layer 80 is greater than or equal to $2\times10^{18}$ and less than or equal to $5\times10^{19}$; and a thickness of the subcollector layer 80 is between 200 nm and 600 nm. The collector layer 82 is made of GaAs; the collector layer 82 is n-type doped and the doping concentration of the collector layer 82 is greater than or equal to $1\times10^{15}$ and less than or equal to $5\times10^{17}$; and a thickness of the collector layer 82 is between 100 nm and 2000 nm. The base layer 83 is made of GaAs; the base layer 83 is p-type doped and the doping concentration of the base layer 83 is greater than or equal to $1\times10^{19}$ and less than or equal to $1\times10^{20}$; and a thickness of the base layer 83 is between 10 nm and 150 nm. The emitter layer 85 is made of GaAs; the emitter layer 85 is n-type doped and the doping concentration of the emitter layer 85 is greater than or equal to $2\times10^{18}$ and less than or equal to $5\times10^{19}$; and a thickness of the emitter layer 85 is between 100 nm and 500 nm.

The present invention further provides a method for fabricating an integrated structure of acoustic wave device, varactor and heterojunction bipolar transistor. Please refer to FIGS. 9A~9F, which are the cross-sectional schematics showing steps of an embodiment of a method for fabricating an integrated structure of acoustic wave device, varactor and heterojunction bipolar transistor of the present invention. The method fabricates the embodiment as shown in FIG. 9G. The method comprises following a step of: (please referring to FIG. 9A and FIG. 9G) Step G1: forming an acoustic wave device 50, a varactor 26 and an heterojunction bipolar transistor 30 on a first part 12(1), a second part 12(2) and a third part 12(3) of a semiconductor substrate 12 respectively, wherein the Step G1 comprises following steps of: Step G11: forming a bottom epitaxial structure 22 on the semiconductor substrate 12, wherein the bottom epitaxial structure 22 includes a first part 22(1), a second part 22(2) and a third part 22(3) of the bottom epitaxial structure 22; wherein the first part 22(1), the second part 22(2) and the third part 22(3) of the bottom epitaxial structure 22 are formed on the first part 12(1), the second part 12(2) and the third part 12(3) of the semiconductor substrate 12 respectively; Step G12: forming a middle epitaxial structure 7 on the bottom epitaxial structure 22, wherein the middle epitaxial structure 7 includes a first part, a second part and a third part of the middle epitaxial structure 7. The first part, the second part and the third part of the middle epitaxial structure 7 are formed on the first part 22(1), the second part 22(2) and the third part 22(3) of the bottom epitaxial structure 22; Step G13: etching the middle epitaxial structure 7 and forming an acoustic wave device upper structure 4, a varactor upper structure 5 and an heterojunction bipolar transistor middle epitaxial structure mesa 7(3) on the first part 22(1), the second part 22(2) and the third part 22(3) of the bottom epitaxial structure 22 respectively, wherein the acoustic wave device 50 comprises the acoustic wave device upper structure 4 and the first part 22(1) of the bottom epitaxial structure 22, wherein the varactor 26 comprises the varactor upper structure 5 and the second part 22(2) of the bottom epitaxial structure 22, wherein the heterojunction bipolar transistor middle epitaxial structure mesa 7(3) is formed by etching the third part of the middle epitaxial structure 7; and Step G14: forming an heterojunction bipolar transistor 30 on the heterojunction bipolar transistor middle epitaxial structure mesa 7(3). To form the structure of FIG. 9A, the Step G11 comprises a following step of: forming a bottom n-type doped layer 25 on the semiconductor substrate 12, wherein the bottom epitaxial structure 22 comprises the bottom n-type doped layer 25; the Step G12 further comprises following steps of: forming a middle n-type graded doped layer 70 on the bottom epitaxial structure 22; and forming a middle p-type doped layer 71 on the middle n-type graded doped layer 70, wherein the middle epitaxial structure 7 comprises the middle n-type graded doped layer 70 and the middle p-type doped layer 71; and the Step G14 comprises a following step of: forming a top epitaxial structure 8 on the middle epitaxial structure 7, which comprises following steps of: forming a subcollector layer 80 on the middle epitaxial structure 7; forming a collector layer 82 on the subcollector layer 80; forming a base layer 83 on the collector layer 82; and forming an emitter layer 85 on the base layer 83. Please refer to FIG. 9B, the Step G14 further comprises a following step of: defining a top epitaxial structure etching area, and etching the top epitaxial structure 8 within the top epitaxial structure etching area to form a top epitaxial structure mesa 8(3), wherein the top epitaxial structure mesa 8(3) comprises the subcollector layer 80, the collector layer 82, the base layer 83 and the emitter layer 85 (this step may include following steps of: defining an emitter layer etching area, and etching the emitter layer 85 within the emitter layer etching area; defining a base layer etching area, and etching the base layer 83 within the base layer etching area; defining a collector layer etching area, and etching the collector layer 82 within the collector layer etching area; and defining a subcollector layer etching area, and etching the subcollector layer 80 within the subcollector layer etching area). The Step G13 (case a) comprises following steps of: defining a middle p-type doped layer etching area, and etching the middle p-type doped layer 71 within the middle p-type doped layer etching area; and defining a middle n-type graded doped layer etching area, and etching the middle n-type graded doped layer 70 within the middle n-type graded doped layer etching area, thereby an acoustic wave device middle epitaxial structure mesa 7(1), a varactor middle epitaxial structure mesa 7(2) and the heterojunction bipolar transistor middle epitaxial structure mesa 7(3) are formed on the first part 22(1), the second part 22(2) and the third part 22(3) of the bottom epitaxial structure 22 respectively, wherein the acoustic wave device middle epitaxial structure mesa 7(1) comprises the middle n-type graded doped layer 70 and the middle p-type doped layer 71 on the first part 22(1) of the bottom epitaxial structure 22, wherein the varactor middle epitaxial structure mesa 7(2) comprises the middle n-type graded doped layer 70 and the middle p-type doped layer 71 on the second part 22(2) of the bottom epitaxial structure 22, wherein the heterojunction bipolar transistor middle epitaxial structure mesa 7(3) comprises the middle n-type graded doped layer 70 and the middle p-type doped layer 71 on the third part 22(3) of the bottom epitaxial structure 22, wherein the top epitaxial structure mesa 8(3) is formed on the heterojunction bipolar transistor middle epitaxial structure mesa 7(3). Please refer to FIG. 9C, the Step G13 further comprises a following step of: forming an acoustic wave device protection layer 66(1), a varactor protection layer 66(2) and an heterojunction bipolar transistor protection layer 66(3), wherein the acoustic wave device protection layer 66(1) covers the exposed surfaces of the first part 22(1) of the bottom epitaxial structure 22 and the acoustic wave device middle epitaxial structure mesa 7(1), and wherein the acoustic wave device protection layer 66(1) covers the acoustic wave device middle epitaxial structure mesa 7(1) to form an acoustic wave device protection layer mesa 607; wherein the varactor protection layer 66(2) covers the exposed surfaces of the second part 22(2) of the bottom epitaxial structure 22 and the varactor middle epitaxial structure mesa 7(2), wherein the varactor protection layer 66(2) covers the varactor middle epitaxial structure mesa 7(2) to form a varactor protection layer mesa 609, wherein the heterojunction bipolar transistor protection layer 66(3) covers the exposed surfaces of the third part 22(3) of the bottom epitaxial structure 22, the heterojunction bipolar transistor middle epitaxial structure mesa 7(3) and the top epitaxial structure mesa 8(3). Please refer to FIG. 9D, the Step G13 further comprises a following step of: etching the varactor protection layer 66(2) to form a varactor bottom electrode recess 52 and a varactor top electrode recess 53 respectively. A bottom of the varactor bottom electrode recess 52 is defined by the second part 22(2) of the bottom epitaxial structure 22 such that part of the second part 22(2) of the bottom epitaxial structure 22 is exposed through the varactor bottom electrode recess 52. A bottom of the varactor top electrode recess 53 is defined by the varactor middle epitaxial structure mesa 7(2) such that part of the varactor middle epitaxial structure mesa 7(2) is exposed through the varactor top electrode recess 53. The Step G14 further comprises a following step of: etching the heterojunction bipolar transistor protection layer 66(3) to form a collector electrode recess 67, a base electrode recess 68 and an emitter electrode recess 69 respectively. In current embodiment, a bottom of the collector electrode recess 67 is defined by the subcollector layer 80; a bottom of the base electrode recess 68 is defined by the base layer 83; and a bottom of the emitter electrode recess 69 is defined by the emitter layer 85. Please refer to FIG. 9E, the Step G13 further comprises following steps of: forming an acoustic wave resonance structure 64 on the acoustic wave device protection layer mesa 607 (the step may include following steps of: forming an acoustic wave device bottom electrode 604 on the acoustic wave device protection layer mesa 607; forming a dielectric layer 605 on the acoustic wave device bottom electrode 604; and forming an acoustic wave device top electrode 606 on the dielectric layer 605), wherein the acoustic wave resonance structure 64 comprises the acoustic wave device bottom electrode 604, the dielectric layer 605 and the acoustic wave device top electrode 606, and wherein the acoustic wave device upper structure 4 comprises an acoustic wave device protection layer 66(1) and an acoustic wave resonance structure 64; forming a varactor top electrode 55 on the varactor middle epitaxial structure mesa 7(2) within the varactor top electrode recess 53; and forming a varactor bottom electrode 54 on the second part 22(2) of the bottom epitaxial structure 22 within the varactor bottom electrode recess 52, wherein the varactor upper structure 5 comprises the varactor middle epitaxial structure mesa 7(2), the varactor protection layer 66(2), the varactor top electrode 55 and the varactor bottom electrode 54. In current embodiment, the bottom n-type doped layer 25 on the second part 12(2) of the semiconductor substrate 12, the middle n-type graded doped layer 70 and the middle p-type doped layer 71 on the second part 22(2) of the bottom epitaxial structure 22, the varactor protection layer 66(2), the varactor top electrode 55 and the varactor bottom electrode 54 form the varactor 26. The Step G14 further comprises following steps of: forming an emitter electrode 39 on the emitter layer 85 within the emitter electrode recess 69; forming a base electrode 38 on the base layer 83 within the base electrode recess 68; and forming a collector electrode 37 on the subcollector layer 80 within the collector electrode recess 67, wherein the heterojunction bipolar transistor 30 comprises the top epitaxial structure mesa 8(3), the heterojunction bipolar transistor protection layer 66(3), the emitter electrode 39, the base electrode 38 and the collector electrode 37. Please refer to FIG. 9F, the Step G13 further comprises following steps of: defining at least one recess etching area, and etching the acoustic wave device protection layer 66(1) within the at least one recess etching area or etching the acoustic wave device protection layer 66(1) and the acoustic wave resonance structure 64 within the at least one recess etching area such that the etching stops at the acoustic wave device middle epitaxial structure mesa 7(1) and/or the first part 22(1) of the bottom epitaxial structure 22 to form at least one etching recess, thereby part of the acoustic wave device middle epitaxial structure mesa 7(1) is exposed. Although in current embodiment, the at least one etching recess is not shown in FIG. 9F, the structure of the at least one etching recess may be similar to the structure of the at least one etching recess 62 in FIG. 1G or FIG. 1H. The Step G13 further comprises a following step of: etching the acoustic wave device middle epitaxial structure mesa 7(1) to form an acoustic wave device protection layer recess 608, wherein at least one middle epitaxial structure etching solution contacts with the acoustic wave device middle epitaxial structure mesa 7(1) via the at least one etching recess and etches and removes the acoustic wave device middle epitaxial structure mesa 7(1), thereby a top and a bottom of the acoustic wave device protection layer recess 608 are the acoustic wave device protection layer 66(1) and the first part 22(1) of the bottom epitaxial structure 22 respectively. Please refer to FIG. 9G, the Step G1 further comprises a following step of: etching the first part 22(1) of the bottom epitaxial structure 22 below the acoustic wave device protection layer recess 608 to form a bottom epitaxial structure recess 24, wherein a bottom of the bottom epitaxial structure recess 24 is the first part 22(1) of the bottom epitaxial structure 22, wherein at least one bottom epitaxial structure etching solution contacts with a top surface of the first part 22(1) of the bottom epitaxial structure 22 via the at least one etching recess and the acoustic wave device protection layer recess 608, the at least one bottom epitaxial structure etching solution is uniformly distributed on the top surface of the first part 22(1) of the bottom epitaxial structure 22 through the acoustic wave device protection layer recess 608 so as to uniformly etch part of the first part 22(1) of the bottom epitaxial structure 22 below the acoustic wave device protection layer recess 608 to form the bottom epitaxial structure recess 24, and thereby prevents the side etching phenomenon during the etching, wherein the acoustic wave device protection layer recess 608 is communicated with the bottom epitaxial structure recess 24, and the acoustic wave device protection layer recess 608 and the bottom epitaxial structure recess 24 have a boundary 104 therebetween and the boundary 104 is extended from the top surface of the first part 22(1) of the bottom epitaxial structure 22, wherein a gap between the acoustic wave device protection layer 66(1) and the bottom of the bottom epitaxial structure recess 24 is increased by the communication of the acoustic wave device protection layer recess 608 and the bottom epitaxial structure recess 24, so as to avoid the contact of the acoustic wave device protection layer 66(1) and the bottom of the bottom epitaxial structure recess when the acoustic wave device 50 is affected by stress such that the acoustic wave device protection layer 66(1) is bended downwardly. The integrated structure of the acoustic wave device 50, the varactor 26 and the heterojunction bipolar transistor 30 formed on the same the semiconductor substrate 12 is capable of reducing the module size, optimizing the impedance matching, and reducing the signal loss between the heterojunction bipolar transistor 30, the varactor 26 and the acoustic wave device 50. In some embodiments, the acoustic wave device protection layer recess 608 has an opening smaller than or equal to that of the bottom epitaxial structure recess 24. In another embodiment, the acoustic wave device protection layer recess 608 may have an opening greater than that of the bottom epitaxial structure recess 24.

Figure 9H:
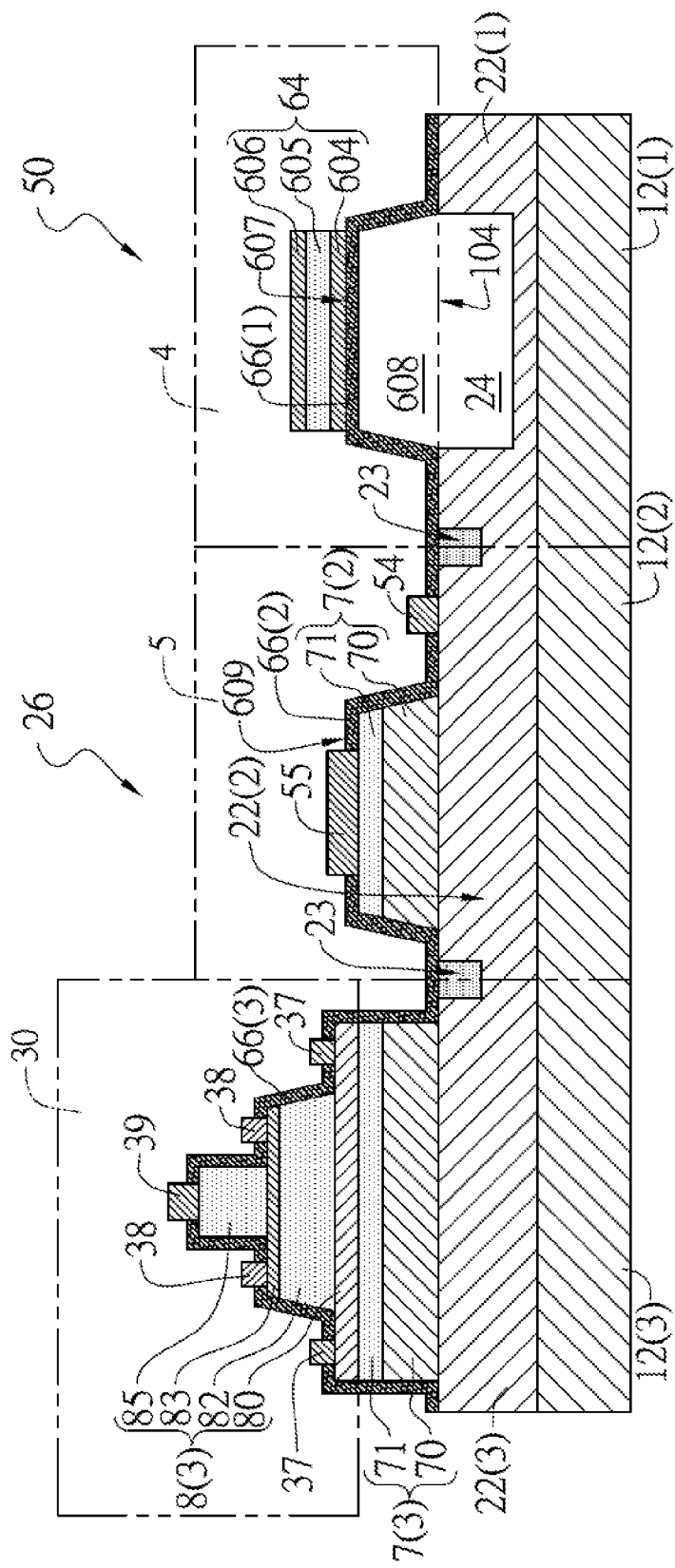

Please refer to FIG. 9H, which is the cross-sectional schematic showing another embodiment of an integrated structure of acoustic wave device, varactor and heterojunction bipolar transistor of the present invention. The Step G1 further comprises a following step of: forming at least one isolation structure 23 between any two of the varactor 26, the acoustic wave device 50 and the heterojunction bipolar transistor 30 such that any two of the varactor 26, the acoustic wave device 50 and the heterojunction bipolar transistor 30 are electrically isolated by the at least one isolation structure 23. The main structure in FIG. 9H is basically the same as the structure shown in FIG. 9G, except that the at least one isolation structure 23 is formed between the varactor 26 and the acoustic wave device 50 and between the varactor 26 and the heterojunction bipolar transistor 30. The varactor 26 and the acoustic wave device 50 are electrically isolated by the at least one isolation structure 23. And the varactor 26 and the heterojunction bipolar transistor 30 are electrically isolated by the at least one isolation structure 23. In some embodiments, the at least one isolation structure 23 is formed between the acoustic wave device 50 and the heterojunction bipolar transistor 30. The acoustic wave device 50 and the heterojunction bipolar transistor 30 are electrically isolated by the at least one isolation structure 23.

Figure 9I:
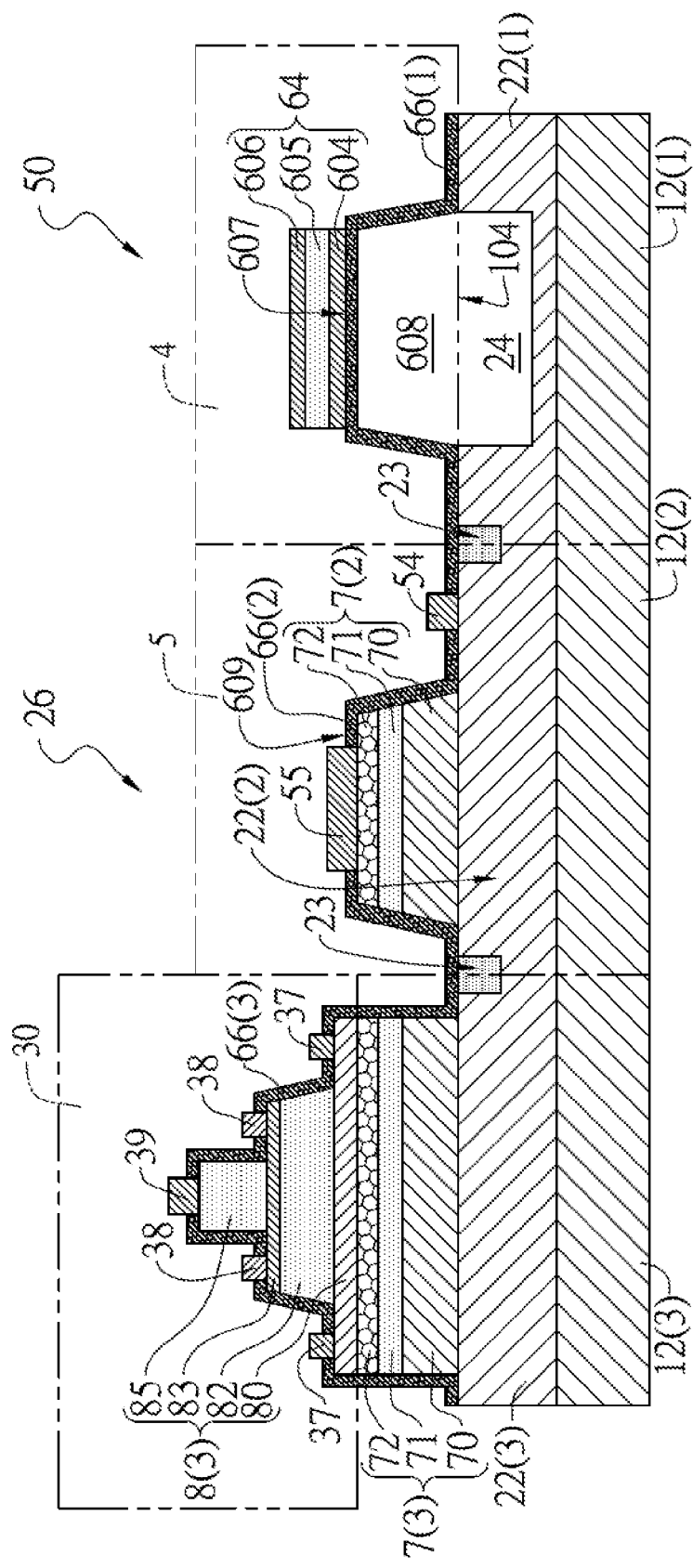

Please refer to FIG. 9I, which is the cross-sectional schematic showing another embodiment of an integrated structure of acoustic wave device, varactor and heterojunction bipolar transistor of the present invention. The main structure in FIG. 9I is basically the same as the structure shown in FIG. 9H, except that the varactor middle epitaxial structure mesa 7(2) and the heterojunction bipolar transistor middle epitaxial structure mesa 7(3) further comprise a varactor ledge layer 72 formed on the middle p-type doped layer 71. The Step G12 further comprises a following step of: forming a varactor ledge layer 72 on the middle p-type doped layer 71. The Step G13 further comprises a following step of: defining a varactor ledge layer etching area, and etching the varactor ledge layer 72 within the varactor ledge layer etching area; wherein the varactor middle epitaxial structure mesa 7(2) comprises the middle n-type graded doped layer 70, the middle p-type doped layer 71 and the varactor ledge layer 72 on the second part 22(2) of the bottom epitaxial structure 22; and wherein the heterojunction bipolar transistor middle epitaxial structure mesa 7(3) comprises the middle n-type graded doped layer 70, the middle p-type doped layer 71 and the varactor ledge layer 72 on the third part 22(3) of the bottom epitaxial structure 22. In the first type of applications of embodiments, the varactor ledge layer 72 is made of $In_xGa_{1-x}As$, wherein x is greater than 0 and less than 1; in a preferable embodiment, x is about 0.53; the varactor ledge layer 72 is n-type doped and the doping concentration of the varactor ledge layer 72 is greater than or equal to $5 \times 10^{16}$ and less than or equal to $5 \times 10^{17}$; and a thickness of the varactor ledge layer 72 is between 1 nm and 60 nm. In the second type of applications of embodiments, the varactor ledge layer 72 is made of $In_xGa_{1-x}P$, wherein x is greater than 0 and less than 1; in a preferable embodiment, x is about 0.48; the varactor ledge layer 72 is n-type doped and the doping concentration of the varactor ledge layer 72 is greater than or equal to $5 \times 10^{16}$ and less than or equal to $5 \times 10^{17}$; and a thickness of the varactor ledge layer 72 is between 1 nm and 60 nm.

Figure 9J:
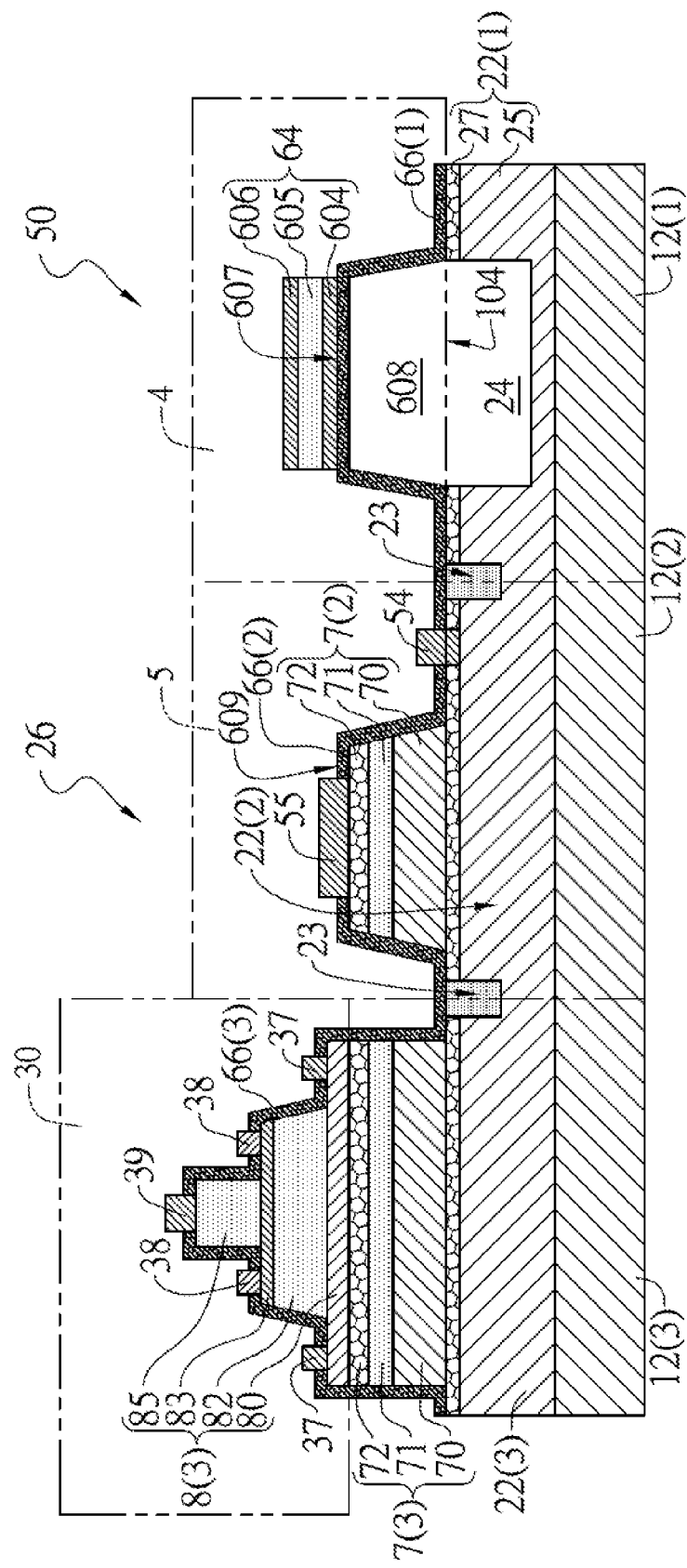

Please refer to FIG. 9J, which is the cross-sectional schematic showing another embodiment of an integrated structure of acoustic wave device, varactor and heterojunction bipolar transistor of the present invention. The main structure in FIG. 9J is basically the same as the structure shown in FIG. 9I, except that the bottom epitaxial structure 22 further comprises an etching stop layer 27. The bottom epitaxial structure 22 comprises the bottom n-type doped layer 25 and the etching stop layer 27, wherein the etching stop layer 27 is formed on the bottom n-type doped layer 25. The Step G11 further comprises following steps of: forming an etching stop layer 27 on the bottom n-type doped layer 25; and etching the etching stop layer 27 to form the varactor bottom electrode recess 52 on the second part 22(2) of the bottom epitaxial structure 22 such that the bottom of the varactor bottom electrode recess 52 is the second part 22(2) of the bottom epitaxial structure 22; wherein the varactor bottom electrode 54 is formed on the bottom n-type doped layer 25 within the varactor bottom electrode recess 52. In the first type of applications of embodiments, the etching stop layer 27 is made of InP; the etching stop layer 27 is n-type doped and the doping concentration of etching stop layer 27 is greater than or equal to $2 \times 10^{18}$ and less than or equal to $5 \times 10^{19}$; and a thickness of the varactor ledge layer 72 is between 1 nm and 40 nm. In the second type of applications of embodiments, the etching stop layer 27 is made of $In_xGa_{1-x}P$, wherein x is greater than 0 and less than 1; in a preferable embodiment, x is about 0.48; the etching stop layer 27 is n-type doped and the doping concentration of etching stop layer 27 is greater than or equal to $2 \times 10^{18}$ and less than or equal to $5 \times 10^{19}$; and a thickness of the varactor ledge layer 72 is between 1 nm and 40 nm.

Figure 9K:
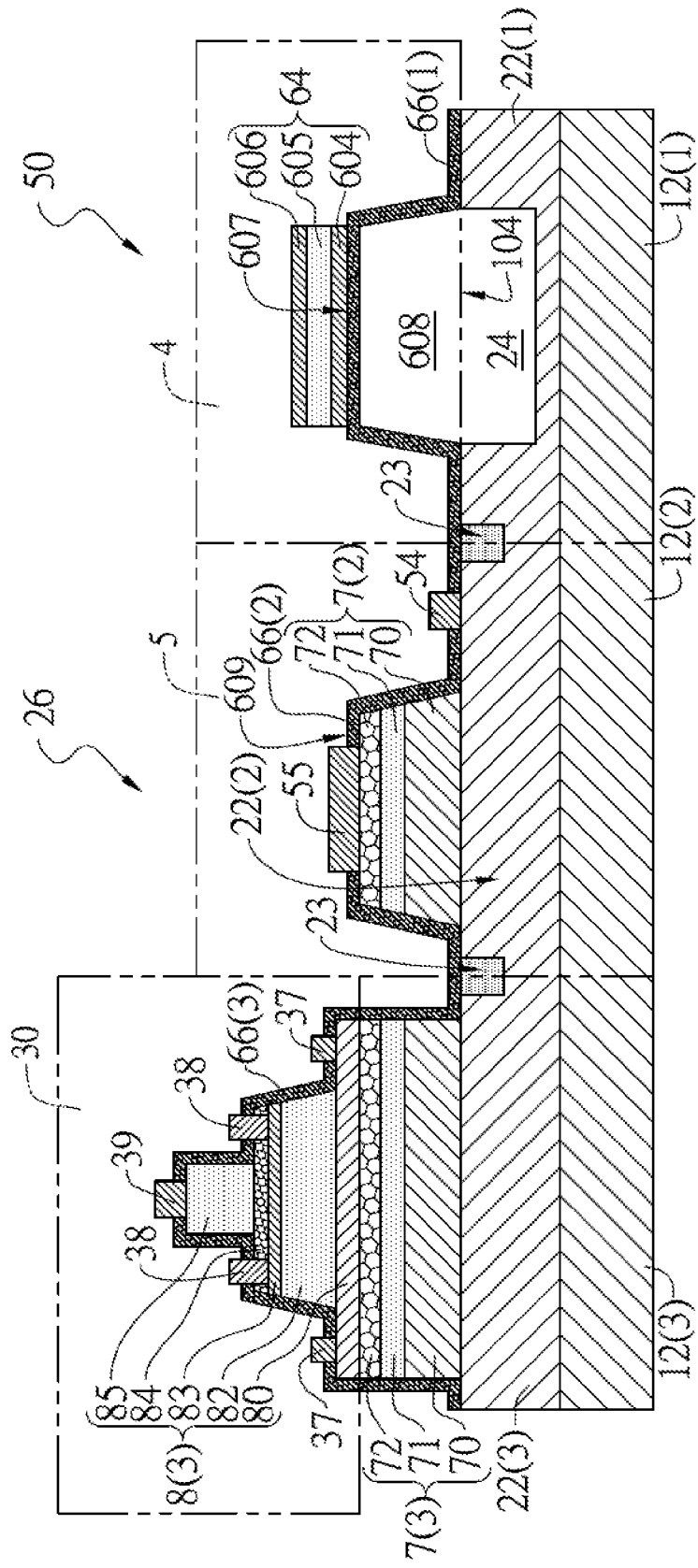

Please refer to FIG. 9K, which is the cross-sectional schematic showing another embodiment of an integrated structure of acoustic wave device, varactor and heterojunction bipolar transistor of the present invention. The main structure in FIG. 9K is basically the same as the structure shown in FIG. 9I, except that the top epitaxial structure mesa 8(3) further comprises an emitter ledge layer 84. The emitter ledge layer 84 is formed on the base layer 83, and the emitter layer 85 is formed on the emitter ledge layer 84. The top epitaxial structure mesa 8(3) comprises the subcollector layer 80, the collector layer 82, the base layer 83, the emitter ledge layer 84 and the emitter layer 85. The emitter ledge layer 84 has a base electrode recess 68 (please referring to FIG. 9D), and wherein a bottom of the base electrode recess 68 is the base layer 83 such that the base electrode 38 is formed on the base layer 83 within the base electrode recess 68. The Step G14 further comprises following steps of: forming an emitter ledge layer 84 on the base layer 83, wherein the emitter layer 85 is formed on the emitter ledge layer 84; and defining an emitter ledge layer etching area, and etching the emitter ledge layer 84 within the emitter ledge layer etching area to form a base electrode recess 68, wherein a bottom of the base electrode recess 68 is the base layer 83 such that the base electrode 38 is formed on the base layer 83 within the base electrode recess 68. In the first type of applications of embodiments, the emitter ledge layer 84 is made of $In_xGa_{1-x}As$, wherein x is greater than 0 and less than 1; in a preferable embodiment, x is about 0.53; the emitter ledge layer 84 is n-type doped and the doping concentration of the emitter ledge layer 84 is greater than or equal to $5\times10^{16}$ and less than or equal to $5\times10^{17}$; and a thickness of the emitter ledge layer 84 is between 1 nm and 60 nm. In the second type of applications of embodiments, the emitter ledge layer 84 is made of $In_xGa_{1-x}P$, wherein x is greater than 0 and less than 1; in a preferable embodiment, x is about 0.48; the emitter ledge layer 84 is n-type doped and the doping concentration of the emitter ledge layer 84 is greater than or equal to $5\times10^{16}$ and less than or equal to $5\times10^{17}$; and a thickness of the emitter ledge layer 84 is between 1 nm and 60 nm.

Figure 9L:
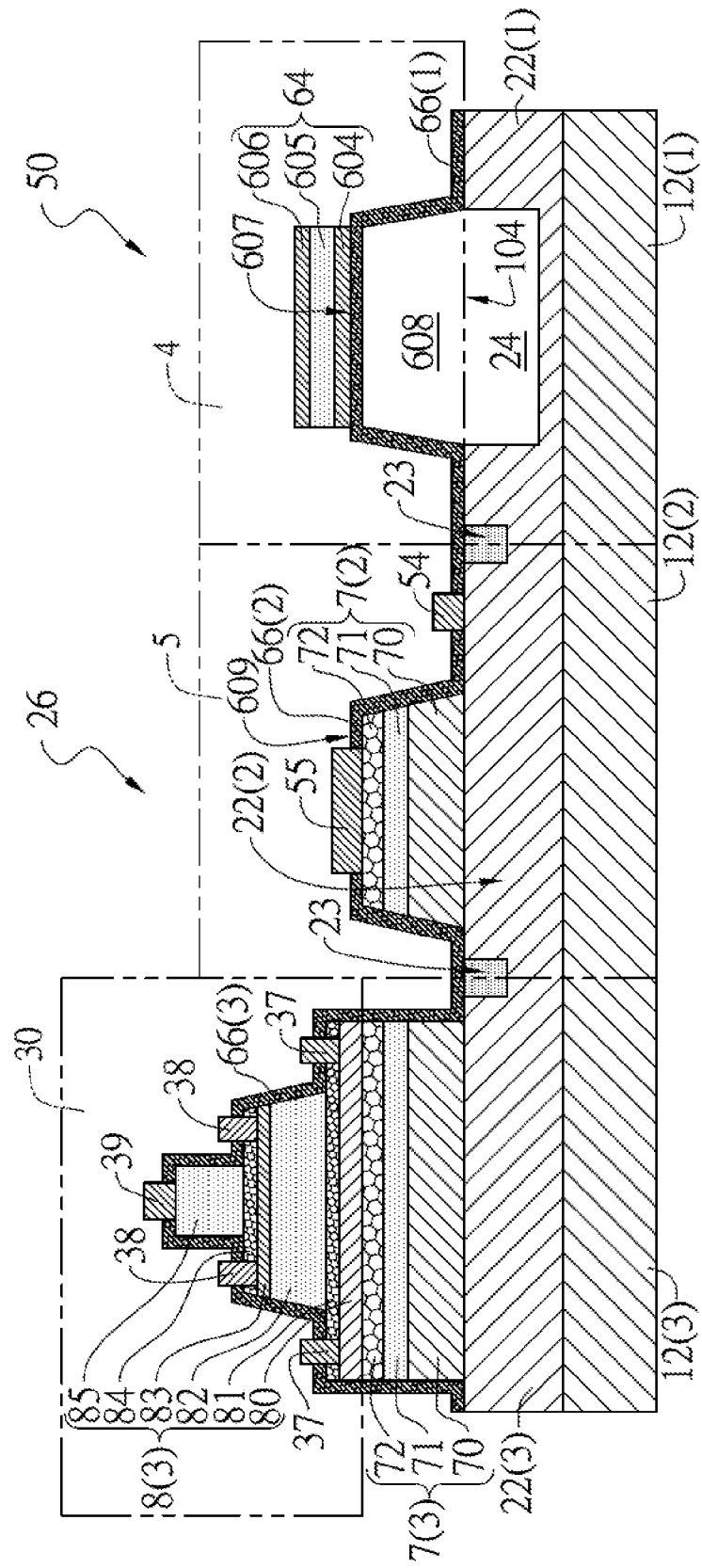

Please refer to FIG. 9L, which is the cross-sectional schematic showing another embodiment of an integrated structure of acoustic wave device, varactor and heterojunction bipolar transistor of the present invention. The main structure in FIG. 9L is basically the same as the structure shown in FIG. 9K, except that the top epitaxial structure mesa 8(3) further comprises a second etching stop layer 81. The second etching stop layer 81 is formed on the subcollector layer 80. The collector layer 82 is formed on the second etching stop layer 81. The top epitaxial structure mesa 8(3) comprises the subcollector layer 80, the second etching stop layer 81, the collector layer 82, the base layer 83, the emitter ledge layer 84 and the emitter layer 85. The second etching stop layer 81 has a collector electrode recess 67 (please referring to FIG. 9D), wherein a bottom of the collector electrode recess 67 is the subcollector layer 80 such that the collector electrode 37 is formed on the subcollector layer 80 within the collector electrode recess 67. The Step G14 further comprises following steps of: forming a second etching stop layer 81 on the subcollector layer 80, wherein the collector layer 82 is formed on the second etching stop layer 81; and defining a second etching stop layer etching area, and etching the second etching stop layer 81 within the second etching stop layer etching area to form a collector electrode recess 67 of the second etching stop layer 81, wherein a bottom of the collector electrode recess 67 is the subcollector layer 80 such that the collector electrode 37 is formed on the subcollector layer 80 within the collector electrode recess 67. In the first type of applications of embodiments, the second etching stop layer 81 is made of InP; the second etching stop layer 81 is n-type doped and the doping concentration of the second etching stop layer 81 is greater than or equal to $2\times10^{18}$ and less than or equal to $5\times10^{19}$; and a thickness of the second etching stop layer 81 is between 1 nm and 40 nm. In the second type of applications of embodiments, the second etching stop layer 81 is made of $In_xGa_{1-x}P$, wherein x is greater than 0 and less than 1; in a preferable embodiment, x is about 0.48; the second etching stop layer 81 is n-type doped and the doping concentration of the second etching stop layer 81 is greater than or equal to $2\times10^{18}$ and less than or equal to $5\times10^{19}$; and a thickness of the second etching stop layer 81 is between 1 nm and 40 nm.

Figure 9M:
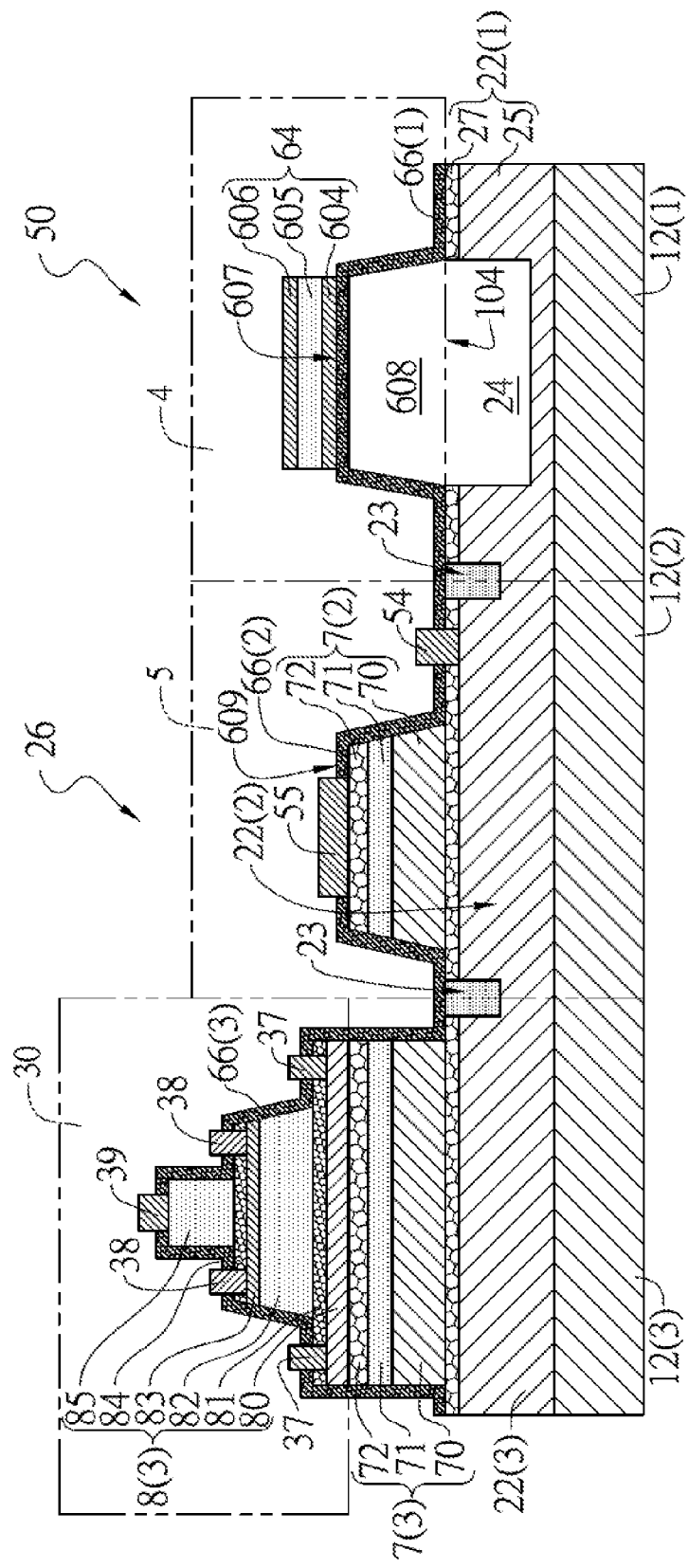

Please refer to FIG. 9M, which is the cross-sectional schematic showing another embodiment of an integrated structure of acoustic wave device, varactor and heterojunction bipolar transistor of the present invention. The main structure in FIG. 9M is basically the same as the structure shown in FIG. 9L, except that the bottom epitaxial structure 22 further comprises an etching stop layer 27. The bottom epitaxial structure 22 comprises the bottom n-type doped layer 25 and the etching stop layer 27, wherein the etching stop layer 27 is formed on the bottom n-type doped layer 25. The Step G11 further comprises following steps of: forming an etching stop layer 27 on the bottom n-type doped layer 25; and etching the etching stop layer 27 to form the varactor bottom electrode recess 52 on the second part 22(2) of the bottom epitaxial structure 22 such that the bottom of the varactor bottom electrode recess 52 is the second part 22(2) of the bottom epitaxial structure 22; wherein the varactor bottom electrode 54 is formed on the bottom n-type doped layer 25 within the varactor bottom electrode recess 52. In the first type of applications of embodiments, the etching stop layer 27 is made of InP; the etching stop layer 27 is n-type doped and the doping concentration of etching stop layer 27 is greater than or equal to $2\times10^{18}$ and less than or equal to $5\times10^{19}$; and a thickness of the varactor ledge layer 72 is between 1 nm and 40 nm. In the second type of applications of embodiments, the etching stop layer 27 is made of $In_xGa_{1-x}P$, wherein x is greater than 0 and less than 1; in a preferable embodiment, x is about 0.48; the etching stop layer 27 is n-type doped and the doping concentration of etching stop layer 27 is greater than or equal to $2\times10^{18}$ and less than or equal to $5\times10^{19}$; and a thickness of the varactor ledge layer 72 is between 1 nm and 40 nm.

Please refer to FIG. 9O is the cross-sectional schematic showing another embodiment of an integrated structure of acoustic wave device, varactor and heterojunction bipolar transistor of the present invention. The main structure in FIG. 9O is basically the same as the structure shown in FIG. 9H, except that the acoustic wave device upper structure 4 comprises an auxiliary layer 280, a dielectric layer 28 and an interdigital transducer electrode 29, wherein the auxiliary layer 280 is formed on the first part 22(1) of the bottom epitaxial structure 22, the dielectric layer 28 is formed on the auxiliary layer 280, wherein the interdigital transducer electrode 29 is formed on the dielectric layer 28, and wherein the first part 22(1) of the bottom epitaxial structure 22 has no bottom epitaxial structure recess 24. In current embodiment, the acoustic wave device 50 may be a surface acoustic wave device. The integrated structure of the acoustic wave device 50, the varactor 26 and the heterojunction bipolar transistor 30 formed on the same the semiconductor substrate 12 is capable of reducing the module size, optimizing the impedance matching, and reducing the signal loss between the varactor 26, the acoustic wave device 50 and the heterojunction bipolar transistor 30.

Figure 9N:
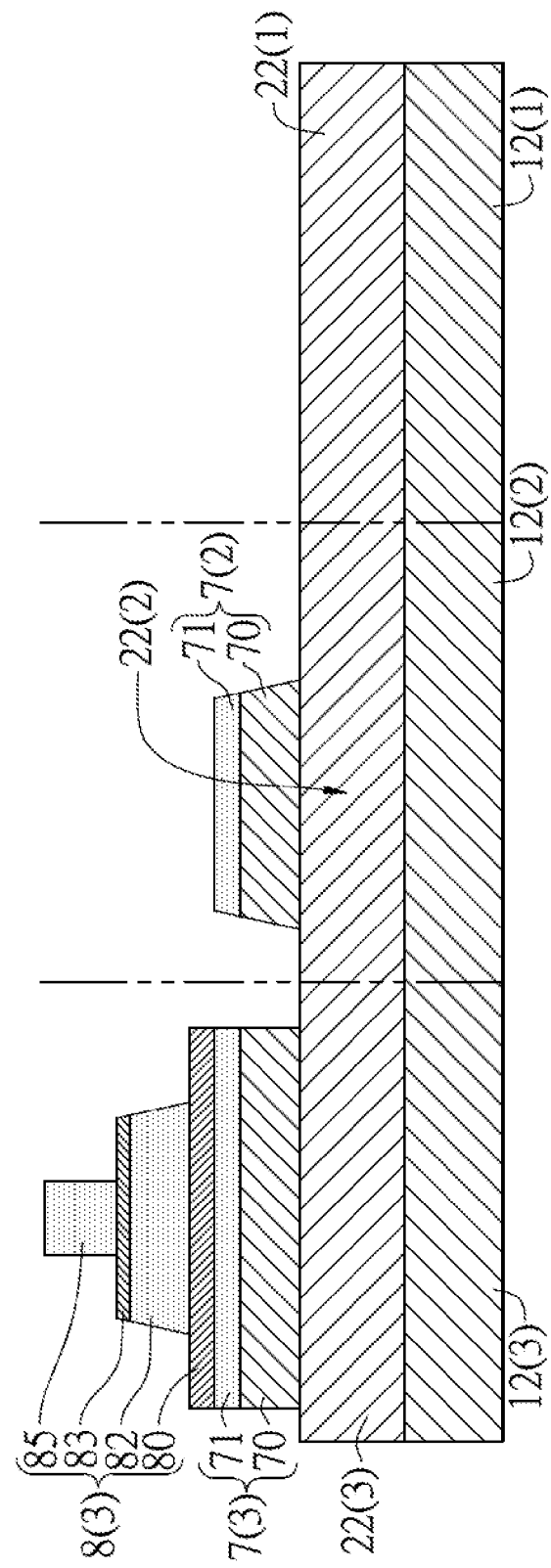
FIG. 9N is the cross-sectional schematic showing a step of another embodiment of a method for fabricating an integrated structure of acoustic wave device, varactor and heterojunction bipolar transistor of the present invention.
Figure 90:
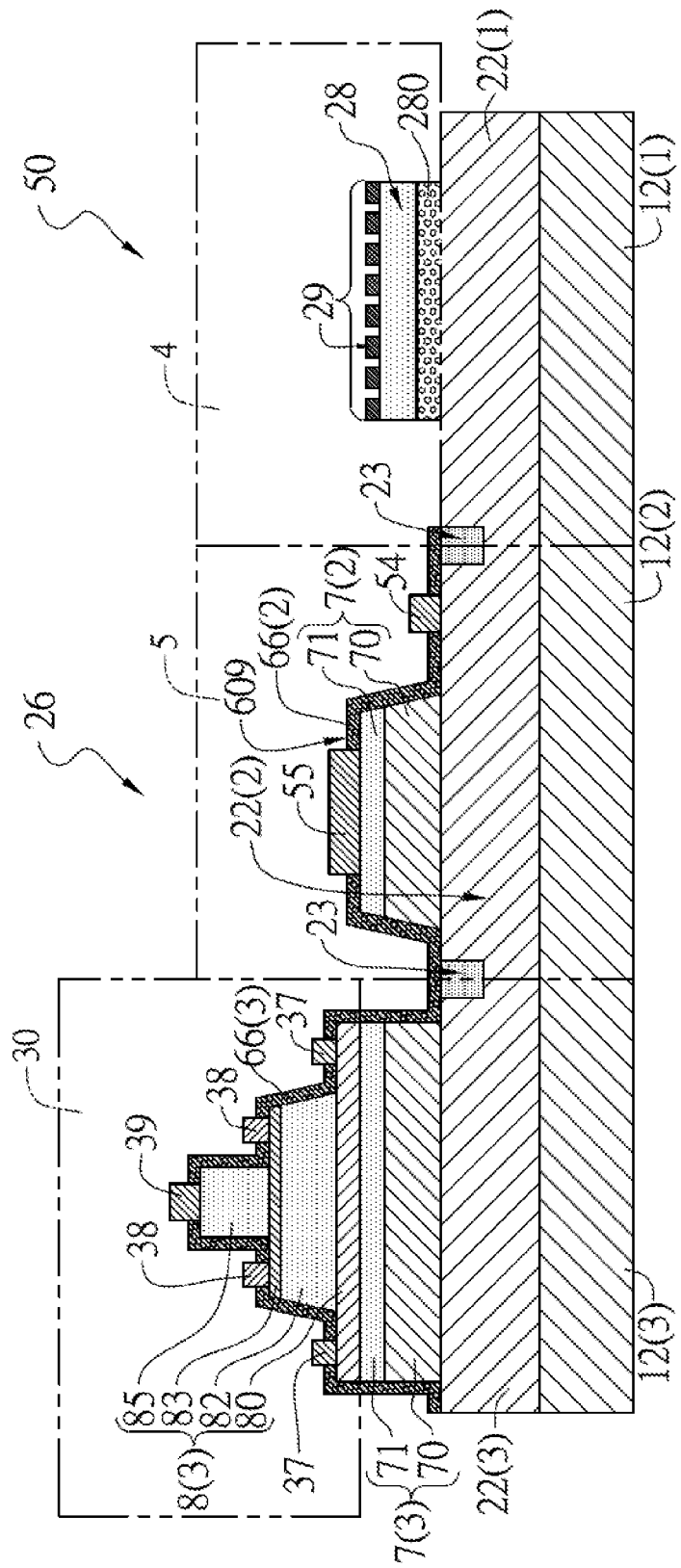

Please refer to FIGS. 9A, 9N and 9O, which are the cross-sectional schematics showing steps of an embodiment of a method for fabricating an integrated structure of acoustic wave device, varactor and heterojunction bipolar transistor of the present invention. The method fabricates the embodiment as shown in FIG. 9O. The method for fabricating the embodiment of FIG. 9O is basically the same as the method for fabricating the embodiment of FIG. 9H (that is the method for fabricating the varactor 26 and the heterojunction bipolar transistor 30 on the second part 12(2) and the third part 12(3) of the semiconductor substrate 12 of the embodiment of FIG. 9O is basically the same as the method for fabricating the varactor 26 and the heterojunction bipolar transistor 30 on the second part 12(2) and the third part 12(3) of the semiconductor substrate 12 of the embodiment of FIG. 9H, while the method for fabricating the acoustic wave device 50 on the first part 12(1) of the semiconductor substrate 12 of the embodiment of FIG. 9O is different from the method for fabricating the acoustic wave device 50 on the first part 12(1) of the semiconductor substrate 12 of the embodiment of FIG. 9H), except that the Step G13 (case b) is modified as following: defining a middle p-type doped layer etching area, and etching the middle p-type doped layer 71 within the middle p-type doped layer etching area; and defining a middle n-type graded doped layer etching area, and etching the middle n-type graded doped layer 70 within the middle n-type graded doped layer etching area, thereby a varactor middle epitaxial structure mesa 7(2) and the heterojunction bipolar transistor middle epitaxial structure mesa 7(3) are formed on the second part 22(2) and the third part 22(3) of the bottom epitaxial structure 22 respectively (therefore, there is no such an acoustic wave device middle epitaxial structure mesa 7(1) formed on the first part 22(1) of the bottom epitaxial structure 22 as shown in FIG. 9B, the first part of the middle epitaxial structure 7 on the first part 22(1) of the bottom epitaxial structure 22 is etched and removed); in the Step G13, forming the acoustic wave device upper structure 4 on the first part 22(1) of the bottom epitaxial structure 22 comprises following steps of: forming an auxiliary layer 280 on the first part 22(1) of the bottom epitaxial structure 22; forming a dielectric layer 28 on the auxiliary layer 280; and forming an interdigital transducer electrode 29 on the dielectric layer 28; and in the Step G1, there is no such a step to etch the first part 22(1) of the bottom epitaxial structure 22 to form the bottom epitaxial structure recess 24. In the embodiment of FIG. 9O, the acoustic wave device upper structure 4 comprises the auxiliary layer 280, the dielectric layer 28 and the interdigital transducer electrode 29. The acoustic wave device 50 may be a surface acoustic wave device. In the embodiment of FIG. 9O, the structure of the varactor 26 and the heterojunction bipolar transistor 30 is basically the same as the structure of the varactor 26 and the heterojunction bipolar transistor 30 in the embodiment of FIG. 9H.

Please refer to FIGS. 9B, 9I and 9P, which are the cross-sectional schematics showing steps of an embodiment of a method for fabricating an integrated structure of acoustic wave device, varactor and heterojunction bipolar transistor of the present invention. The method fabricates the embodiment as shown in FIG. 9I. In FIG. 9B, the varactor middle epitaxial structure mesa 7(2) comprises the middle n-type graded doped layer 70 and the middle p-type doped layer 71 on the second part 22(2) of the bottom epitaxial structure 22. The acoustic wave device middle epitaxial structure mesa 7(1) comprises the middle n-type graded doped layer 70 and the middle p-type doped layer 71 on the first part 22(1) of the bottom epitaxial structure 22. The heterojunction bipolar transistor middle epitaxial structure mesa 7(3) comprises the middle n-type graded doped layer 70 and the middle p-type doped layer 71 on the third part 22(3) of the bottom epitaxial structure 22. To form the structure of FIG. 9P, the Step G12 may further comprise a following step of: forming a varactor ledge layer 72 on the middle p-type doped layer 71. And the Step G13 may further comprise a following step of: defining a varactor ledge layer etching area, and etching the varactor ledge layer 72 within the varactor ledge layer etching area. Then the structure of FIG. 9P may be fabricated. In FIG. 9P, the varactor middle epitaxial structure mesa 7(2) comprises the middle n-type graded doped layer 70, the middle p-type doped layer 71 and the varactor ledge layer 72 on the second part 22(2) of the bottom epitaxial structure 22. The acoustic wave device middle epitaxial structure mesa 7(1) comprises the middle n-type graded doped layer 70, the middle p-type doped layer 71 and the varactor ledge layer 72 on the first part 22(1) of the bottom epitaxial structure 22. The heterojunction bipolar transistor middle epitaxial structure mesa 7(3) comprises the middle n-type graded doped layer 70, the middle p-type doped layer 71 and the varactor ledge layer 72 on the third part 22(3) of the bottom epitaxial structure 22. Therefore, after forming the acoustic wave device protection layer 66(1) and the varactor protection layer 66(2), the acoustic wave device protection layer mesa 607 and the varactor protection layer mesa 609 may have the same height (as shown in FIG. 9I).

Figure 9S:
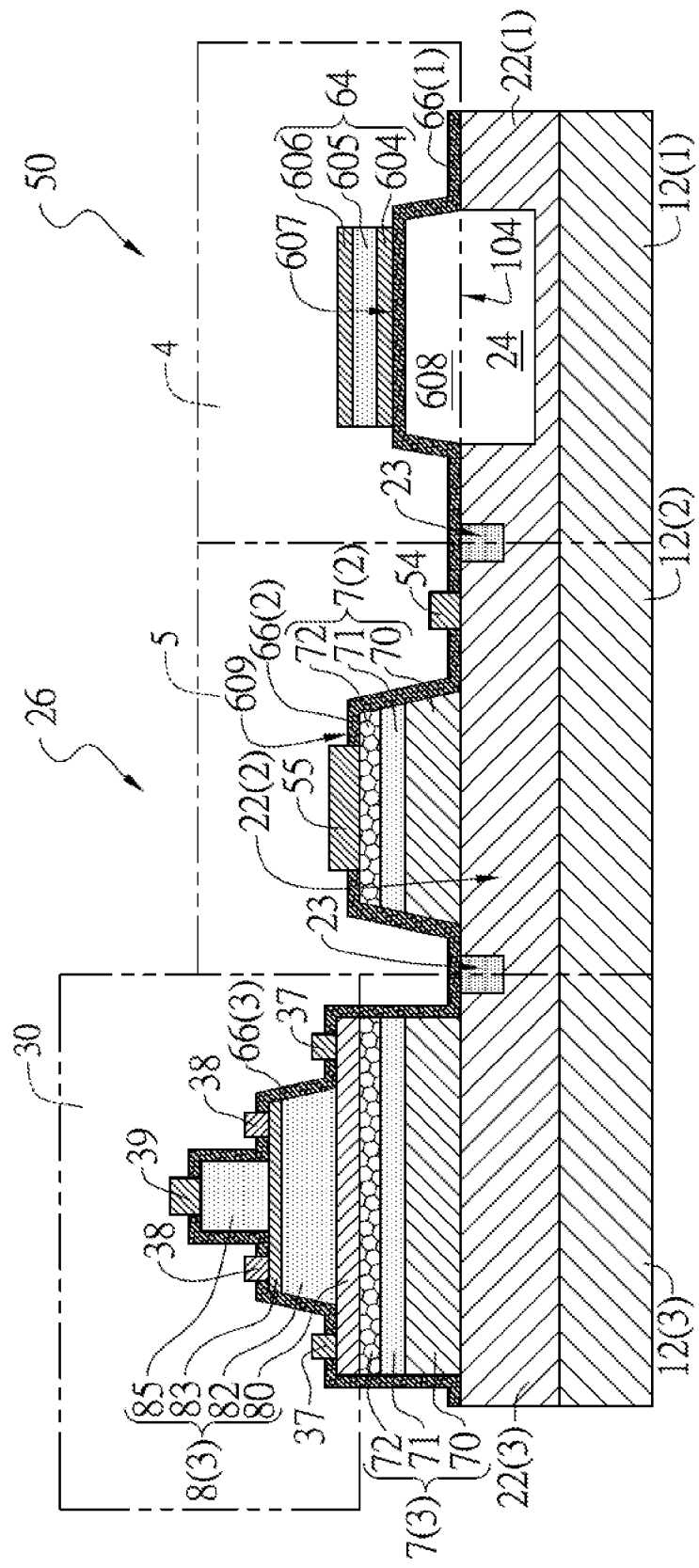
FIG. 9S is the cross-sectional schematic showing an embodiment of an integrated structure of acoustic wave device, varactor and heterojunction bipolar transistor of the present invention.

Please refer to FIGS. 9Q, 9R and 9S, which are the cross-sectional schematics showing steps of an embodiment of a method for fabricating an integrated structure of acoustic wave device, varactor and heterojunction bipolar transistor of the present invention. The method fabricates the embodiment as shown in FIG. 9S. The main structure in FIG. 9S is basically the same as the structure shown in FIG. 9I, except that a height of the varactor protection layer mesa 609 is greater than a height of the acoustic wave device protection layer mesa 607. To form the structure of FIG. 9Q from the structure of FIG. 9P, the Step G13 may further comprise a following step of: etching the varactor ledge layer 72 of the acoustic wave device middle epitaxial structure mesa 7(1) such that the acoustic wave device middle epitaxial structure mesa 7(1) comprises the middle n-type graded doped layer 70 and the middle p-type doped layer 71 on the first part 22(1) of the bottom epitaxial structure 22, while the varactor middle epitaxial structure mesa 7(2) comprises the middle n-type graded doped layer 70, the middle p-type doped layer 71 and the varactor ledge layer 72 on the second part 22(2) of the bottom epitaxial structure 22 and the heterojunction bipolar transistor middle epitaxial structure mesa 7(3) comprises the middle n-type graded doped layer 70, the middle p-type doped layer 71 and the varactor ledge layer 72 on the third part 22(3) of the bottom epitaxial structure 22. To form the structure of FIG. 9R from the structure of FIG. 9Q, the Step G13 may further comprise a following step of: etching the middle p-type doped layer 71 of the acoustic wave device middle epitaxial structure mesa 7(1) such that the acoustic wave device middle epitaxial structure mesa 7(1) comprises the middle n-type graded doped layer 70 on the first part 22(1) of the bottom epitaxial structure 22, while the varactor middle epitaxial structure mesa 7(2) comprises the middle n-type graded doped layer 70, the middle p-type doped layer 71 and the varactor ledge layer 72 on the second part 22(2) of the bottom epitaxial structure 22 and the heterojunction bipolar transistor middle epitaxial structure mesa 7(3) comprises the middle n-type graded doped layer 70, the middle p-type doped layer 71 and the varactor ledge layer 72 on the third part 22(3) of the bottom epitaxial structure 22. The structure of FIG. 9S may be formed from the structure of FIG. 9Q or FIG. 9R. And therefore, after forming the acoustic wave device protection layer 66(1) and the varactor protection layer 66(2), the height of the varactor protection layer mesa 609 is greater than the height of the acoustic wave device protection layer mesa 607 (as shown in FIG. 9S).

In the embodiment in FIG. 8S, the auxiliary layer 610 is introduced and is inserted between the acoustic wave device protection layer mesa 607 and the acoustic wave device bottom electrode 604. Similarly the auxiliary layer 610 may be introduced and inserted between the acoustic wave device protection layer mesa 607 and the acoustic wave device bottom electrode 604 in the embodiments of FIGS. 9G, 9H, 9I, 9J, 9K, 9L, 9M and 9S.

In the present invention, the acoustic wave device protection layer 66(1), the varactor protection layer 66(2) and the heterojunction bipolar transistor protection layer 66(3) is made of at least one material selected from the group consisting of: polymer, $SiO_2$, $SiN_x$ and AlN. The acoustic wave device bottom electrode 604 is needed to have a lower roughness and resistivity for benefit the preferable crystal growth axis. The acoustic wave device bottom electrode 604 is made of at least one material selected from the group consisting of: Mo, Pt, Al, Au, W and Ru. And the acoustic wave device bottom electrode 604 is formed on the acoustic wave device protection layer 66(1) by evaporation or sputtering. The dielectric layer 605 is made of at least one material selected from the group consisting of: AlN, monocrystalline $SiO_2$, ZnO, $HfO_2$, barium strontium titanate (BST) and lead zirconate titanate (PZT), and is formed on the acoustic wave device bottom electrode 604 or formed on both the acoustic wave device bottom electrode 604 and the acoustic wave device protection layer 66(1) by epitaxial growth or sputtering. The selection of the materials of the dielectric layer 605 is associated with the application. AlN is a high acoustic wave velocity material (12000 m/s) and is suitable for high frequency application, and after the formation of the micro structure of the material, it has good physical and chemical stability and its properties are not easily to be influenced by the circumstance. ZnO may be formed under lower temperature and it has an acoustic wave velocity 6000 m/s. Its electromechanical coupling coefficient is higher (8.5%) and it is suitable for the application of broadband filter. However when forming ZnO, the concentration of oxygen vacancies in ZnO is not easily controlled, yet it is easily influenced by the humidity and oxygen of the circumstance. Both barium strontium titanate (BST) and lead zirconate titanate (PZT) are ferroelectric materials. Their dielectric constant may vary under external electric field. Hence, they are suitable for the application of acoustic wave device with tunable frequency within dozen MHz range of frequencies. Both barium strontium titanate (BST) and lead zirconate titanate (PZT) need to be polarized under high voltage electric field in order to obtain their dielectric characteristics. Lead zirconate titanate (PZT) has higher electromechanical coupling coefficient, however it contains lead. The acoustic wave device top electrode 606 may be made of at least one material selected from the group consisting of: Mo, Pt, Al, Au, W and Ru. The acoustic wave device top electrode 606 is formed on the dielectric layer 605 or is formed on both the dielectric layer 605 and the acoustic wave device protection layer 66(1) by evaporation or sputtering. In an embodiment, the acoustic wave device bottom electrode 604 is made of at least one material selected from the group consisting of: Mo and Pt, while the dielectric layer 605 is made of AlN. The Mo of the acoustic wave device bottom electrode 604 may be etched by Lithography and Lift-off process. And the AlN of the dielectric layer 605 may be etched by inductively coupled plasma (ICP) process with $CF_4$ plasma. The dielectric layer 28 is made of at least one material selected from the group consisting of: AlN, monocrystalline $SiO_2$, ZnO, $HfO_2$, Lithium Tantalate ($LiTaO_3$), Lithium Niobate ($LiNbO_3$), barium strontium titanate (BST) and lead zirconate titanate (PZT), and is formed on the auxiliary layer 280 by epitaxial growth or sputtering. In an embodiment, the interdigital transducer electrode 29 is made of at least one material selected from the group consisting of: Au, Al, Cu and Al—Cu alloy. In an embodiment, the varactor bottom electrode 54 and the varactor top electrode 55 is made of Au.

As disclosed in the above description and attached drawings, the present invention can provide an integrated structure of an acoustic wave device, a varactor and an heterojunction bipolar transistor, and fabrication methods thereof with reduced module size, optimized the impedance matching, and reduced the signal loss between the heterojunction bipolar transistor, the varactor and the acoustic wave device. It is new and can be put into industrial use.

Although the embodiments of the present invention have been described in detail, many modifications and variations may be made by those skilled in the art from the teachings disclosed hereinabove. Therefore, it should be understood that any modification and variation equivalent to the spirit of the present invention be regarded to fall into the scope defined by the appended claims.

What is claimed is:

1. An integrated structure of acoustic wave device and varactor comprising:
   a semiconductor substrate, wherein said semiconductor substrate includes a first part and a second part of said semiconductor substrate;
   an acoustic wave device formed on said first part of said semiconductor substrate, wherein said acoustic wave device comprises an acoustic wave device upper structure and a first part of a bottom epitaxial structure, wherein said bottom epitaxial structure is formed on said semiconductor substrate, wherein said bottom epitaxial structure includes said first part and a second part of said bottom epitaxial structure formed on said first part and said second part of said semiconductor substrate respectively, wherein said acoustic wave device upper structure is formed on said first part of said bottom epitaxial structure; and
   a varactor formed on said second part of said semiconductor substrate, wherein said varactor comprises a varactor upper structure and said second part of said bottom epitaxial structure, wherein said varactor upper structure is formed on said second part of said bottom epitaxial structure;
   wherein the integrated structure of said acoustic wave device and said varactor formed on the same said semiconductor substrate is capable of reducing the module size, optimizing the impedance matching, and reducing the signal loss between said varactor and said acoustic wave device.

2. The integrated structure of acoustic wave device and varactor according to claim 1, wherein said first part of said bottom epitaxial structure comprises a bottom epitaxial structure recess on the top of said bottom epitaxial structure, wherein a bottom of said bottom epitaxial structure recess is said bottom epitaxial structure or said semiconductor substrate; and wherein said acoustic wave device upper structure comprises:
   an acoustic wave device protection layer formed on said first part of said bottom epitaxial structure, wherein said acoustic wave device protection layer comprises an acoustic wave device protection layer recess on a bottom of said acoustic wave device protection layer and an upwardly protruding acoustic wave device protection layer mesa right above said acoustic wave device protection layer recess, and wherein said acoustic wave device protection layer recess is located right above said bottom epitaxial structure recess, said acoustic wave device protection layer recess is communicated with said bottom epitaxial structure recess, and wherein said acoustic wave device protection layer recess and said bottom epitaxial structure recess have a boundary therebetween and said boundary is extended from a top surface of said bottom epitaxial structure; and an acoustic wave resonance structure formed on said acoustic wave device protection layer mesa, said acoustic wave resonance structure including:
an acoustic wave device bottom electrode formed on said acoustic wave device protection layer mesa;
a dielectric layer formed on said acoustic wave device bottom electrode; and
an acoustic wave device top electrode formed on said dielectric layer;

wherein a gap between said acoustic wave device protection layer and said bottom of said bottom epitaxial structure recess is increased by the communication of said acoustic wave device protection layer recess and said bottom epitaxial structure recess, so as to avoid the contact of said acoustic wave device protection layer and said bottom of said bottom epitaxial structure recess when said acoustic wave device is affected by stress such that said acoustic wave device protection layer is bended downwardly.

3. The integrated structure of acoustic wave device and varactor according to claim 2, wherein said acoustic wave device protection layer recess has an opening smaller than or equal to that of said bottom epitaxial structure recess.

4. The integrated structure of acoustic wave device and varactor according to claim 1, wherein said acoustic wave device comprises:
an auxiliary layer formed on said first part of said bottom epitaxial structure;
a dielectric layer formed on said auxiliary layer; and
an interdigital transducer electrode formed on said dielectric layer.

5. The integrated structure of acoustic wave device and varactor according to claim 1, wherein said bottom epitaxial structure comprises a bottom n-type doped layer; wherein said varactor upper structure comprises a varactor middle epitaxial structure mesa, a varactor top electrode and a varactor bottom electrode, wherein said varactor top electrode is formed on said varactor middle epitaxial structure mesa, wherein said varactor bottom electrode is formed on said second part of said bottom epitaxial structure, wherein said varactor middle epitaxial structure mesa comprises:
a middle n-type graded doped layer formed on said bottom epitaxial structure; and
a middle p-type doped layer formed on said middle n-type graded doped layer.

6. The integrated structure of acoustic wave device and varactor according to claim 5, wherein a thickness of said bottom n-type doped layer is between 200 nm and 600 nm, wherein a thickness of said middle n-type graded doped layer is between 100 nm and 2000 nm, and wherein a thickness of said middle p-type doped layer is between 10 nm and 150 nm.

7. The integrated structure of acoustic wave device and varactor according to claim 5, wherein said bottom n-type doped layer is made of InGaAs; said middle n-type graded doped layer is made of InGaAs; and said middle p-type doped layer is made of InGaAs.

8. The integrated structure of acoustic wave device and varactor according to claim 7, wherein said varactor middle epitaxial structure mesa further comprises a varactor ledge layer formed on said middle p-type doped layer, wherein said varactor ledge layer is n-type doped and made of InGaAs, and wherein a thickness of said varactor ledge layer is between 1 nm and 60 nm.

9. The integrated structure of acoustic wave device and varactor according to claim 7, wherein said bottom epitaxial structure further comprises an etching stop layer formed on said bottom n-type doped layer, wherein said etching stop layer is made of InP; wherein said etching stop layer has a varactor bottom electrode recess, wherein a bottom of said varactor bottom electrode recess is said bottom n-type doped layer such that said varactor bottom electrode is formed on said bottom n-type doped layer within said varactor bottom electrode recess.

10. The integrated structure of acoustic wave device and varactor according to claim 5, wherein said bottom n-type doped layer is made of GaAs; said middle n-type graded doped layer is made of GaAs; and said middle p-type doped layer is made of GaAs.

11. The integrated structure of acoustic wave device and varactor according to claim 10, wherein said varactor middle epitaxial structure mesa further comprises a varactor ledge layer formed on said middle p-type doped layer, wherein said varactor ledge layer is n-type doped and made of InGaP, and wherein a thickness of said varactor ledge layer is between 1 nm and 60 nm.

12. The integrated structure of acoustic wave device and varactor according to claim 10, wherein said bottom epitaxial structure further comprises an etching stop layer formed on said bottom n-type doped layer, wherein said etching stop layer is made of InGaP; wherein said etching stop layer has a varactor bottom electrode recess, wherein a bottom of said varactor bottom electrode recess is said bottom n-type doped layer such that said varactor bottom electrode is formed on said bottom n-type doped layer within said varactor bottom electrode recess.

13. The integrated structure of acoustic wave device and varactor according to claim 5, wherein said varactor upper structure further comprises a varactor protection layer, said varactor protection layer covers the exposed surfaces of said varactor middle epitaxial structure mesa and said second part of said bottom epitaxial structure.

14. The integrated structure of acoustic wave device and varactor according to claim 1, wherein said semiconductor substrate is made one material selected from the group consisting of: of Si, GaAs, SiC, InP, GaN, AlN and Sapphire.

15. A method for fabricating an integrated structure of acoustic wave device and varactor, which comprises following steps of:
Step F1: forming an acoustic wave device and a varactor on a first part and a second part of a semiconductor substrate respectively, which comprises following steps of:
Step F11: forming a bottom epitaxial structure on said semiconductor substrate, wherein said bottom epitaxial structure includes a first part and a second part of said bottom epitaxial structure formed on said first part and said second part of said semiconductor substrate respectively; and
Step F12: forming an acoustic wave device upper structure and a varactor upper structure on said first part and said second part of said bottom epitaxial structure respectively;

wherein said acoustic wave device comprises said acoustic wave device upper structure and said first part of said bottom epitaxial structure, wherein said varactor comprises said varactor upper structure and said second part of said bottom epitaxial structure;

wherein the integrated structure of said acoustic wave device and said varactor formed on the same said semiconductor substrate is capable of reducing the module size, optimizing the impedance matching, and reducing the signal loss between said varactor and said acoustic wave device.

16. The method for fabricating an integrated structure of acoustic wave device and varactor according to claim 15, wherein said Step F12 further comprises following steps of:
Step F121: forming a middle epitaxial structure on said bottom epitaxial structure; and
Step F122: defining a middle epitaxial structure etching area, and etching said middle epitaxial structure within said middle epitaxial structure etching area to form (a) an acoustic wave device middle epitaxial structure mesa and a varactor middle epitaxial structure mesa on said first part and said second part of said bottom epitaxial structure respectively or (b) a varactor middle epitaxial structure mesa on said second part of said bottom epitaxial structure.

17. The method for fabricating an integrated structure of acoustic wave device and varactor according to claim 16, wherein said Step F11 comprises a following step of:
forming a bottom n-type doped layer on said semiconductor substrate, wherein said bottom epitaxial structure comprises said bottom n-type doped layer;
wherein said Step F121 comprises following steps of:
forming a middle n-type graded doped layer on said bottom epitaxial structure; and
forming a middle p-type doped layer on said middle n-type graded doped layer, wherein said middle epitaxial structure comprises said middle n-type graded doped layer and said middle p-type doped layer;
wherein said Step F122 comprises following steps of:
defining a middle p-type doped layer etching area, and etching said middle p-type doped layer within said middle p-type doped layer etching area; and
defining a middle n-type graded doped layer etching area, and etching said middle n-type graded doped layer within said middle n-type graded doped layer etching area, thereby said varactor middle epitaxial structure mesa is formed, wherein said varactor middle epitaxial structure mesa comprises said middle n-type graded doped layer and said middle p-type doped layer on said second part of said bottom epitaxial structure;
and wherein said Step F12 further comprises following steps of:
forming a varactor top electrode on said varactor middle epitaxial structure mesa; and
forming a varactor bottom electrode on said second part of said bottom epitaxial structure, wherein said varactor upper structure comprises said varactor middle epitaxial structure mesa, said varactor top electrode and said varactor bottom electrode.

18. The method for fabricating an integrated structure of acoustic wave device and varactor according to claim 17, wherein a thickness of said bottom n-type doped layer is between 200 nm and 600 nm, wherein a thickness of said middle n-type graded doped layer is between 100 nm and 2000 nm, and wherein a thickness of said middle p-type doped layer is between 10 nm and 150 nm.

19. The method for fabricating an integrated structure of acoustic wave device and varactor according to claim 17, wherein said bottom n-type doped layer is made of InGaAs; said middle n-type graded doped layer is made of InGaAs; and said middle p-type doped layer is made of InGaAs.

20. The method for fabricating an integrated structure of acoustic wave device and varactor according to claim 19, wherein said Step F121 further comprises a following step of: forming a varactor ledge layer on said middle p-type doped layer, wherein said varactor ledge layer is n-type doped and made of InGaAs, wherein a thickness of said varactor ledge layer is between 1 nm and 60 nm; and wherein said Step F122 further comprises a following step of: defining a varactor ledge layer etching area, and etching said varactor ledge layer within said varactor ledge layer etching area; wherein said varactor middle epitaxial structure mesa comprises said middle n-type graded doped layer, said middle p-type doped layer and said varactor ledge layer on said second part of said bottom epitaxial structure.

21. The method for fabricating an integrated structure of acoustic wave device and varactor according to claim 19, wherein said Step F11 further comprises following steps of:
forming an etching stop layer on said bottom n-type doped layer, wherein said bottom epitaxial structure comprises said bottom n-type doped layer and said etching stop layer, wherein said etching stop layer is made of InP; and
etching said etching stop layer to form a varactor bottom electrode recess, wherein a bottom of said varactor bottom electrode recess is said bottom n-type doped layer such that said varactor bottom electrode is formed on said bottom n-type doped layer within said varactor bottom electrode recess.

22. The method for fabricating an integrated structure of acoustic wave device and varactor according to claim 17, wherein said bottom n-type doped layer is made of GaAs; said middle n-type graded doped layer is made of GaAs; and said middle p-type doped layer is made of GaAs.

23. The method for fabricating an integrated structure of acoustic wave device and varactor according to claim 22, wherein said Step F121 further comprises a following step of: forming a varactor ledge layer on said middle p-type doped layer, wherein said varactor ledge layer is n-type doped and made of InGaP, wherein a thickness of said varactor ledge layer is between 1 nm and 60 nm; and wherein said Step F122 further comprises a following step of: defining a varactor ledge layer etching area, and etching said varactor ledge layer within said varactor ledge layer etching area; wherein said varactor middle epitaxial structure mesa comprises said middle n-type graded doped layer, said middle p-type doped layer and said varactor ledge layer on said second part of said bottom epitaxial structure.

24. The method for fabricating an integrated structure of acoustic wave device and varactor according to claim 22, wherein said Step F11 further comprises following steps of:
forming an etching stop layer on said bottom n-type doped layer, wherein said bottom epitaxial structure comprises said bottom n-type doped layer and said etching stop layer, wherein said etching stop layer is made of InGaP; and
etching said etching stop layer to form a varactor bottom electrode recess, wherein a bottom of said varactor bottom electrode recess is said bottom n-type doped layer such that said varactor bottom electrode is formed on said bottom n-type doped layer within said varactor bottom electrode recess.

25. The method for fabricating an integrated structure of acoustic wave device and varactor according to claim 17, wherein said Step F12 further comprises a following step of: forming a varactor protection layer, wherein said varactor protection layer covers the exposed surfaces of said second part of said bottom epitaxial structure and said varactor middle epitaxial structure mesa, wherein said varactor upper structure comprises said varactor middle epitaxial structure mesa, said varactor top electrode, said varactor bottom electrode and said varactor protection layer.

26. The method for fabricating an integrated structure of acoustic wave device and varactor according to claim 16, wherein in said Step F122 said middle epitaxial structure on said first part of said bottom epitaxial structure is etched and removed; and wherein said Step F12 further comprises following steps of:
    forming an auxiliary layer formed on said first part of said bottom epitaxial structure;
    forming a dielectric layer on said auxiliary layer; and
    forming an interdigital transducer electrode on said dielectric layer, wherein said acoustic wave device upper structure comprises said auxiliary layer, said dielectric layer and said interdigital transducer electrode.

27. The method for fabricating an integrated structure of acoustic wave device and varactor according to claim 16, wherein in said Step F122 said acoustic wave device middle epitaxial structure mesa and said varactor middle epitaxial structure mesa are formed on said first part and said second part of said bottom epitaxial structure respectively; wherein said Step F12 further comprises following steps of:
    forming an acoustic wave device protection layer, wherein said acoustic wave device protection layer covers the exposed surfaces of said first part of said bottom epitaxial structure and said acoustic wave device middle epitaxial structure mesa, and wherein the acoustic wave device protection layer covers the acoustic wave device middle epitaxial structure mesa to form an acoustic wave device protection layer mesa;
    forming an acoustic wave resonance structure on said acoustic wave device protection layer mesa, which comprises following steps of:
      forming an acoustic wave device bottom electrode on said acoustic wave device protection layer mesa;
      forming a dielectric layer on said acoustic wave device bottom electrode; and
      forming an acoustic wave device top electrode on said dielectric layer, wherein said acoustic wave resonance structure comprises said acoustic wave device bottom electrode, said dielectric layer and said acoustic wave device top electrode; and
    etching said acoustic wave device middle epitaxial structure mesa to form an acoustic wave device protection layer recess, wherein at least one middle epitaxial structure etching solution contacts with said acoustic wave device middle epitaxial structure mesa and etches and removes said acoustic wave device middle epitaxial structure mesa, thereby a top and a bottom of said acoustic wave device protection layer recess are said acoustic wave device protection layer and said bottom epitaxial structure respectively, wherein said acoustic wave upper structure comprises said acoustic wave device protection layer and said acoustic wave resonance structure;
    wherein said Step F1 further comprises a following step of:
      etching said bottom epitaxial structure below said acoustic wave device protection layer recess to form a bottom epitaxial structure recess, wherein a bottom of said bottom epitaxial structure recess is said bottom epitaxial structure or said semiconductor substrate, wherein at least one bottom epitaxial structure etching solution contacts with a top surface of said bottom epitaxial structure and said acoustic wave device protection layer recess, said at least one bottom epitaxial structure etching solution is uniformly distributed on said top surface of said bottom epitaxial structure through said acoustic wave device protection layer recess so as to uniformly etch part of said bottom epitaxial structure below said acoustic wave device protection layer recess to form said bottom epitaxial structure recess, and thereby prevents the side etching phenomenon during the etching, wherein said acoustic wave device protection layer recess is communicated with said bottom epitaxial structure recess, and said acoustic wave device protection layer recess and said bottom epitaxial structure recess have a boundary therebetween and said boundary is extended from said top surface of said bottom epitaxial structure, wherein a gap between said acoustic wave device protection layer and said bottom of said bottom epitaxial structure recess is increased by the communication of said acoustic wave device protection layer recess and said bottom epitaxial structure recess, so as to avoid the contact of said acoustic wave device protection layer and said bottom of said bottom epitaxial structure recess when said acoustic wave device is affected by stress such that said acoustic wave device protection layer is bended downwardly.

28. The method for fabricating an integrated structure of acoustic wave device and varactor according to claim 27, wherein said acoustic wave device protection layer recess has an opening smaller than or equal to that of said bottom epitaxial structure recess.

29. The method for fabricating an integrated structure of acoustic wave device and varactor according to claim 27, wherein said Step F121 further comprises following steps of:
    forming a middle n-type graded doped layer on said bottom epitaxial structure; and
    forming a middle p-type doped layer on said middle n-type graded doped layer, wherein said middle epitaxial structure comprises said middle n-type graded doped layer and said middle p-type doped layer; and
wherein said Step F122 comprises following steps of:
    defining a middle p-type doped layer etching area, and etching said middle p-type doped layer within said middle p-type doped layer etching area; and
    defining a middle n-type graded doped layer etching area, and etching said middle n-type graded doped layer within said middle n-type graded doped layer etching area;
    wherein said varactor middle epitaxial structure mesa comprises said middle n-type graded doped layer and said middle p-type doped layer on said second part of said bottom epitaxial structure, and wherein said acoustic wave device middle epitaxial structure mesa comprises (a) said middle n-type graded doped layer on said first part of said bottom epitaxial structure, or (b) said middle n-type graded doped layer and said middle p-type doped layer on said first part of said bottom epitaxial structure.

30. The method for fabricating an integrated structure of acoustic wave device and varactor according to claim 29, wherein said Step F121 further comprises a following step of: forming a varactor ledge layer on said middle p-type doped layer; and wherein said Step F122 further comprises a following step of: defining a varactor ledge layer etching area, and etching said varactor ledge layer within said varactor ledge layer etching area; wherein said varactor middle epitaxial structure mesa comprises said middle n-type graded doped layer, said middle p-type doped layer and said varactor ledge layer on said second part of said bottom epitaxial structure; and wherein said acoustic wave device middle epitaxial structure mesa comprises (a) said middle n-type graded doped layer on said first part of said bottom epitaxial structure, (b) said middle n-type graded doped layer and said middle p-type doped layer on said first part of said bottom epitaxial structure, or (c) said middle n-type graded doped layer, said middle p-type doped layer and said varactor ledge layer on said first part of said bottom epitaxial structure.

31. The method for fabricating an integrated structure of acoustic wave device and varactor according to claim 15, wherein said semiconductor substrate is made of one material selected from the group consisting of: Si, GaAs, SiC, InP, GaN, AlN and Sapphire.

32. An integrated structure of acoustic wave device, varactor and heterojunction bipolar transistor comprising:
a semiconductor substrate, wherein said semiconductor substrate includes a first part, a second part and a third part of said semiconductor substrate;
an acoustic wave device formed on said first part of said semiconductor substrate, wherein said acoustic wave device comprises an acoustic wave device upper structure and a first part of a bottom epitaxial structure, wherein said bottom epitaxial structure is formed on said semiconductor substrate, wherein said bottom epitaxial structure includes said first part, a second part and a third part of said bottom epitaxial structure formed on said first part, said second part and said third part of said semiconductor substrate respectively, wherein said acoustic wave device upper structure is formed on said first part of said bottom epitaxial structure;
a varactor formed on said second part of said semiconductor substrate, wherein said varactor comprises a varactor upper structure and said second part of said bottom epitaxial structure, wherein said varactor upper structure is formed on said second part of said bottom epitaxial structure; and
an heterojunction bipolar transistor formed on an heterojunction bipolar transistor middle epitaxial structure mesa, wherein heterojunction bipolar transistor middle epitaxial structure mesa is formed on said third part of said bottom epitaxial structure;
wherein the integrated structure of said acoustic wave device, said varactor and said heterojunction bipolar transistor formed on the same said semiconductor substrate is capable of reducing the module size, optimizing the impedance matching, and reducing the signal loss between said heterojunction bipolar transistor, said varactor and said acoustic wave device.

33. The integrated structure of acoustic wave device, varactor and heterojunction bipolar transistor according to claim 32, wherein said first part of said bottom epitaxial structure comprises a bottom epitaxial structure recess on the top of said bottom epitaxial structure, wherein a bottom of said bottom epitaxial structure recess is said bottom epitaxial structure or said semiconductor substrate; and wherein said acoustic wave device upper structure comprising:
an acoustic wave device protection layer formed on said first part of said bottom epitaxial structure, wherein said acoustic wave device protection layer comprises an acoustic wave device protection layer recess on a bottom of said acoustic wave device protection layer and an upwardly protruding acoustic wave device protection layer mesa right above said acoustic wave device protection layer recess, and wherein said acoustic wave device protection layer recess is located right above said bottom epitaxial structure recess, said acoustic wave device protection layer recess is communicated with said bottom epitaxial structure recess, and wherein said acoustic wave device protection layer recess and said bottom epitaxial structure recess have a boundary therebetween and said boundary is extended from a top surface of said bottom epitaxial structure; and
an acoustic wave resonance structure formed on said acoustic wave device protection layer mesa, said acoustic wave resonance structure including:
an acoustic wave device bottom electrode formed on said acoustic wave device protection layer mesa;
a dielectric layer formed on said acoustic wave device bottom electrode; and
an acoustic wave device top electrode formed on said dielectric layer;
wherein a gap between said acoustic wave device protection layer and said bottom of said bottom epitaxial structure recess is increased by the communication of said acoustic wave device protection layer recess and said bottom epitaxial structure recess, so as to avoid the contact of said acoustic wave device protection layer and said bottom of said bottom epitaxial structure recess when said acoustic wave device is affected by stress such that said acoustic wave device protection layer is bended downwardly.

34. The integrated structure of acoustic wave device, varactor and heterojunction bipolar transistor according to claim 33, wherein said acoustic wave device protection layer recess has an opening smaller than or equal to that of said bottom epitaxial structure recess.

35. The integrated structure of acoustic wave device, varactor and heterojunction bipolar transistor according to claim 32, wherein said acoustic wave device comprises:
an auxiliary layer formed on said first part of said bottom epitaxial structure;
a dielectric layer formed on said auxiliary layer; and
an interdigital transducer electrode formed on said dielectric layer.

36. The integrated structure of acoustic wave device, varactor and heterojunction bipolar transistor according to claim 32, wherein said heterojunction bipolar transistor comprises:
a top epitaxial structure mesa, wherein said top epitaxial structure mesa comprises:
a subcollector layer formed on said heterojunction bipolar transistor middle epitaxial structure mesa;
a collector layer formed on said subcollector layer;
a base layer formed on said collector layer; and
an emitter layer formed on said base layer;
a collector electrode formed on said subcollector layer;
a base electrode formed on said base layer; and
an emitter electrode formed on said emitter layer.

37. The integrated structure of acoustic wave device, varactor and heterojunction bipolar transistor according to claim 36, wherein said subcollector layer is n-type doped and made of InGaAs; said collector layer is n-type doped and made of InGaAs; said base layer is p-type doped and made of InGaAs; and said emitter layer is n-type doped and made of InP; and wherein said heterojunction bipolar transistor is an InP heterojunction bipolar transistor.

38. The integrated structure of acoustic wave device, varactor and heterojunction bipolar transistor according to claim 37, wherein said top epitaxial structure mesa further comprises an emitter ledge layer formed on said base layer, said emitter layer is formed on said emitter ledge layer, wherein said emitter ledge layer is n-type doped and made of InGaAs, and wherein said emitter ledge layer has a base electrode recess, and wherein a bottom of said base electrode recess is said base layer such that said base electrode is formed on said base layer within said base electrode recess.

39. The integrated structure of acoustic wave device, varactor and heterojunction bipolar transistor according to claim 37, wherein said top epitaxial structure mesa further comprises a second etching stop layer, wherein said second etching stop layer is formed on said subcollector layer, said collector layer is formed on said second etching stop layer, wherein said second etching stop layer is made of InP; wherein said second etching stop layer has a collector electrode recess, a bottom of said collector electrode recess is said subcollector layer such that said collector electrode is formed on said subcollector layer within said collector electrode recess.

40. The integrated structure of acoustic wave device, varactor and heterojunction bipolar transistor according to claim 36, wherein said subcollector layer is n-type doped and made of GaAs; said collector layer is n-type doped and made of GaAs; said base layer is p-type doped and made of GaAs; and said emitter layer is n-type doped and made of GaAs; wherein said heterojunction bipolar transistor is an GaAs heterojunction bipolar transistor.

41. The integrated structure of acoustic wave device, varactor and heterojunction bipolar transistor according to claim 40, wherein said top epitaxial structure mesa further comprises an emitter ledge layer formed on said base layer, said emitter layer is formed on said emitter ledge layer, wherein said emitter ledge layer is n-type doped and made of InGaP, and wherein said emitter ledge layer has a base electrode recess, and wherein a bottom of said base electrode recess is said base layer such that said base electrode is formed on said base layer within said base electrode recess.

42. The integrated structure of acoustic wave device, varactor and heterojunction bipolar transistor according to claim 40, wherein said top epitaxial structure mesa further comprises a second etching stop layer, wherein said second etching stop layer is formed on said subcollector layer, said collector layer is formed on said second etching stop layer, wherein said second etching stop layer is made of InGaP; wherein said second etching stop layer has a collector electrode recess, a bottom of said collector electrode recess is said subcollector layer such that said collector electrode is formed on said subcollector layer within said collector electrode recess.

43. The integrated structure of acoustic wave device, varactor and heterojunction bipolar transistor according to claim 36, wherein said heterojunction bipolar transistor further comprises an heterojunction bipolar transistor protection layer, said heterojunction bipolar transistor protection layer covers the exposed surfaces of said top epitaxial structure mesa, said heterojunction bipolar transistor middle epitaxial structure mesa and said third part of said bottom epitaxial structure.

44. The integrated structure of acoustic wave device, varactor and heterojunction bipolar transistor according to claim 32, wherein said bottom epitaxial structure comprises a bottom n-type doped layer; wherein said varactor upper structure comprises a varactor middle epitaxial structure mesa, a varactor top electrode and a varactor bottom electrode, wherein said varactor top electrode is formed on said varactor middle epitaxial structure mesa, wherein said varactor bottom electrode is formed on said second part of said bottom epitaxial structure, wherein said varactor middle epitaxial structure mesa comprises:
  a middle n-type graded doped layer formed on said bottom epitaxial structure; and
  a middle p-type doped layer formed on said middle n-type graded doped layer.

45. The integrated structure of acoustic wave device, varactor and heterojunction bipolar transistor according to claim 44, wherein a thickness of said bottom n-type doped layer is between 200 nm and 600 nm, wherein a thickness of said middle n-type graded doped layer is between 100 nm and 2000 nm, and wherein a thickness of said middle p-type doped layer is between 10 nm and 150 nm.

46. The integrated structure of acoustic wave device, varactor and heterojunction bipolar transistor according to claim 44, wherein said bottom n-type doped layer is made of InGaAs; said middle n-type graded doped layer is made of InGaAs; and said middle p-type doped layer is made of InGaAs.

47. The integrated structure of acoustic wave device, varactor and heterojunction bipolar transistor according to claim 46, wherein said varactor middle epitaxial structure mesa further comprises a varactor ledge layer formed on said middle p-type doped layer, wherein said varactor ledge layer is n-type doped and made of InGaAs, and wherein a thickness of said varactor ledge layer is between 1 nm and 60 nm.

48. The integrated structure of acoustic wave device, varactor and heterojunction bipolar transistor according to claim 46, wherein said bottom epitaxial structure further comprises an etching stop layer formed on said bottom n-type doped layer, wherein said etching stop layer is made of InP; wherein said etching stop layer has a varactor bottom electrode recess, wherein a bottom of said varactor bottom electrode recess is said bottom n-type doped layer such that said varactor bottom electrode is formed on said bottom n-type doped layer within said varactor bottom electrode recess.

49. The integrated structure of acoustic wave device, varactor and heterojunction bipolar transistor according to claim 44, wherein said bottom n-type doped layer is made of GaAs; said middle n-type graded doped layer is made of GaAs; and said middle p-type doped layer is made of GaAs.

50. The integrated structure of acoustic wave device, varactor and heterojunction bipolar transistor according to claim 49, wherein said varactor middle epitaxial structure mesa further comprises a varactor ledge layer formed on said middle p-type doped layer, wherein said varactor ledge layer is n-type doped and made of InGaP, and wherein a thickness of said varactor ledge layer is between 1 nm and 60 nm.

51. The integrated structure of acoustic wave device, varactor and heterojunction bipolar transistor according to claim 49, wherein said bottom epitaxial structure further comprises an etching stop layer formed on said bottom n-type doped layer, wherein said etching stop layer is made of InGaP; wherein said etching stop layer has a varactor bottom electrode recess, wherein a bottom of said varactor bottom electrode recess is said bottom n-type doped layer such that said varactor bottom electrode is formed on said bottom n-type doped layer within said varactor bottom electrode recess.

52. The integrated structure of acoustic wave device, varactor and heterojunction bipolar transistor according to claim 44, wherein said varactor upper structure further comprises a varactor protection layer, said varactor protection layer covers the exposed surfaces of said varactor middle epitaxial structure mesa and said second part of said bottom epitaxial structure.

53. The integrated structure of acoustic wave device, varactor and heterojunction bipolar transistor according to claim 32, wherein said semiconductor substrate is made of one material selected from the group consisting of: Si, GaAs, SiC, InP, GaN, AlN and Sapphire.

54. A method for fabricating an integrated structure of acoustic wave device, varactor and heterojunction bipolar transistor, which comprises following steps of:
   Step G1: forming an acoustic wave device, a varactor and an heterojunction bipolar transistor on a first part, a second part and a third part of a semiconductor substrate respectively, which comprises following steps of:
      Step G11: forming a bottom epitaxial structure on said semiconductor substrate, wherein said bottom epitaxial structure includes a first part, a second part and a third part of said bottom epitaxial structure formed on said first part, said second part and said third part of said semiconductor substrate respectively;
      Step G12: forming a middle epitaxial structure on said bottom epitaxial structure, wherein said middle epitaxial structure includes a first part, a second part and a third part of said middle epitaxial structure formed on said first part, said second part and said third part of said bottom epitaxial structure;
      Step G13: etching said middle epitaxial structure and forming an acoustic wave device upper structure, a varactor upper structure and an heterojunction bipolar transistor middle epitaxial structure mesa on said first part, said second part and said third part of said bottom epitaxial structure respectively, wherein said acoustic wave device comprises said acoustic wave device upper structure and said first part of said bottom epitaxial structure, wherein said varactor comprises said varactor upper structure and said second part of said bottom epitaxial structure, wherein said heterojunction bipolar transistor middle epitaxial structure mesa is formed by etching said third part of said middle epitaxial structure; and
      Step G14: forming an heterojunction bipolar transistor on said heterojunction bipolar transistor middle epitaxial structure mesa;
   wherein the integrated structure of said acoustic wave device, said varactor and said heterojunction bipolar transistor formed on the same said semiconductor substrate is capable of reducing the module size, optimizing the impedance matching, and reducing the signal loss between said heterojunction bipolar transistor, said varactor and said acoustic wave device.

55. The method for fabricating an integrated structure of acoustic wave device, varactor and heterojunction bipolar transistor according to claim 54, wherein said Step G14 comprises following steps of:
   forming a top epitaxial structure mesa on said heterojunction bipolar transistor middle epitaxial structure mesa, which comprises following steps of:
      forming a subcollector layer on said heterojunction bipolar transistor middle epitaxial structure mesa;
      forming a collector layer on said subcollector layer;
      forming a base layer on said collector layer;
      forming an emitter layer on said base layer;
      defining an emitter layer etching area, and etching said emitter layer within said emitter layer etching area;
      defining a base layer etching area, and etching said base layer within said base layer etching area;
      defining a collector layer etching area, and etching said collector layer within said collector layer etching area; and
      defining a subcollector layer etching area, and etching said subcollector layer within said subcollector layer etching area, wherein said top epitaxial structure mesa comprises said subcollector layer, said collector layer, said base layer and said emitter layer;
   forming an emitter electrode on said emitter layer;
   forming a base electrode on said base layer; and
   forming a collector electrode on said subcollector layer, wherein said heterojunction bipolar transistor comprises said top epitaxial structure mesa, said emitter electrode, said base electrode and said collector electrode.

56. The method for fabricating an integrated structure of acoustic wave device, varactor and heterojunction bipolar transistor according to claim 55, wherein said subcollector layer is n-type doped and made of InGaAs; said collector layer is n-type doped and made of InGaAs; said base layer is p-type doped and made of InGaAs; and said emitter layer is n-type doped and made of InP; and wherein said heterojunction bipolar transistor is an InP heterojunction bipolar transistor.

57. The method for fabricating an integrated structure of acoustic wave device, varactor and heterojunction bipolar transistor according to claim 56, wherein said Step G14 further comprises following steps of:
   forming an emitter ledge layer on said base layer, wherein said emitter layer is formed on said emitter ledge layer, wherein said emitter ledge layer is n-type doped and made of InGaAs; and
   defining an emitter ledge layer etching area, and etching said emitter ledge layer within said emitter ledge layer etching area to form a base electrode recess, wherein a bottom of said base electrode recess is said base layer such that said base electrode is formed on said base layer within said base electrode recess, wherein said top epitaxial structure mesa comprises said subcollector layer, said collector layer, said base layer, said emitter ledge layer and said emitter layer.

58. The method for fabricating an integrated structure of acoustic wave device, varactor and heterojunction bipolar transistor according to claim 56, wherein said Step G14 further comprises following steps of:
   forming a second etching stop layer on said subcollector layer, wherein said collector layer is formed on said second etching stop layer, wherein said second etching stop layer is made of InP; and
   defining a second etching stop layer etching area, and etching said second etching stop layer within said second etching stop layer etching area to form a collector electrode recess of said second etching stop layer, wherein a bottom of said collector electrode recess is said subcollector layer such that said collector electrode is formed on said subcollector layer within said collector electrode recess, wherein said top epitaxial structure mesa comprises said subcollector layer, said second etching stop layer, said collector layer, said base layer and said emitter layer.

59. The method for fabricating an integrated structure of acoustic wave device, varactor and heterojunction bipolar transistor according to claim 55, wherein said subcollector layer is n-type doped and made of GaAs; said collector layer is n-type doped and made of GaAs; said base layer is p-type doped and made of GaAs; and said emitter layer is n-type doped and made of GaAs; wherein said heterojunction bipolar transistor is an GaAs heterojunction bipolar transistor.

60. The method for fabricating an integrated structure of acoustic wave device, varactor and heterojunction bipolar transistor according to claim 59, wherein said Step G14 further comprises following steps of:
forming an emitter ledge layer on said base layer, wherein said emitter layer is formed on said emitter ledge layer, wherein said emitter ledge layer is n-type doped and made of InGaP; and
defining an emitter ledge layer etching area, and etching said emitter ledge layer within said emitter ledge layer etching area and to form a base electrode recess, wherein a bottom of said base electrode recess is said base layer such that said base electrode is formed on said base layer within said base electrode recess, wherein said top epitaxial structure mesa comprises said subcollector layer, said collector layer, said base layer, said emitter ledge layer and said emitter layer.

61. The method for fabricating an integrated structure of acoustic wave device, varactor and heterojunction bipolar transistor according to claim 59, wherein said Step G14 further comprises following steps of:
forming a second etching stop layer on said subcollector layer, wherein said collector layer is formed on said second etching stop layer, wherein said second etching stop layer is made of InGaP; and
defining a second etching stop layer etching area, and etching said second etching stop layer within said second etching stop layer etching area to form a collector electrode recess of said second etching stop layer, wherein a bottom of said collector electrode recess is said subcollector layer such that said collector electrode is formed on said subcollector layer within said collector electrode recess, wherein said top epitaxial structure mesa comprises said subcollector layer, said second etching stop layer, said collector layer, said base layer and said emitter layer.

62. The method for fabricating an integrated structure of acoustic wave device, varactor and heterojunction bipolar transistor according to claim 55, wherein said Step G14 further comprises a following step of: forming an heterojunction bipolar transistor protection layer, wherein said heterojunction bipolar transistor protection layer covers the exposed surfaces of said third part of said bottom epitaxial structure, said heterojunction bipolar transistor middle epitaxial structure mesa and said top epitaxial structure mesa, wherein said heterojunction bipolar transistor comprises said top epitaxial structure mesa, said emitter electrode, said base electrode, said collector electrode and said heterojunction bipolar transistor protection layer.

63. The method for fabricating an integrated structure of acoustic wave device, varactor and heterojunction bipolar transistor according to claim 54, wherein in said Step G13, said first part and said second part of said middle epitaxial structure are etched such that (a) an acoustic wave device middle epitaxial structure mesa and a varactor middle epitaxial structure mesa are formed on said first part and said second part of said bottom epitaxial structure respectively or (b) said middle epitaxial structure on said first part of said bottom epitaxial structure is etched and removed and a varactor middle epitaxial structure mesa is formed on said second part of said bottom epitaxial structure.

64. The method for fabricating an integrated structure of acoustic wave device, varactor and heterojunction bipolar transistor according to claim 63, wherein said Step G11 comprises a following step of: forming a bottom n-type doped layer on said semiconductor substrate, wherein said bottom epitaxial structure comprises said bottom n-type doped layer;
wherein said Step G12 comprises following steps of:
forming a middle n-type graded doped layer on said bottom epitaxial structure; and
forming a middle p-type doped layer on said middle n-type graded doped layer, wherein said middle epitaxial structure comprises said middle n-type graded doped layer and said middle p-type doped layer;
and wherein said Step G13 comprises following steps of:
defining a middle p-type doped layer etching area, and etching said middle p-type doped layer within said middle p-type doped layer etching area;
defining a middle n-type graded doped layer etching area, and etching said middle n-type graded doped layer within said middle n-type graded doped layer etching area, thereby said varactor middle epitaxial structure mesa is formed, wherein said varactor middle epitaxial structure mesa comprises said middle n-type graded doped layer and said middle p-type doped layer on said second part of said bottom epitaxial structure;
forming a varactor top electrode on said varactor middle epitaxial structure mesa; and
forming a varactor bottom electrode on said second part of said bottom epitaxial structure, wherein said varactor upper structure comprises said varactor middle epitaxial structure mesa, said varactor top electrode and said varactor bottom electrode.

65. The method for fabricating an integrated structure of acoustic wave device, varactor and heterojunction bipolar transistor according to claim 64, wherein a thickness of said bottom n-type doped layer is between 200 nm and 600 nm, wherein a thickness of said middle n-type graded doped layer is between 100 nm and 2000 nm, and wherein a thickness of said middle p-type doped layer is between 10 nm and 150 nm.

66. The method for fabricating an integrated structure of acoustic wave device, varactor and heterojunction bipolar transistor according to claim 64, wherein said bottom n-type doped layer is made of InGaAs; said middle n-type graded doped layer is made of InGaAs; and said middle p-type doped layer is made of InGaAs.

67. The method for fabricating an integrated structure of acoustic wave device, varactor and heterojunction bipolar transistor according to claim 66, wherein said Step G12 further comprises a following step of: forming a varactor ledge layer on said middle p-type doped layer, wherein said varactor ledge layer is n-type doped and made of InGaAs, wherein a thickness of said varactor ledge layer is between 1 nm and 60 nm; and wherein said Step G13 further comprises a following step of: defining a varactor ledge layer etching area, and etching said varactor ledge layer within said varactor ledge layer etching area; wherein said varactor middle epitaxial structure mesa comprises said middle n-type graded doped layer, said middle p-type doped layer and said varactor ledge layer on said second part of said bottom epitaxial structure.

68. The method for fabricating an integrated structure of acoustic wave device, varactor and heterojunction bipolar transistor according to claim 66, wherein said Step G11 further comprises following steps of:
forming an etching stop layer on said bottom n-type doped layer, wherein said bottom epitaxial structure comprises said bottom n-type doped layer and said etching stop layer, wherein said etching stop layer is made of InP; and
etching said etching stop layer to form a varactor bottom electrode recess, wherein a bottom of said varactor bottom electrode recess is said bottom n-type doped layer such that said varactor bottom electrode is formed on said bottom n-type doped layer within said varactor bottom electrode recess.

69. The method for fabricating an integrated structure of acoustic wave device, varactor and heterojunction bipolar transistor according to claim 64, wherein said bottom n-type doped layer is made of GaAs; said middle n-type graded doped layer is made of GaAs; and said middle p-type doped layer is made of GaAs.

70. The method for fabricating an integrated structure of acoustic wave device, varactor and heterojunction bipolar transistor according to claim 69, wherein said Step G12 further comprises a following step of: forming a varactor ledge layer on said middle p-type doped layer, wherein said varactor ledge layer is n-type doped and made of InGaP, wherein a thickness of said varactor ledge layer is between 1 nm and 60 nm; and wherein said Step G13 further comprises a following step of: defining a varactor ledge layer etching area, and etching said varactor ledge layer within said varactor ledge layer etching area; wherein said varactor middle epitaxial structure mesa comprises said middle n-type graded doped layer, said middle p-type doped layer and said varactor ledge layer on said second part of said bottom epitaxial structure.

71. The method for fabricating an integrated structure of acoustic wave device, varactor and heterojunction bipolar transistor according to claim 69, wherein said Step G11 further comprises following steps of:
forming an etching stop layer on said bottom n-type doped layer, wherein said bottom epitaxial structure comprises said bottom n-type doped layer and said etching stop layer, wherein said etching stop layer is made of InGaP; and
etching said etching stop layer to form a varactor bottom electrode recess, wherein a bottom of said varactor bottom electrode recess is said bottom n-type doped layer such that said varactor bottom electrode is formed on said bottom n-type doped layer within said varactor bottom electrode recess.

72. The method for fabricating an integrated structure of acoustic wave device, varactor and heterojunction bipolar transistor according to claim 64, wherein said Step G13 further comprises a following step of: forming a varactor protection layer, wherein said varactor protection layer covers the exposed surfaces of said second part of said bottom epitaxial structure and said varactor middle epitaxial structure mesa, wherein said varactor upper structure comprises said varactor middle epitaxial structure mesa, said varactor top electrode, said varactor bottom electrode and said varactor protection layer.

73. The method for fabricating an integrated structure of acoustic wave device, varactor and heterojunction bipolar transistor according to claim 63, wherein in said Step G13 said middle epitaxial structure on said first part of said bottom epitaxial structure is etched and removed; wherein said Step G13 further comprises following steps of:
forming an auxiliary layer on said first part of said bottom epitaxial structure;
forming a dielectric layer on said auxiliary layer; and
forming an interdigital transducer electrode on said dielectric layer, wherein said acoustic wave device upper structure comprises said auxiliary layer, said dielectric layer and said interdigital transducer electrode.

74. The method for fabricating an integrated structure of acoustic wave device, varactor and heterojunction bipolar transistor according to claim 63, wherein in said Step G13 said acoustic wave device middle epitaxial structure mesa and said varactor middle epitaxial structure mesa are formed on said first part and said second part of said bottom epitaxial structure respectively; wherein said Step G13 further comprises following steps of:
forming an acoustic wave device protection layer, wherein said acoustic wave device protection layer covers the exposed surfaces of said first part of said bottom epitaxial structure and said acoustic wave device middle epitaxial structure mesa, and wherein the acoustic wave device protection layer covers the acoustic wave device middle epitaxial structure mesa to form an acoustic wave device protection layer mesa;
forming an acoustic wave resonance structure on said acoustic wave device protection layer mesa, which comprises following steps of:
forming an acoustic wave device bottom electrode on said acoustic wave device protection layer mesa;
forming a dielectric layer on said acoustic wave device bottom electrode; and
forming an acoustic wave device top electrode on said dielectric layer, wherein said acoustic wave resonance structure comprises said acoustic wave device bottom electrode, said dielectric layer and said acoustic wave device top electrode; and
etching said acoustic wave device middle epitaxial structure mesa to form an acoustic wave device protection layer recess, wherein at least one middle epitaxial structure etching solution contacts with said acoustic wave device middle epitaxial structure mesa and etches and removes said acoustic wave device middle epitaxial structure mesa, thereby a top and a bottom of said acoustic wave device protection layer recess are said acoustic wave device protection layer and said bottom epitaxial structure respectively, wherein said acoustic wave device upper structure comprises said acoustic wave device protection layer and said acoustic wave resonance structure;
wherein said Step G1 further comprises a following step of:
etching said bottom epitaxial structure below said acoustic wave device protection layer recess to form a bottom epitaxial structure recess, wherein a bottom of said bottom epitaxial structure recess is said bottom epitaxial structure or said semiconductor substrate, wherein at least one bottom epitaxial structure etching solution contacts with a top surface of said bottom epitaxial structure and said acoustic wave device protection layer recess, said at least one bottom epitaxial structure etching solution is uniformly distributed on said top surface of said bottom epitaxial structure through said acoustic wave device protection layer recess so as to uniformly etch part of said bottom epitaxial structure below said acoustic wave device protection layer recess to form said bottom epitaxial structure recess, and thereby prevents the side etching phenomenon during the etching, wherein said acoustic wave device protection layer recess is communicated with said bottom epitaxial structure recess, and said acoustic wave device protection layer recess and said bottom epitaxial structure recess have a boundary therebetween and said boundary is extended from said top surface of said bottom epitaxial structure, wherein a gap between said acoustic wave device protection layer and said bottom of said bottom epitaxial structure recess is increased by the communication of said acoustic wave device protection layer recess and said bottom epitaxial structure recess, so as to avoid the contact of said acoustic wave device protection layer and said bottom of said bottom epitaxial structure recess when said acoustic wave device is affected by stress such that said acoustic wave device protection layer is bended downwardly.

75. The method for fabricating an integrated structure of acoustic wave device, varactor and heterojunction bipolar transistor according to claim 74, wherein said acoustic wave device protection layer recess has an opening smaller than or equal to that of said bottom epitaxial structure recess.

76. The method for fabricating an integrated structure of acoustic wave device, varactor and heterojunction bipolar transistor according to claim 74, wherein said Step G12 comprises following steps of:
forming a middle n-type graded doped layer on said bottom epitaxial structure; and
forming a middle p-type doped layer on said middle n-type graded doped layer, wherein said middle epitaxial structure comprises said middle n-type graded doped layer and said middle p-type doped layer; and
wherein said Step G13 comprises following steps of:
defining a middle p-type doped layer etching area, and etching said middle p-type doped layer within said middle p-type doped layer etching area; and
defining a middle n-type graded doped layer etching area, and etching said middle n-type graded doped layer within said middle n-type graded doped layer etching area;
wherein said varactor middle epitaxial structure mesa comprises said middle n-type graded doped layer and said middle p-type doped layer on said second part of said bottom epitaxial structure, and wherein said acoustic wave device middle epitaxial structure mesa comprises (a) said middle n-type graded doped layer on said first part of said bottom epitaxial structure; or (b) said middle n-type graded doped layer and said middle p-type doped layer on said first part of said bottom epitaxial structure.

77. The method for fabricating an integrated structure of acoustic wave device, varactor and heterojunction bipolar transistor according to claim 76, wherein said Step G12 further comprises a following step of: forming a varactor ledge layer on said middle p-type doped layer; wherein said Step G13 further comprises a following step of: defining a varactor ledge layer etching area, and etching said varactor ledge layer within said varactor ledge layer etching area; wherein said varactor middle epitaxial structure mesa comprises said middle n-type graded doped layer, said middle p-type doped layer and said varactor ledge layer on said second part of said bottom epitaxial structure; and wherein said acoustic wave device middle epitaxial structure mesa comprises (a) said middle n-type graded doped layer on said first part of said bottom epitaxial structure; (b) said middle n-type graded doped layer and said middle p-type doped layer on said first part of said bottom epitaxial structure; or (c) said middle n-type graded doped layer, said middle p-type doped layer and said varactor ledge layer on said first part of said bottom epitaxial structure.

78. The method for fabricating an integrated structure of acoustic wave device, varactor and heterojunction bipolar transistor according to claim 54, wherein said semiconductor substrate is made of one material selected from the group consisting of: Si, GaAs, SiC, InP, GaN, AlN and Sapphire.

\* \* \* \* \*